(12) United States Patent
Ichikawa et al.

(10) Patent No.: US 9,063,414 B2
(45) Date of Patent: Jun. 23, 2015

(54) PHOTORESIST COMPOSITION

(75) Inventors: Koji Ichikawa, Toyonaka (JP); Mitsuhiro Hata, Mamaroneck, NY (US); Takahiro Yasue, Toyonaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 13/190,173

(22) Filed: Jul. 25, 2011

(65) Prior Publication Data

US 2012/0028188 A1    Feb. 2, 2012

(30) Foreign Application Priority Data

Jul. 28, 2010 (JP) .................................. 2010-169074
Feb. 25, 2011 (JP) .................................. 2011-039453

(51) Int. Cl.
G03F 7/004    (2006.01)
G03F 7/039    (2006.01)

(52) U.S. Cl.
CPC ............ *G03F 7/0045* (2013.01); *G03F 7/0397* (2013.01)

(58) Field of Classification Search
None
See application file for complete search history.

(56) References Cited

U.S. PATENT DOCUMENTS

| | | | |
|---|---|---|---|
| 3,779,778 A | 12/1973 | Smith et al. | |
| 3,849,137 A | 11/1974 | Barzynski et al. | |
| 3,859,099 A | 1/1975 | Petropoulos et al. | |
| 4,556,737 A | 12/1985 | Koda et al. | |
| 4,576,902 A | 3/1986 | Saenger et al. | |
| 4,822,716 A | 4/1989 | Onishi et al. | |
| 4,857,437 A | 8/1989 | Banks et al. | |
| 5,017,453 A | 5/1991 | Onishi et al. | |
| 5,073,476 A | 12/1991 | Meier et al. | |
| 5,198,520 A | 3/1993 | Onishi et al. | |
| 5,260,410 A | 11/1993 | Schwalm | |
| 5,453,341 A | 9/1995 | Schwalm | |
| 5,663,035 A * | 9/1997 | Masuda et al. | 430/270.1 |
| 5,916,728 A | 6/1999 | Fukui et al. | |
| 5,928,818 A * | 7/1999 | Mertesdorf et al. | 430/18 |
| 6,040,112 A | 3/2000 | Yako et al. | |
| 6,800,422 B2 * | 10/2004 | Thackeray et al. | 430/311 |
| 7,122,542 B2 | 10/2006 | Singh et al. | |
| 7,304,175 B2 | 12/2007 | Harada et al. | |
| 7,439,006 B2 | 10/2008 | Yoshida et al. | |
| 7,452,879 B2 | 11/2008 | Singh et al. | |
| 7,511,137 B2 | 3/2009 | Li | |
| 7,560,466 B2 | 7/2009 | Singh et al. | |
| 7,575,850 B2 | 8/2009 | Takata et al. | |
| 7,579,132 B2 | 8/2009 | Harada et al. | |
| 7,582,648 B2 | 9/2009 | Singh et al. | |
| 7,612,217 B2 | 11/2009 | Sakamoto et al. | |
| 7,754,714 B2 | 7/2010 | Li et al. | |
| 7,981,589 B2 | 7/2011 | Hasegawa et al. | |
| 7,981,989 B2 | 7/2011 | Yan et al. | |
| 8,039,200 B2 | 10/2011 | Kodama | |
| 8,124,803 B2 | 2/2012 | Yoshida et al. | |
| 8,206,886 B2 | 6/2012 | Kodama | |
| 8,236,842 B2 | 8/2012 | Yoshida et al. | |
| 2002/0058201 A1 | 5/2002 | Miyaji et al. | |
| 2005/0113398 A1 | 5/2005 | Argade et al. | |
| 2005/0192301 A1 | 9/2005 | Li | |
| 2005/0209224 A1 | 9/2005 | Singh et al. | |
| 2005/0234049 A1 | 10/2005 | Singh et al. | |
| 2005/0266336 A1 | 12/2005 | Kodama | |
| 2006/0035891 A1 | 2/2006 | Li et al. | |
| 2006/0167249 A1 | 7/2006 | Argade et al. | |
| 2006/0194982 A1 | 8/2006 | Harada et al. | |
| 2006/0199100 A1 | 9/2006 | Kanda | |

(Continued)

FOREIGN PATENT DOCUMENTS

CN    1784305 A    6/2006
DE    39 14 407 A1    10/1990

(Continued)

OTHER PUBLICATIONS

Luis et al., "Non Concerted Pathways in the Generation of Dehydroarenes by Thermal Decomposition of Diaryliodonium Carboxylates", Tetrahedron, vol. 45, No. 19, 1989, pp. 6281-6296.

(Continued)

*Primary Examiner* — Cynthia H Kelly
*Assistant Examiner* — Alyssa L Cepluch
(74) *Attorney, Agent, or Firm* — Birch, Stewart, Kolasch & Birch, LLP

(57) ABSTRACT

The present invention provides a photoresist composition comprising a resin which comprises a structural unit derived from a compound having an acid-labile group and which is insoluble or poorly soluble in an alkali aqueous solution but becomes soluble in an alkali aqueous solution by the action of an acid, an acid generator and a compound represented by the formula (I):

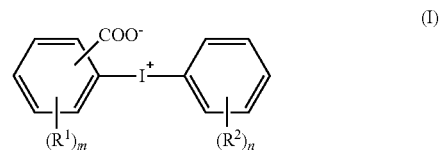

(I)

wherein $R^1$ and $R^2$ are independently in each occurrence a C1-C12 hydrocarbon group, a C1-C6 alkoxy group, a C2-C7 acyl group, a C2-C7 acyloxy group, a C2-C7 alkoxycarbonyl group, a nitro group or a halogen atom, and m and n independently each represent an integer of 0 to 4.

3 Claims, No Drawings

(56) References Cited

U.S. PATENT DOCUMENTS

| | | |
|---|---|---|
| 2007/0027336 A1 | 2/2007 | Yoshida et al. |
| 2007/0167439 A1 | 7/2007 | Singh et al. |
| 2007/0179140 A1 | 8/2007 | Argade et al. |
| 2007/0225495 A1 | 9/2007 | Singh et al. |
| 2007/0231741 A1 | 10/2007 | Nishi et al. |
| 2007/0299060 A1 | 12/2007 | Li et al. |
| 2008/0009484 A1 | 1/2008 | Argade et al. |
| 2008/0009494 A1 | 1/2008 | Li et al. |
| 2008/0021020 A1 | 1/2008 | Argade et al. |
| 2008/0027045 A1 | 1/2008 | Argade et al. |
| 2008/0044738 A1 | 2/2008 | Harada et al. |
| 2008/0051412 A1 | 2/2008 | Argade et al. |
| 2008/0076063 A1 | 3/2008 | Yoshida et al. |
| 2008/0081925 A1 | 4/2008 | Sakamoto et al. |
| 2008/0193874 A1* | 8/2008 | Takata et al. ............... 430/270.1 |
| 2008/0312438 A1 | 12/2008 | Singh et al. |
| 2009/0068591 A1 | 3/2009 | Kawaue et al. |
| 2009/0137589 A1 | 5/2009 | Argade et al. |
| 2009/0176981 A1 | 7/2009 | Argade et al. |
| 2009/0197204 A1 | 8/2009 | Shiono et al. |
| 2009/0202945 A1 | 8/2009 | Nakagawa et al. |
| 2009/0317745 A1 | 12/2009 | Mimura et al. |
| 2009/0318687 A1 | 12/2009 | Singh et al. |
| 2010/0035185 A1 | 2/2010 | Hagiwara et al. |
| 2010/0081088 A1 | 4/2010 | Kawaue et al. |
| 2010/0136480 A1* | 6/2010 | Motoike et al. ............ 430/270.1 |
| 2010/0203446 A1 | 8/2010 | Ichikawa et al. |
| 2010/0304300 A1 | 12/2010 | Kodama |
| 2011/0020749 A1 | 1/2011 | Ichikawa et al. |
| 2011/0039208 A1 | 2/2011 | Hata et al. |
| 2011/0053082 A1 | 3/2011 | Ichikawa et al. |
| 2011/0171576 A1 | 7/2011 | Yamaguchi et al. |
| 2011/0200935 A1 | 8/2011 | Masuyama et al. |
| 2011/0201823 A1 | 8/2011 | Yoshida et al. |
| 2011/0266534 A1 | 11/2011 | Yan et al. |
| 2011/0318688 A1 | 12/2011 | Hiraoka et al. |
| 2012/0028188 A1 | 2/2012 | Ichikawa et al. |
| 2012/0052443 A1 | 3/2012 | Masuyama et al. |
| 2012/0070778 A1 | 3/2012 | Ichikawa et al. |
| 2012/0088190 A1 | 4/2012 | Ichikawa et al. |
| 2012/0100483 A1 | 4/2012 | Masuyama et al. |
| 2012/0135350 A1 | 5/2012 | Kobayashi et al. |
| 2012/0148954 A1 | 6/2012 | Fukumoto et al. |
| 2012/0156620 A1 | 6/2012 | Ichikawa et al. |
| 2012/0219899 A1 | 8/2012 | Ichikawa et al. |
| 2012/0219907 A1 | 8/2012 | Ichikawa et al. |
| 2012/0219908 A1 | 8/2012 | Ichikawa et al. |
| 2012/0219909 A1 | 8/2012 | Ichikawa et al. |
| 2012/0219912 A1 | 8/2012 | Ichikawa et al. |
| 2012/0237875 A1 | 9/2012 | Asano et al. |
| 2012/0258405 A1 | 10/2012 | Ichikawa et al. |
| 2012/0264059 A1 | 10/2012 | Ichikawa et al. |
| 2013/0022924 A1 | 1/2013 | Ichikawa et al. |

FOREIGN PATENT DOCUMENTS

| | | |
|---|---|---|
| EP | 0 126 712 A1 | 11/1984 |
| JP | 55-164824 A | 12/1980 |
| JP | 62-69263 A | 3/1987 |
| JP | 62-153853 A | 7/1987 |
| JP | 63-26653 A | 2/1988 |
| JP | 63-146029 A | 6/1988 |
| JP | 63-146038 A | 6/1988 |
| JP | 63-163452 A | 7/1988 |
| JP | 11-52575 A | 2/1996 |
| JP | 2002-131917 A | 5/2002 |
| JP | 2002-226436 A | 8/2002 |
| JP | 2005-221721 A | 8/2005 |
| JP | 2006-257078 A | 9/2006 |
| JP | 2006-276851 A | 10/2006 |
| JP | 2007-119696 A | 5/2007 |
| JP | 2007-514775 A | 6/2007 |
| JP | 2007-224008 A | 9/2007 |
| JP | 2008-13551 A | 1/2008 |
| JP | 2008-69146 A | 3/2008 |
| JP | 2008-127367 A | 6/2008 |
| JP | 2008-209917 A | 9/2008 |
| JP | 2009-19146 A | 1/2009 |
| JP | 2009-86358 A | 4/2009 |
| JP | 2009-145408 A | 7/2009 |
| JP | 2009-229603 A | 10/2009 |
| JP | 2010-26478 A | 2/2010 |
| JP | 2010-111660 A | 5/2010 |
| JP | 2010-152341 A | 7/2010 |
| JP | 2010-197413 A | 9/2010 |
| JP | 2010-204646 A | 9/2010 |
| JP | 2011-128226 A | 6/2011 |
| JP | 2012-8553 A | 1/2012 |
| TW | 575789 B | 2/2004 |
| WO | WO 2004/101280 A1 | 11/2004 |
| WO | WO 2007/116664 A1 | 10/2007 |
| WO | WO 2008/099869 A1 | 8/2008 |
| WO | WO 2011/024953 A1 | 3/2011 |
| WO | WO 2011/034176 A1 | 3/2011 |

OTHER PUBLICATIONS

English translation of JP 2010-197413-A published Sep. 9, 2010.
United States Notice of Allowance for U.S. Appl. No. 13/404,054 dated Dec. 28, 2012.
United States Notice of Allowance for U.S. Appl. No. 13/404,871 dated Dec. 26, 2012.
United States Office Action for U.S. Appl. No. 13/404,049 dated Dec. 20, 2012.
United States Office Action for U.S. Appl. No. 13/404,064 dated Mar. 25, 2013.
United States Office Action for U.S. Appl. No. 13/404,140 dated Nov. 28, 2012.
United States Office Action for U.S. Appl. No. 13/404,238 dated Dec. 20, 2012.
United States Office Action for U.S. Appl. No. 13/405,068 dated May 9, 2013.
United States Office Action for U.S. Appl. No. 13/551,724 dated May 10, 2013.
United States Office Action for U.S. Appl. No. 13/551,855 dated Apr. 25, 2013.
United States Office Action for U.S. Appl. No. 13/551,860 dated Mar. 21, 2013.
United States Office Action for U.S. Appl. No. 13/551,864 dated Apr. 11, 2013.
United States Office Action for U.S. Appl. No. 13/551,874 dated May 9, 2013.
United States Office Action for U.S. Appl. No. 13/551,906 dated Apr. 26, 2013.
United States Office Action for U.S. Appl. No. 13/551,980 dated May 9, 2013.
United States Office Action for U.S. Appl. No. 13/552,044 dated May 9, 2013.
United States Office Action for U.S. Appl. No. 13/552,242 dated May 14, 2013.
United States Office Action for U.S. Appl. No. 13/552,273 dated Apr. 23, 2013.
United States Office Action for U.S. Appl. No. 13/552,278 dated Apr. 25, 2013.
United States Office Action for U.S. Appl. No. 13/552,281 dated Aug. 13, 2013.
United States Office Action for U.S. Appl. No. 13/552,281 dated Feb. 22, 2013.
United States Office Action for U.S. Appl. No. 13/552,315 dated Feb. 25, 2013.
Beringer et al., "Diaryliodonium Salts. XIII. Salts in which the Cations Bear Carboxyl, Hydroxyl, Alkoxyl or Amino Groups", J. Am. Chem. Soc., vol. 82, 1960, pp. 725-731.
Taiwanese Search Report dated Dec. 23, 2014, for Taiwanese Application No. 100126149 with the English translation.

* cited by examiner

PHOTORESIST COMPOSITION

This nonprovisional application claims priority under 35 U.S.C. §119(a) on Patent Application No. 2010-169074 filed in JAPAN on Jul. 28, 2010, and on Patent Application No. 2011-039453 filed in JAPAN on Feb. 25, 2011, the entire contents of which are hereby incorporated by reference.

FIELD OF THE INVENTION

The present invention relates to a photoresist composition.

BACKGROUND OF THE INVENTION

A photoresist composition used for semiconductor microfabrication employing a lithography process contains a resin having a structural unit derived from a compound having an acid-labile group, being insoluble or poorly soluble in an alkali aqueous solution but becoming soluble in an alkali aqueous solution by the action of an acid, an acid generator and a basic compound.

US 2006/0194982 A1 discloses a photoresist composition comprising a resin having a structural unit derived from 2-ethyl-2-adamantyl methacrylate, a structural unit derived from 3-hydroxy-1-adamantyl methacrylate and a structural unit derived from α-methacryloyloxy-γ-butyrolactone, an acid generator comprising triphenylsulfonium 1-((3-hydroxyadamantyl)methoxycarbonyl)difluoromethanesulfonate and 2,6-diisopropylaniline.

SUMMARY OF THE INVENTION

The present invention is to provide a photoresist composition.

The present invention relates to the followings:
<1> A photoresist composition comprising
a resin which comprises a structural unit derived from a compound having an acid-labile group and which is insoluble or poorly soluble in an alkali aqueous solution but becomes soluble in an alkali aqueous solution by the action of an acid,
an acid generator and
a compound represented by the formula (I):

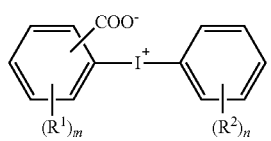

wherein $R^1$ and $R^2$ are independently in each occurrence a C1-C12 hydrocarbon group, a C1-C6 alkoxy group, a C2-C7 acyl group, a C2-C7 acyloxy group, a C2-C7 alkoxycarbonyl group, a nitro group or a halogen atom, and m and n independently each represent an integer of 0 to 4;
<2> A process for producing a photoresist pattern comprising the following steps (1) to (5):
  (1) a step of applying the photoresist composition according to <1> on a substrate,
  (2) a step of forming a photoresist film by conducting drying,
  (3) a step of exposing the photoresist film to radiation,
  (4) a step of baking the exposed photoresist film, and
  (5) a step of developing the baked photoresist film with an alkaline developer, thereby forming a photoresist pattern.

DESCRIPTION OF PREFERRED EMBODIMENTS

The photoresist composition of the present invention comprises a resin which comprises a structural unit derived from a compound having an acid-labile group and which is insoluble or poorly soluble in an alkali aqueous solution but becomes soluble in an alkali aqueous solution by the action of an acid,
an acid generator and
a compound represented by the formula (I) (hereinafter, simply referred to as the compound (I)).

In the formula (I), $R^1$ and $R^2$ are independently in each occurrence a C1-C12 hydrocarbon group, a C1-C6 alkoxy group, a C2-C7 acyl group, a C2-C7 acyloxy group, a C2-C7 alkoxycarbonyl group, a nitro group or a halogen atom, and m and n independently each represent an integer of 0 to 4.

Examples of the hydrocarbon group include a C1-C12 aliphatic hydrocarbon group, a C3-C12 alicyclic hydrocarbon group, a C6-C12 aromatic hydrocarbon group and a group formed by combining two or more groups of the above mentioned groups.

Examples of the C1-C12 aliphatic hydrocarbon group include a C1-C12 alkyl group such as a methyl group, an ethyl group, a propyl group, an isopropyl group, a butyl group, an isobutyl group, a tert-butyl group, a pentyl group, a hexyl group, a heptyl group, an octyl group and a nonyl group.

The C3-C12 alicyclic hydrocarbon group may be monocyclic or polycyclic, and may be saturated or unsaturated. Examples thereof include a monocyclic alicyclic hydrocarbon group such as a C3-C12 cycloalkyl group (e.g. a cyclopropyl group, a cyclobutyl group, a cyclopentyl group, a cyclohexyl group, a cyclononyl group and a cyclododecyl group) and a polycyclic alicyclic hydrocarbon group such as an adamantyl group and a norbornyl group.

Examples of the C6-C12 aromatic hydrocarbon group include a C6-C12 aryl group such as a phenyl group, a 1-naphthyl group, a 2-naphthyl group, a 2-methylphenyl group, a 3-methylphenyl group, a 4-methylphenyl group, a 4-ethylphenyl group, a 4-propylphenyl group, a 4-isopropylphenyl group, a 4-butylphenyl group, a 4-tert-butylphenyl group, a 4-hexylphenyl group, 4-cyclohexylphenyl group, an anthryl group, a p-adamantyl phenyl group, a tolyl group, a xylyl group, a cumyl group, a mesityl group, a biphenyl group, a phenanthryl group, a 2,6-diethylphenyl group and a 2-methyl-6-ethylphenyl group.

Examples of the group formed by combining two or more groups of the above mentioned groups include an alkyl-cycloalkyl group, a cylcoalkyl-alkyl group and an aralkyl group such as a phenylmethyl group, a 1-phenylethyl group, a 2-phenylethyl group, a 1-phenyl-1-propyl group, a 1-phenyl-2-propyl group, a 2-phenyl-2-propyl group, a 3-phenyl-1-propyl group, a 4-phenyl-1-butyl group, a 5-phenyl-1-pentyl group and a 6-phenyl-1-hexyl group.

Examples of the C1-C6 alkoxy group include a methoxy group and an ethoxy group. Examples of the C2-C7 acyl group include an acetyl group, a propyonyl group, a benzoyl group and a cyclohexanecarbonyl group. Examples of the C2-C7 acyloxy group include an acetyloxy group, a propyonyloxy group, a benzoyloxy group and a cyclohexanecarbonyloxy group. Examples of the C2-C7 alkoxycarbonyl group include a methoxycarbonyl group and an ethoxycarbonyl group. Examples of the halogen atom include fluorine atom, a chlorine atom and a bromine atom.

It is preferred that $R^1$ and $R^2$ are independently in each occurrence a C1-C8 alkyl group, a C3-C10 cycloalkyl group, a C1-C6 alkoxy group, a C2-C4 acyl group, a C2-C4 acyloxy group, a C2-C4 alkoxycarbonyl group, a nitro group or a halogen atom.

It is preferred that m and n independently each represent an integer of 0 to 2.

Examples of the compound (I) include the following.

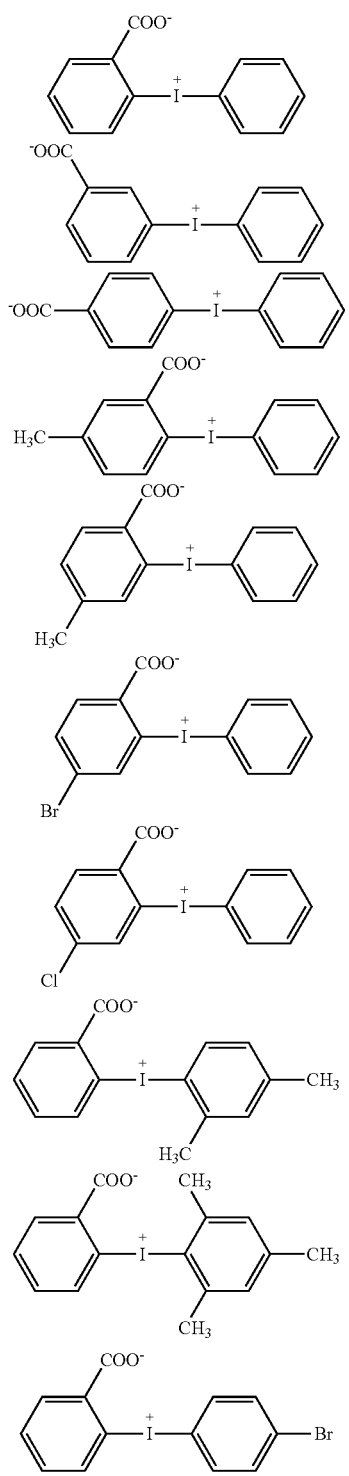

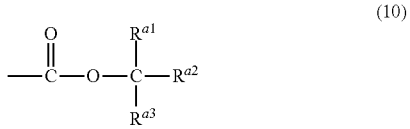

The content of the compound (I) in the photoresist composition of the present invention is usually 0.01% by mass to 5% by mass based on sum of solid component, preferably 0.01% by mass to 3% by mass and more preferably 0.01% by mass to 1% by mass. In this specification, "solid component" means components other than solvent in the photoresist composition.

The resin is insoluble or poorly soluble in an alkali aqueous solution but becomes soluble in an alkali aqueous solution by the action of an acid. The resin has a structural unit derived from a compound having an acid-labile group, and can be produced by polymerizing one or more compounds having an acid-labile group.

In this specification, "an acid-labile group" means a group capable of being eliminated by the action of an acid.

Examples of the acid-labile group include a group represented by the formula (10):

$$\overset{O}{\underset{}{\text{—C}}}\text{—O}\text{—}\underset{R^{a3}}{\overset{R^{a1}}{\underset{|}{\overset{|}{\text{C}}}}}\text{—}R^{a2} \quad (10)$$

wherein $R^{a1}$, $R^{a2}$ and $R^{a1}$ independently each represent a C1-C8 aliphatic hydrocarbon group or a C3-C20 alicyclic hydrocarbon group, and $R^{a1}$ and $R^{a2}$ can be bonded each other to form a C3-C20 ring together with the carbon atom to which they are bonded, and one or more —CH$_2$— in the C1-C8 aliphatic hydrocarbon group, the C3-C20 alicyclic hydrocarbon group and the C3-C20 ring can be replaced by —O—, —S— or —CO—.

Examples of the aliphatic hydrocarbon group include a C1-C8 alkyl group. Specific examples of the C1-C8 alkyl group include a methyl group, an ethyl group, a propyl group, an isopropyl group, a butyl group, a pentyl group, a hexyl group, a heptyl group and an octyl group. The alicyclic hydrocarbon group may be monocyclic or polycyclic, and may be saturated or non-aromatic unsaturated.

Examples thereof include a monocyclic alicyclic hydrocarbon group such as a C3-C20 cycloalkyl group (e.g. a cyclopentyl group, a cyclohexyl group, a methylcyclohexyl group, a dimethylcyclohexyl group, a cycloheptyl group and a cyclooctyl group) and a polycyclic alicyclic hydrocarbon group such as a decahydronaphthyl group, an adamantyl group, a norbornyl group, a methylnorbornyl group, and the followings:

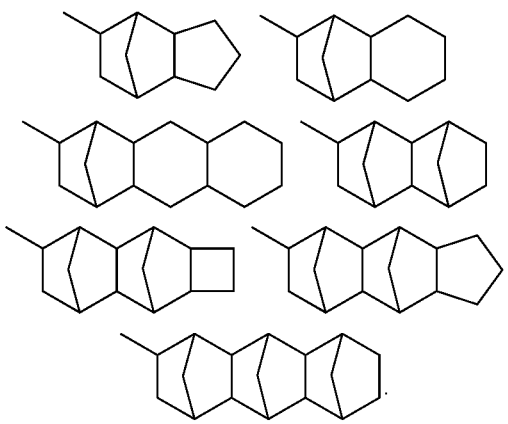

The alicyclic hydrocarbon group is preferably a saturated cyclic hydrocarbon group, and preferably has 3 to 16 carbon atoms.

Examples of the ring formed by bonding $R^{a1}$ and $R^{a2}$ each other include the following groups and the ring preferably has 3 to 12 carbon atoms.

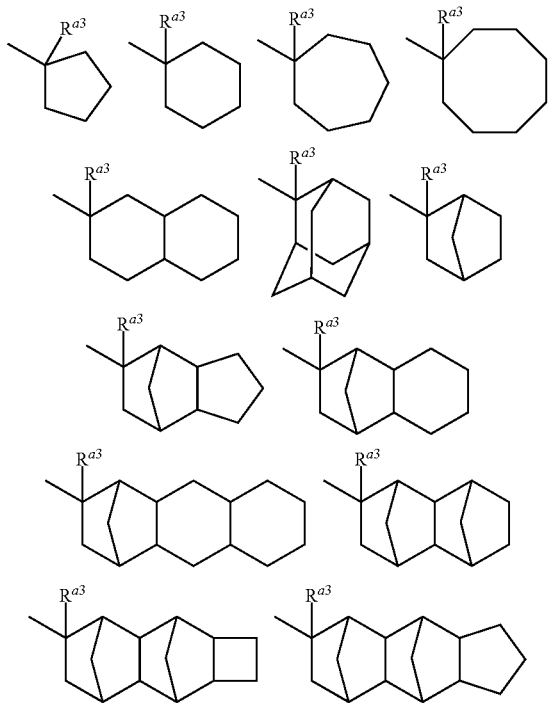

-continued

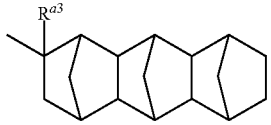

wherein $R^{a3}$ is the same as defined above.

The group represented by the formula (10) wherein $R^{a1}$, $R^{a2}$ and $R^{a3}$ independently each represent a C1-C8 alkyl group such as a tert-butyl group, the group represented by the formula (10) wherein $R^{a1}$ and $R^{a2}$ are bonded each other to form an adamantyl ring and $R^{a3}$ is a C1-C8 alkyl group such as a 2-alkyl-2-adamantyl group, and the group represented by the formula (10) wherein $R^{a1}$ and $R^{a2}$ are C1-C8 alkyl groups and $R^{a3}$ is an adamantyl group such as a 1-(1-adamantyl)-1-alkylalkoxycarbonyl group are preferable.

Examples of the acid-labile group include a group represented by the formula (20):

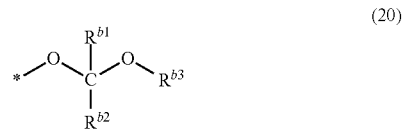

(20)

wherein $R^{b1}$ and $R^{b2}$ independently each represent a hydrogen atom or a C1-C12 hydrocarbon group, and $R^{b3}$ represents a C1-C20 hydrocarbon group, and $R^{b2}$ and $R^{b3}$ can be bonded each other to form a C3-C20 ring together with the carbon atom and the oxygen atom to which they are bonded, and one or more —CH$_2$— in the hydrocarbon group and the ring can be replaced by —O—, —S— or —CO—.

The group represented by the formula (20) has an acetal structure.

Examples of the hydrocarbon group include an aliphatic hydrocarbon group, an alicyclic hydrocarbon group and an aromatic hydrocarbon group.

It is preferred that at least one of $R^{b1}$ and $R^{b2}$ is a hydrogen atom.

Examples of the group represented by the formula (20) include the following.

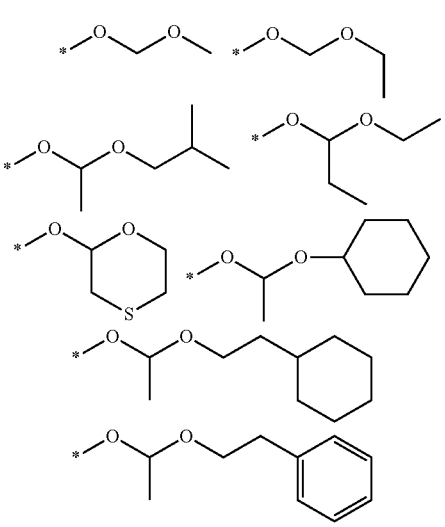

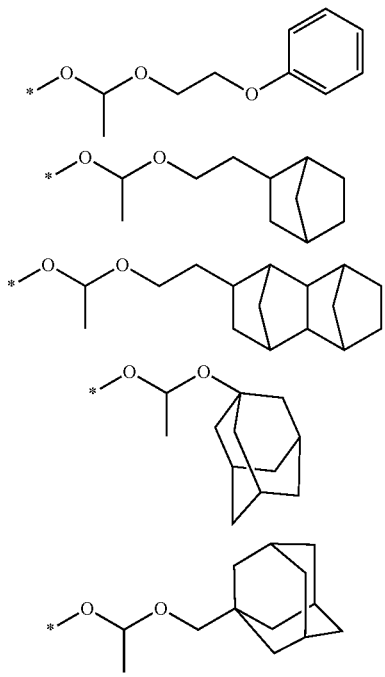

The compound having an acid-labile group is preferably a monomer having an acid-labile group in its side chain and a carbon-carbon double bond, and is more preferably an acrylate monomer having an acid-labile group in its side chain or a methacryalte monomer having an acid-labile group in its side chain.

A monomer having the group represented by the formula (10) or (20) in its side chain and a carbon-carbon double bond is preferable, and an acrylate monomer having the group represented by the formula (10) in its side chain or a methacryalte monomer having the group represented by the formula (10) in its side chain is more preferable.

An acrylate monomer having the group represented by the formula (10) in which $R^{a1}$ and $R^{a2}$ are bonded each other to form a C5-C20 alicycle together with the carbon atom to which they are bonded in its side chain or a methacryalte monomer having the group represented by the formula (10) in which $R^{a1}$ and $R^{a2}$ are bonded each other to form a C5-C20 alicycle together with the carbon atom to which they are bonded in its side chain is especially preferable.

Preferable examples of the compound having an acid-labile group include monomers represented by the formulae (a1-1) and (a1-2):

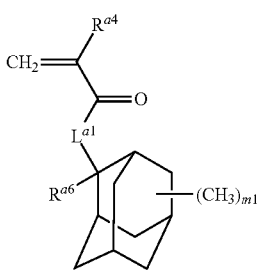

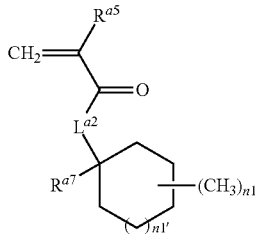

wherein $R^{a4}$ and $R^{a5}$ each independently represents a hydrogen atom or a methyl group, $R^{a6}$ and $R^{a7}$ each independently represents a C1-C8 aliphatic hydrocarbon group or a C3-C10 alicyclic hydrocarbon group, $L^{a1}$ and $L^{a2}$ each independently represents *—O— or *—O—$(CH_2)_{k1}$—CO—O— in which * represents a binding position to —CO—, and k1 represents an integer of 1 to 7, and m1 represents an integer of 0 to 14, n1 represents an integer of 0 to 10, and n1' represents an integer of 0 to 3.

The aliphatic hydrocarbon group preferably has 1 to 6 carbon atoms, and the alicyclic hydrocarbon group preferably has 3 to 8 carbon atoms and more preferably 3 to 6 carbon atoms. The alicyclic hydrocarbon group is preferably a saturated aliphatic cyclic hydrocarbon group.

Examples of the aliphatic hydrocarbon group include a C1-C8 alkyl group such as a methyl group, an ethyl group, a propyl group, an isopropyl group, a butyl group, a tert-butyl group, a 2,2-dimethylethyl group, a 1-methylpropyl group, a 2,2-dimethylpropyl group, a 1-ethylpropyl group, a 1-methylbutyl group, a 2-methylbutyl group, a 3-methylbutyl group, a 1-propylbutyl group, a pentyl group, a 1-methylpentyl group, a hexyl group, a 1,4-dimethylhexyl group, a heptyl group, a 1-methylheptyl group and an octyl group. Examples of the saturated cyclic hydrocarbon group include a cyclohexyl group, a methylcyclohexyl group, a dimethylcyclohexyl group, a cycloheptyl group, a methylcycloheptyl group, a norbornyl group and a methylnorbornyl group.

$L^{a1}$ is preferably *—O— or *—O— $(CH_2)_{f1}$—CO—O— in which * represents a binding position to —CO—, and f1 represents an integer of 1 to 4, and is more preferably *—O— or *—O—$CH_2$—CO—O—, and is especially preferably *—O—. $L^{a2}$ is preferably *—O— or *—O—$(CH_2)_{f1}$—CO—O— in which * represents a binding position to —CO—, and f1 is the same as defined above, and is more preferably *—O— or *—O—$CH_2$—CO—O—, and is especially preferably *—O—.

In the formula (a1-1), m1 is preferably an integer of 0 to 3, and is more preferably 0 or 1. In the formula (a1-2), n1 is preferably an integer of 0 to 3, and is more preferably 0 or 1, and n1' is preferably 0 or 1.

$R^{a4}$ and $R^{a5}$ are preferably methyl groups.

Particularly when the photoresist composition contains a resin derived from a monomer having a bulky structure such as a saturated cyclic hydrocarbon group, the photoresist composition having excellent resolution tends to be obtained.

Examples of the monomer represented by the formula (a1-1) include the followings.
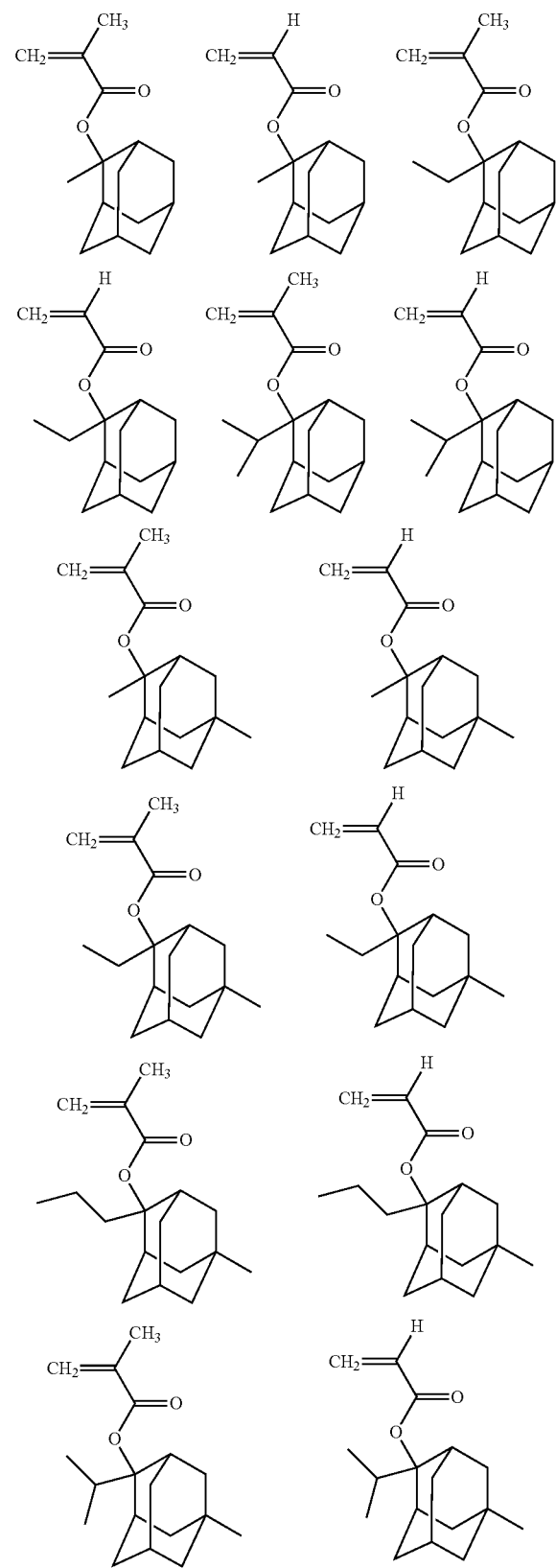
-continued
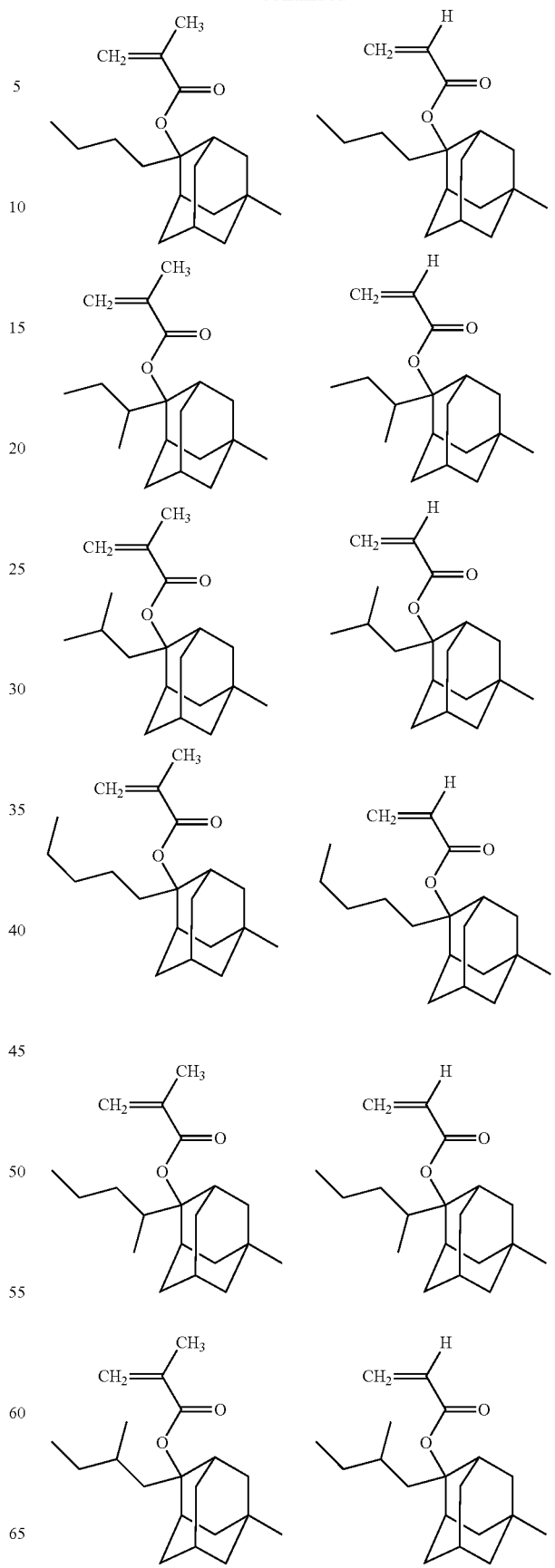

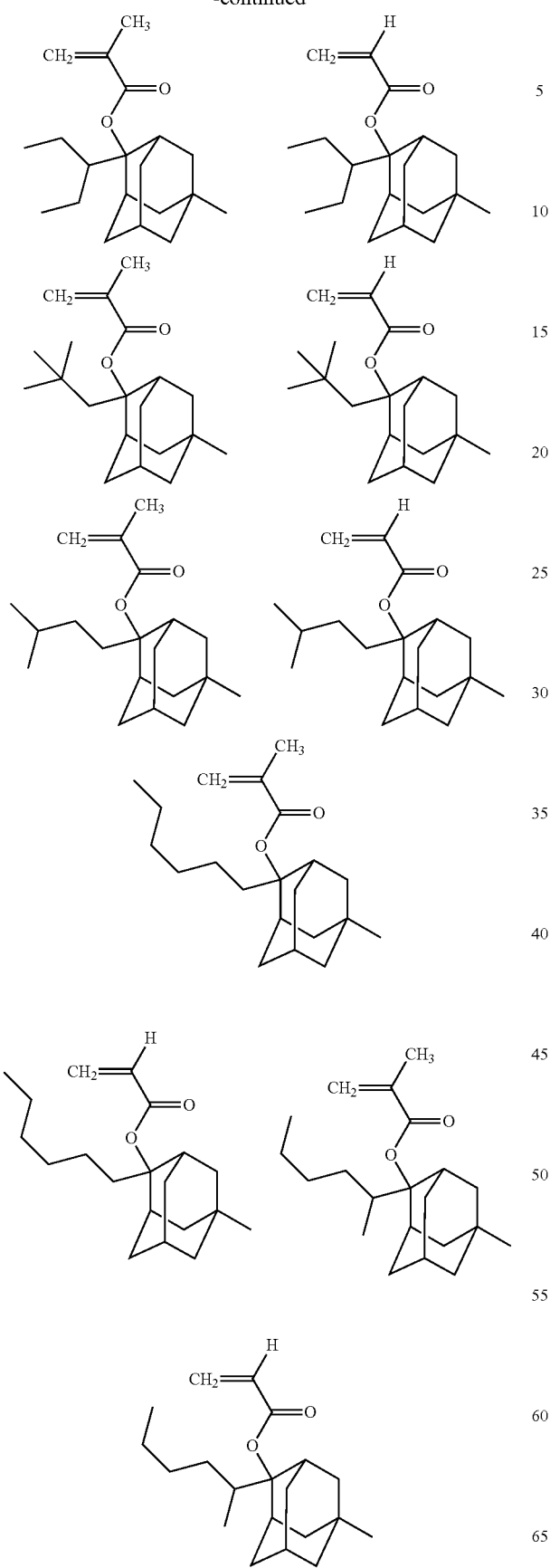

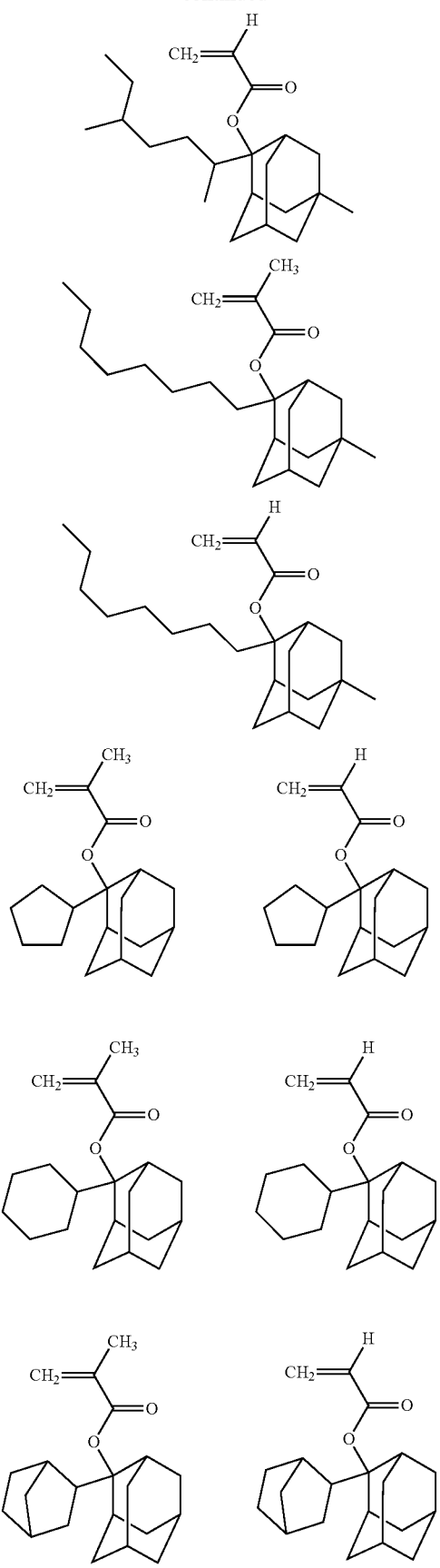
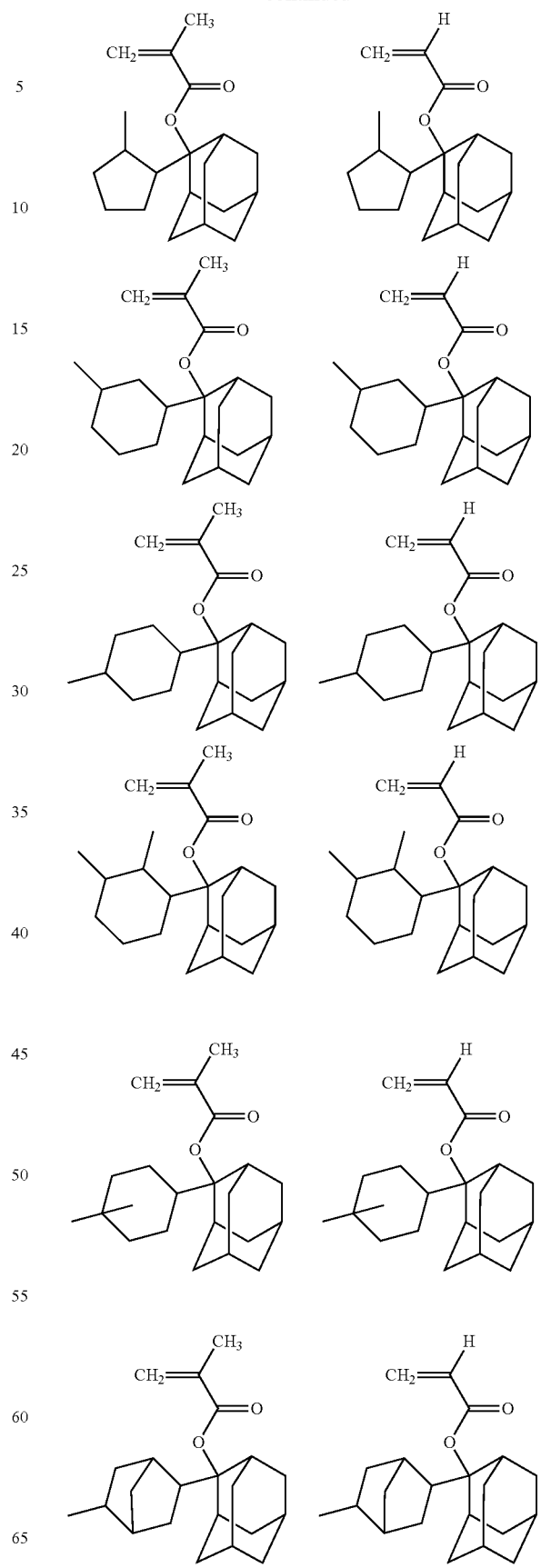

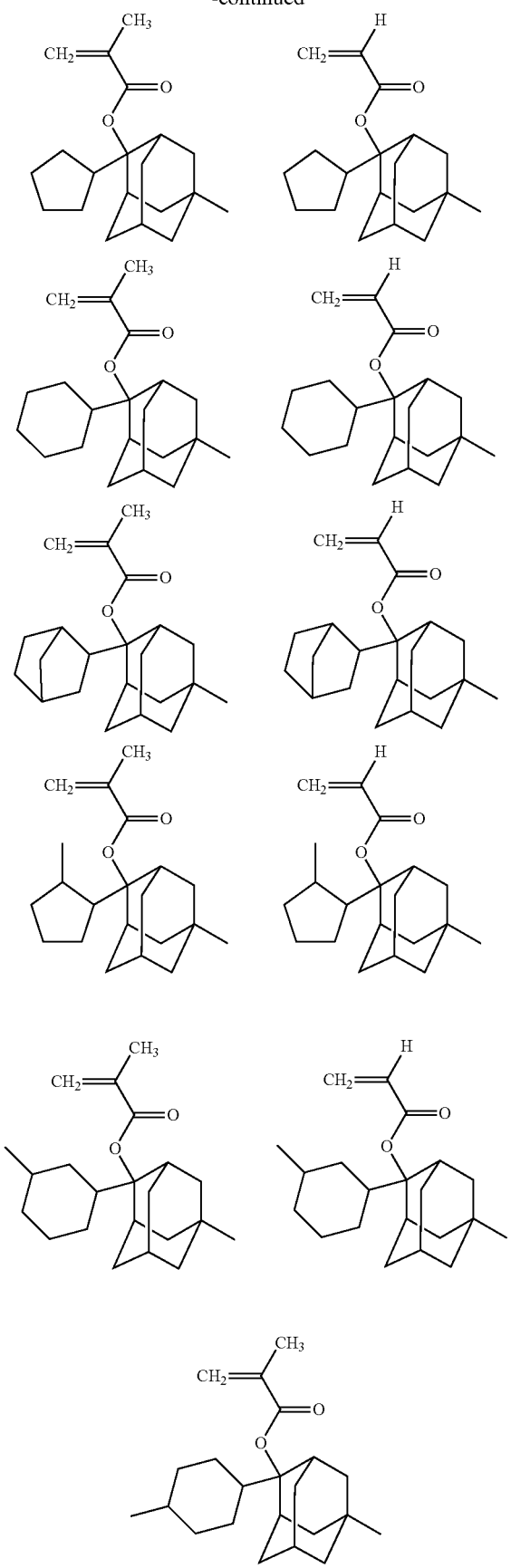
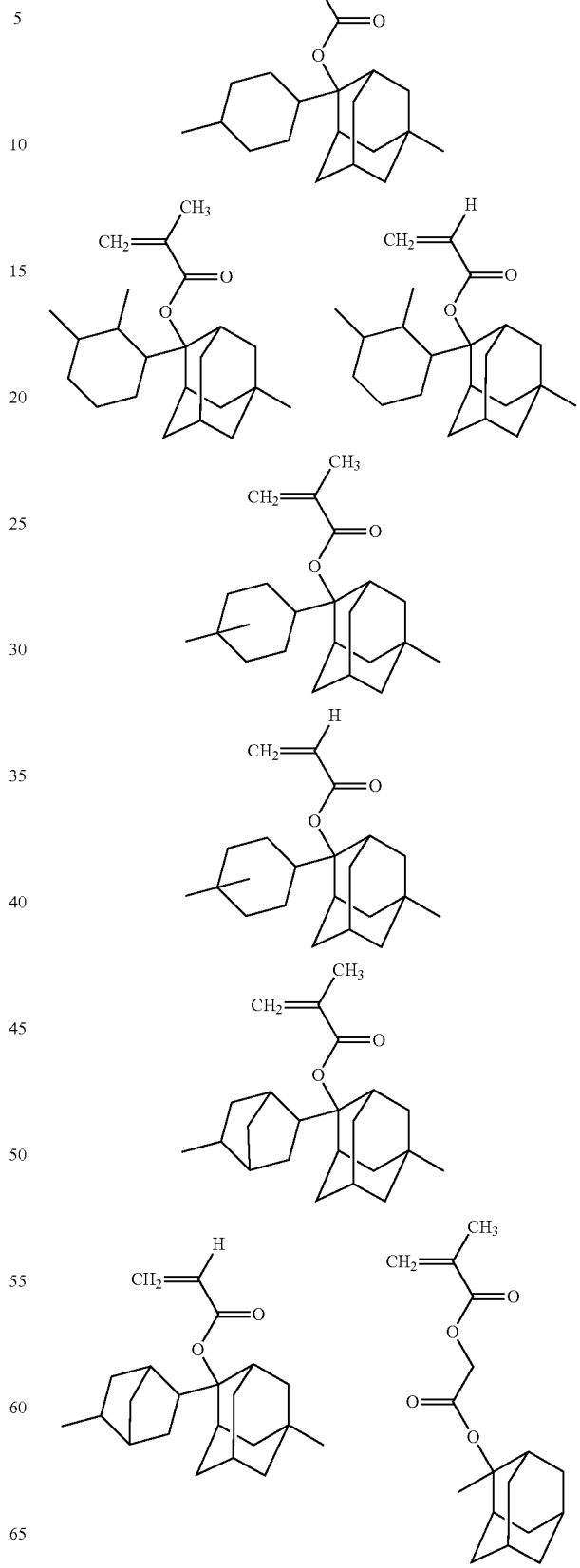

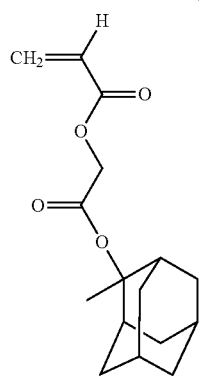 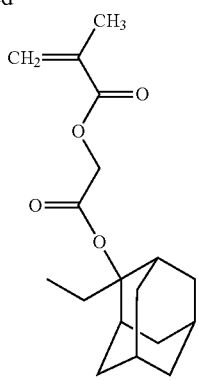 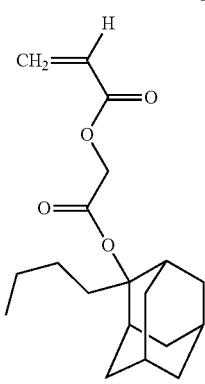 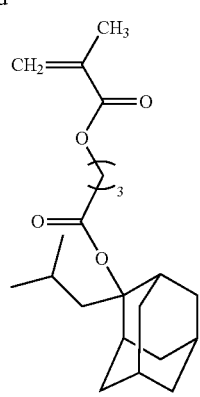
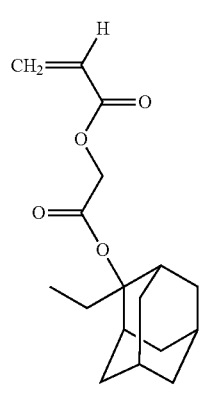 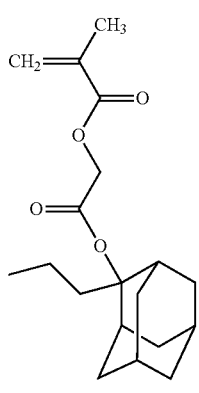 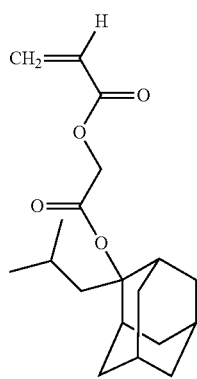 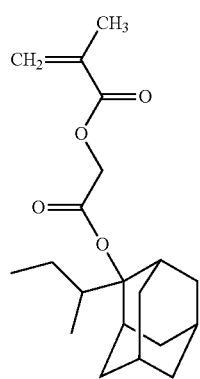
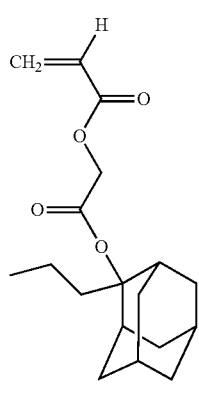 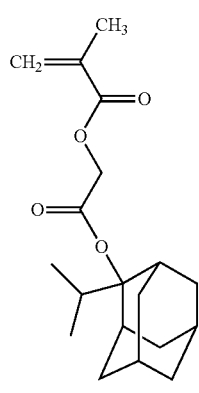 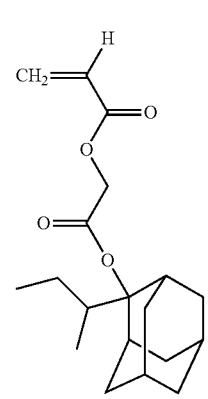 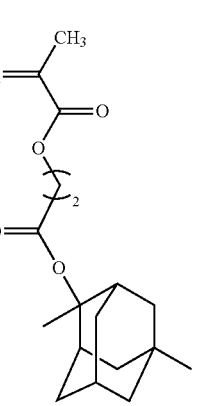
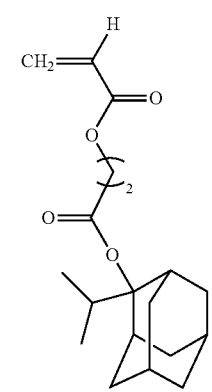 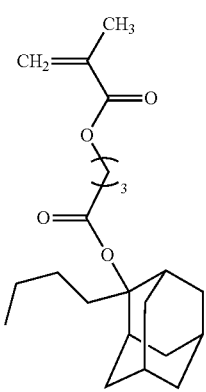 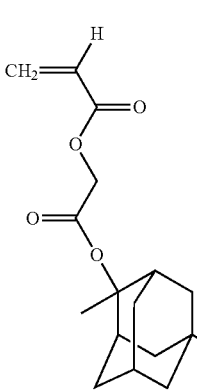 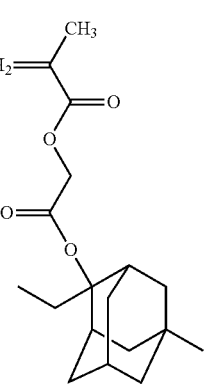

-continued
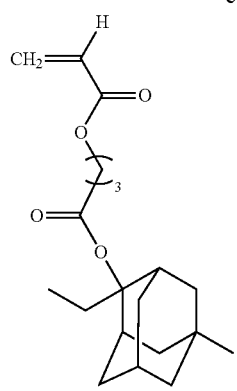 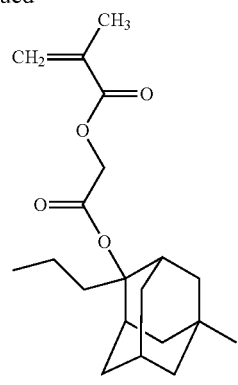 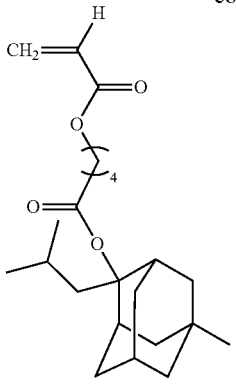 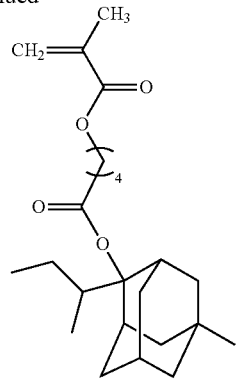
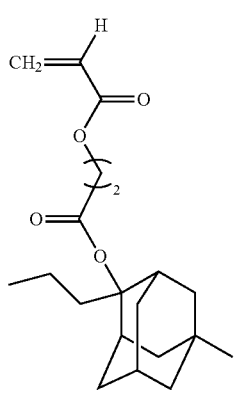 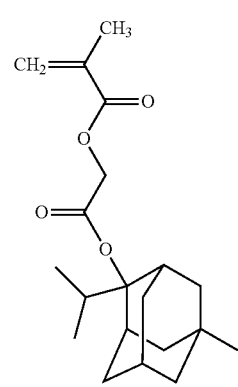 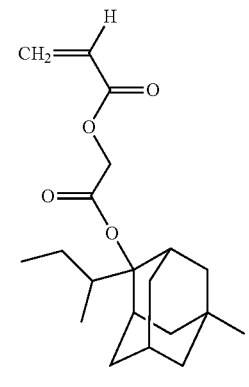 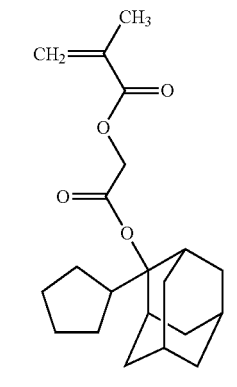
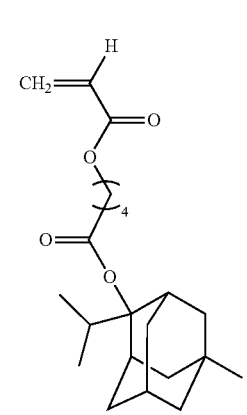 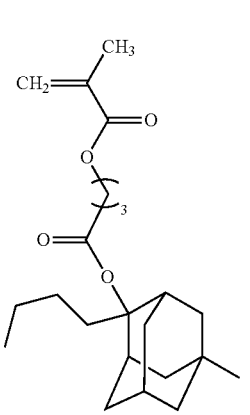 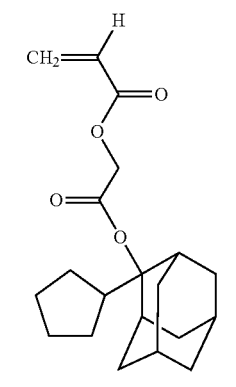 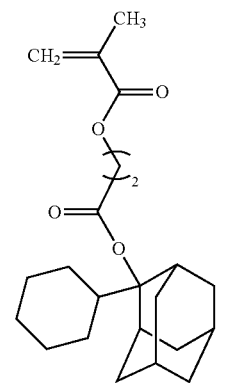
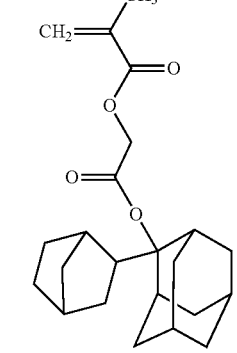

-continued
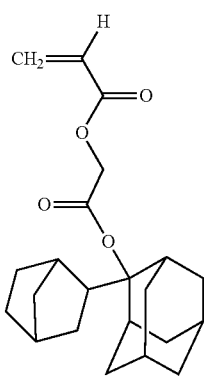 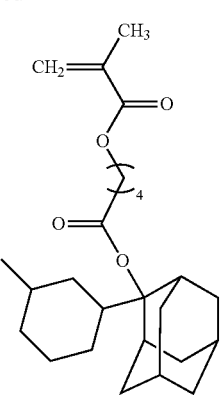 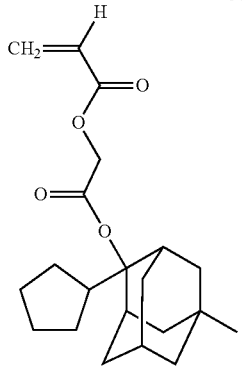 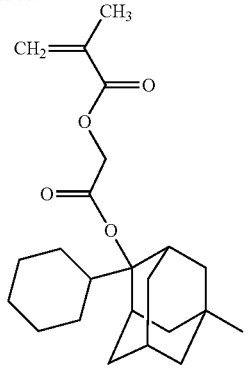
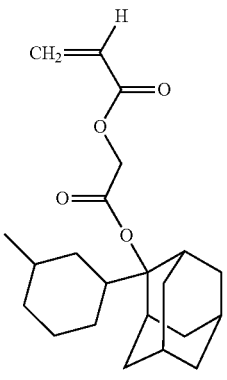 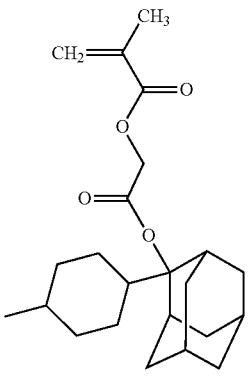 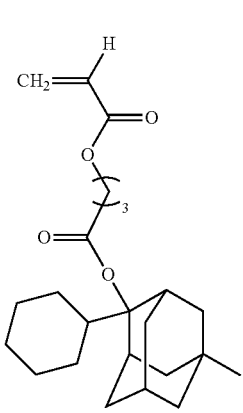 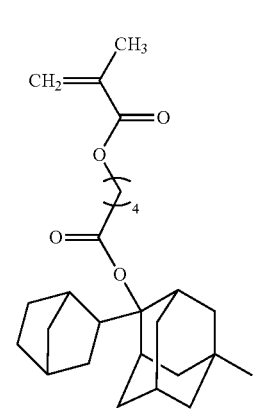
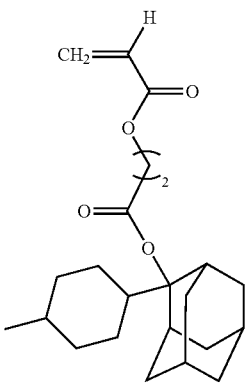 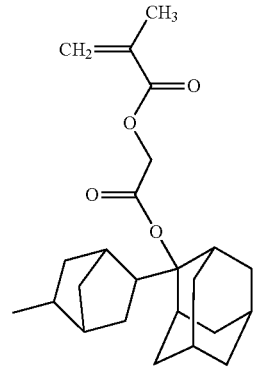 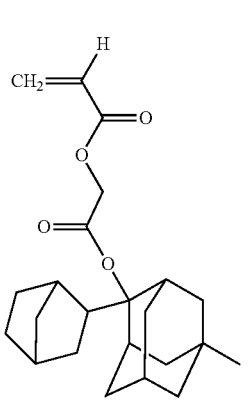 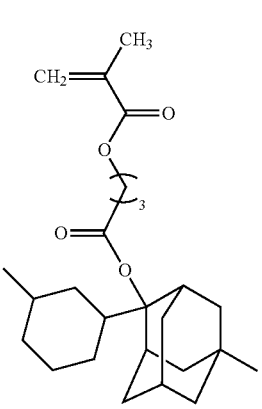
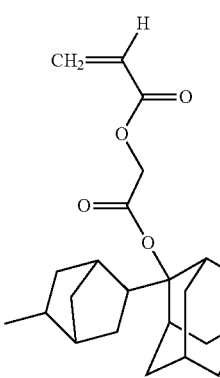 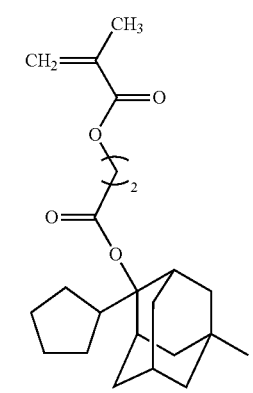 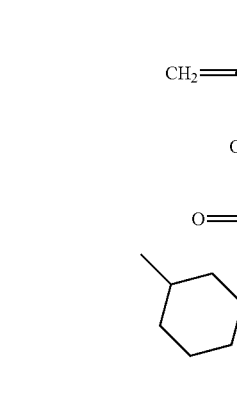

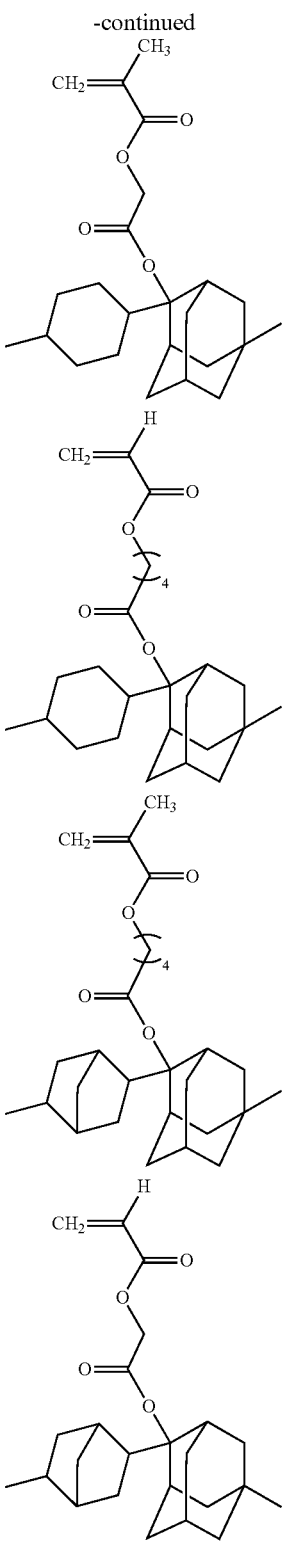

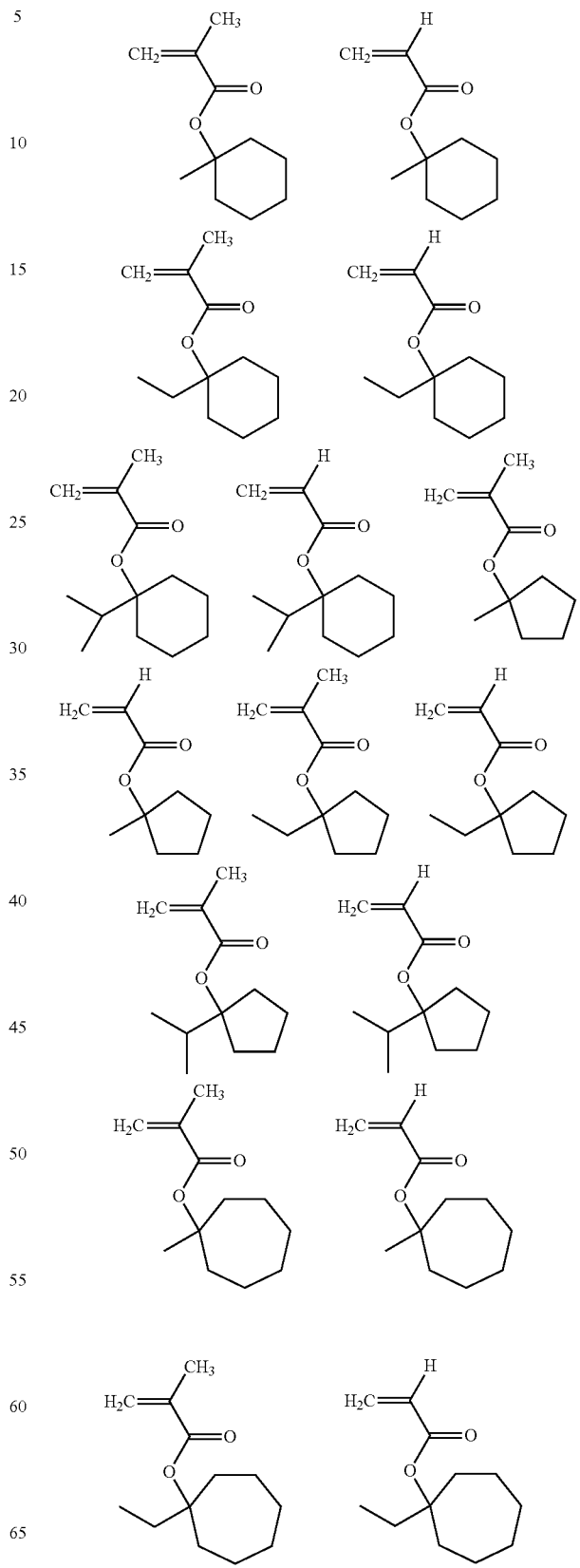

Examples of the monomer represented by the formula (a1-2) include the followings.

Among them, preferred are 2-methyl-2-adamantyl acrylate, 2-methyl-2-adamantyl methacrylate, 2-ethyl-2-adamantyl acrylate, 2-ethyl-2-adamantyl methacrylate, 2-isopropyl-2-adamantyl acrylate and 2-isopropyl-2-adamantyl methacrylate, and more preferred are 2-methyl-2-adamantyl methacrylate, 2-ethyl-2-adamantyl methacrylate, and 2-isopropyl-2-adamantyl methacrylate.

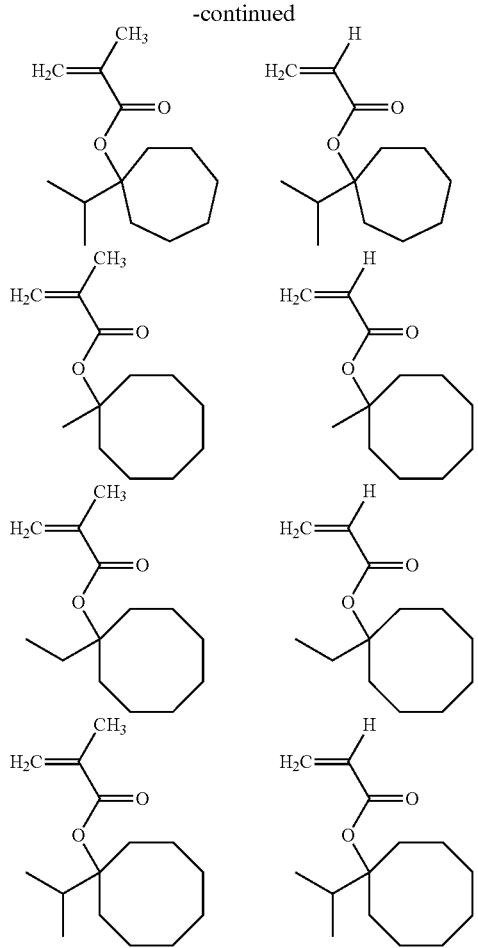

Among them, preferred are 1-ethyl-1-cyclohexyl acrylate and 1-ethyl-1-cyclohexyl methacrylate, and more preferred is 1-ethyl-1-cyclohexyl methacrylate.

The content of the structural unit derived from a compound having an acid-labile group in the resin is usually 10 to 95% by mole, preferably 15 to 90% by mole and more preferably 20 to 85% by mole based on 100% by mole of all the structural units of the resin.

Other examples of the compound having an acid-labile group include a monomer represented by the formula (a1-3):

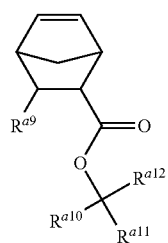

(a1-3)

wherein $R^{a9}$ represents a hydrogen atom, a C1-C3 aliphatic hydrocarbon group which can have one or more hydroxyl groups, a carboxyl group, a cyano group or a —COOR$^{a13}$ group in which $R^{a13}$ represents a C1-C8 aliphatic hydrocarbon group or a C3-C8 saturated cyclic hydrocarbon group, and the C1-C8 aliphatic hydrocarbon group and the C3-C8 saturated cyclic hydrocarbon group can have one or more hydroxyl groups, and one or more —CH$_2$— in the C1-C8 aliphatic hydrocarbon group and the C3-C8 saturated cyclic hydrocarbon group can be replaced by —O— or —CO—, $R^{a10}$, $R^{a11}$ and $R^{a12}$ each independently represent a C1-C12 aliphatic hydrocarbon group or a C3-C12 saturated cyclic hydrocarbon group, and $R^{a10}$ and $R^{a11}$ can be bonded each other to form a C3-C20 ring together with the carbon atom to which $R^{a10}$ and $R^{a11}$ are bonded, and the C1-C12 aliphatic hydrocarbon group and the C3-C12 saturated cyclic hydrocarbon group can have one or more hydroxyl groups, and one or more —CH$_2$— in the C1-C12 aliphatic hydrocarbon group and the C3-C12 saturated cyclic hydrocarbon group can be replaced by —O— or —CO—.

Examples of the C1-C3 aliphatic hydrocarbon group which can have one or more hydroxyl groups include a methyl group, an ethyl group, a propyl group, a hydroxymethyl group and a 2-hydroxyethyl group. Examples of $R^{a13}$ include a methyl group, an ethyl group, a propyl group, a 2-oxo-oxolan-3-yl group and a 2-oxo-oxolan-4-yl group. Examples of $R^{a10}$, $R^{a11}$ and $R^{a12}$ include a methyl group, an ethyl group, a cyclohexyl group, a methylcyclohexyl group, a hydroxycyclohexyl group, an oxocyclohexyl group and an adamantyl group, and examples of the C3-C20 ring formed by bonding $R^{a10}$ and $R^{a11}$ each other together with the carbon atom to which $R^{a10}$ and $R^{a11}$ are bonded include a cyclohexane ring and an adamantane ring.

Examples of the monomer represented by the formula (a1-3) include tert-butyl 5-norbornene-2-carboxylate, 1-cyclohexyl-1-methylethyl 5-norbornene-2-carboxylate, 1-methylcyclohexyl 5-norbornene-2-carboxylate, 2-methyl-2-adamantyl 5-norbornene-2-carboxylate, 2-ethyl-2-adamantyl 5-norbornene-2-carboxylate, 1-(4-methylcyclohexyl)-1-methylethyl 5-norbornene-2-carboxylate, 1-(4-hydroxylcyclohexyl)-1-methylethyl 5-norbornene-2-carboxylate, 1-methyl-1-(4-oxocyclohexyl) ethyl 5-norbornene-2-carboxylate and 1-(1-adamantyl)-1-methylethyl 5-norbornene-2-carboxylate.

When the resin has a structural unit derived from the monomer represented by the formula (a1-3), the photoresist composition having excellent resolution and higher dry-etching resistance tends to be obtained.

When the resin contains the structural unit derived form the monomer represented by the formula (a1-3), the content of the structural unit derived from the monomer represented by the formula (a1-3) is usually 10 to 95% by mole and preferably 15 to 90% by mole and more preferably 20 to 85% by mole based on total molar of all the structural units of the resin.

Other examples of the compound having an acid-labile group include a monomer represented by the formula (a1-4):

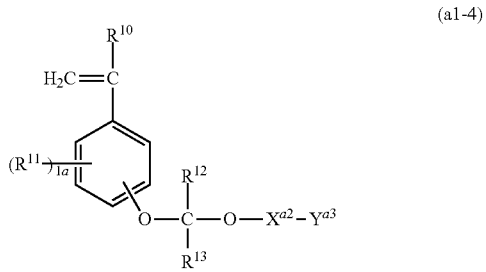

(a1-4)

wherein $R^{10}$ represents a hydrogen atom, a halogen atom, a C1-C6 alkyl group or a C1-C6 halogenated alkyl group, $R^{11}$ is independently in each occurrence a halogen atom, a hydroxyl group, a C1-C6 alkyl group, a C1-C6 alkoxy group, a C2-C4 acyl group, a C2-C4 acyloxy group, an acryloyl group or a methacryloyl group, la represents an integer of 0 to 4, $R^{12}$ and $R^{13}$ each independently represent a hydrogen atom or a C1-C12 hydrocarbon group, $X^{a2}$ represents a single bond or a C1-C17 divalent saturated hydrocarbon group in which one or more —CH$_2$— can be replaced by —O—, —CO—, —S—, —SO$_2$— or —N(R$^c$)— wherein R$^c$ represents a hydrogen atom or a C1-C6 alkyl group, and $Y^{a3}$ represents a C1-C12 aliphatic hydrocarbon group, a C3-C18 saturated cyclic hydrocarbon group or a C6-C18 aromatic hydrocarbon group, and the C1-C17 divalent saturated hydrocarbon group, the C1-C12 aliphatic hydrocarbon group, the C2-C18 saturated cyclic hydrocarbon group and the C6-C18 aromatic hydrocarbon group can have one or more substituents selected from the group consisting of a halogen atom, a hydroxyl group, a C1-C6 alkyl group, a C1-C6 alkoxy group, a C2-C4 acyl group and a C2-C4 acyloxy group.

Examples of the halogen atom include a fluorine atom, a chlorine atom, a bromine atom and an iodine atom.

Examples of the C1-C6 alkyl group include a methyl group, an ethyl group, a propyl group, an isopropyl group, a butyl group, an isobutyl group, a sec-butyl group, a tert-butyl group, a pentyl group and a hexyl group, and a C1-C4 alkyl group is preferable and a C1-C2 alkyl group is more preferable and a methyl group is especially preferable.

Examples of the C1-C6 halogenated alkyl group include a trifluoromethyl group, a pentafluoroethyl group, a heptafluoropropyl group, a heptafluoroisopropyl group, a nonafluorobutyl group, a nonafluoro-sec-butyl group, a nonafluoro-tert-butyl group, a perfluoropentyl group, a perfluorohexyl group, a perchloromethyl group, a perbromomethyl group and a periodomethyl group.

Examples of the C1-C6 alkoxy group include a methoxy group, an ethoxy group, a propoxy group, an isopropoxy group, a butoxy group, an isobutoxy group, a sec-butoxy group, a tert-butoxy group, a pentyloxy group and a hexyloxy group, and a C1-C4 alkoxy group is preferable and a C1-C2 alkoxy group is more preferable and a methoxy group is especially preferable.

Examples of the C2-C4 acyl group include an acetyl group, a propionyl group and a butyryl group, and examples of the C2-C4 acyloxy group include an acetyloxy group, a propionyloxy group and a butyryloxy group.

Examples of the C1-C12 hydrocarbon group include a C1-C12 aliphatic hydrocarbon group such as a methyl group, an ethyl group, a propyl group, an isopropyl group, a butyl group, an isobutyl group, a sec-butyl group, a tert-butyl group, a pentyl group, a hexyl group, a heptyl group, an octyl group, a 2-ethylhexyl group, a nonyl group, a decyl group, an undecyl group and a dodecyl group, a C3-C12 alicyclic hydrocarbon group such as a cyclohexyl group, an adamantyl group, a 2-alkyl-2-adamantyl group, a 1-(1-adamantyl)-1-alkyl group and an isobornyl group, an C6-C12 aromatic hydrocarbon group and a group formed by combining one or more above-mentioned groups. Among them, preferred are an isopropyl group, a butyl group, a sec-butyl group, a tert-butyl group, a pentyl group, a hexyl group, an octyl group, a 2-ethylhexyl group, a cyclohexyl group, an adamantyl group, a 2-alkyl-2-adamantyl group, a 1-(1-adamantyl)-1-alkyl group and an isobornyl group.

Examples of the C1-C17 divalent saturated hydrocarbon group include a C1-C17 alkanediyl group such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, a undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group and a heptadecane-1,17-diyl group.

Examples of the C1-C12 aliphatic hydrocarbon group include a methyl group, an ethyl group, a propyl group, an isopropyl group, a butyl group, an isobutyl group, a sec-butyl group, a tert-butyl group, a pentyl group, a hexyl group, a heptyl group, an octyl group, a 2-ethylhexyl group, a nonyl group, a decyl group, an undecyl group and a dodecyl group. Examples of the C3-C18 saturated cyclic hydrocarbon group include a cyclopropyl group, a cyclobutyl group, a cyclopentyl group, a cyclohexyl group, a cycloheptyl group, a cyclooctyl group, a cyclononyl group, a cyclodecyl group, a norbornyl group, a 1-adamantyl group, a 2-adamantyl group, an isobornyl group and the following groups:

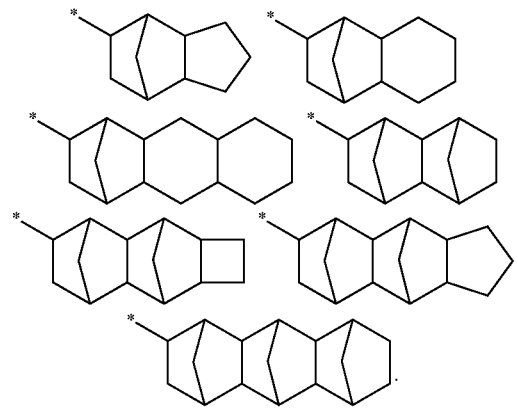

Examples of the C6-C18 aromatic hydrocarbon group include a phenyl group, a naphthyl group, an anthryl group, a p-methylphenyl group, a p-tert-butylphenyl group and a p-adamantylphenyl group.

Preferred substituents of $X^{a2}$ and $Y^{a3}$ is a hydroxyl group.

Examples of the monomer represented by the formula (a1-4) include the followings.

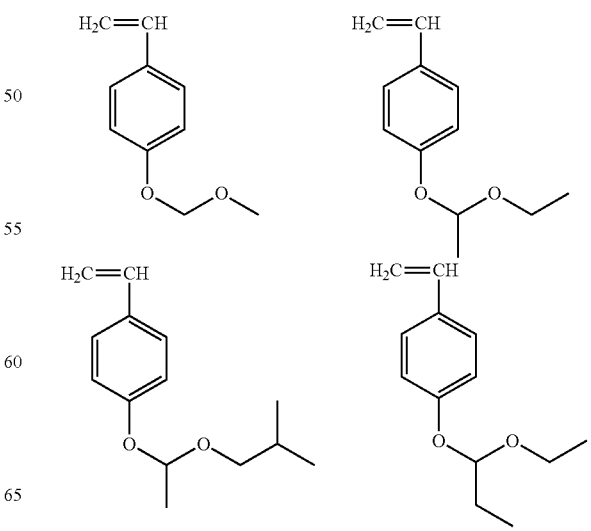

-continued
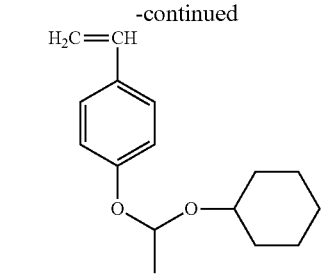
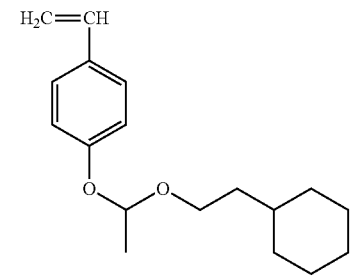
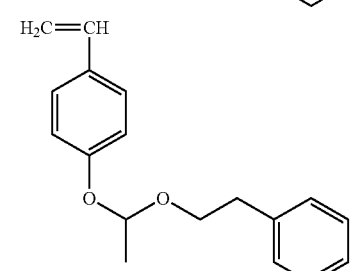
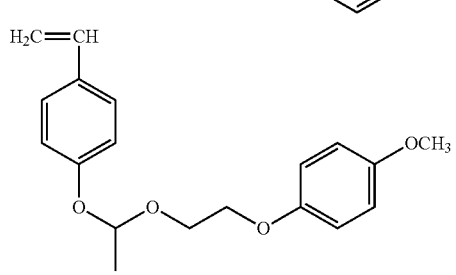
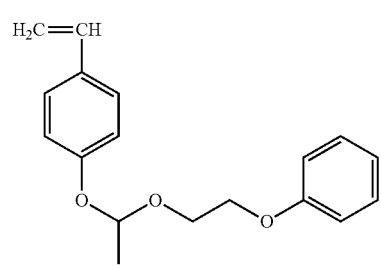
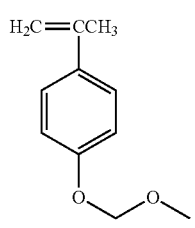
-continued
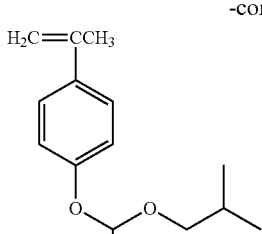
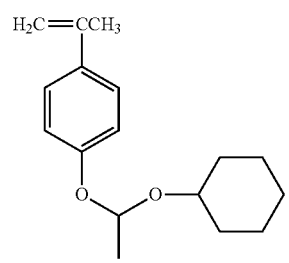
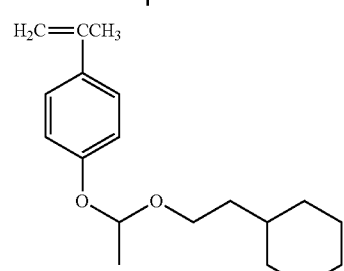
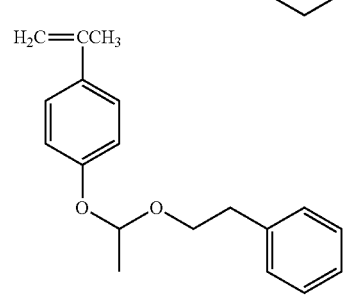
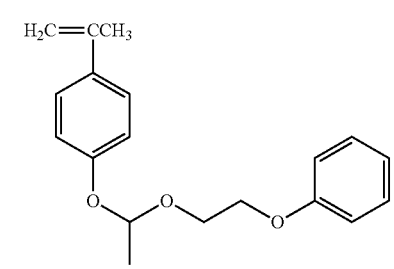
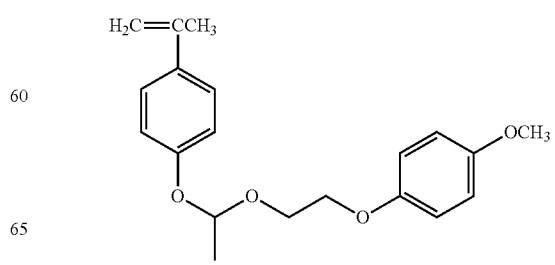

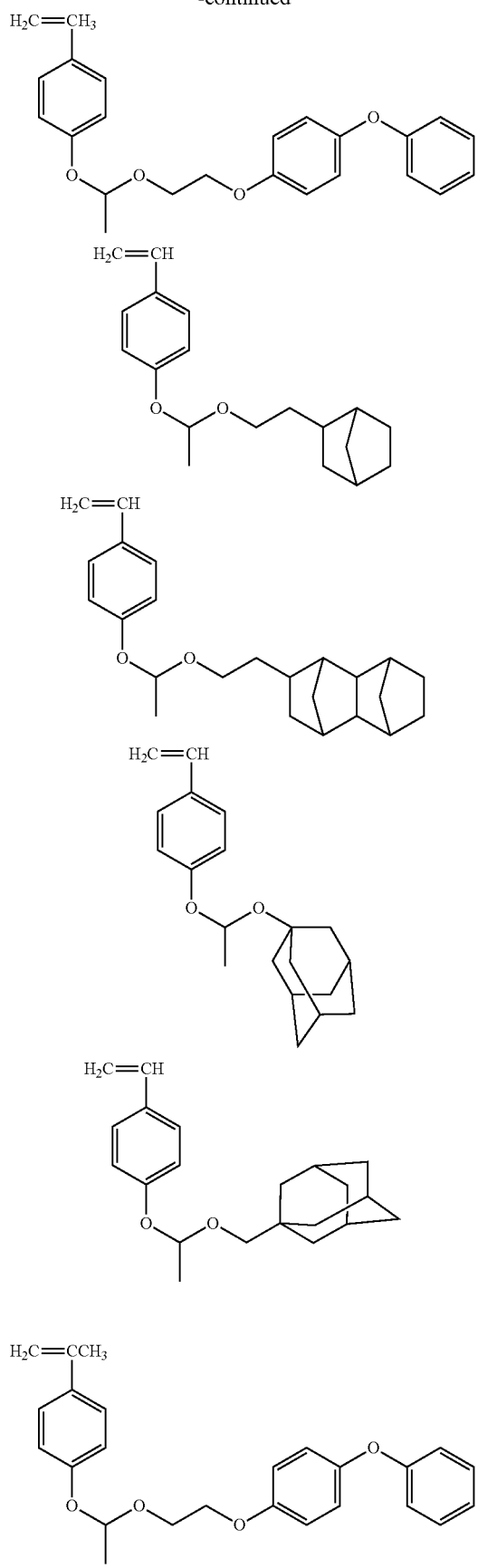
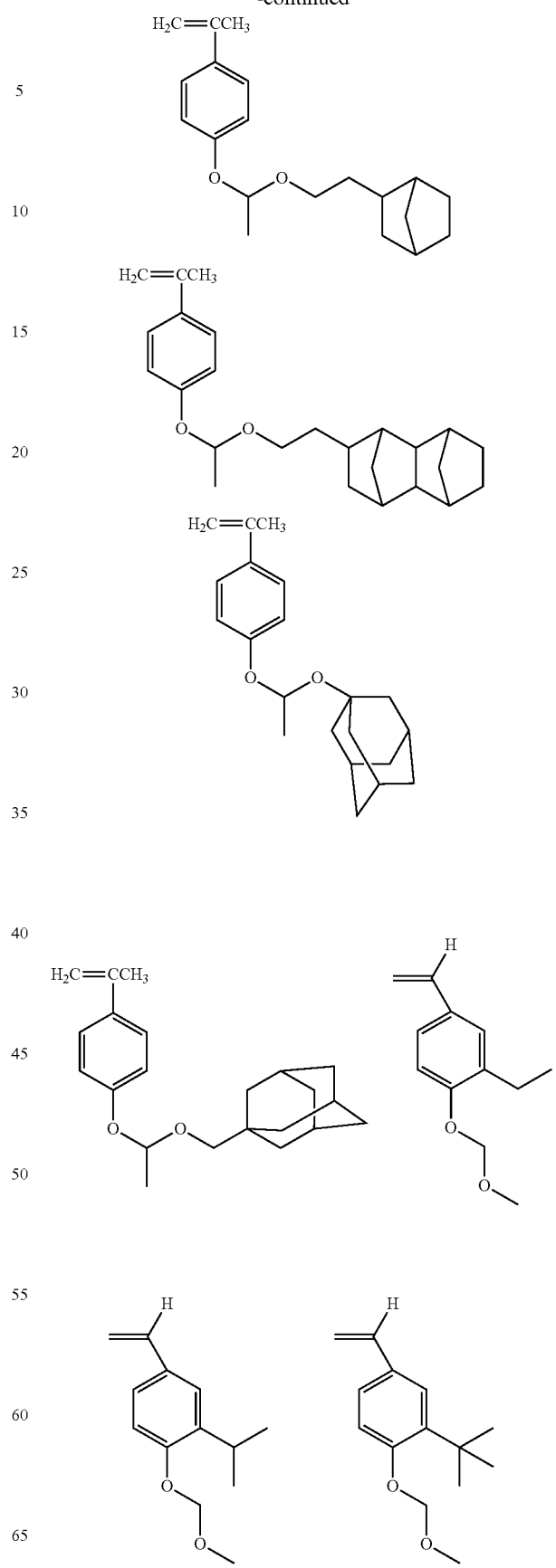

-continued
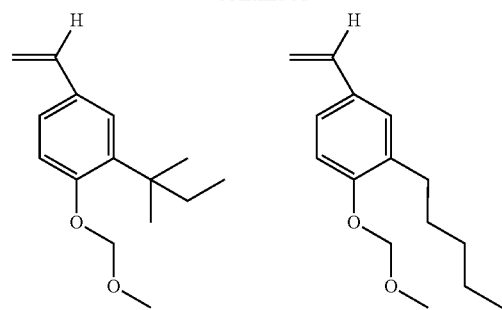
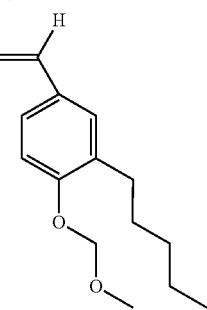
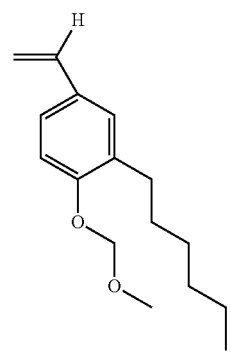
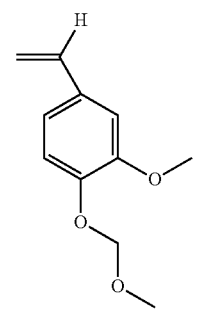
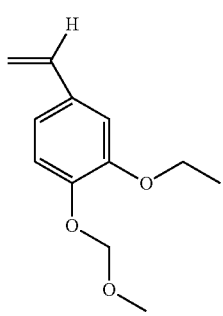
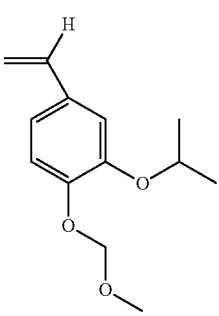
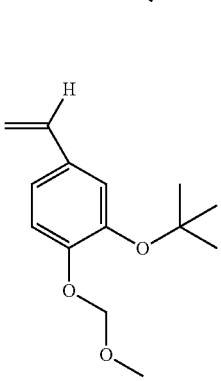
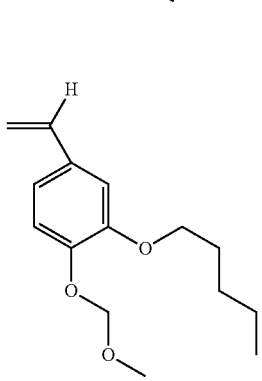
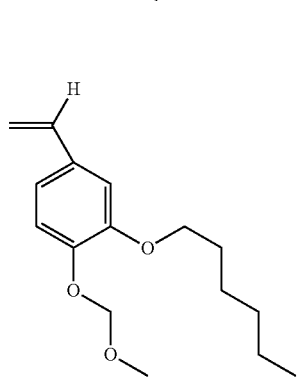
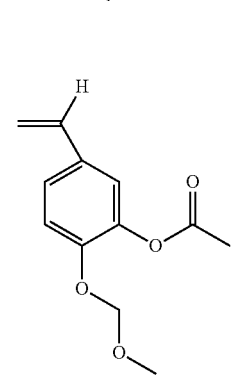
-continued
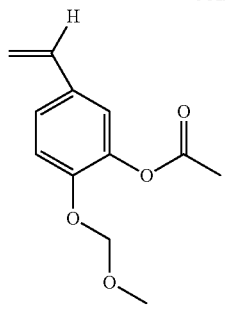
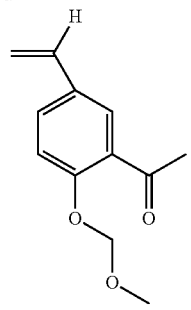
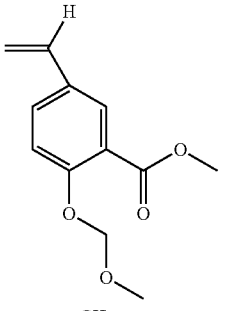
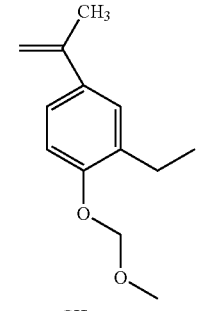
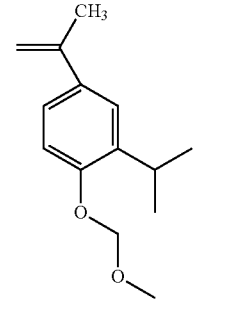
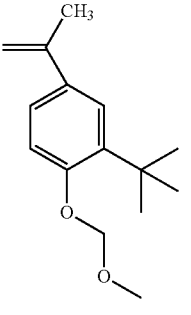
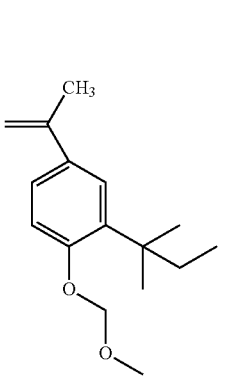
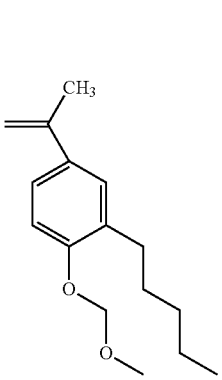
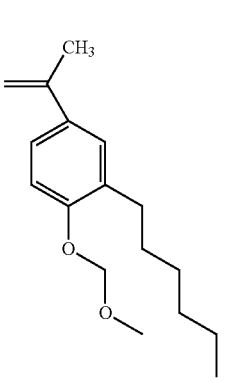
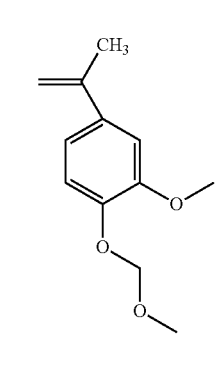

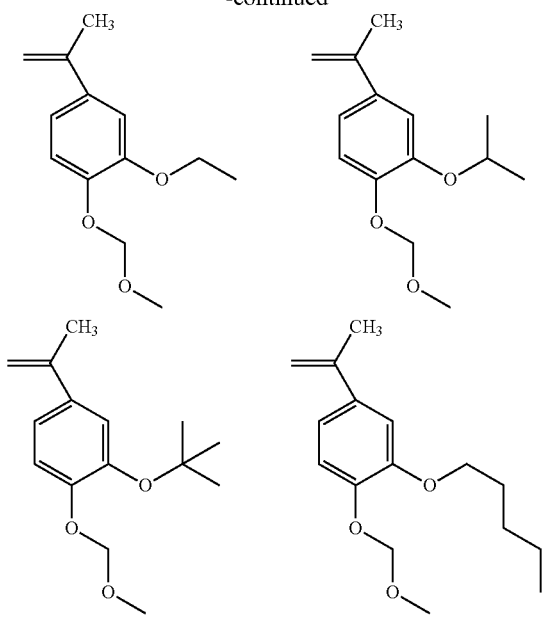
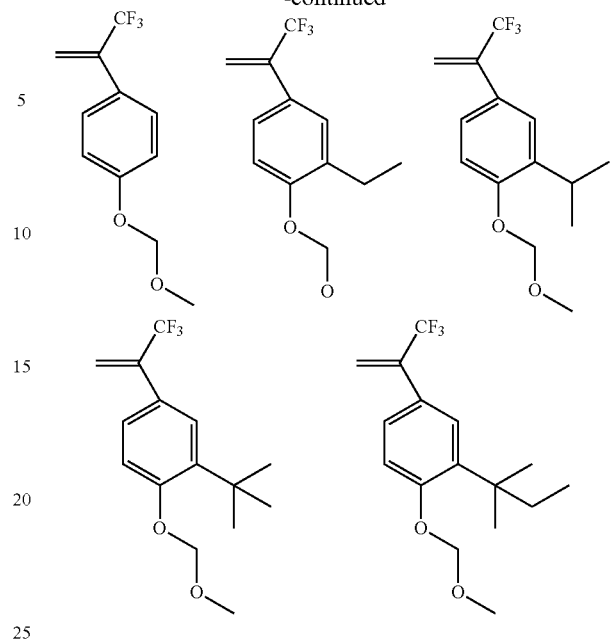
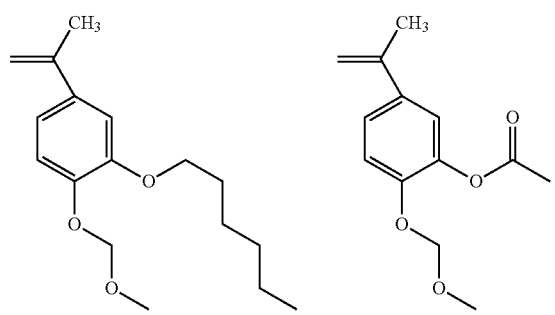
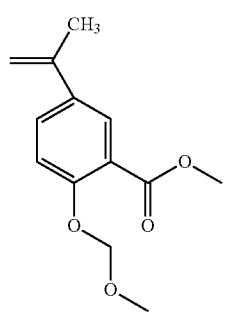
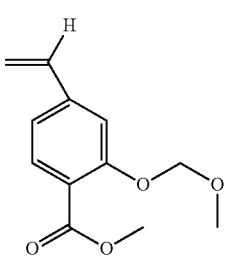

When the resin contains the structural unit derived form the monomer represented by the formula (a1-4), the content of the structural unit derived from the monomer represented by the formula (a1-4) is usually 10 to 95% by mole and preferably 15 to 90% by mole and more preferably 20 to 85% by mole based on total molar of all the structural units of the resin.

Other examples of the compound having an acid-labile group include a monomer represented by the formula (a1-5):

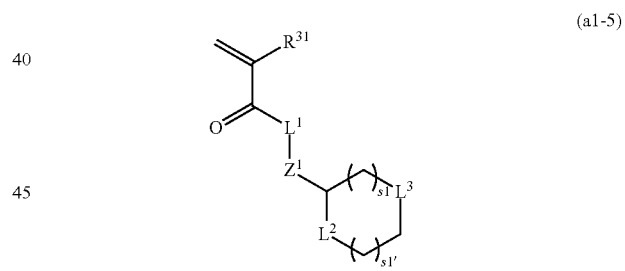

wherein $R^{31}$ represents a hydrogen atom, a halogen atom, a C1-C4 alkyl group which may be substituted with a halogen atom, $L^1$ represents —O—, —S— or *—O—$(CH_2)_{k1}$—CO—O—, k1 represents an integer of 1 to 7, * represents a binding position to —CO—, $L^2$ and $L^3$ independently each represent —O— or —S—, $Z^1$ represents a single bond or a C1-C6 alkylene group in which one or more —$CH_2$— may be replaced by —O— or —CO—, s1 and s1' independently each represent an integer of 0 to 4.

$R^{31}$ is preferably a hydrogen atom or a methyl group.

$L^1$ is preferably —O—.

It is preferred that one of $L^2$ and $L^3$ is —O— and the other is —S—.

In the formula (a1-5), s1 is preferably 1 and s1' is preferably 0, 1 or 2.

$Z^1$ is preferably a single bond or —$CH_2$—CO—O—.

Examples of the monomer represented by the formula (a1-5) include the following.
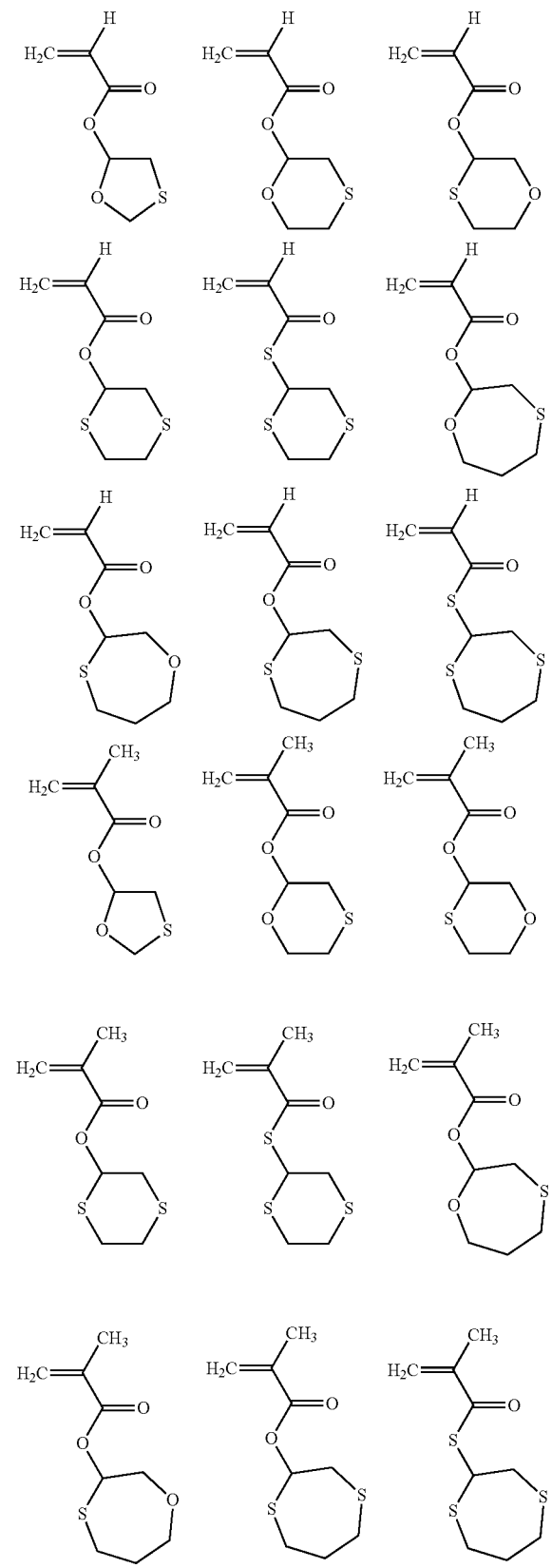
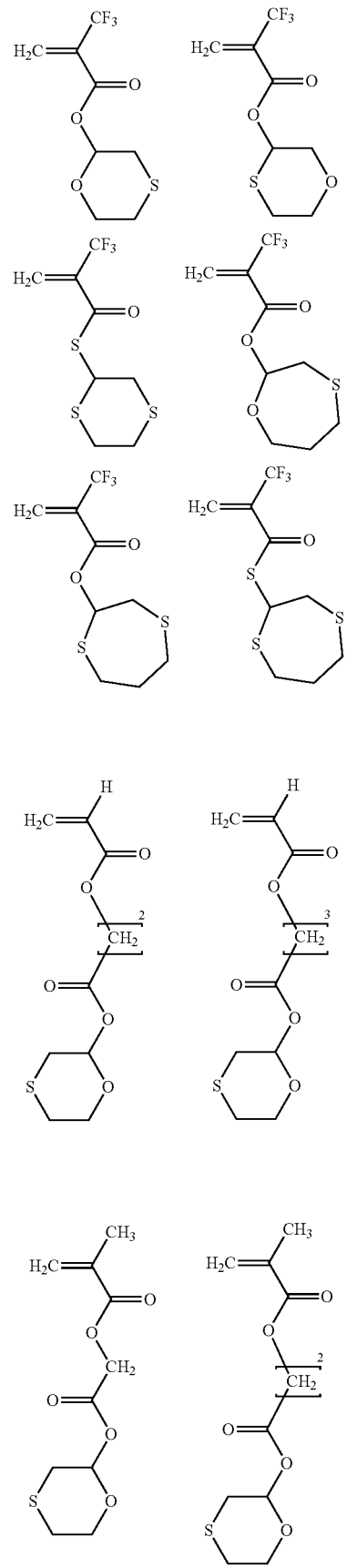

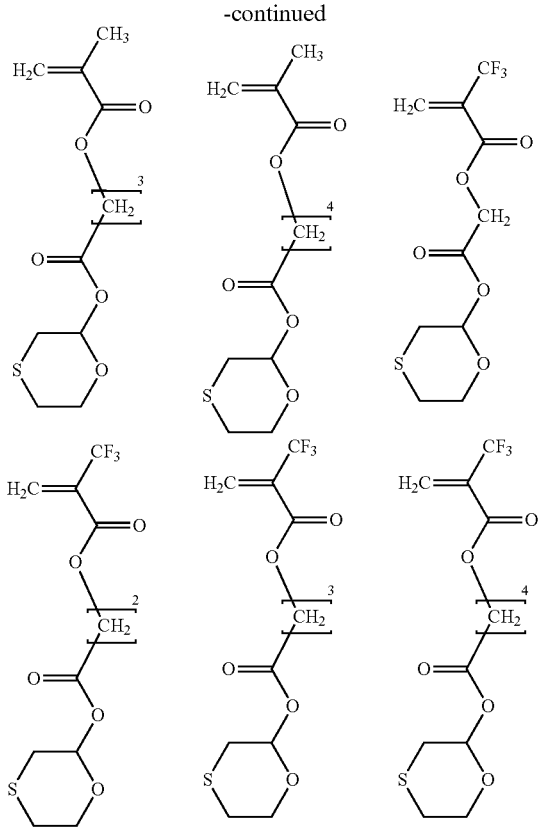

When the resin contains the structural unit derived form the monomer represented by the formula (a1-5), the content of the structural unit derived from the monomer represented by the formula (a1-5) is usually 10 to 95% by mole and preferably 15 to 90% by mole and more preferably 20 to 85% by mole based on total molar of all the structural units of the resin.

The resin can have two or more kinds of structural units derived from the compounds having an acid-labile group.

The resin preferably contains the structural unit derived from the compound having an acid-labile group and a structural unit derived from the compound having no acid-labile group. The resin can have two or more kinds of structural units derived from the compounds having no acid-labile group. When the resin contains the structural unit derived from the compound having an acid-labile group and the structural unit derived from the compound having no acid-labile group, the content of the structural unit derived from the compound having an acid-labile group is usually 10 to 80% by mole and preferably 20 to 60% by mole based on total molar of all the structural units of the resin. The content of the structural unit derived from a monomer having an adamantyl group, especially the monomer represented by the formula (a1-1) in the structural unit derived from the compound having no acid-labile group is preferably 15% by mole or more from the viewpoint of dry-etching resistance of the photoresist composition.

The compound having no acid-labile group preferably contains one or more hydroxyl groups or a lactone ring. When the resin contains the structural unit derived from the compound having no acid-labile group and having one or more hydroxyl groups or a lactone ring, a photoresist composition having good resolution and adhesiveness of photoresist to a substrate tends to be obtained.

Examples of the compound having no acid-labile group and having one or more hydroxyl groups include a monomer represented by the formula (a2-0):

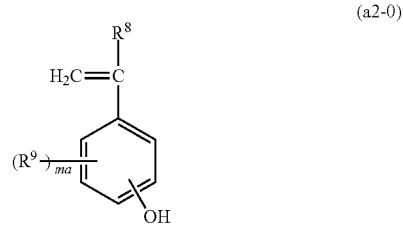

wherein $R^8$ represents a hydrogen atom, a halogen atom, a C1-C6 alkyl group or a C1-C6 halogenated alkyl group, $R^9$ is independently in each occurrence a halogen atom, a hydroxyl group, a C1-C6 alkyl group, a C1-C6 alkoxy group, a C2-C4 acyl group, a C2-C4 acyloxy group, an acryloyl group or a methacryloyl group, ma represents an integer of 0 to 4, and a monomer represented by the formula (a2-1):

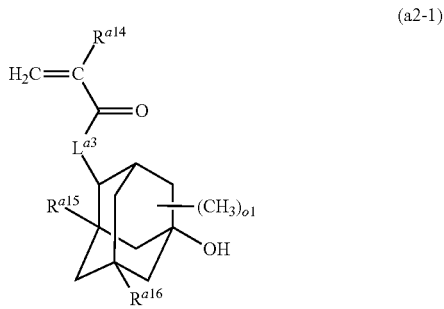

wherein $R^{a14}$ represents a hydrogen atom or a methyl group, $R^{a15}$ and $R^{a16}$ each independently represent a hydrogen atom, a methyl group or a hydroxyl group, $L^{a3}$ represents *—O— or *—O—$(CH_2)_{k2}$—CO—O— in which * represents a binding position to —CO—, and k2 represents an integer of 1 to 7, and of represents an integer of 0 to 10.

When KrF excimer laser (wavelength: 248 nm) lithography system, or a high energy laser such as electron beam and extreme ultraviolet is used as an exposure system, the resin containing the structural unit derived from the monomer represented by the formula (a2-0) is preferable, and when ArF excimer laser (wavelength: 193 nm) is used as an exposure system, the resin containing the structural unit derived from the monomer represented by the formula (a2-1) is preferable.

In the formula (a2-0), examples of the halogen atom include a fluorine atom, examples of the C1-C6 alkyl group include a methyl group, an ethyl group, a propyl group, an isopropyl group, a butyl group, an isobutyl group, a sec-butyl group, a tert-butyl group, a pentyl group and a hexyl group, and a C1-C4 alkyl group is preferable and a C1-C2 alkyl group is more preferable and a methyl group is especially preferable. Examples of the C1-C6 halogenated alkyl group include a trifluoromethyl group, a pentafluoroethyl group, a heptafluoropropyl group, a heptafluoroisopropyl group, a nonafluorobutyl group, a nonafluoro-sec-butyl group, a nonafluoro-tert-butyl group, a perfluoropentyl group and a perfluorohexyl group. Examples of the C1-C6 alkoxy group include a methoxy group, an ethoxy group, a propoxy group, an isopropoxy group, a butoxy group, an isobutoxy group, a sec-butoxy group, a tert-butoxy group, a pentyloxy group and a hexyloxy group, and a C1-C4 alkoxy group is preferable and a C1-C2 alkoxy group is more preferable and a methoxy group is especially preferable. Examples of the C2-C4 acyl group include an acetyl group, a propionyl group and a butyryl group, and examples of the C2-C4 acyloxy group include an acetyloxy group, a propionyloxy group and a butyryloxy group. In the formula (a2-0), ma is preferably 0, 1 or 2, and is more preferably 0 or 1, and especially preferably 0.

The resin containing the structural unit derived from the monomer represented by the formula (a2-0) can be produced, for example, by polymerizing a monomer obtained by protecting a hydroxyl group of the monomer represented by the formula (a2-0) with a protecting group such as an acetyl group followed by conducting deprotection of the obtained polymer with an acid or a base.

Examples of the monomer represented by the formula (a2-0) include the followings.

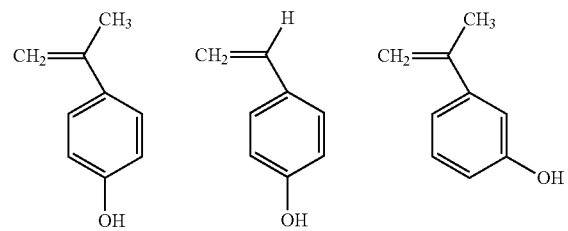
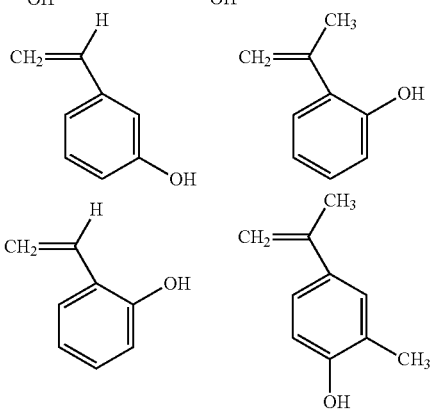
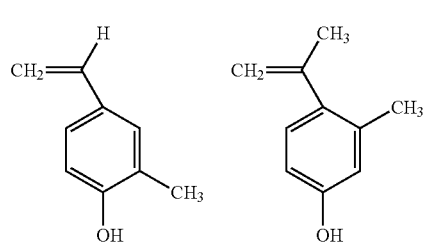
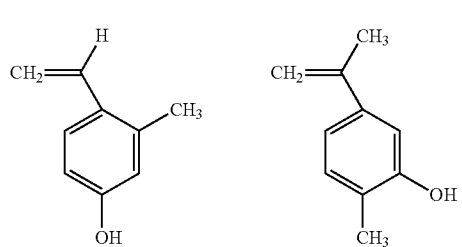
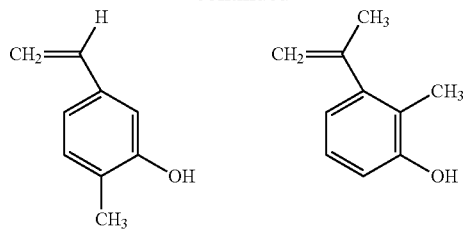
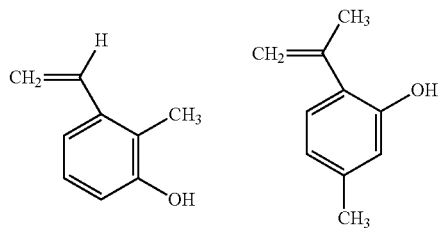
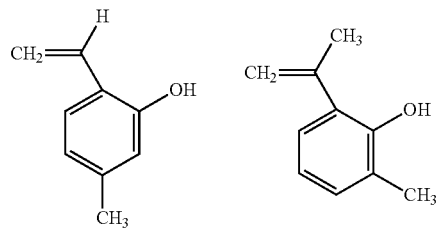
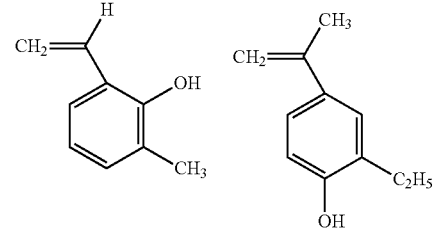
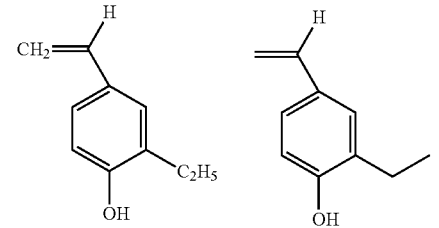
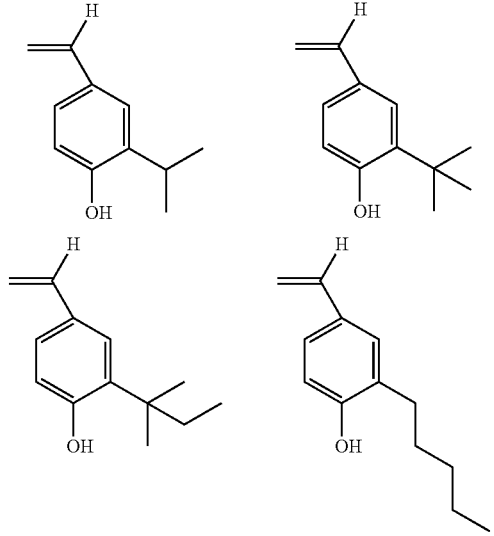

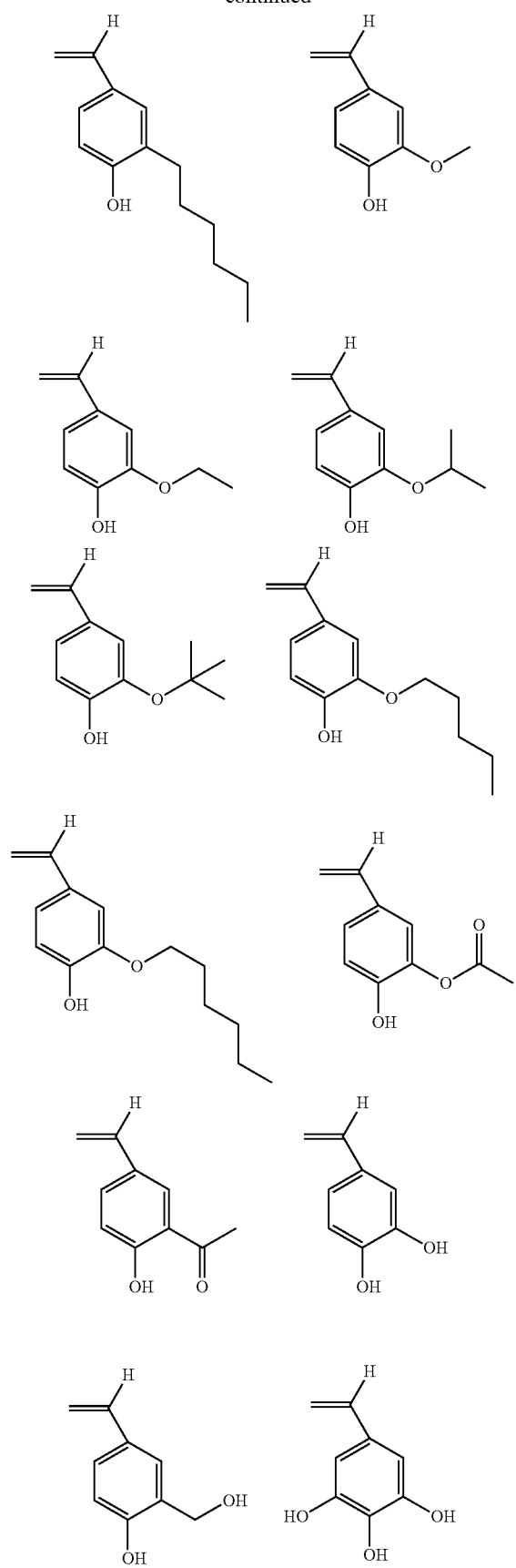
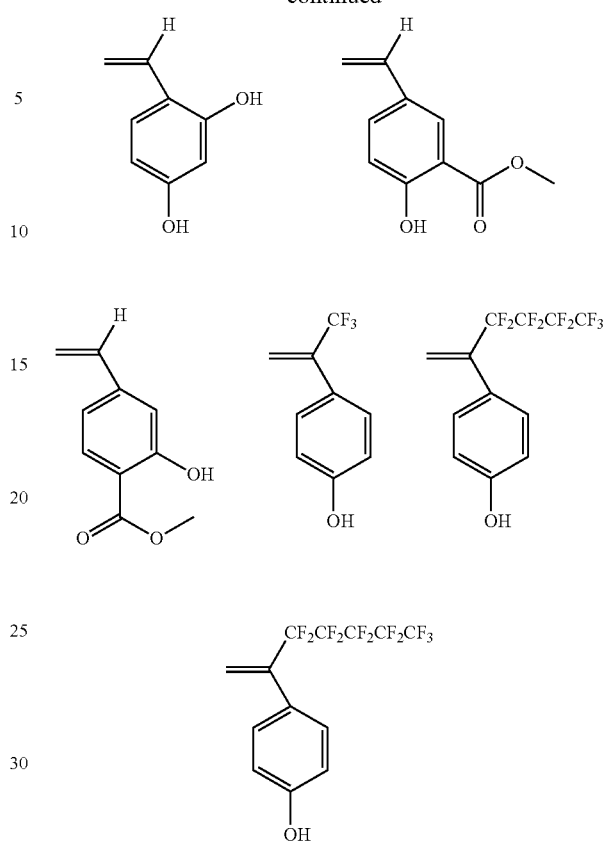

Among them, preferred are 4-hydroxystyrene and 4-hydroxy-α-methyl styrene.

When the resin contains the structural unit derived from the monomer represented by the formula (a2-0), the content of the structural unit derived from the monomer represented by the formula (a2-0) is usually 5 to 95% by mole and preferably 10 to 80% by mole and more preferably 15 to 80% by mole based on total molar of all the structural units of the resin.

In the formula (a2-1), $R^{a14}$ is preferably a methyl group, $R^{a15}$ is preferably a hydrogen atom, $R^{a16}$ is preferably a hydrogen atom or a hydroxyl group, $L^{a3}$ is preferably *—O— or *—O—$(CH_2)_{f2}$—CO—O— in which * represents a binding position to —CO—, and f2 represents an integer of 1 to 4, and is more preferably *—O—, and o1 is preferably 0, 1, 2 or 3 and is more preferably 0 or 1.

Examples of the monomer represented by the formula (a2-1) include the following.

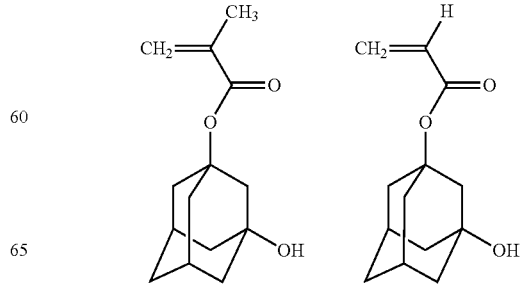

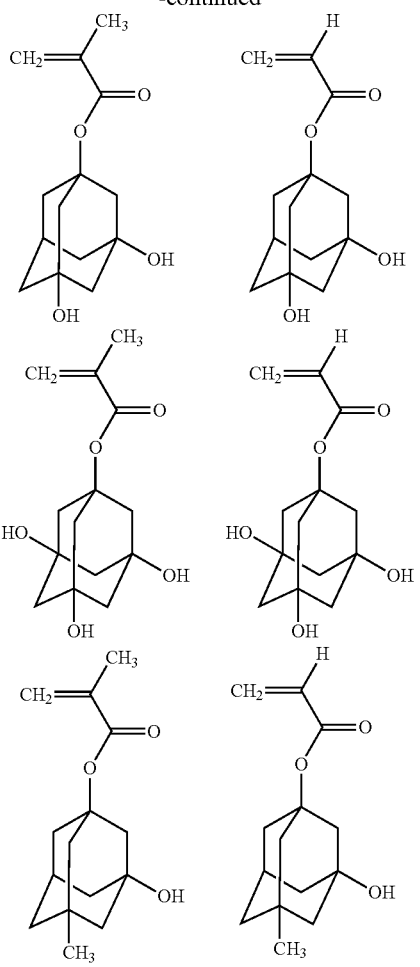
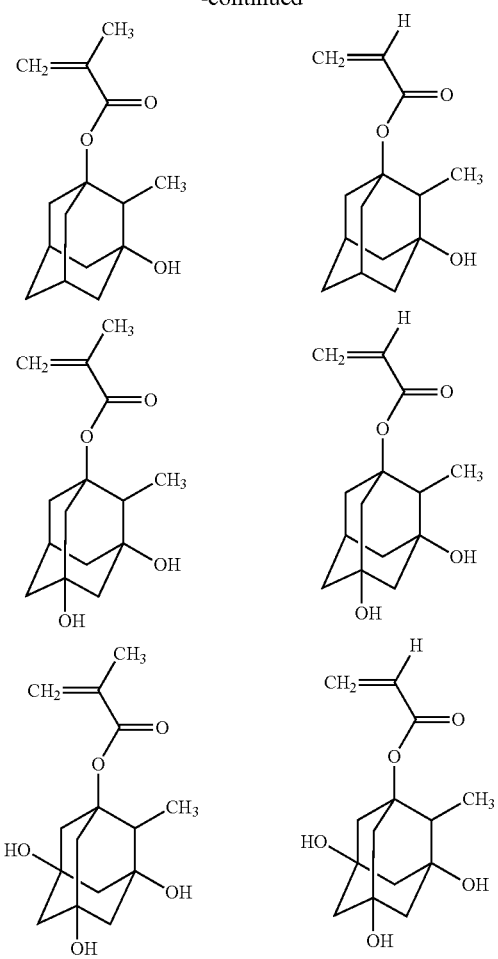
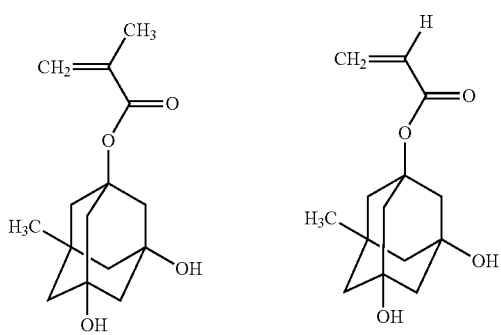
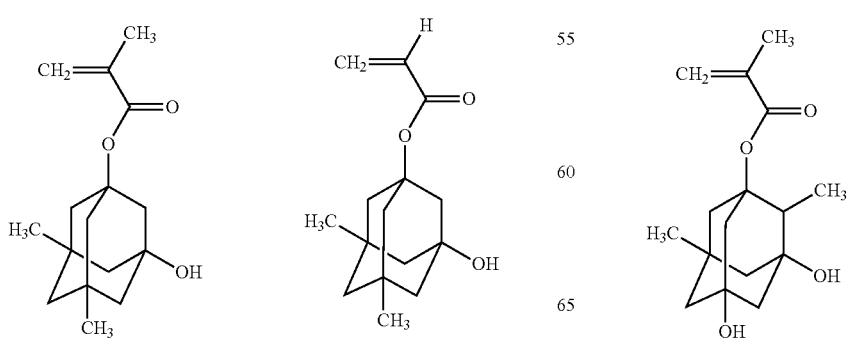
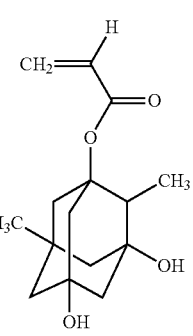

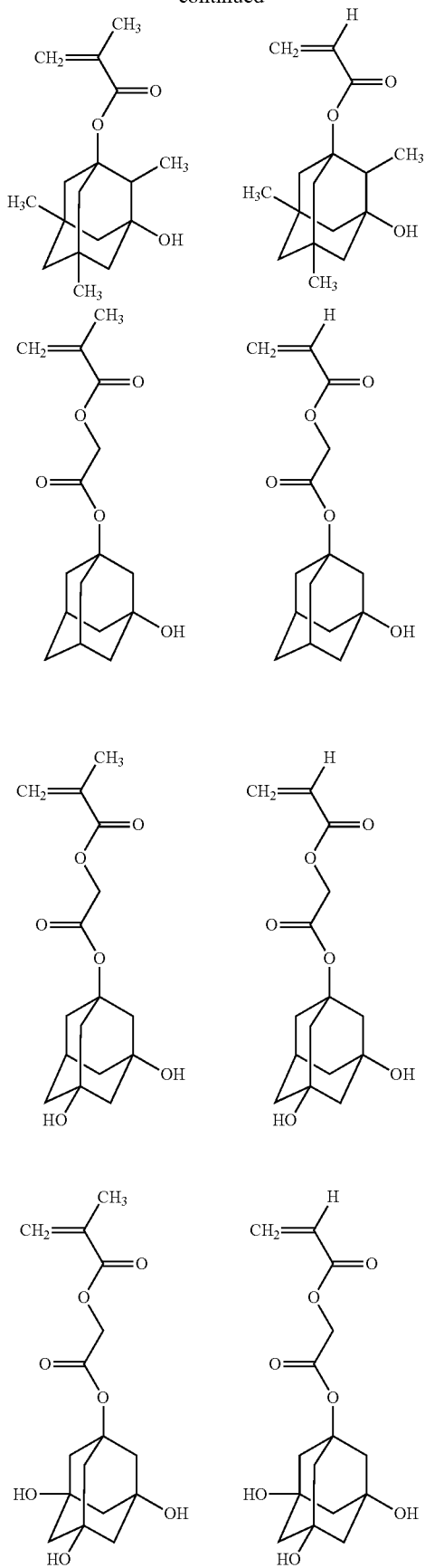
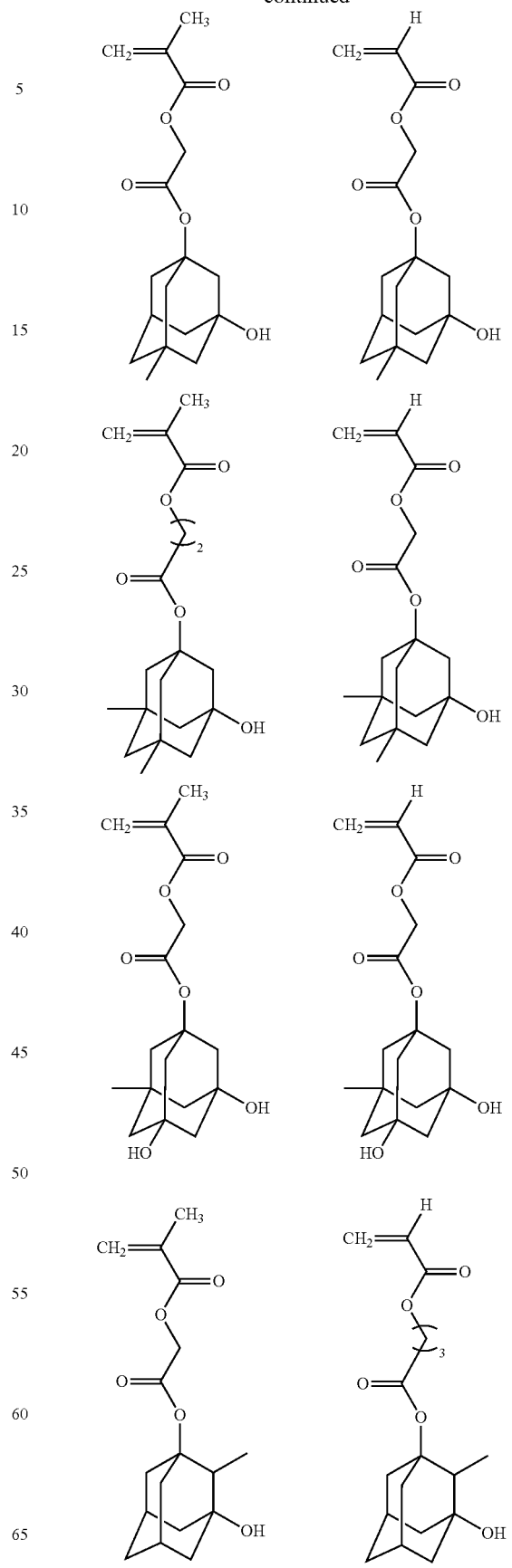

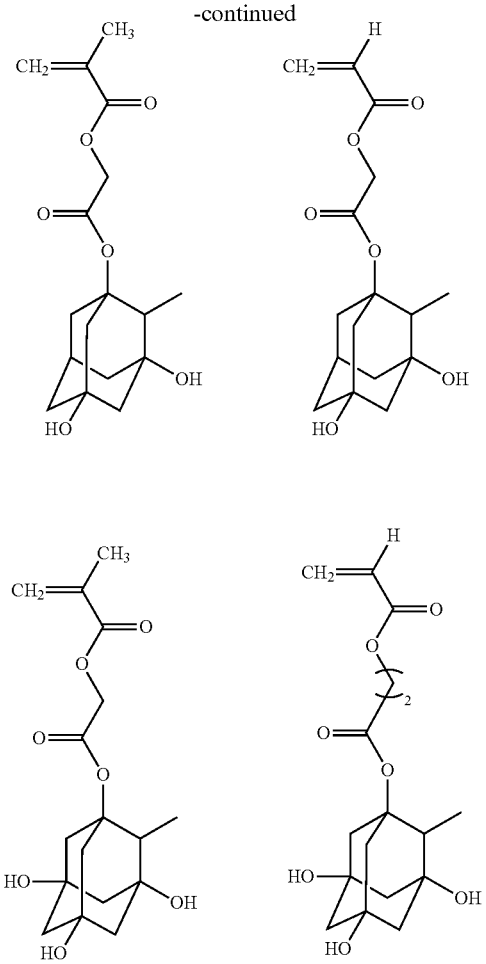

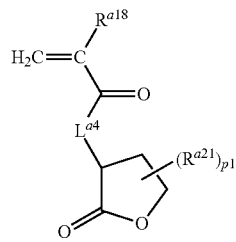

(a3-1)

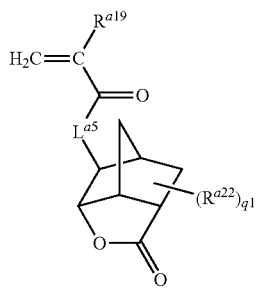

(a3-2)

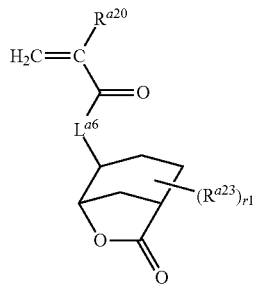

(a3-3)

Among them, preferred are 3-hydroxy-1-adamantyl acrylate, 3-hydroxy-1-adamantyl methacrylate, 3,5-dihydroxy-1-adamantyl acrylate, 3,5-dihydroxy-1-adamantyl methacrylate, 1-(3,5-dihydroxy-1-adamantyloxycarbonyl)methyl acrylate and 1-(3,5-dihydroxy-1-adamantyloxycarbonyl)methyl methacrylate, and more preferred are 3-hydroxy-1-adamantyl methacrylate and 3,5-dihydroxy-1-adamantyl methacrylate.

When the resin contains the structural unit derived from the monomer represented by the formula (a2-1), the content of the structural unit derived from the monomer represented by the formula (a2-1) is usually 3 to 40% by mole based on total molar of all the structural units of the resin, and preferably 5 to 35% by mole, and more preferably 5 to 30% by mole, and especially preferably 5 to 15% by mole.

Examples of the lactone ring of the compound having no acid-labile group and a lactone ring include a monocyclic lactone ring such as β-propiolactone ring, γ-butyrolactone ring and γ-valerolactone ring, and a condensed ring formed from a monocyclic lactone ring and the other ring. Among them, preferred are γ-butyrolactone ring and a condensed lactone ring formed from γ-butyrolactone ring and the other ring.

Preferable examples of the monomer having no acid-labile group and a lactone ring include the monomers represented by the formulae (a3-1), (a3-2) and (a3-3):

wherein $L^{a4}$, $L^{a5}$ and $L^{a6}$ each independently represent *—O— or *—O—$(CH_2)_{k3}$—CO—O— in which * represents a binding position to —CO— and k3 represents an integer of 1 to 7, $R^{a18}$, $R^{a19}$ and $R^{a20}$ each independently represent a hydrogen atom or a methyl group, $R^{a21}$ represents a C1-C4 aliphatic hydrocarbon group, $R^{a22}$ and $R^{a23}$ are independently in each occurrence a carboxyl group, a cyano group or a C1-C4 aliphatic hydrocarbon group, and p1 represents an integer of 0 to 5, q1 and r1 independently each represent an integer of 0 to 3.

It is preferred that $L^{a4}$, $L^{a5}$ and $L^{a6}$ each independently represent *—O— or *—O—$(CH_2)_{d1}$—CO—O— in which * represents a binding position to —CO— and d1 represents an integer of 1 to 4, and it is more *—O—. $R^{a18}$, $R^{a19}$ and $R^{a20}$ are preferably methyl groups. $R^{a21}$ is preferably a methyl group. It is preferred that $R^{a22}$ and $R^{a23}$ are independently in each occurrence a carboxyl group, a cyano group or a methyl group. It is preferred that p1 is an integer of 0 to 2, and it is more preferred that p1 is 0 or 1. It is preferred that q1 and r1 independently each represent an integer of 0 to 2, and it is more preferred that q1 and r1 independently each represent 0 or 1.

Examples of the monomer represented by the formula (a3-1) include the following.
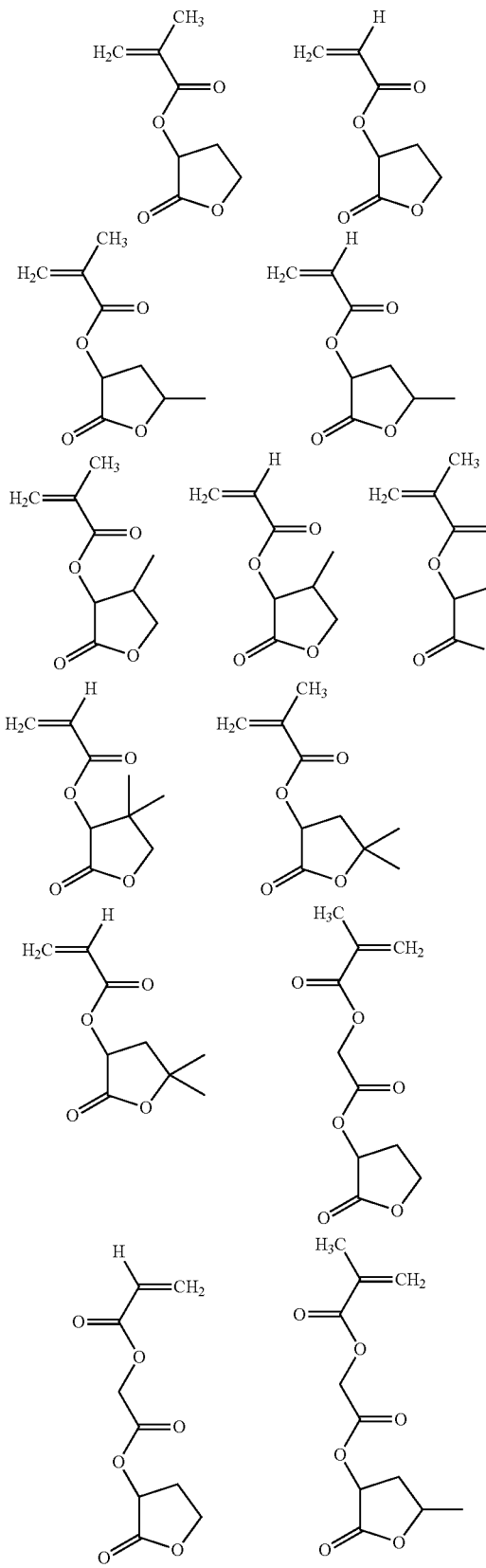
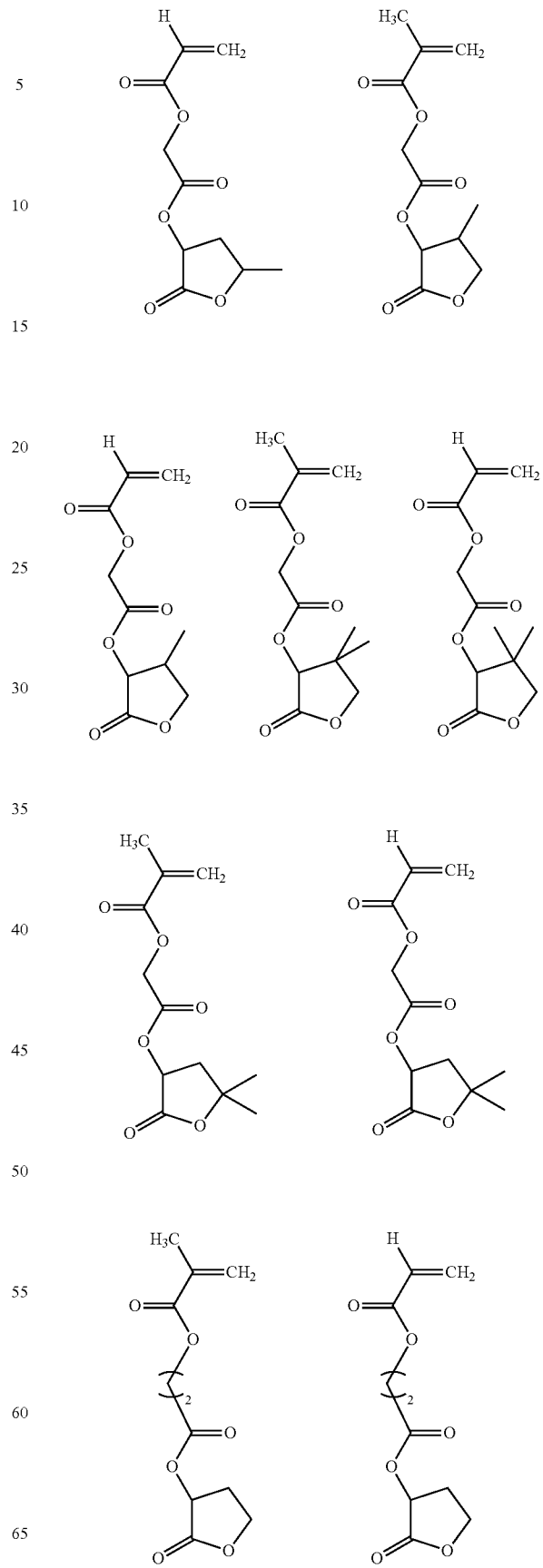

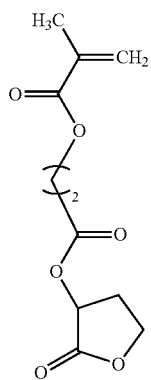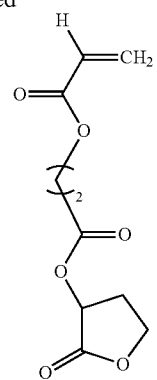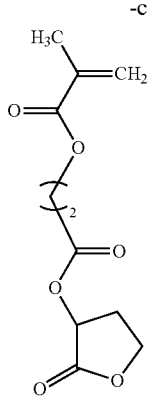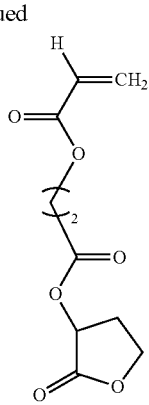
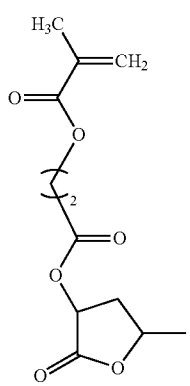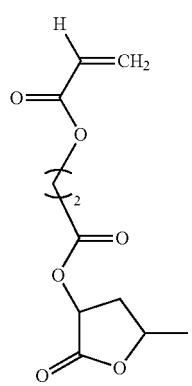
Examples of the monomer represented by the formula (a3-2) include the following.
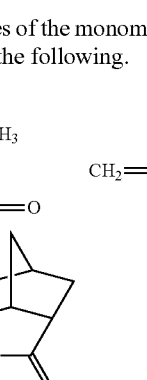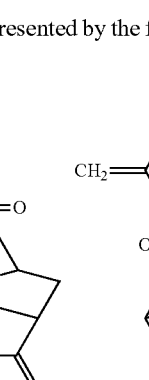
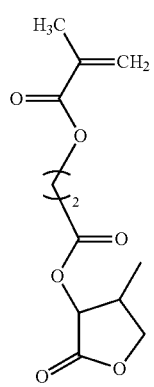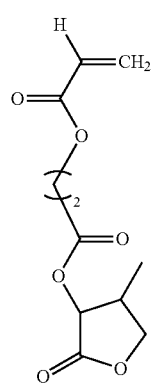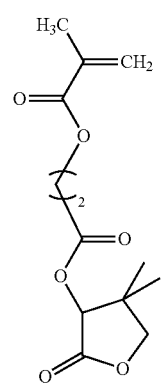
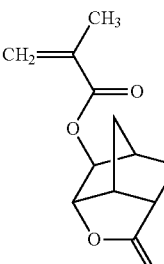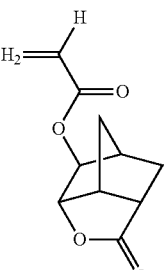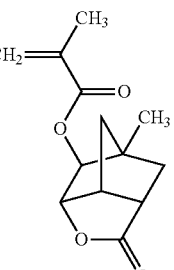
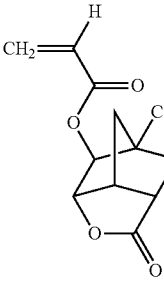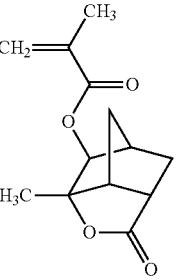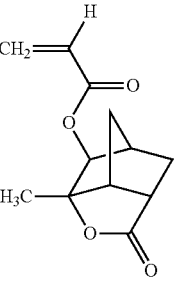
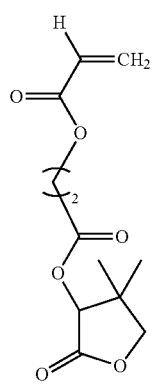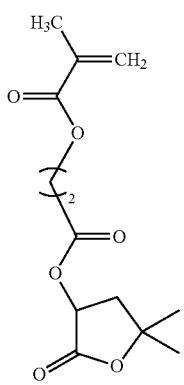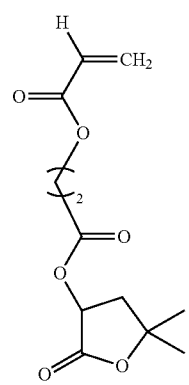
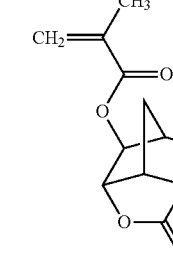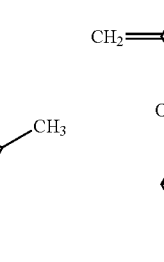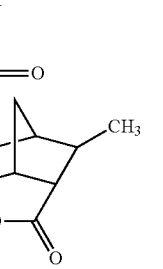
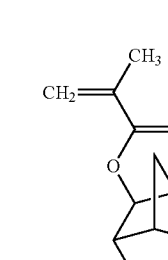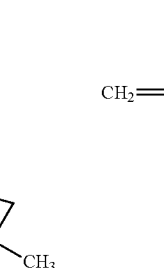

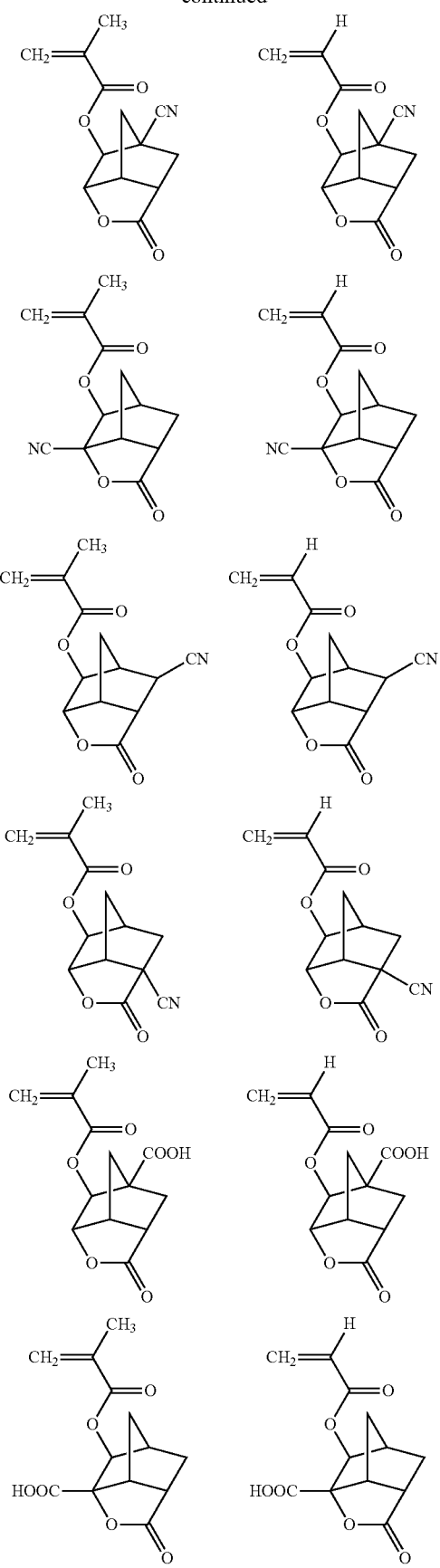
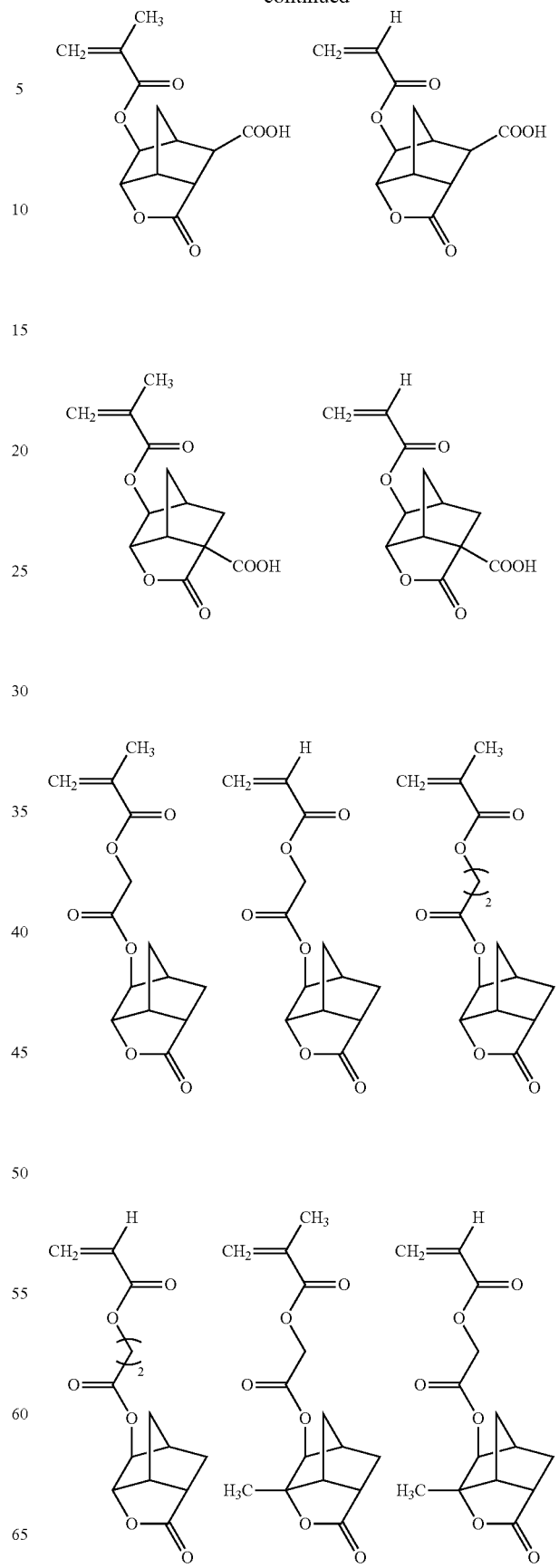

57
-continued
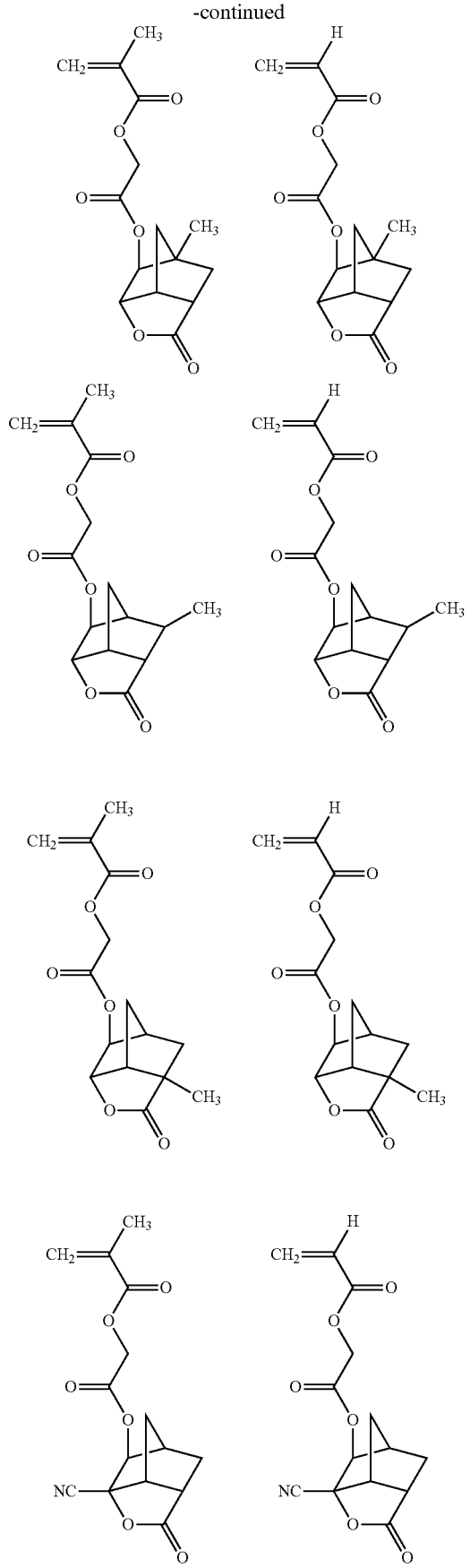
58
-continued
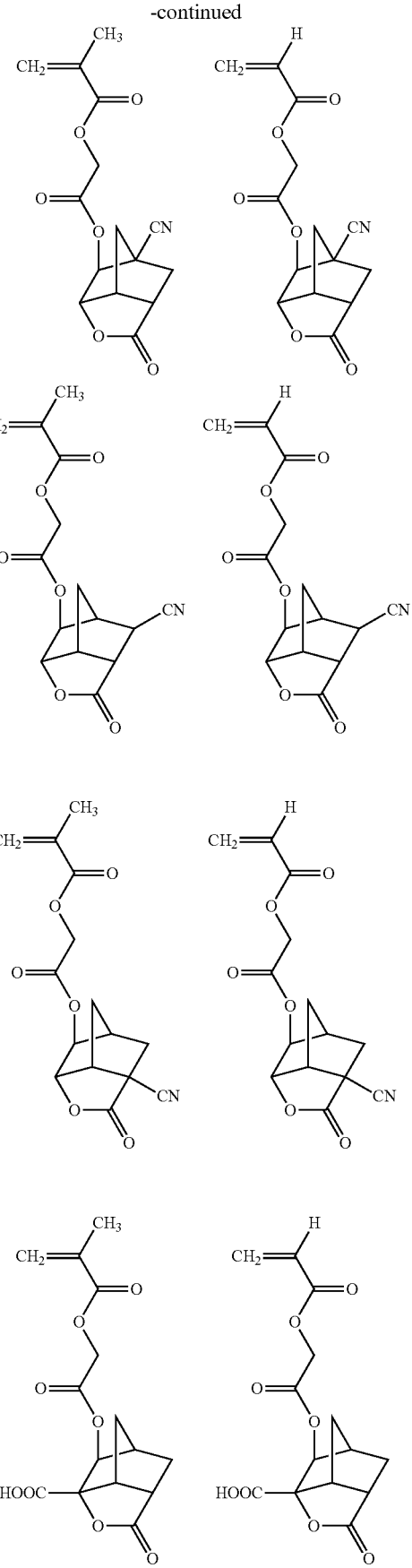

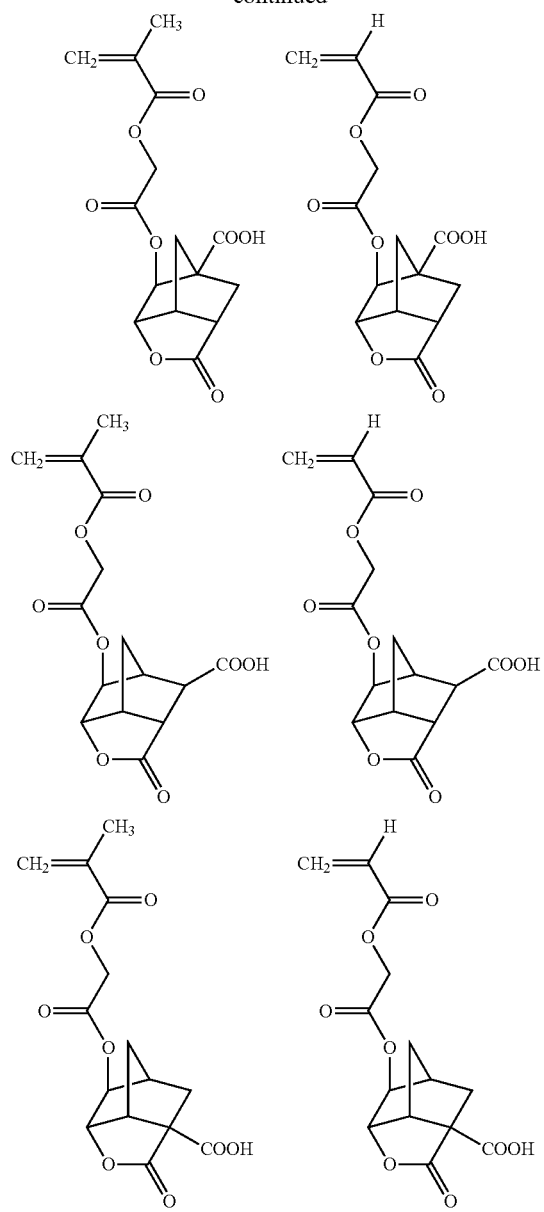
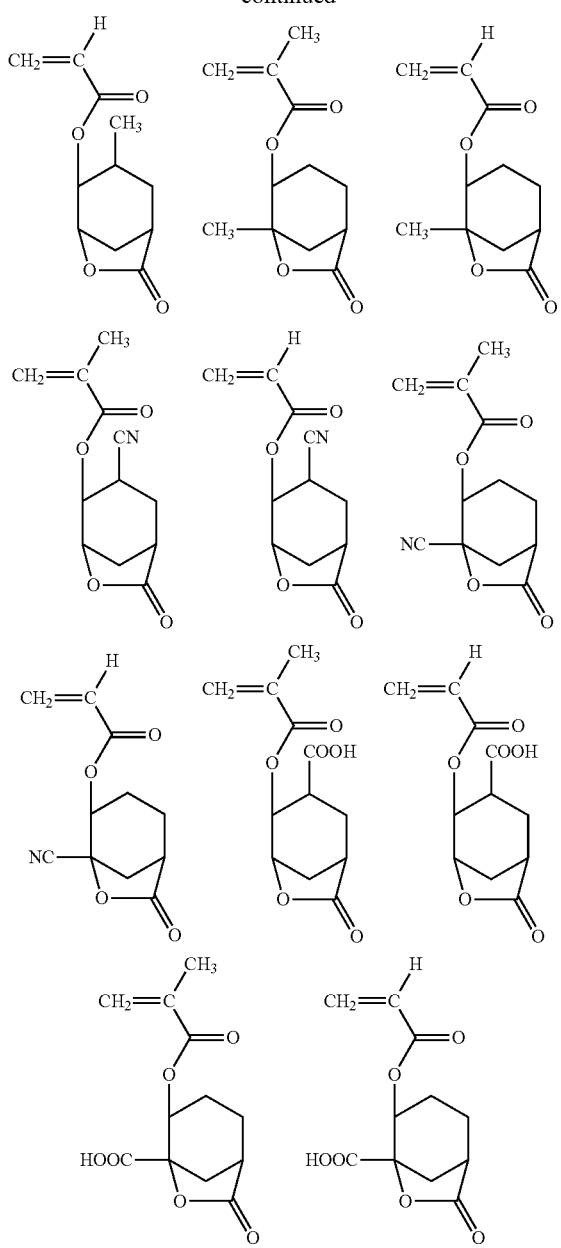
Examples of the monomer represented by the formula (a3-3) include the following.
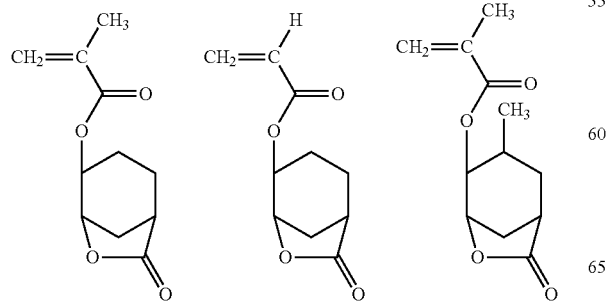

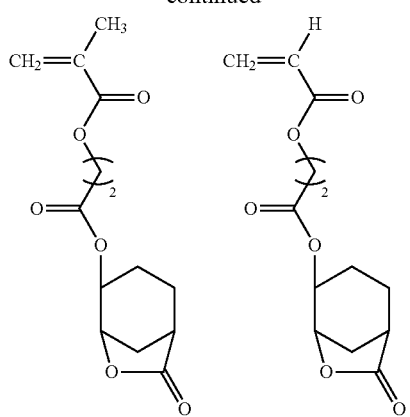
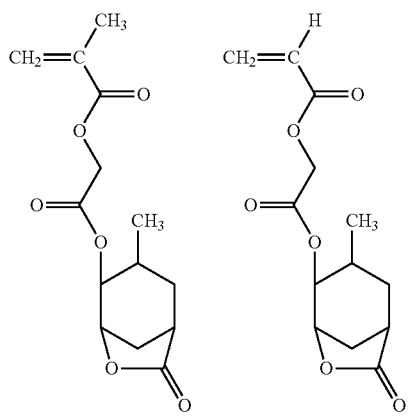
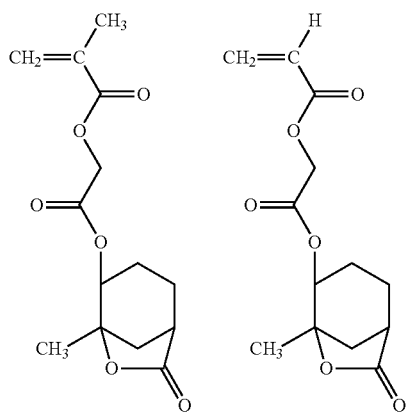
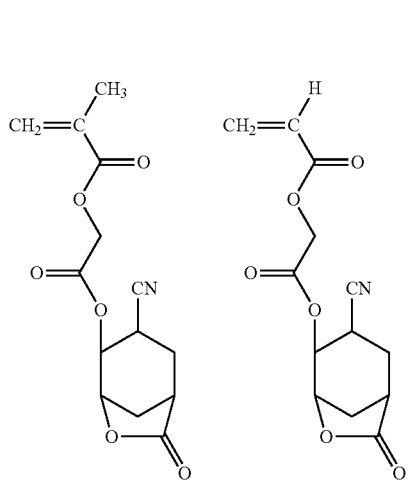
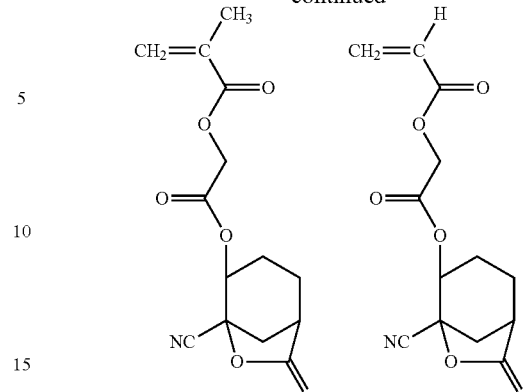
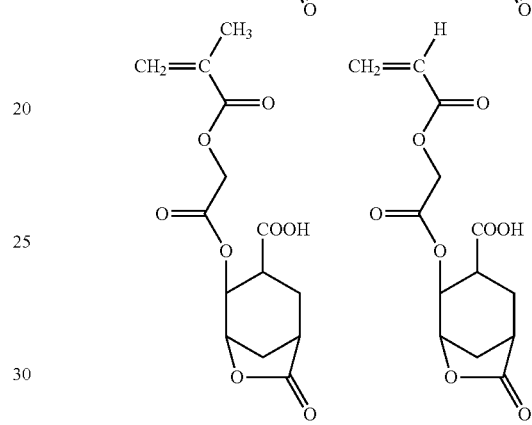
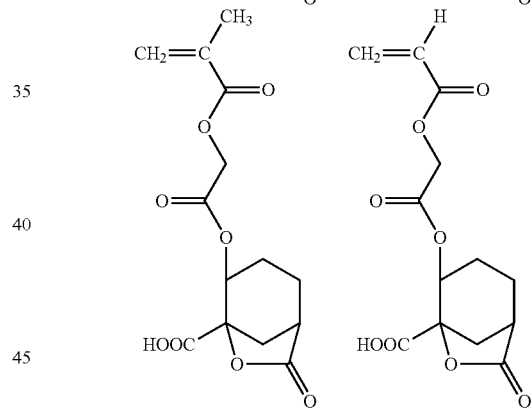

Among them, preferred are 5-oxo-4-oxatricyclo[4.2.1.0$^{3,7}$]nonan-2-yl acrylate, 5-oxo-4-oxatricyclo[4.2.1.0$^{3,7}$]nonan-2-yl methacrylate, tetrahydro-2-oxo-3-furyl acrylate, tetrahydro-2-oxo-3-furyl methacrylate, 2-(5-oxo-4-oxatricyclo[4.2.1.0$^{3,7}$]nonan-2-yloxy)-2-oxoethyl acrylate and 2-(5-oxo-4-oxatricyclo[4.2.1.0$^{3,7}$]nonan-2-yloxy)-2-oxoethyl methacrylate, and more preferred are 5-oxo-4-oxatricyclo[4.2.1.0$^{3,7}$]nonan-2-yl methacrylate, tetrahydro-2-oxo-3-furyl methacrylate and 2-(5-oxo-4-oxatricyclo[4.2.1.0$^{3,7}$]nonan-2-yloxy)-2-oxoethyl methacrylate.

When the resin contains the structural unit derived from the monomer having no acid-labile group and having a lactone ring, the content thereof is usually 5 to 60% by mole based on total molar of all the structural units of the resin, and preferably 5 to 50% by mole and more preferably 10 to 40% by mole and especially preferably 15 to 40% by mole.

When the resin contains the structural unit derived from the monomer represented by the formula (a3-1), (a3-2) or (a3-3), the content thereof is usually 5 to 60% by mole based on total molar of all the structural units of the resin, and preferably 10 to 55% by mole and more preferably 20 to 50% by mole.

Examples of the other monomer having no acid-labile group include the monomers represented by the formulae (a-4-1), (a-4-2) and (a-4-3):

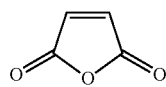
(a4-1)

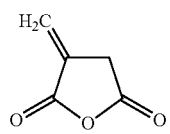
(a4-2)

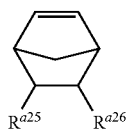
(a4-3)

wherein $R^{a25}$ and $R^{a26}$ each independently represents a hydrogen atom, a C1-C3 aliphatic hydrocarbon group which can have one or more hydroxyl groups, a carboxyl group, a cyano group or a —COOR$^{a27}$ group in which R$^{a27}$ represents a C1-C18 aliphatic hydrocarbon group or a C3-C18 alicyclic hydrocarbon group, and one or more —CH$_2$— in the C1-C18 aliphatic hydrocarbon group and the C3-C18 alicyclic hydrocarbon group can be replaced by —O— or —CO—, with the proviso that the carbon atom bonded to —O— of —COO— of R$^{a27}$ is not a tertiary carbon atom, or R$^{a26}$ and R$^{a26}$ are bonded together to form a carboxylic anhydride residue represented by —C(=O)—O—C(=O)—.

Examples of the substituent of the C1-C3 aliphatic hydrocarbon group include a hydroxyl group. Examples of the C1-C3 aliphatic hydrocarbon group which can have one or more hydroxyl groups include a C1-C3 alkyl group such as a methyl group, an ethyl group and a propyl group, and a C1-C3 hydroxyalkyl group such a hydroxymethyl group and a 2-hydroxyethyl group. The C1-C18 aliphatic hydrocarbon group represented by R$^{a27}$ is preferably a C1-C8 aliphatic hydrocarbon group and is more preferably a C1-C6 aliphatic hydrocarbon group. The C3-C18 alicyclic hydrocarbon group represented by R$^{a27}$ is preferably a C4-C18 alicyclic hydrocarbon group, and is more preferably C4-C12 alicyclic hydrocarbon group. Examples of R$^{a27}$ include a methyl group, an ethyl group, a propyl group, a 2-oxo-oxolan-3-yl group and a 2-oxo-oxolan-4-yl group.

Examples of the monomer represented by the formula (a-4-3) include 2-norbornene, 2-hydroxy-5-norbornene, 5-norbornene-2-carboxylic acid, methyl 5-norbornene-2-carboxylate, 2-hydroxyethyl 5-norbornene-2-carboxylate, 5-norbornene-2-methanol and 5-norbornene-2,3-dicarboxylic anhydride.

When the resin contains a structural unit derived from a monomer represented by the formula (a-4-1), (a-4-2) or (a-4-3), the content thereof is usually 2 to 40% by mole and preferably 3 to 30% by mole and more preferably 5 to 20% by mole based on total molar of all the structural units of the resin.

Examples of the other monomer having no acid-labile group include a monomer represented by the formula (a-4-4):

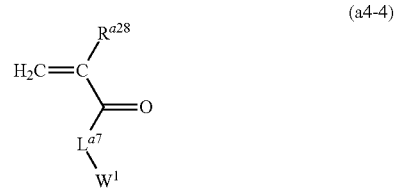
(a4-4)

wherein $R^{a28}$ represents a hydrogen atom or a methyl group, $L^{a7}$ represents —O— or *—O—(CH$_2$)$_{k2}$—CO—O— in which * represents a binding position to —CO— and k2 represents an integer of 1 to 7, and $W^1$ represents a group containing a sultone ring which may have one or more substituents.

Examples of the sultone ring include the following.

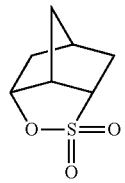 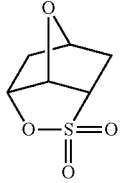 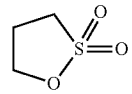

Examples of the group containing a sultone ring include groups formed by removing any one hydrogen atom from the above-mentioned sultone ring. Examples of the substituents include a hydroxyl group, a cyano group, a C1-C6 alkyl group, a C1-C6 fluorinated alkyl group, a C1-C6 hydroxyalkyl group, a C1-C6 alkoxy group, a C2-C7 alkoxycarbonyl group, a C2-C8 acyl group and a C2-C7 acyloxy group.

Examples of the fluorinated alkyl group include a difluoromethyl group, a trifluoromethyl group, a 1,1-difluoroethyl group, a 2,2-difluoroethyl group, a 2,2,2-trifluoroethyl group, a perfluoroethyl group, a 1,1,2,2-tetrafluoropropyl group, a 1,1,2,2,3,3-hexafluoropropyl group, a (perfluoroethyl)methyl group, a 1-(trifluoromethyl)-1,2,2,2-tetrafluoroethyl group, a perfluoropropyl group, a 1,1,2,2-tetrafluorobutyl group, a 1,1,2,2,3,3-hexafluorobutyl group, a 1,1,2,2,3,3,4,4-octafluorobutyl group, a perfluorobutyl group, a 1,1-bis(trifluoromethyl)-2,2,2-trifluoroethyl group, 2-(perfluoropropyl)ethyl group, a 1,1,2,2,3,3,4,4-octafluoropentyl group, a perfluoropentyl group, a 1,1,2,2,3,3,4,4,5,5-decafluoropentyl group, a 1,1-bis(trifluoromethyl)-2,2,3,3,3,-pentafluoropropyl group, a perfluoropentyl group, a 2-(perfluorobutyl)ethyl group, a 1,1,2,2,3,3,4,4,5,5-decafluorohexyl group, a 1,1,2,2, 3,3,4,4,5,5,6,6-dodecafluorohexyl group, a (perfluoropentyl) methyl group and a perfluorohexyl group. Among them preferred is a C1-C4 fluorinated alkyl group, and more preferred are a trifluoromethyl group, a perfluoroethyl group and a perfluoropropyl group, and especially preferred is a trifluoromethyl group.

Examples of the hydroxyalkyl group include a hydroxymethyl group and a 2-hydroxyethyl group.

Examples of the monomer represented by the formula (a-4-4) include the following.
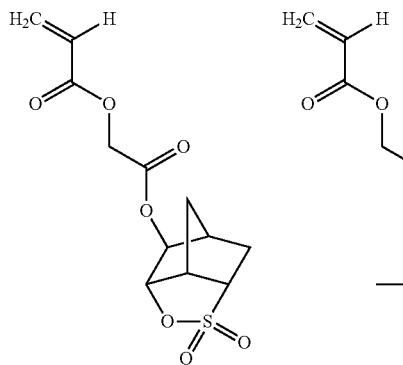
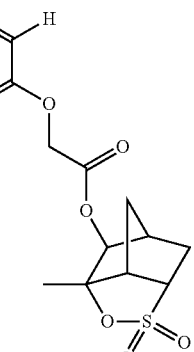
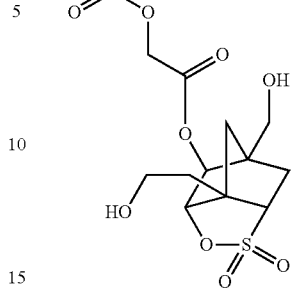
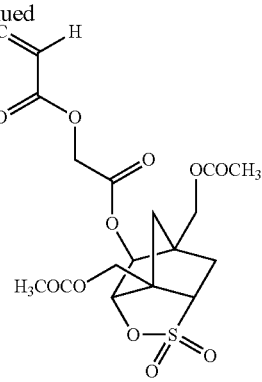
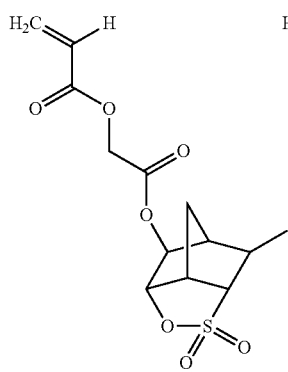
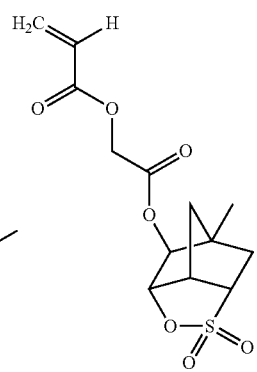
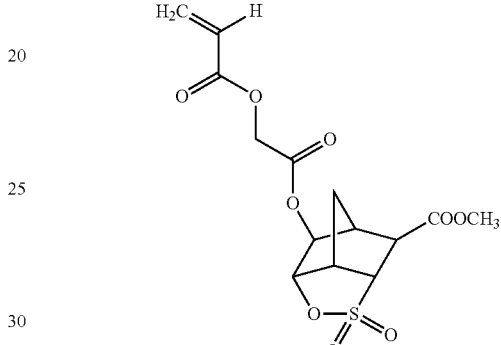
-continued
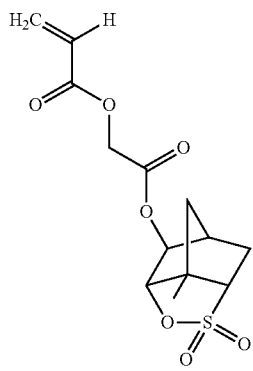
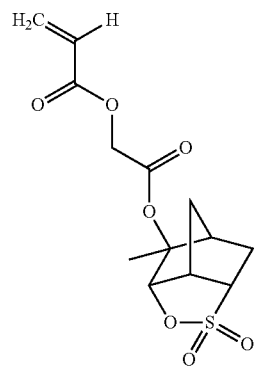
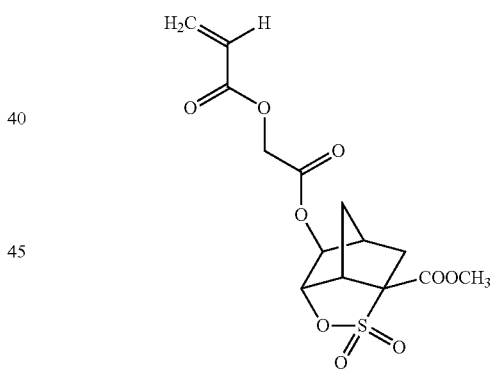
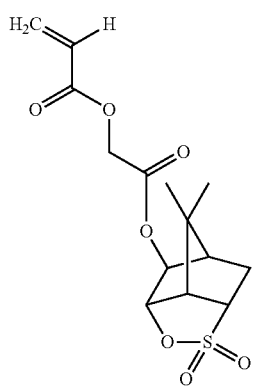
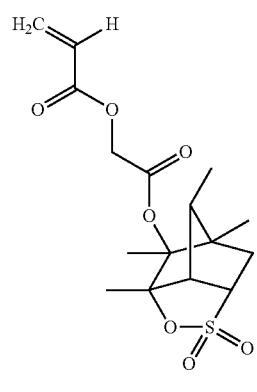
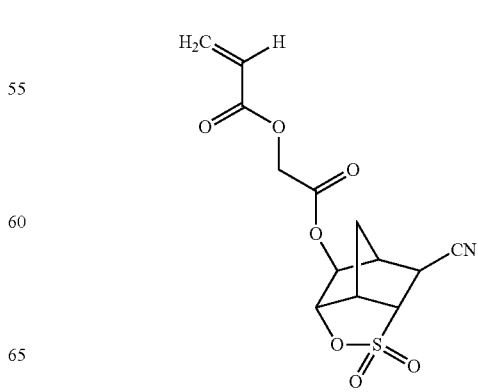

-continued
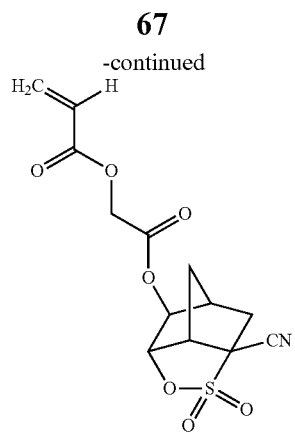
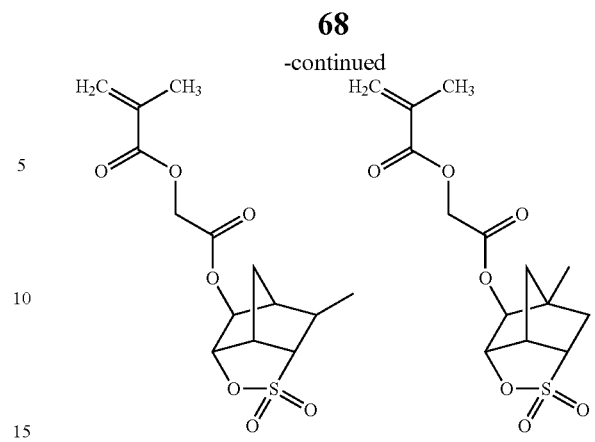
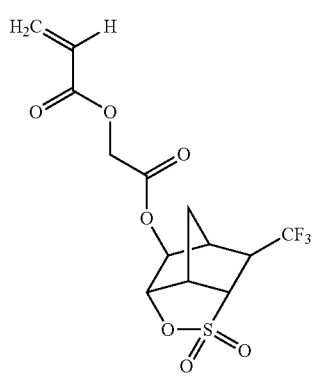
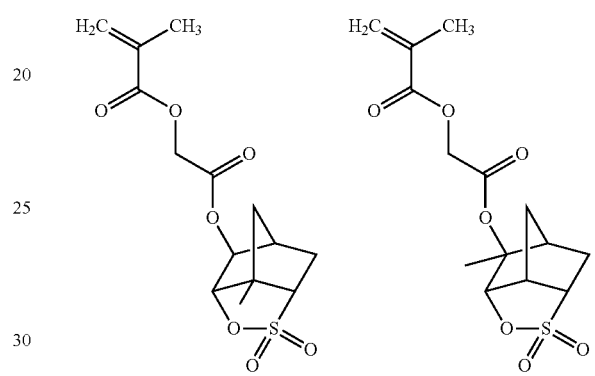
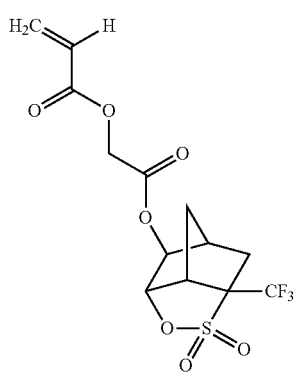
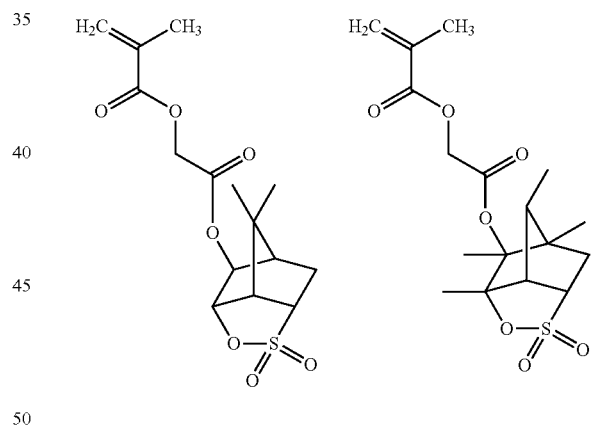
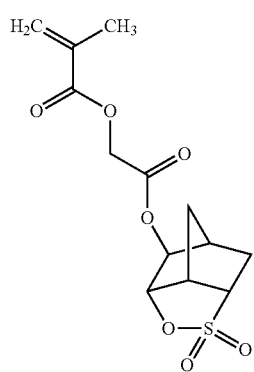
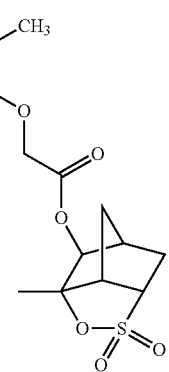
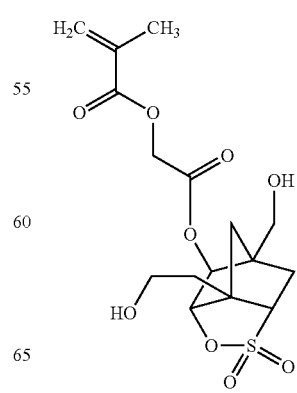
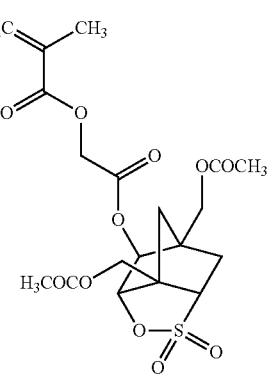

69
-continued
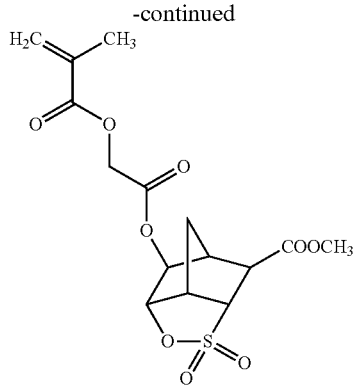
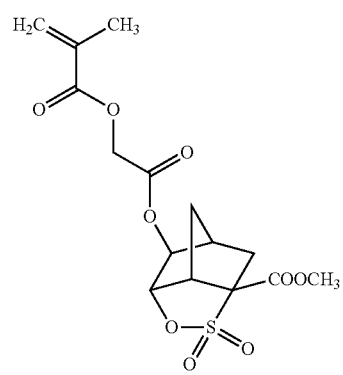
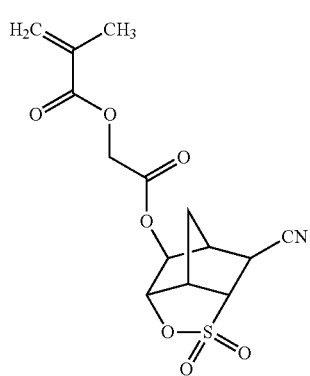
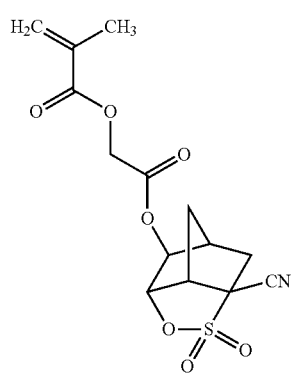
70
-continued
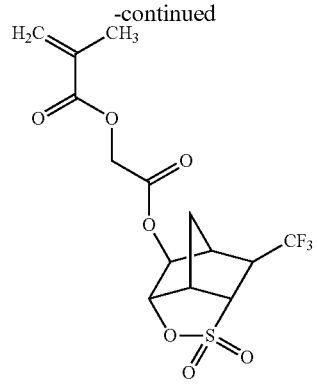
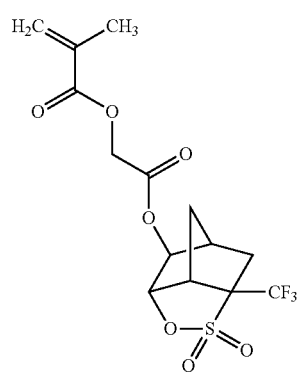
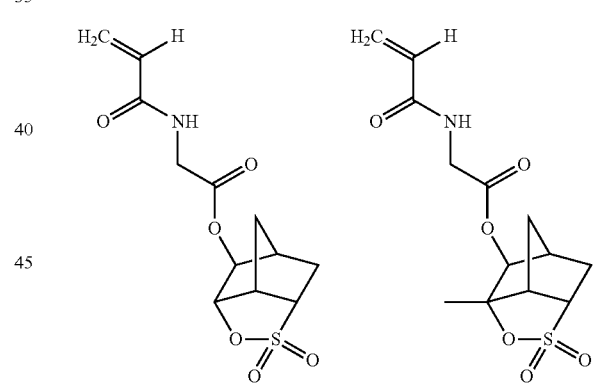
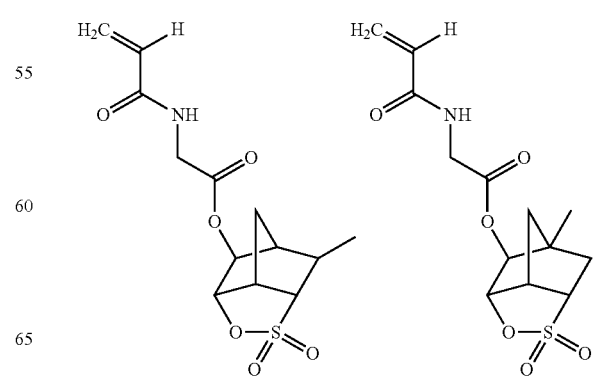

71
-continued
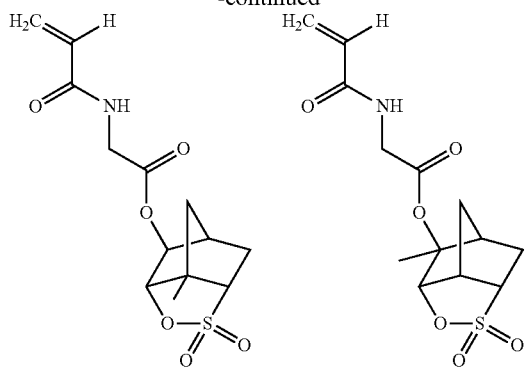
72
-continued
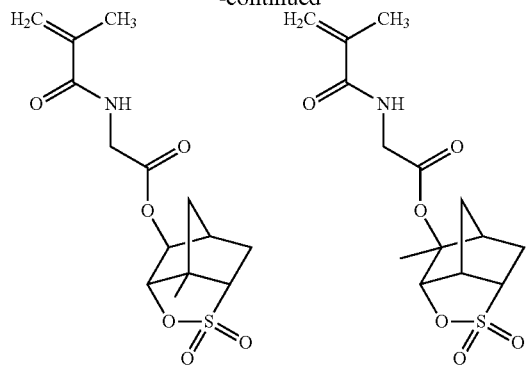
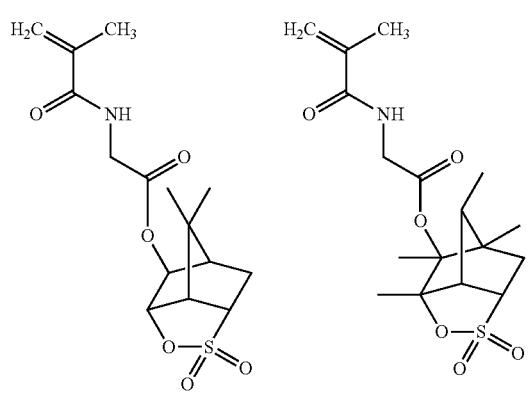
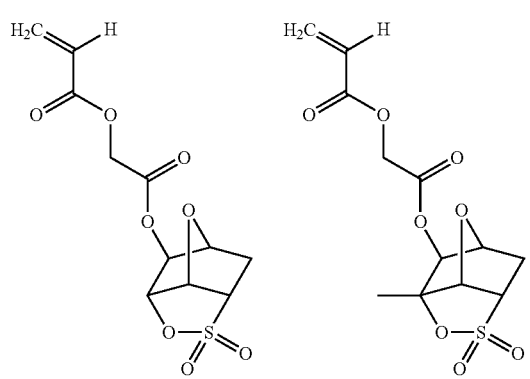
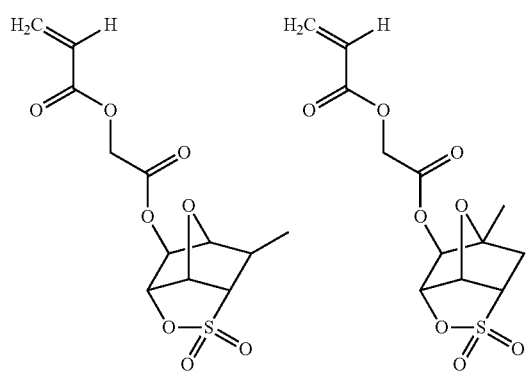

73
-continued
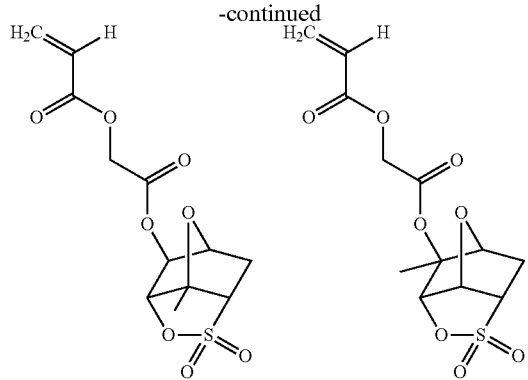
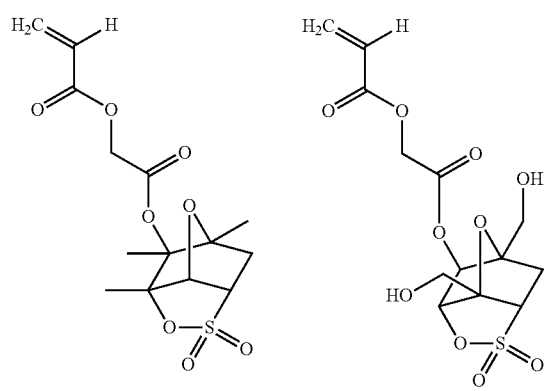
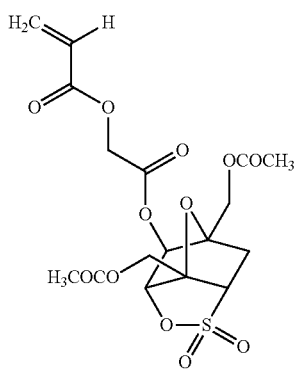
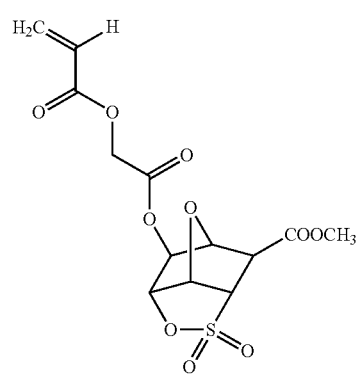
74
-continued
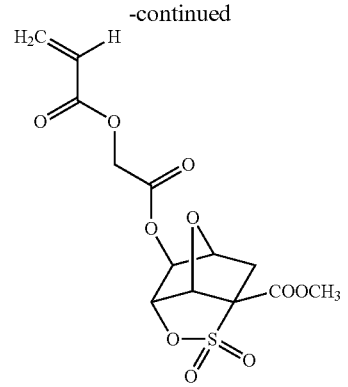
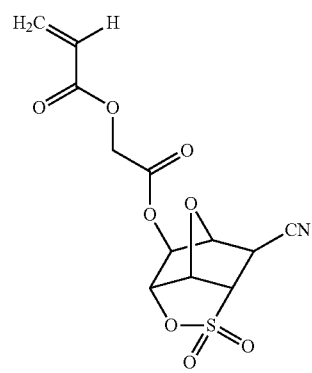
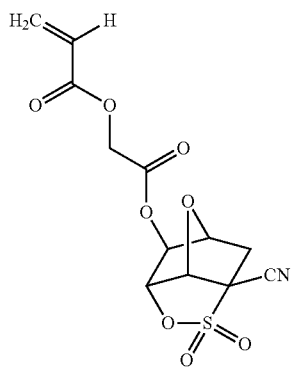
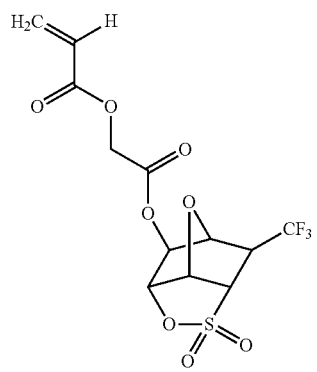

75
-continued
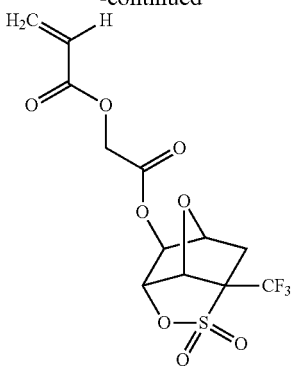
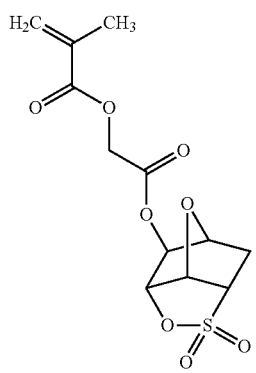 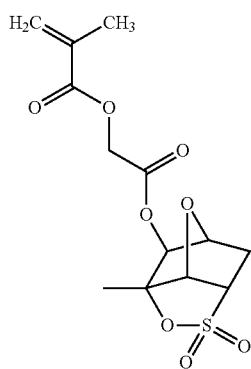
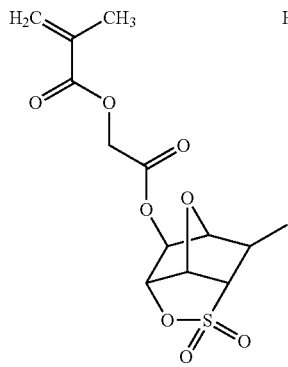 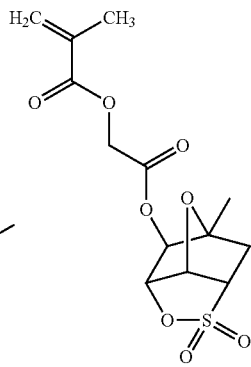
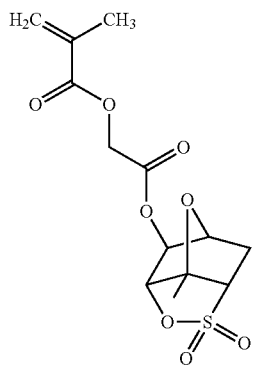 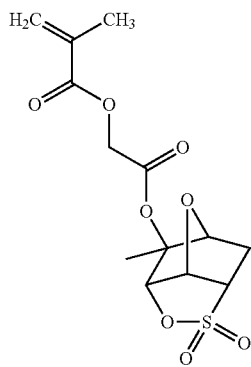
76
-continued
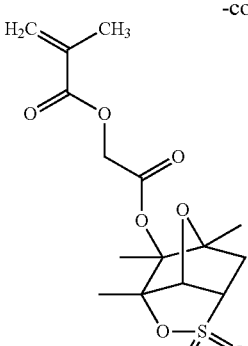 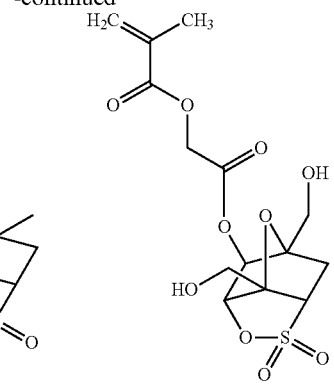
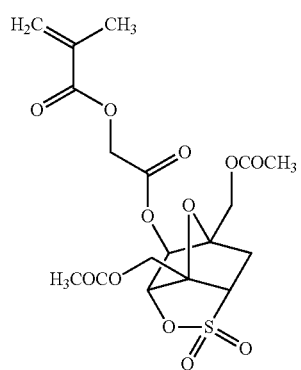
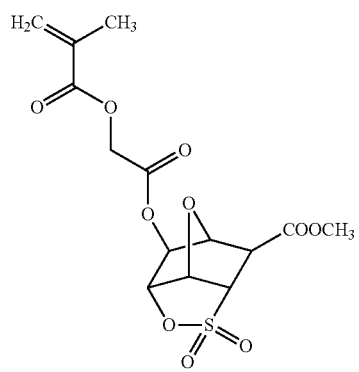
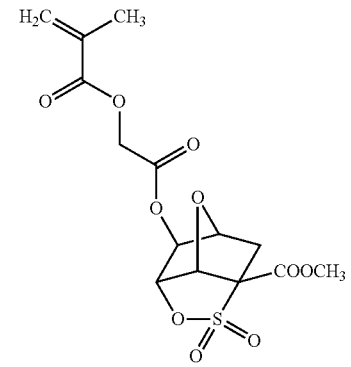

77
-continued
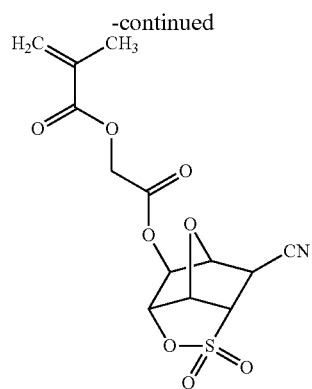
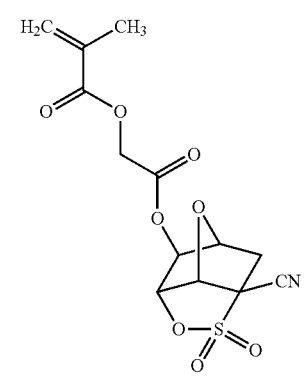
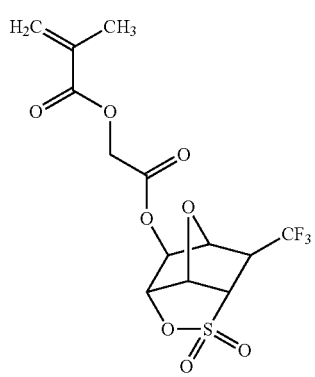
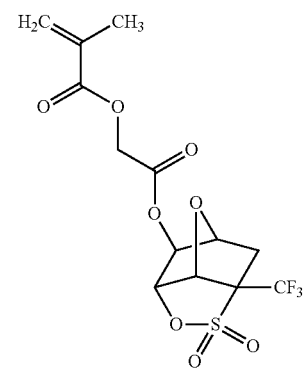
78
-continued
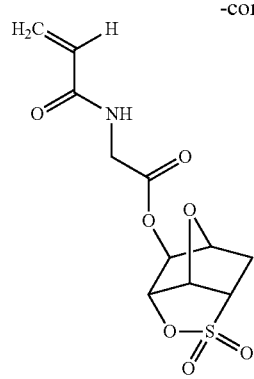 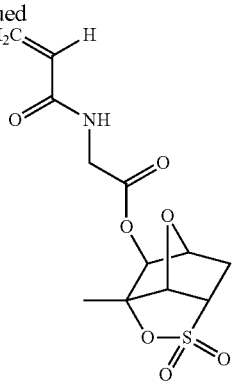
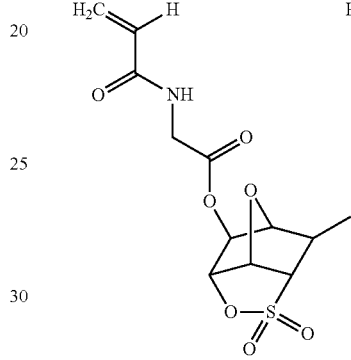 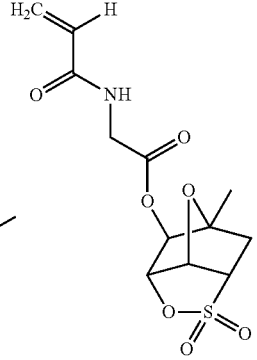
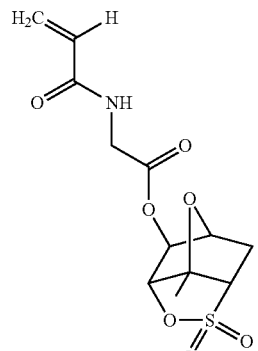 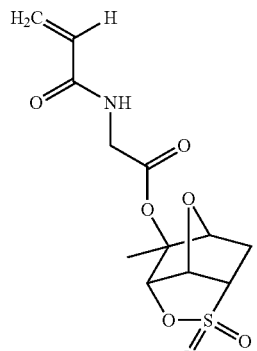
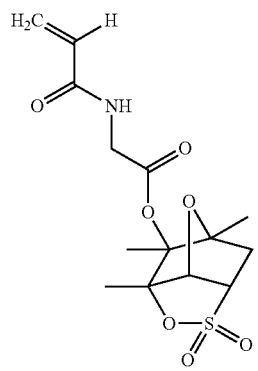 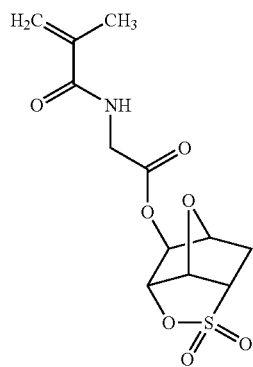

-continued
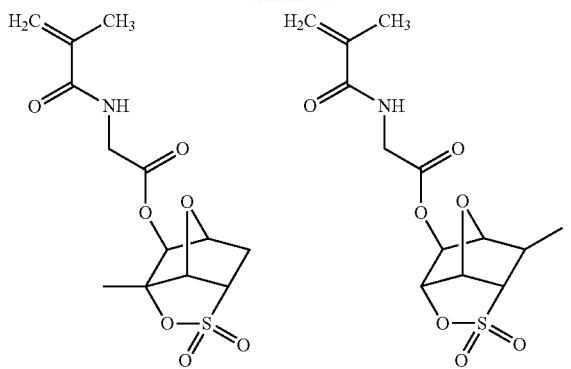
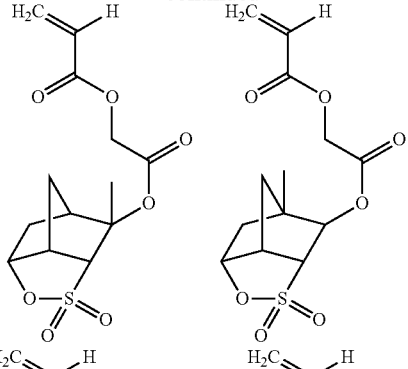
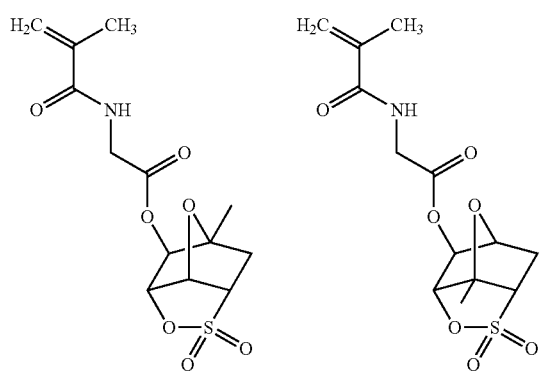
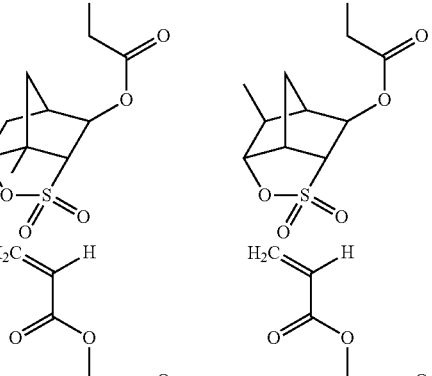
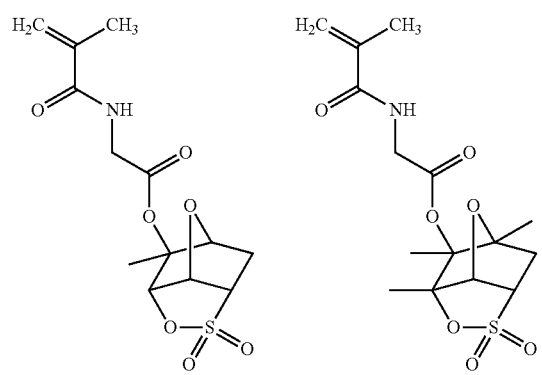
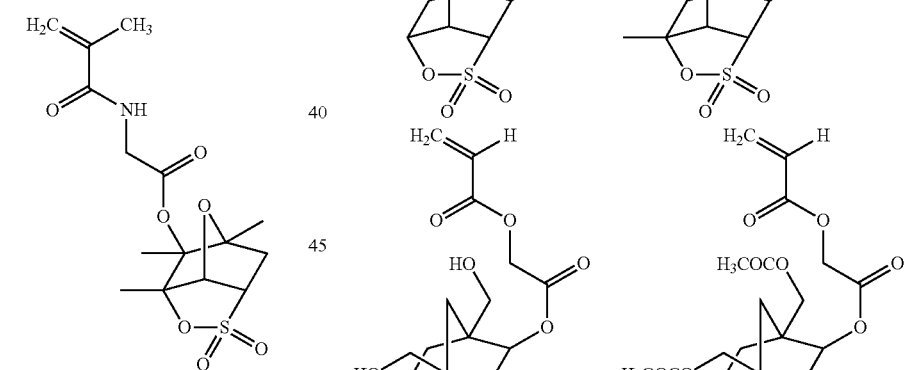
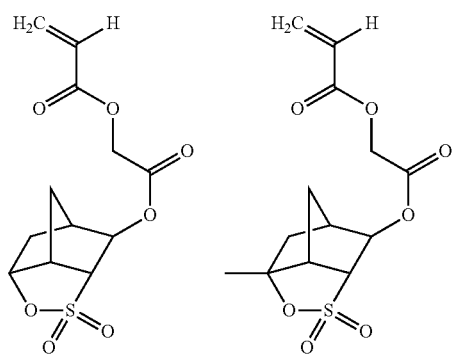
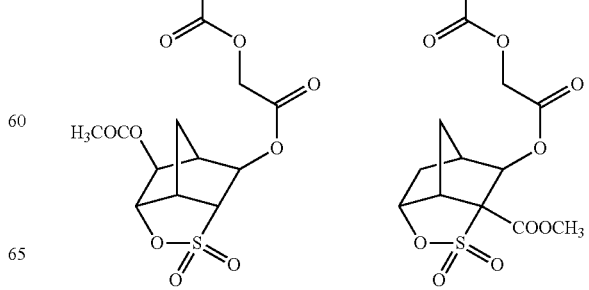

81
-continued
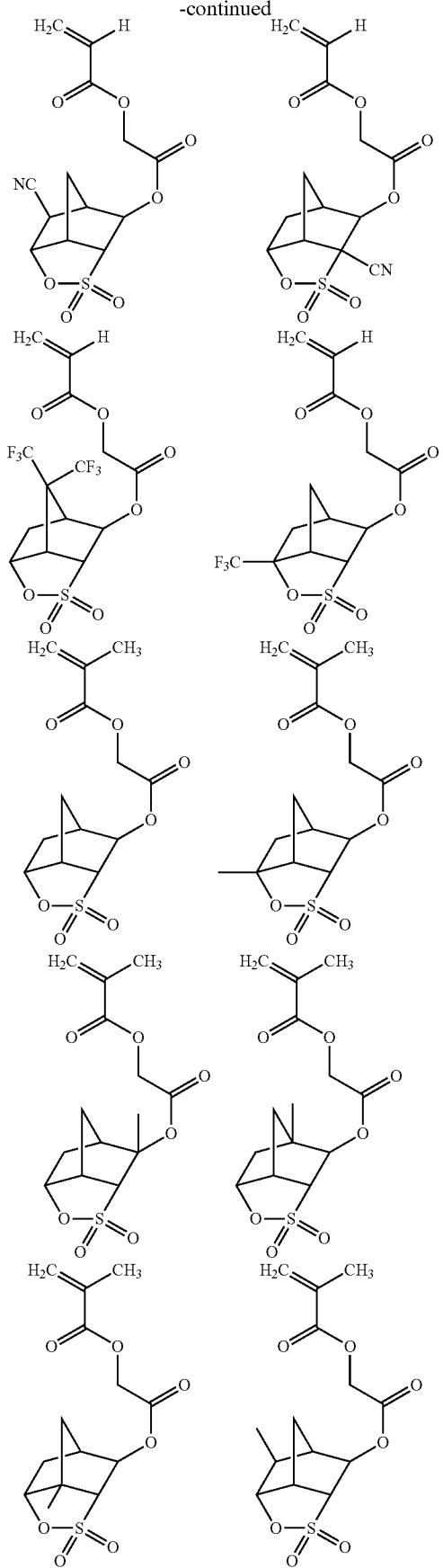
82
-continued
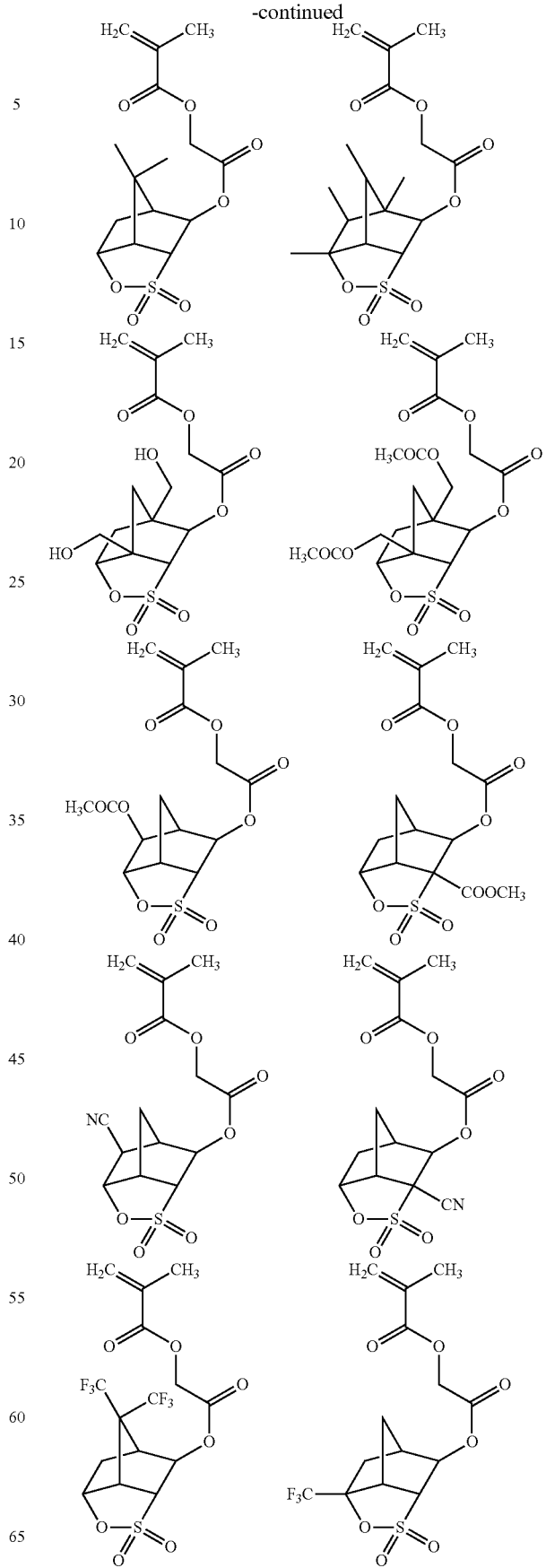

83
-continued
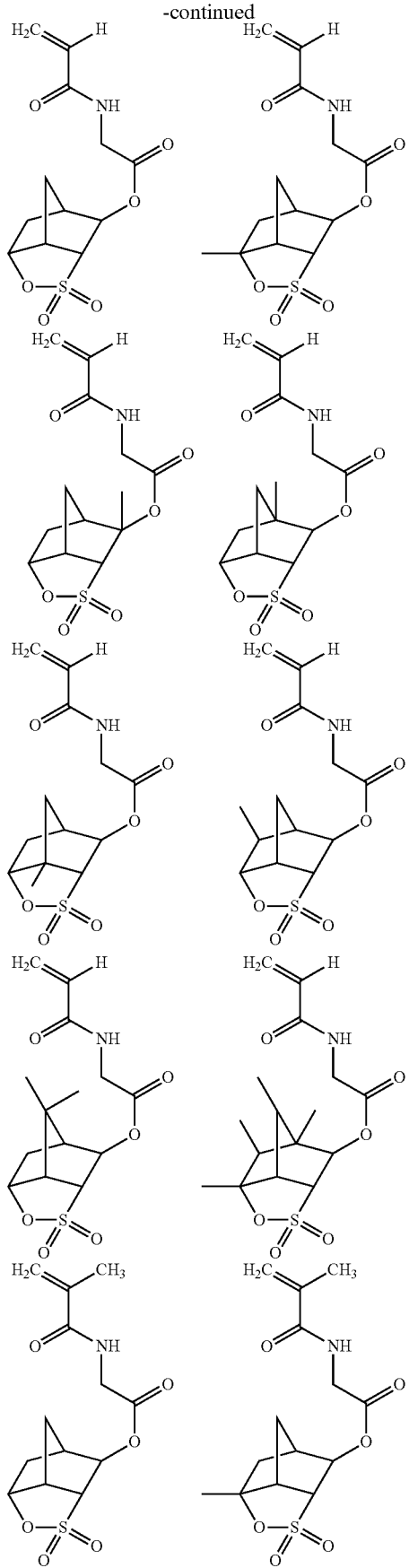
84
-continued
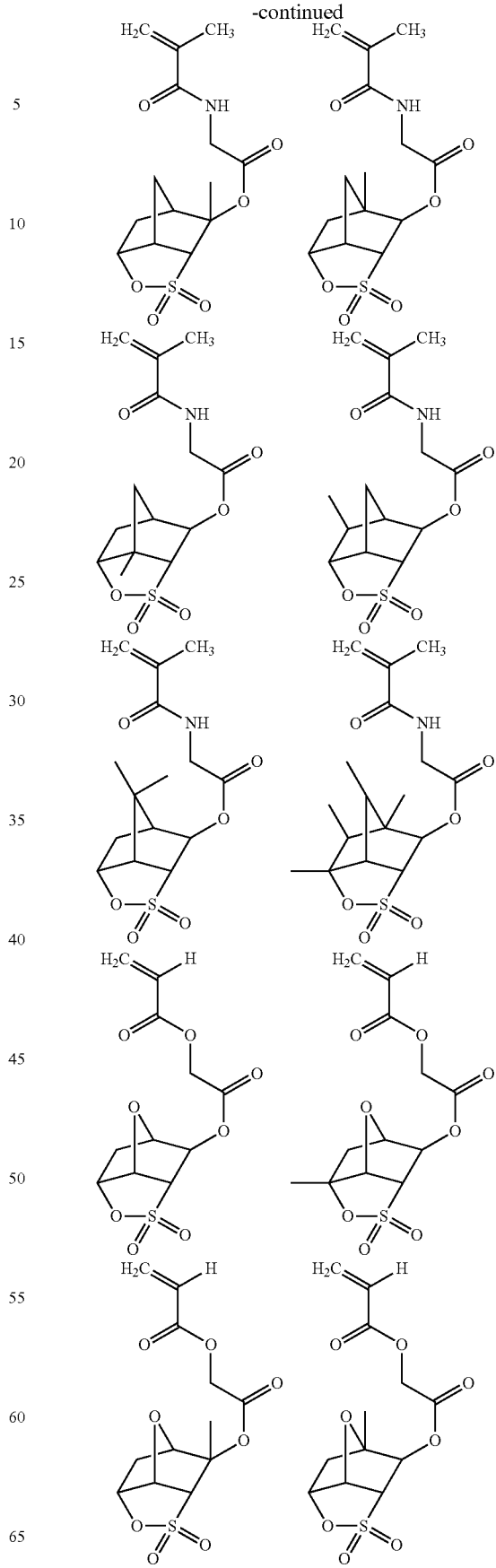

-continued
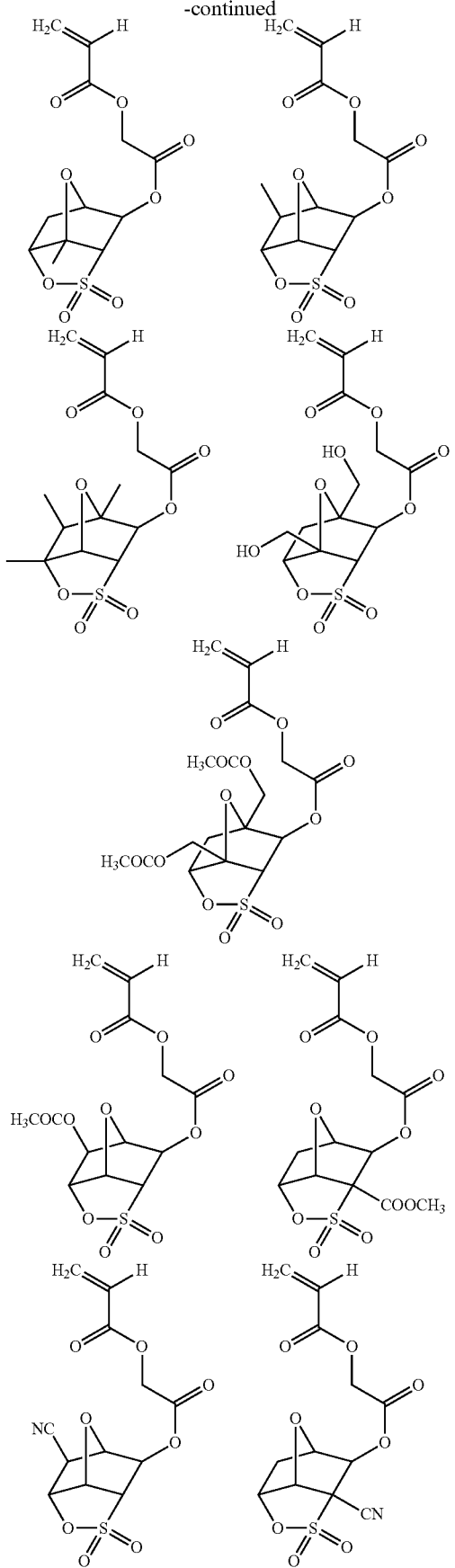
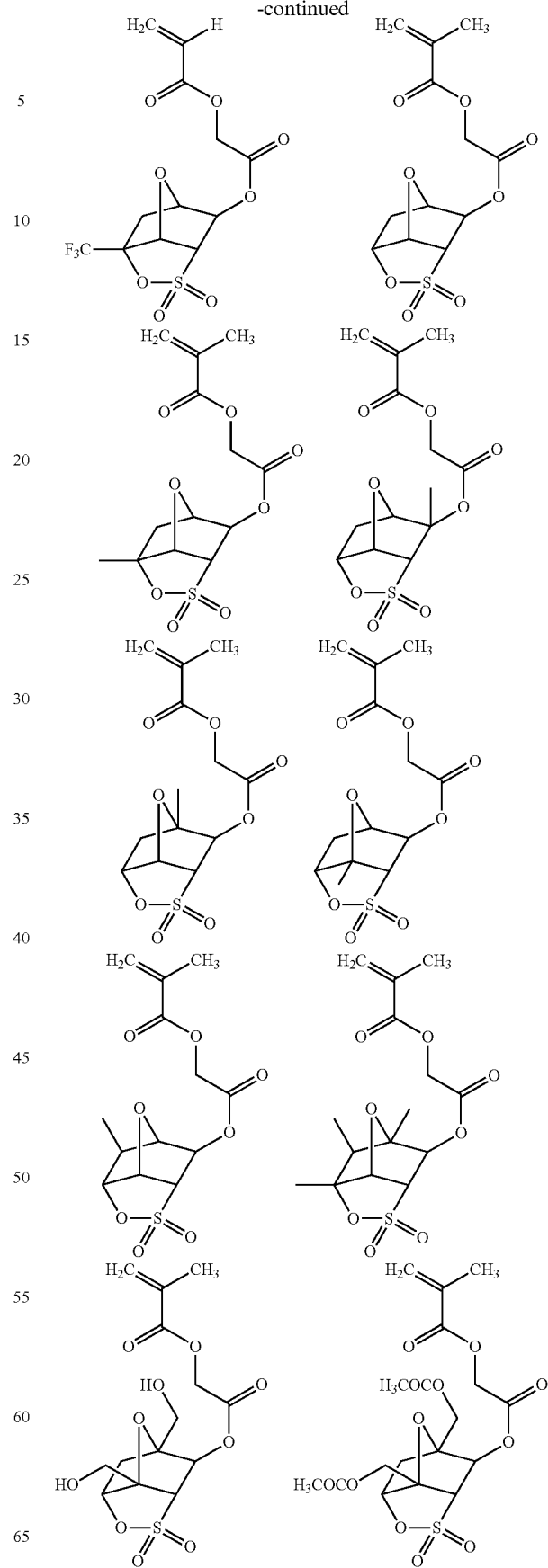

-continued
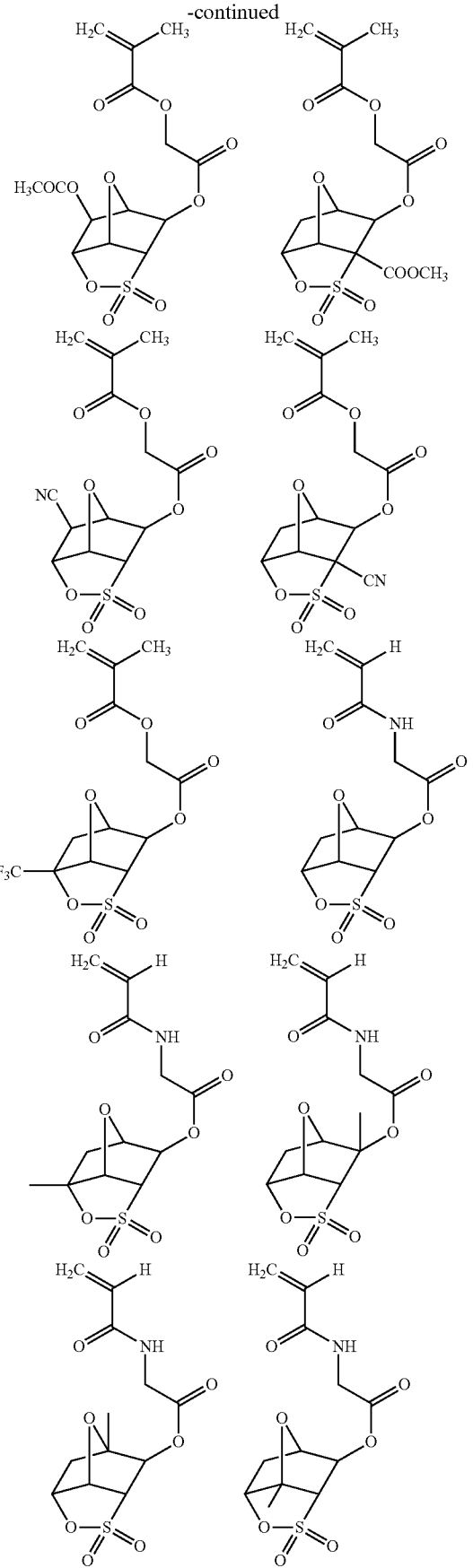
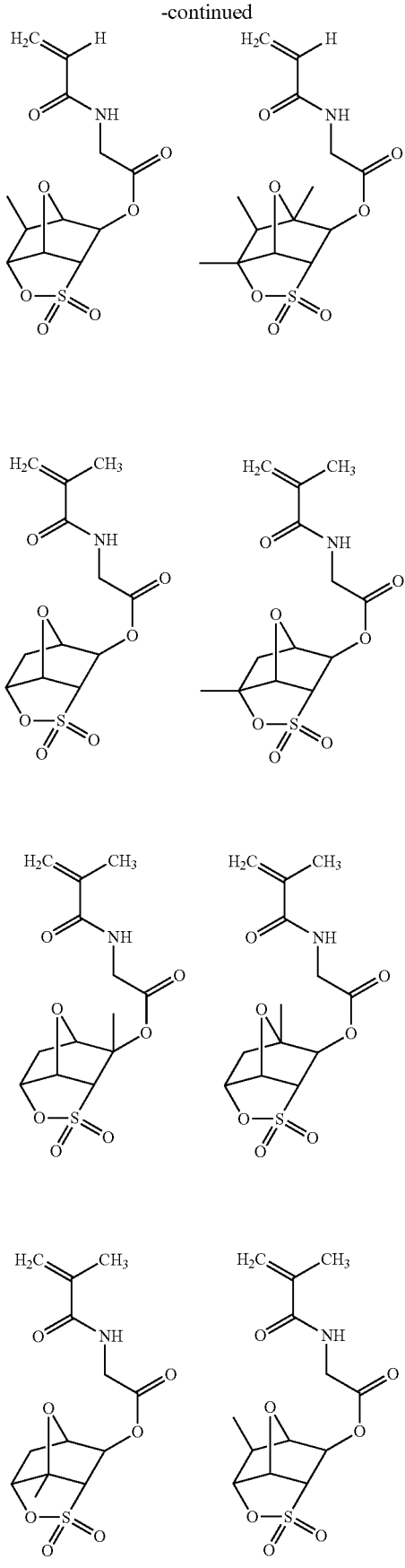

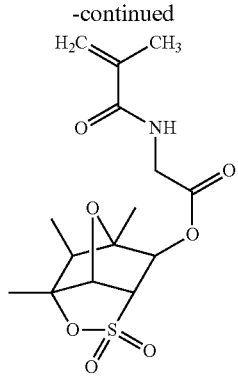

When the resin contains a structural unit derived from a monomer represented by the formula (a-4-4), the content thereof is usually 2 to 40% by mole based on total molar of all the structural units of the resin, and preferably 3 to 35% by mole and more preferably 5 to 30% by mole.

Examples of the other monomer having no acid-labile group include the fluorine-containing monomers represented by the following formulae.

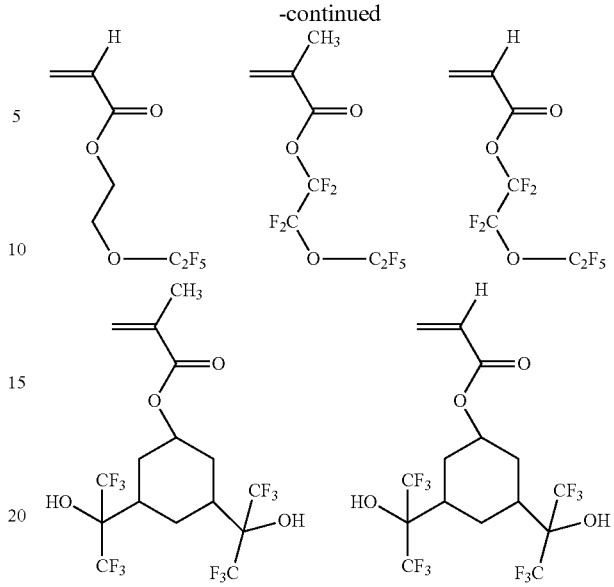

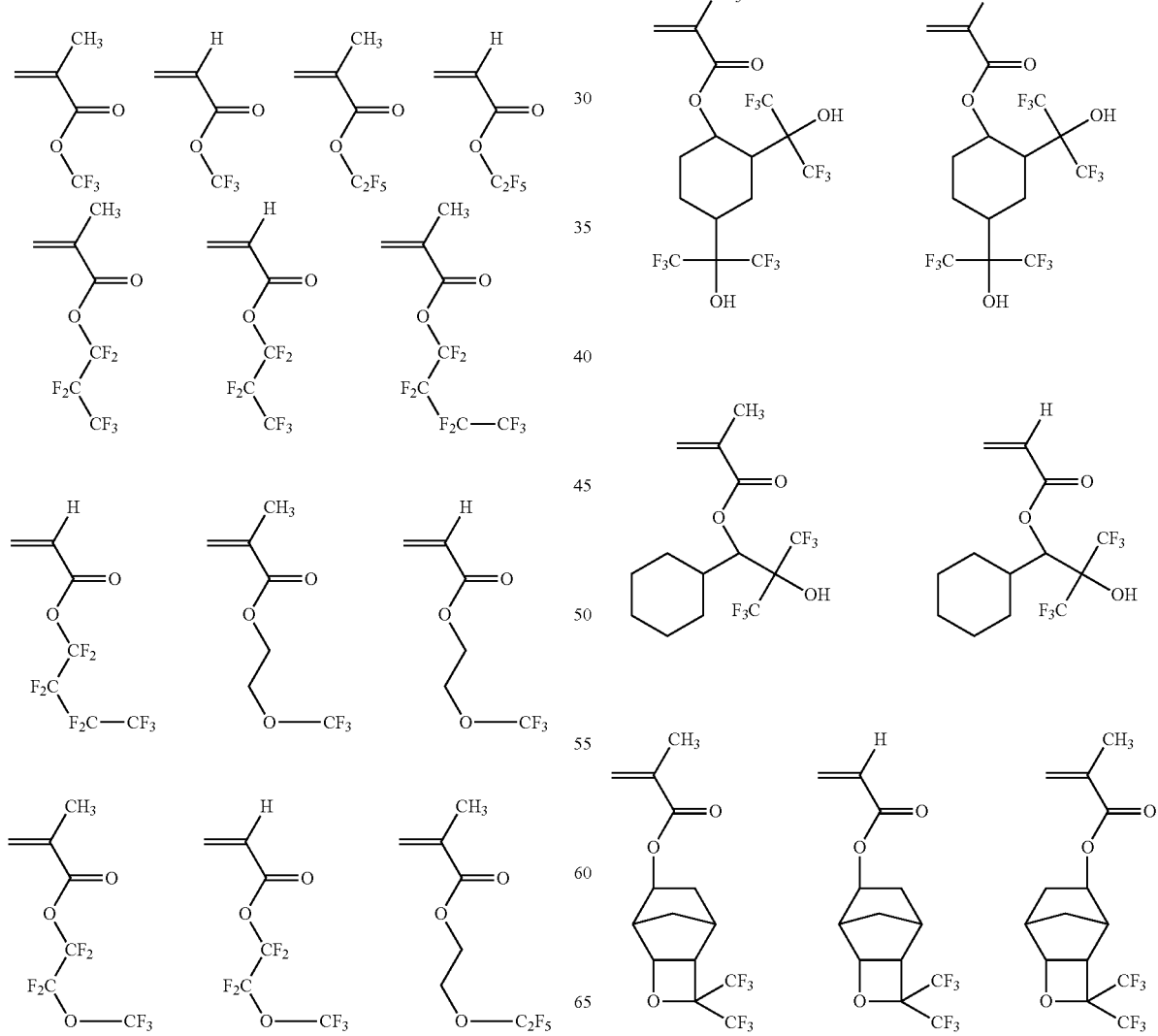

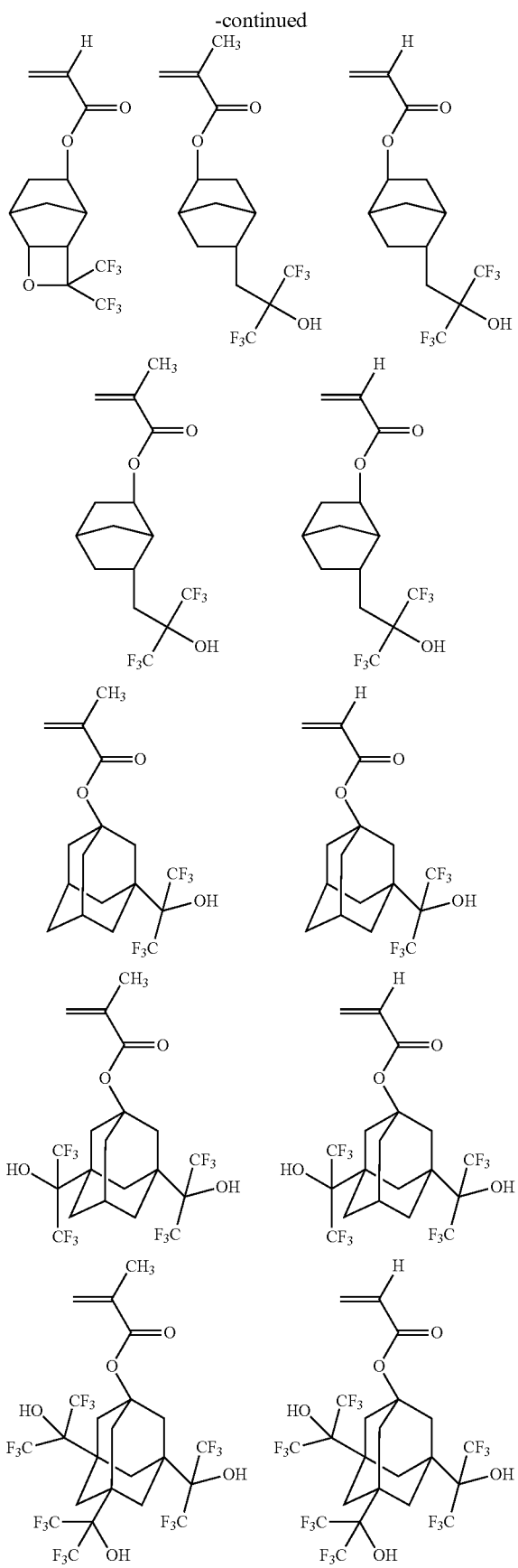

Among them, preferred are 5-(3,3,3-trifluoro-2-hydroxy-2-(trifluoromethyl)propyl)bicyclo[2.2.1]hept-2-yl acrylate, 5-(3,3,3-trifluoro-2-hydroxy-2-(trifluoromethyl)propyl)bicyclo[2.2.1]hept-2-yl methacrylate, 6-(3,3,3-trifluoro-2-hydroxy-2-(trifluoromethyl)propyl)bicyclo[2.2.1]hept-2-yl acrylate, 5-(3,3,3-trifluoro-2-hydroxy-2-(trifluoromethyl) propyl)bicyclo[2.2.1]hept-2-yl methacrylate, 4,4-bis(trifluoromethyl)-3-oxatricyclo[4.2.1.0$^{2,5}$]nonyl acrylate and 4,4-bis(trifluoromethyl)-3-oxatricyclo[4.2.1.0$^{2,5}$]nonyl methacrylate.

When the resin contains a structural unit derived from the above-mentioned fluorine-containing monomer, the content thereof is usually 1 to 20% by mole based on total molar of all the structural units of the resin, and preferably 2 to 15% by mole and more preferably 3 to 10% by mole.

Examples of the other monomer having no acid-labile group include the monomers having a group represented by the formula (3):

(3)

wherein R$^{10}$ represents a C1-C6 fluorinated alkyl group, in its side chain.

Examples of the C1-C6 fluorinated alkyl group include a difluoromethyl group, a trifluoromethyl group, a 1,1-difluoroethyl group, a 2,2-difluoroethyl group, a 2,2,2-trifluoroethyl group, a perfluoroethyl group, a 1,1,2,2-tetrafluoropropyl group, a 1,1,2,2,3,3-hexafluoropropyl group, a (perfluoroethyl)methyl group, a 1-(trifluoromethyl)-1,2,2,2-tetrafluoroethyl group, a perfluoropropyl group, a 1,1,2,2-tetrafluorobutyl group, a 1,1,2,2,3,3-hexafluorobutyl group, a 1,1,2,2,3,3,4,4-octafluorobutyl group, a perfluorobutyl group, a 1,1-bis(trifluoromethyl)-2,2,2-trifluoroethyl group, 2-(perfluoropropyl)ethyl group, a 1,1,2,2,3,3,4,4-octafluoropentyl group, a perfluoropentyl group, a 1,1,2,2,3,3,4,4,5,5-decafluoropentyl group, a 1,1-bis(trifluoromethyl)-2,2,3,3,3,-pentafluoropropyl group, perfluoropentyl group, a 2-(perfluorobutyl)ethyl group, a 1,1,2,2,3,3,4,4,5,5-decafluorohexyl group, a 1,1,2,2,3,3,4,4,5,5,6,6-dodecafluorohexyl group, a (perfluoropentyl)methyl group and a perfluorohexyl group. Among them preferred is a C1-C4 fluorinated alkyl group, and more preferred are a trifluoromethyl group, a perfluoroethyl group and a perfluoropropyl group, and especially preferred is a trifluoromethyl group.

Examples of the monomer having the group represented by the formula (3) in its side chain include the following.

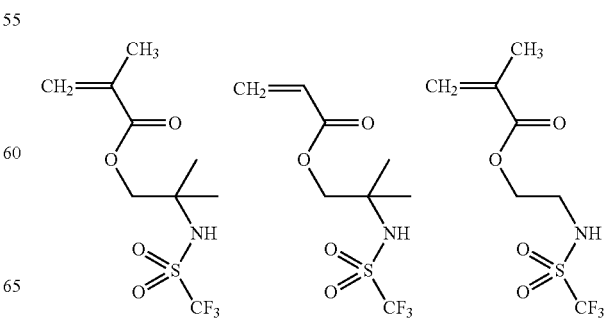

-continued
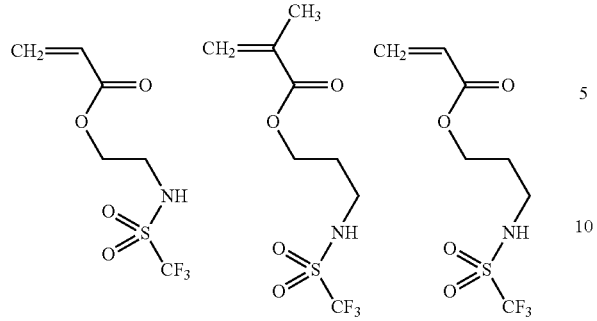
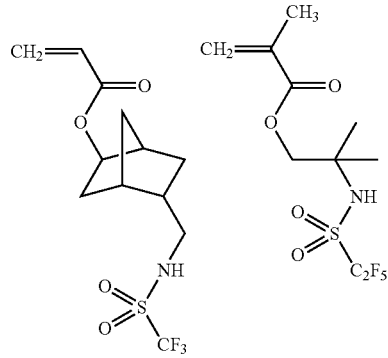
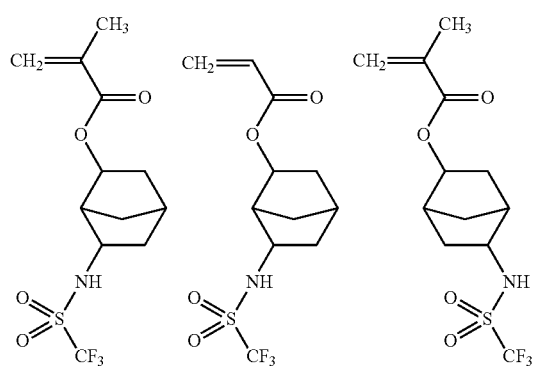
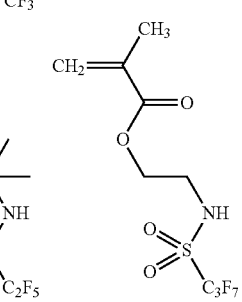
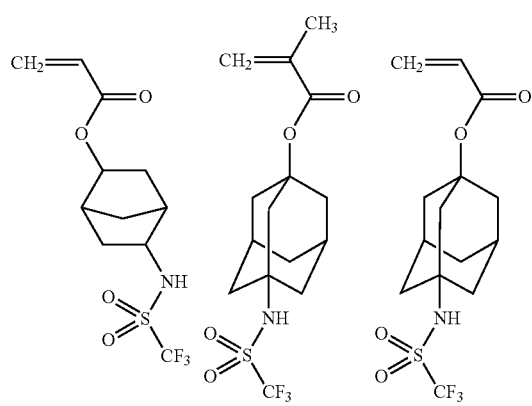
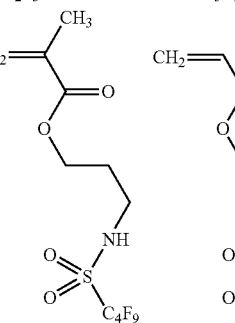
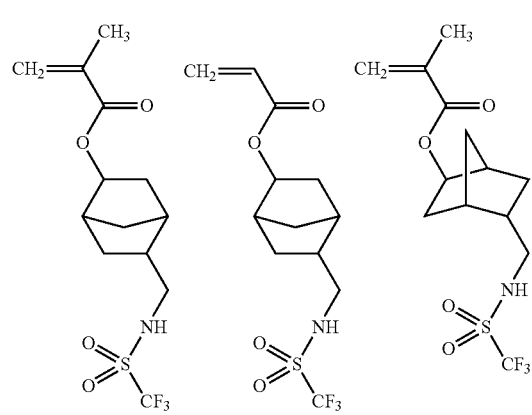
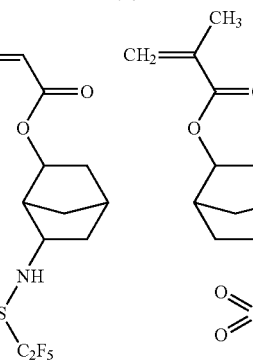
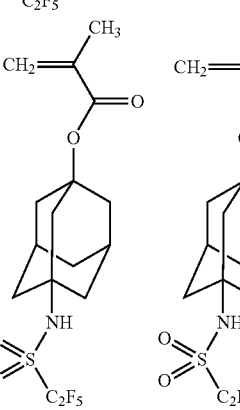

-continued

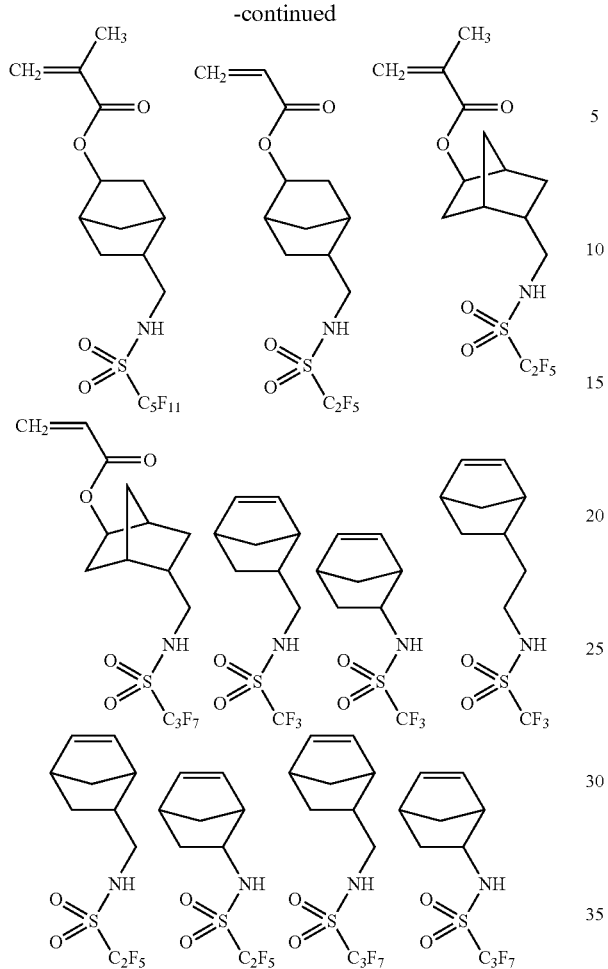

When the resin contains a structural unit derived from the above-mentioned monomer having the group represented by the formula (3) in its side chain, the content thereof is usually 5 to 90% by mole based on total molar of all the structural units of the resin, and preferably 10 to 80% by mole and more preferably 20 to 70% by mole.

Examples of the other monomer having no acid-labile group include the monomers having a group represented by the formula (4):

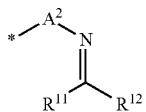

(4)

wherein $R^{11}$ represents a C6-C12 aromatic hydrocarbon group which may have one or more substituents, $R^{12}$ represents a C1-C12 hydrocarbon group which may have one or more substituents and which may contain one or more heteroatoms, and $A^2$ represents a single bond, —$(CH_2)_m$—$SO_2$—O—* or —$(CH_2)_m$—CO—O—* in which one or more —$CH_2$— may be replaced by —O—, —CO— or —$SO_2$— and in which one or more hydrogen atoms may be replaced by a fluorine atom, and m represents an integer of 1 to 12, in its side chain.

Examples of the substituents of the aromatic hydrocarbon group include a C1-C4 alkyl group such as a methyl group, an ethyl group, a propyl group, an isopropyl group, a butyl group, an isobutyl group and a tert-butyl group, a halogen atom such as a fluorine atom, a chlorine atom and a bromine atom, a phenyl group, a nitro group, a cyano group, a hydroxyl group, a phenoxy group and a tert-butylphenyl group.

Examples of $R^{11}$ include the following. In the following formulae, * represents a binding position to —$C(R^{12})$=N.

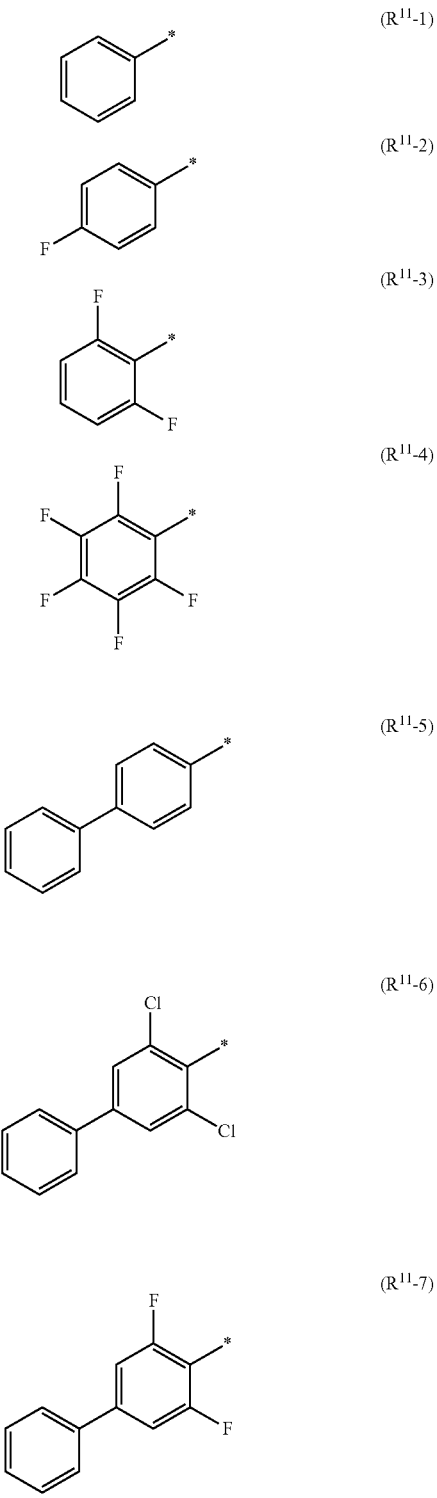

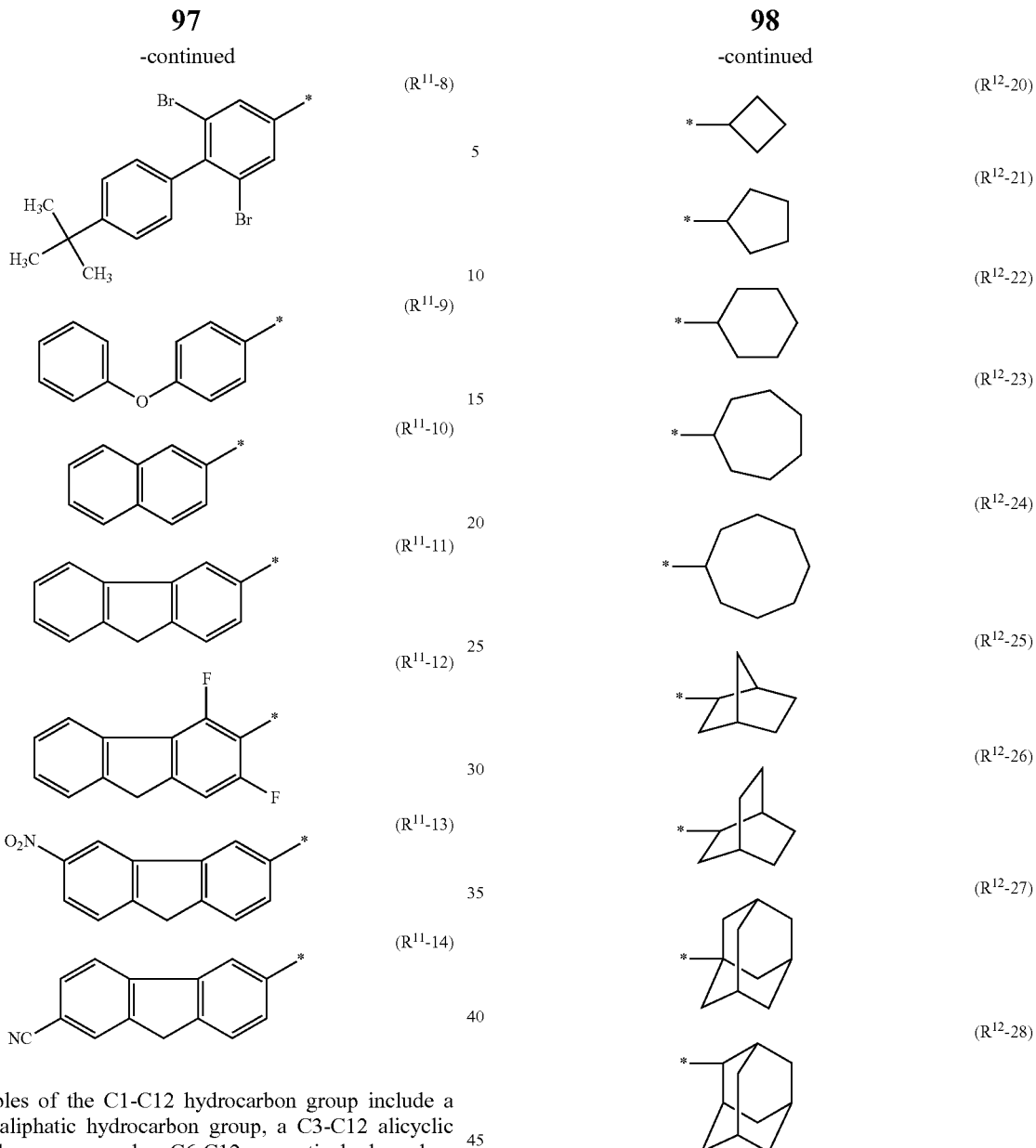

Examples of the C1-C12 hydrocarbon group include a C1-C12 aliphatic hydrocarbon group, a C3-C12 alicyclic hydrocarbon group and a C6-C12 aromatic hydrocarbon group. Examples of the C1-C12 aliphatic hydrocarbon group include a linear aliphatic hydrocarbon group such as a methyl group, an ethyl group, a propyl group, a butyl group, a pentyl group, a hexyl group, a heptyl group, an octyl group, a nonyl group, a decyl group, an undecyl group and a dodecyl group, and a branched chain aliphatic hydrocarbon group such as an isopropyl group, a sec-butyl group, a tert-butyl group, a methylpentyl group, an ethylpentyl group, a methylhexyl group, an ethylhexyl group, a propylhexyl group and a tert-octyl group. Preferred is a branched chain aliphatic hydrocarbon group, and more preferred are an isopropyl group, a sec-butyl group, a tert-butyl group and an ethylhexyl group.

Examples of the C3-C12 alicyclic hydrocarbon group include the following. In the following formulae, * represents a binding position to —C($R^{11}$)=N.

The C1-C12 hydrocarbon group may contain one or more heteroatoms such as a halogen atom, a sulfur atom, an oxygen atom and a nitrogen atom, and it may also contain a group formed by combining two or more heteroatoms such as —$SO_2$— and —CO—. Examples of the C1-C12 hydrocarbon group containing one or more heteroatoms include the following.

-continued
*—CF₂CF₂CF₃ (R¹²-6)
*—CF₂C₂H₅ (R¹²-7)
*—CF₂CF₂CF₂—CO₂—CH₃ (R¹²-8)
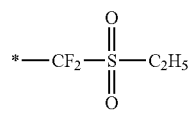 (R¹²-9)
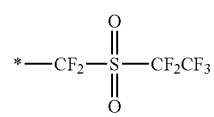 (R¹²-10)
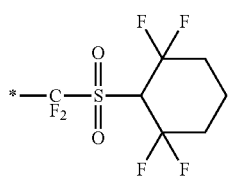 (R¹²-11)
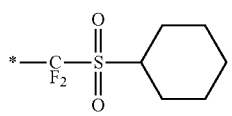 (R¹²-12)
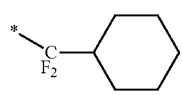 (R¹²-13)
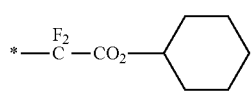 (R¹²-14)
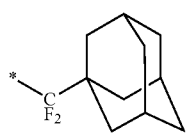 (R¹²-15)
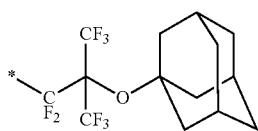 (R¹²-16)
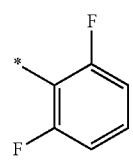 (R¹²-17)
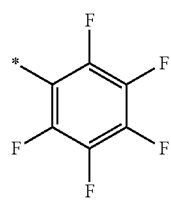 (R¹²-18)
Examples of the C6-C12 aromatic hydrocarbon group include the same as those of $R^{11}$.
Examples of $A^2$ include the following.
— (A²-1)
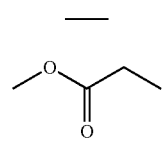 (A²-2)
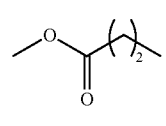 (A²-3)
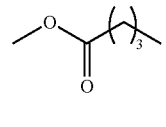 (A²-4)
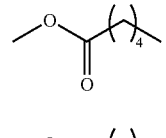 (A²-5)
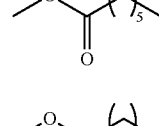 (A²-6)
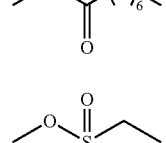 (A²-7)
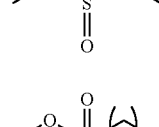 (A²-8)
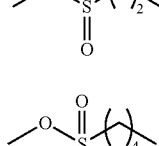 (A²-9)
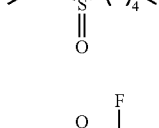 (A²-10)
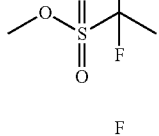 (A²-11)
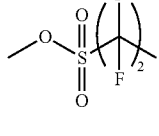 (A²-12)
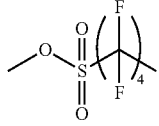 (A²-13)

-continued

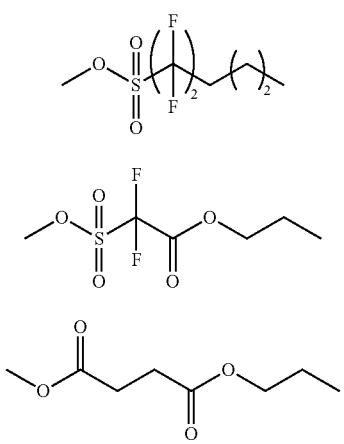

(A²-14)

(A²-15)

(A²-16)

In the formulae, the group represented by the formula (A²-1) represents a single bond.

Preferable examples of the monomer having the group represented by the formula (4) include a monomer represented by the formula (a6-1):

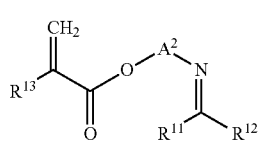

(a6-1)

wherein $A^2$, $R^{11}$ and $R^{12}$ are the same as defined above, and $R^{13}$ represents a hydrogen atom or a methyl group.

Examples of the monomer represented by the formula (a6-1) include the following.

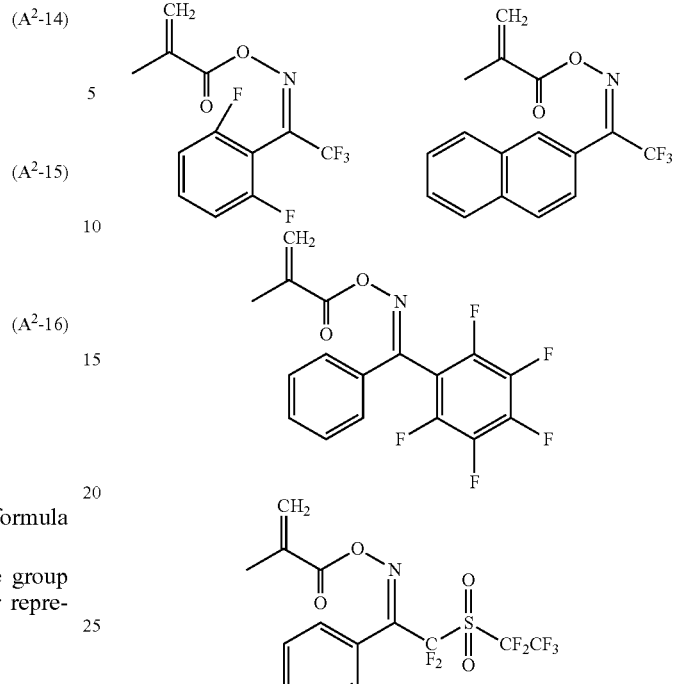

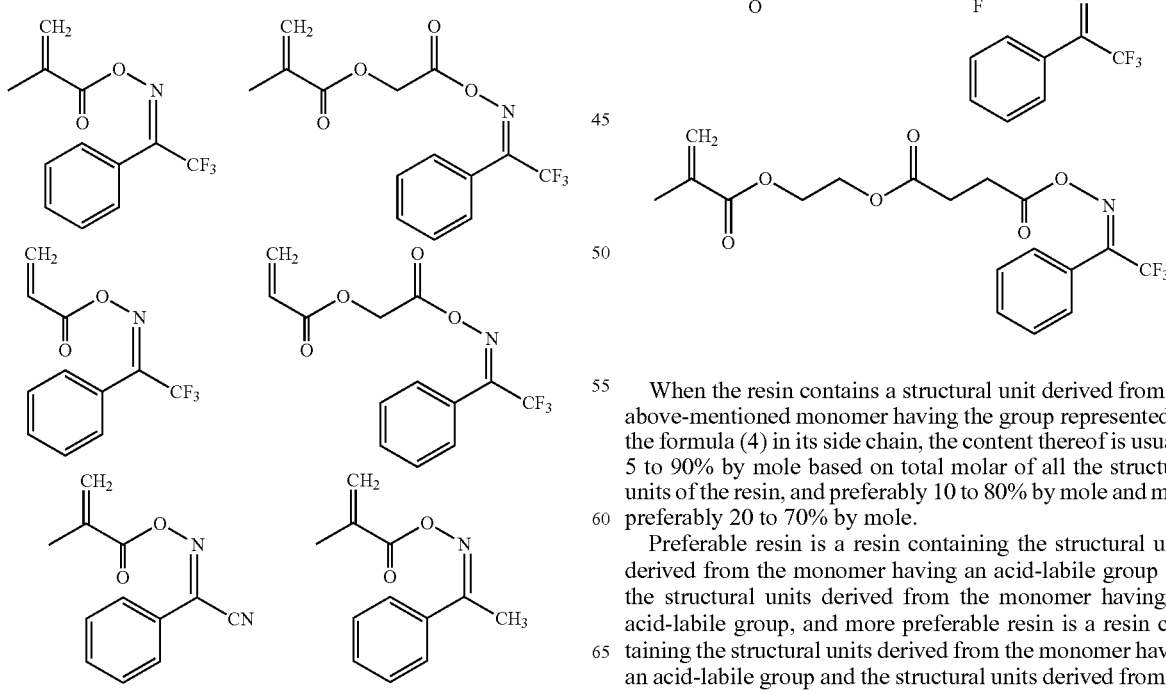

When the resin contains a structural unit derived from the above-mentioned monomer having the group represented by the formula (4) in its side chain, the content thereof is usually 5 to 90% by mole based on total molar of all the structural units of the resin, and preferably 10 to 80% by mole and more preferably 20 to 70% by mole.

Preferable resin is a resin containing the structural units derived from the monomer having an acid-labile group and the structural units derived from the monomer having no acid-labile group, and more preferable resin is a resin containing the structural units derived from the monomer having an acid-labile group and the structural units derived from the monomer having one or more hydroxyl groups and/or the monomer having a lactone ring. The monomer having an acid-labile group is preferably the monomer represented by the formula (a1-1) or the monomer represented by the formula (a1-2), and is more preferably the monomer represented by the formula (a1-1). The monomer having one or more hydroxyl groups is preferably the monomer represented by the formula (a2-1), and the monomer having a lactone ring is preferably the monomer represented by the formula (a3-1) or (a3-2).

The resin can be produced according to known polymerization methods such as radical polymerization.

The resin usually has 2,500 or more of the weight-average molecular weight, preferably 3,000 or more of the weight-average molecular weight, and more preferably 4,000 or more of the weight-average molecular weight. The resin usually has 50,000 or less of the weight-average molecular weight, preferably has 30,000 or less of the weight-average molecular weight, more preferably 10,000 or less of the weight-average molecular weight. The weight-average molecular weight can be measured with gel permeation chromatography.

The photoresist composition of the present invention usually includes 80% by mass or more and 99% by mass or less of the resin based on sum of solid component.

The photoresist composition of the present invention contains an acid generator.

The acid generator is a substance which is decomposed to generate an acid by applying a radiation such as a light, an electron beam or the like on the substance itself or on a photoresist composition containing the substance. The acid generated from the acid generator acts on the resin resulting in cleavage of the acid-labile group existing in the resin.

Examples of the acid generator include a nonionic acid generator, an ionic acid generator and the combination thereof. Examples of the nonionic acid generator include an organo-halogen compound, a sulfone compound such as a disulfone, a ketosulfone and a sulfonyldiazomethane, a sulfonate compound such as a 2-nitrobenzylsulfonate, an aromatic sulfonate, an oxime sulfonate, an N-sulfonyloxyimide, a sulfonyloxyketone and diazonaphthoquinone 4-sulfonate. Examples of the ionic acid generator include an onium salt compound such as a diazonium salt, a phosphonium salt, a sulfonium salt and an iodonium salt. Examples of the anion of the onium salt include a sulfonic acid anion, a sulfonylimide anion and a sulfonulmethide anion. The onium salt compound is preferable.

Other examples of the acid generator include acid generators described in JP 63-26653A, JP 55-164824A, JP 62-69263A, JP 63-146038 A, JP 63-163452 A, JP 62-153853 A, JP 63-146029 A, U.S. Pat. Nos. 3,779,778, 3,849,137, DE Patent No. 3914407 and EP Patent No. 126,712.

A fluorine-containing acid generator is preferable.

Preferable examples of the acid generator include a salt represented by the formula (B1):

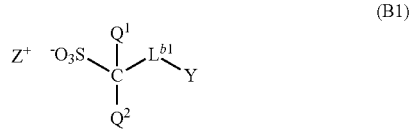

(B1)

wherein $Q^1$ and $Q^2$ each independently represent a fluorine atom or a C1-C6 perfluoroalkyl group, $L^{b1}$ represents a single bond or a C1-C17 saturated divalent hydrocarbon group which can have one or more substituents, and one or more —$CH_2$— in the saturated divalent hydrocarbon group can be replaced by —O— or —CO—, Y represents a C1-C18 aliphatic hydrocarbon group or a C3-C18 saturated cyclic hydrocarbon group, and the aliphatic hydrocarbon group and the saturated cyclic hydrocarbon group can have one or more substituents, and one or more —$CH_2$— in the aliphatic hydrocarbon group and the saturated cyclic hydrocarbon group can be replaced by —O—, —CO— or —$SO_2$—, and $Z^+$ represents an organic cation.

Examples of the C1-C6 perfluoroalkyl group include a trifluoromethyl group, a pentafluoroethyl group, a heptafluoropropyl group, a nonafluorobutyl group, an undecafluoropentyl group and a tridecafluorohexyl group, and a trifluoromethyl group is preferable. $Q^1$ and $Q^2$ each independently preferably represent a fluorine atom or a trifluoromethyl group, and $Q^1$ and $Q^2$ are more preferably fluorine atoms.

Examples of the C1-C17 saturated divalent hydrocarbon group include a C1-C17 alkandiyl group and a divalent group having an alicyclic divalent hydrocarbon group. Examples of the alkanediyl group include a linear alkanediyl group such as a methylene group, an ethylene group, a propane-1,3-diyl group, a butane-1,4-diyl group, a pentane-1,5-diyl, a hexane-1,6-diyl group, a heptane-1,7-diyl group, an octane-1,8-diyl group, a nonane-1,9-diyl group, a decane-1,10-diyl group, an undecane-1,1'-diyl group, a dodecane-1,12-diyl group, a tridecane-1,13-diyl group, a tetradecane-1,14-diyl group, a pentadecane-1,15-diyl group, a hexadecane-1,16-diyl group and a heptadecane-1,17-diyl group, a branched chain alkanediyl group formed by replacing one or more hydrogen atom of the above-mentioned linear alkanediyl group by a C1-C4 alkyl group, and a divalent group having an alicyclic divalent hydrocarbon group such as the following groups represented by the formulae ($X^1$-A) to ($X^1$-C):

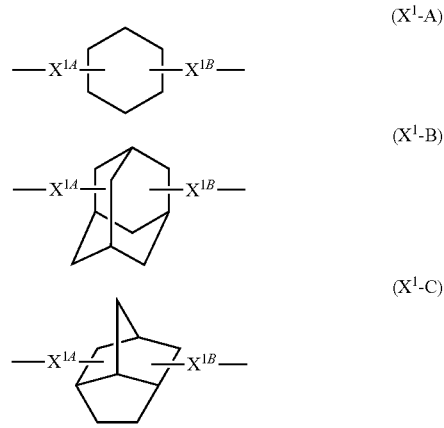

wherein $X^{1A}$ and $X^{1B}$ independently each represent a C1-C6 alkylene group which can have one or more substituents, with the proviso that total carbon number of the group represented by the formula ($X^1$-A), ($X^1$-B) or ($X^1$-C) is 1 to 17.

One or more —$CH_2$— in the C1-C6 alkylene group can be replaced by —O— or —CO—.

Examples of the C1-C17 saturated hydrocarbon group in which one or more —$CH_2$— are replaced by —O— or —CO— include *—CO—O-$L^{b2}$-, *—CO—O-$L^{b4}$-CO—O-$L^{b3}$-, *-$L^{b5}$-O—CO—, *-$L^{b7}$-O-$L^{b6}$-, *—CO—O-$L^{b8}$-O—, and *—CO—O-$L^{b10}$-O-$L^{b9}$-CO—O—, wherein $L^{b2}$ represents a single bond or a C1-C15 alkanediyl group, $L^{b3}$ represents a single bond or a C1-C12 alkanediyl group, $L^{b4}$ represents a single bond or a C1-C13 alkanediyl group, with proviso that total carbon number of $L^{b3}$ and $L^{b4}$ is 1 to 13, $L^{b5}$ represents a C1-C15 alkanediyl group, $L^{b6}$ represents a C1-C15 alkanediyl group, $L^{b7}$ represents a C1-C15 alkanediyl group, with proviso that total carbon number of $L^{b6}$ and $L^{b7}$ is 1 to 16, $L^{b8}$ represents a C1-C14 alkanediyl group, $L^{b9}$ represents a C1-C11 alkanediyl group, $L^{b10}$ represents a C1-C11 alkanediyl group, with proviso that total carbon number of $L^{b9}$ and $L^{b10}$ is 1 to 12, and * represents a binding position to —$C(Q^1)(Q^2)$-. Among them, preferred are *—CO—O-$L^{b2}$-, *—CO—O-$L^{b4}$-CO—O-$L^{b3}$-, *-$L^{b5}$-O—CO— and *$L^{b7}$-O-$L^{b6}$-, and more preferred are *—CO—O-$L^{b2}$ and *—CO—O-$L^{b4}$-CO—O-$L^{b3}$-, and much more preferred is *—CO—O-$L^{b2}$-, and especially preferred is *—CO—O-$L^{b2}$- in which $L^{b2}$ is a single bond or —$CH_2$—.

Examples of *—CO—O-$L^{b2}$- include *—CO—O— and *—CO—O—$CH_2$. Examples of *—CO—O-$L^{b4}$-CO—O-$L^{b3}$- include *—CO—O—$CH_2$—CO—O—, *—CO—O—$(CH_2)_2$—CO—O—, *—CO—O—$(CH_2)_3$—CO—O—, *—CO—O—$(CH_2)_4$—CO—O—; *—CO—O—$(CH_2)_6$—CO—O—, *—CO—O—$(CH_2)_8$—CO—O—, *—CO—O—$CH_2$—$CH(CH_3)$—CO—O— and *—CO—O—$CH_2$—$C(CH_3)_2$—CO—O—. Examples of *-$L^{b5}$-O—CO— include *—$CH_2$—O—CO—, *—$(CH_2)_2$—O—CO—, *—$(CH_2)_3$—O—CO, *—$(CH_2)_4$—O—CO—, *—$(CH_2)_6$—O—CO— and *—$(CH_2)_8$—O—CO—. Examples of *-$L^{b7}$-O-$L^{b6}$- include *—$CH_2$—O—$CH_2$—. Examples of *—CO—O-$L^{b8}$-O— include *—CO—O—$CH_2$—O—, *—CO—O—$(CH_2)_2$—O—, *—CO—O—$(CH_2)_3$—O—, *—CO—O—$(CH_2)_4$—O— and *—CO—O—$(CH_2)_6$—O—. Examples of *—CO—O-$L^{b10}$-O-$L^{b9}$-CO—O— include the followings.

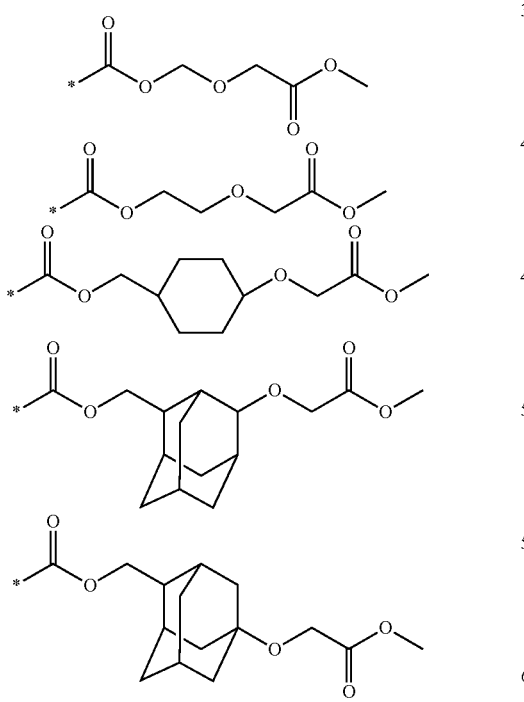

Examples of the substituent in Y include a halogen atom, a hydroxyl group, an oxo group, a glycidyloxy group, a C2-C4 acyl group, a C1-C12 alkoxy group, a C2-C7 alkoxycarbonyl group, a C1-C12 aliphatic hydrocarbon group, a C1-C12 hydroxy-containing aliphatic hydrocarbon group, a C3-C16 saturated cyclic hydrocarbon group, a C6-C18 aromatic hydrocarbon group, a C7-C21 aralkyl group and —$(CH_2)_{j2}$—O—CO—$R^{b1}$— in which $R^{b1}$ represents a C1-C16 aliphatic hydrocarbon group, a C3-C16 saturated cyclic hydrocarbon group or a C6-C18 aromatic hydrocarbon group and j2 represents an integer of 0 to 4. Examples of the halogen atom include a fluorine atom, a chlorine atom, a bromine atom and an iodine atom. Examples of the acyl group include an acetyl group and a propionyl group, and examples of the alkoxy group include a methoxy group, an ethoxy group, a propoxy group, an isopropoxy group and a butoxy group.

Examples of the alkoxycarbonyl group include a methoxycarbonyl group, an ethoxycarbonyl group, a propoxycarbonyl group, an isopropoxycarbonyl group and a butoxycarbonyl group. Examples of the aliphatic hydrocarbon group include the same as described above. Examples of the hydroxyl-containing aliphatic hydrocarbon group include a hydroxymethyl group. Examples of the C3-C16 saturated cyclic hydrocarbon group include the same as described above, and examples of the aromatic hydrocarbon group include a phenyl group, a naphthyl group, an anthryl group, a p-methylphenyl group, a p-tert-butylphenyl group and a p-adamantylphenyl group. Examples of the aralkyl group include a benzyl group, a phenethyl group, a phenylpropyl group, a trityl group, a naphthylmethyl group and a naphthylethyl group.

Examples of the C1-C18 aliphatic hydrocarbon group represented by Y include a methyl group, an ethyl group, a propyl group, an isopropyl group, a butyl group, an isobutyl group, a sec-butyl group, a tert-butyl group, a pentyl group, a neopentyl group, a 1-methylbutyl group, a 2-methylbutyl group, a 1,2-dimethylpropyl group, a 1-ethylpropyl group, a hexyl group, a 1-methylpentyl group, a heptyl group, an octyl group, a 2-ethylhexyl group, a nonyl group, a decyl group, an undecyl group and a dodecyl group, and a C1-C6 alkyl group is preferable. Examples of the C3-C18 saturated cyclic hydrocarbon group represented by Y include the groups represented by the formulae (Y1) to (Y26):

(Y1)

(Y2)

(Y3)

(Y4)

(Y5)

(Y6)

(Y7) 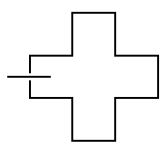
(Y8) 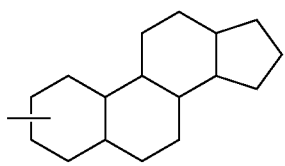
(Y9) 
(Y10) 
(Y11) 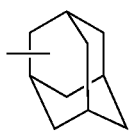
(Y12) 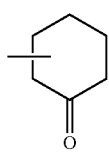
(Y13) 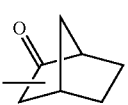
(Y14) 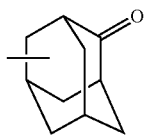
(Y15) 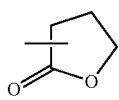
(Y16) 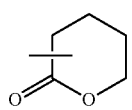
(Y17) 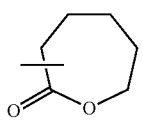
(Y18) 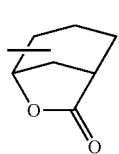
(Y19) 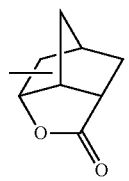
(Y20) 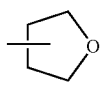
(Y21) 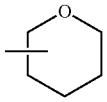
(Y22) 
(Y23) 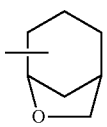
(Y24) 
(Y25) 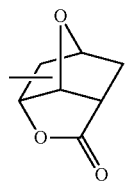
(Y26) 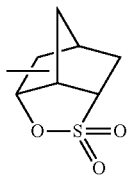
Among them, preferred are the groups represented by the formulae (Y1) to (Y19), and more preferred are the groups represented by the formulae (Y11), (Y14), (Y15) and (Y19). The groups represented by the formulae (Y11) and (Y14) are especially preferable.
Examples of Y having one or more substituents include the followings:
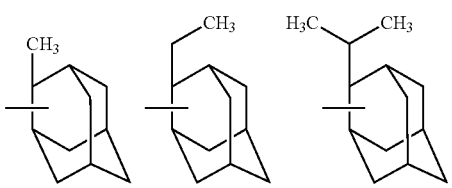

-continued

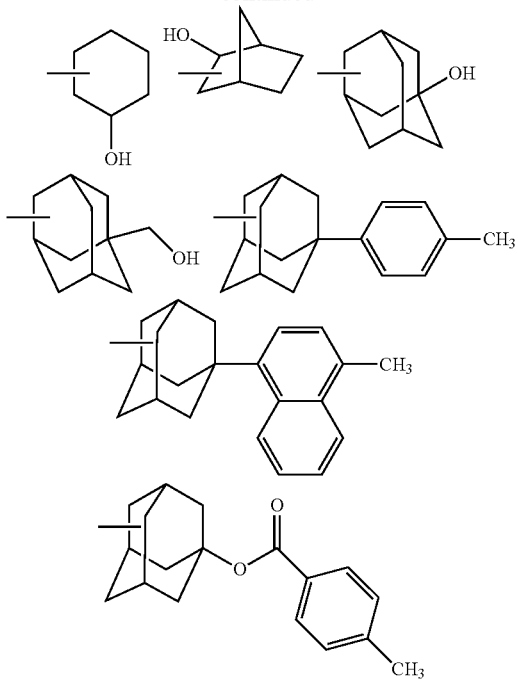

Y is preferably an adamantyl group which can have one or more substituents, and is more preferably an adamantyl group or an hydroxyadamantyl group.

Among the sulfonic acid anions of the acid generator represented by the formula (B1), preferred is a sulfonic acid anion having the group represented by the above-mentioned formula (b1-1), and more preferred are anions represented by the formulae (b1-1-1) to (b1-1-9).

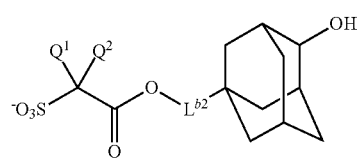 (b1-1-1)

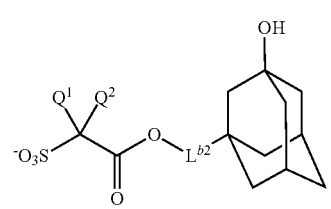 (b1-1-2)

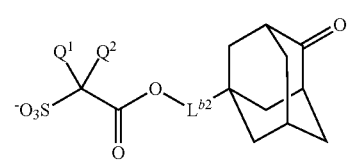 (b1-1-3)

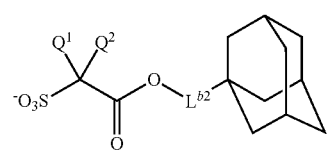 (b1-1-4)

-continued

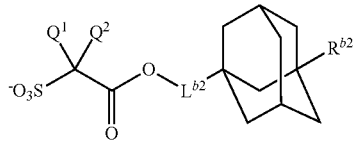 (b-1-1-5)

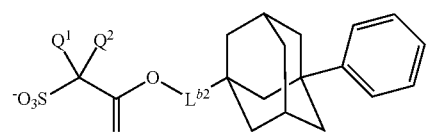 (b-1-1-6)

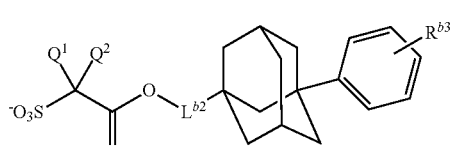 (b-1-1-7)

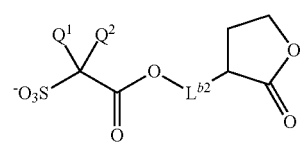 (b-1-1-8)

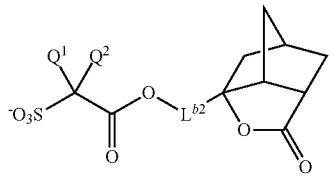 (b-1-1-9)

wherein $Q^1$, $Q^2$ and $L^{b2}$ are the same as defined above, and $R^{b2}$ and $R^{b3}$ each independently represent the same as the substituent of the aliphatic hydrocarbon group or the alicyclic hydrocarbon group represented by Y. It is preferred that $R^{b2}$ and $R^{b3}$ each independently represent a C1-C4 aliphatic hydrocarbon group or a hydroxyl group, and it is more preferred that $R^{b2}$ and $R^{b3}$ each independently represent a methyl group or a hydroxyl group.

Specific examples of the sulfonic acid anion include the followings.

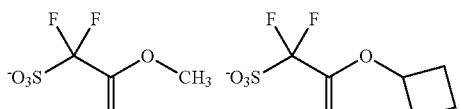

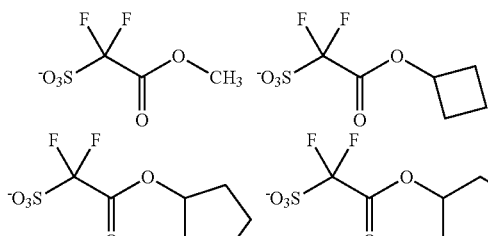

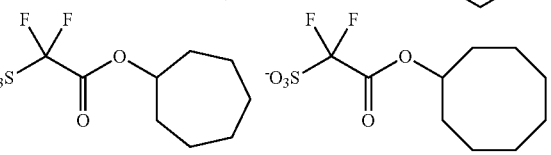

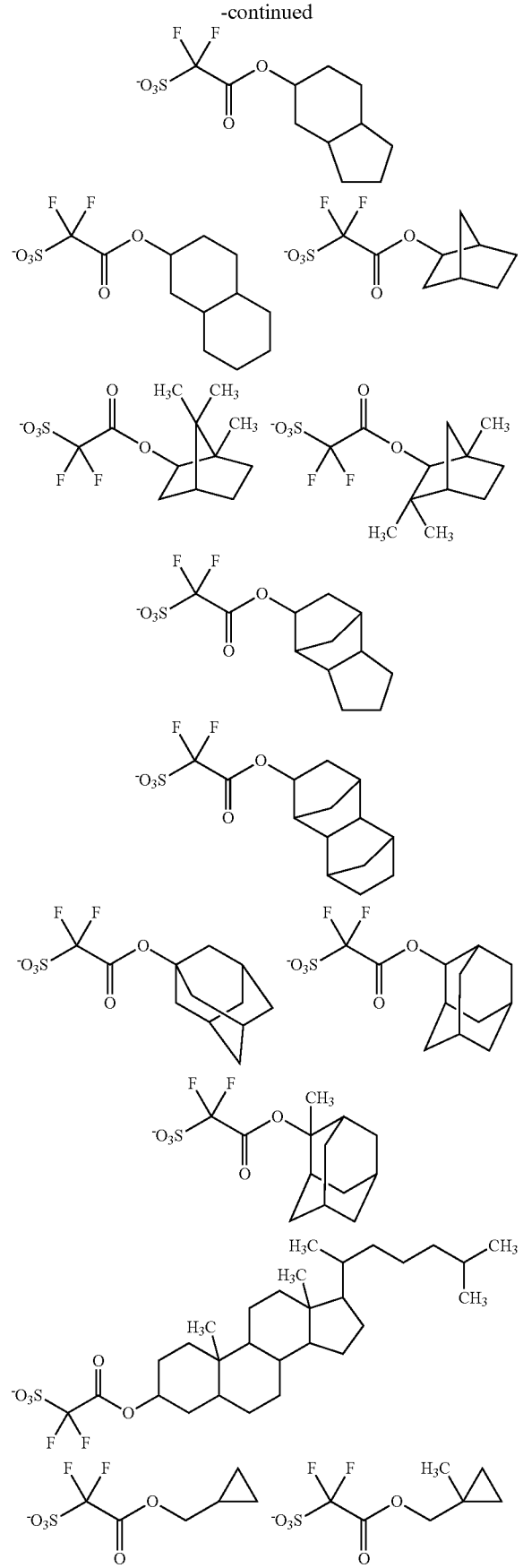
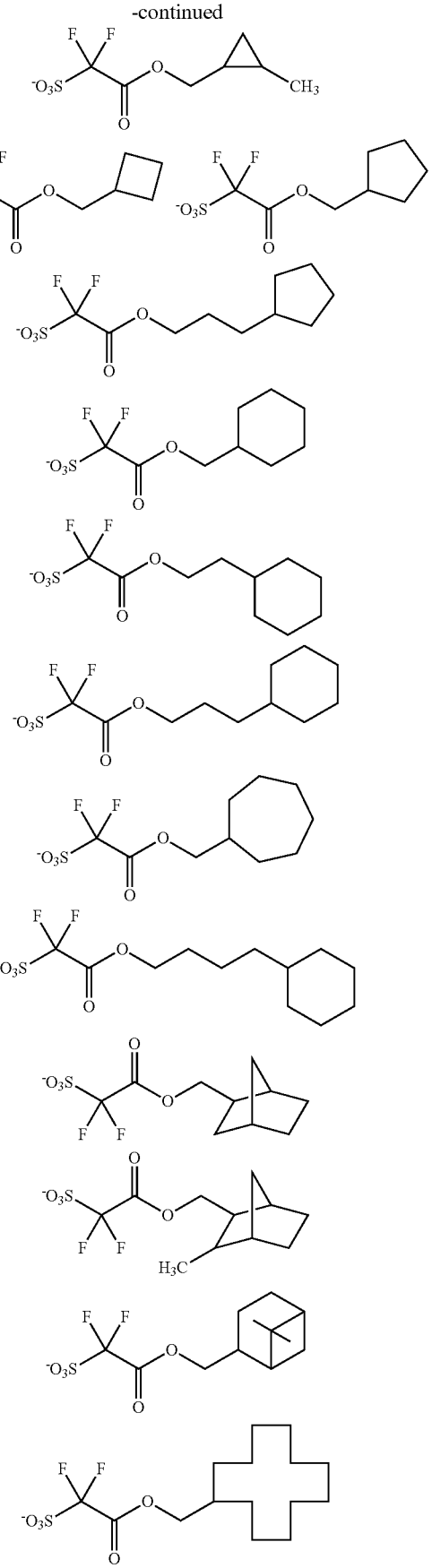

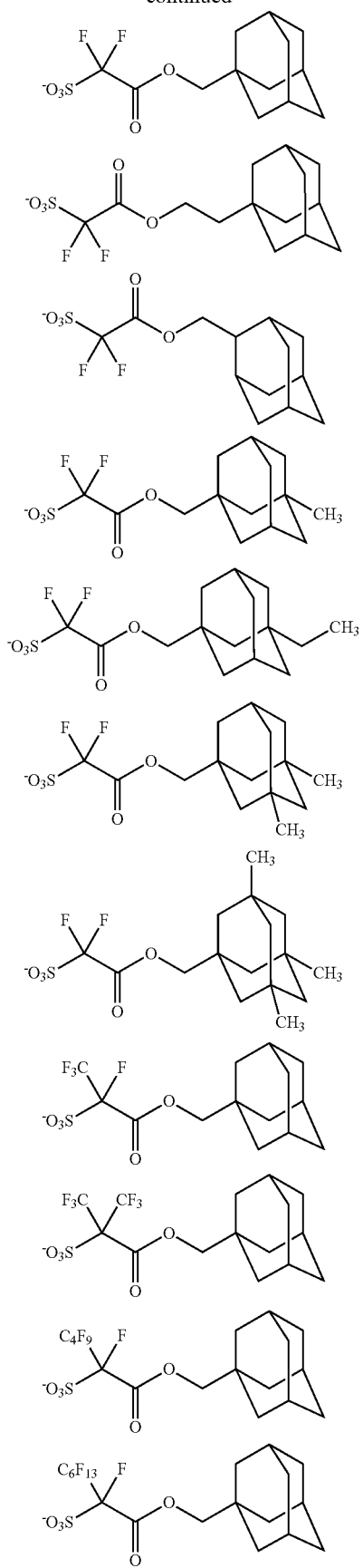
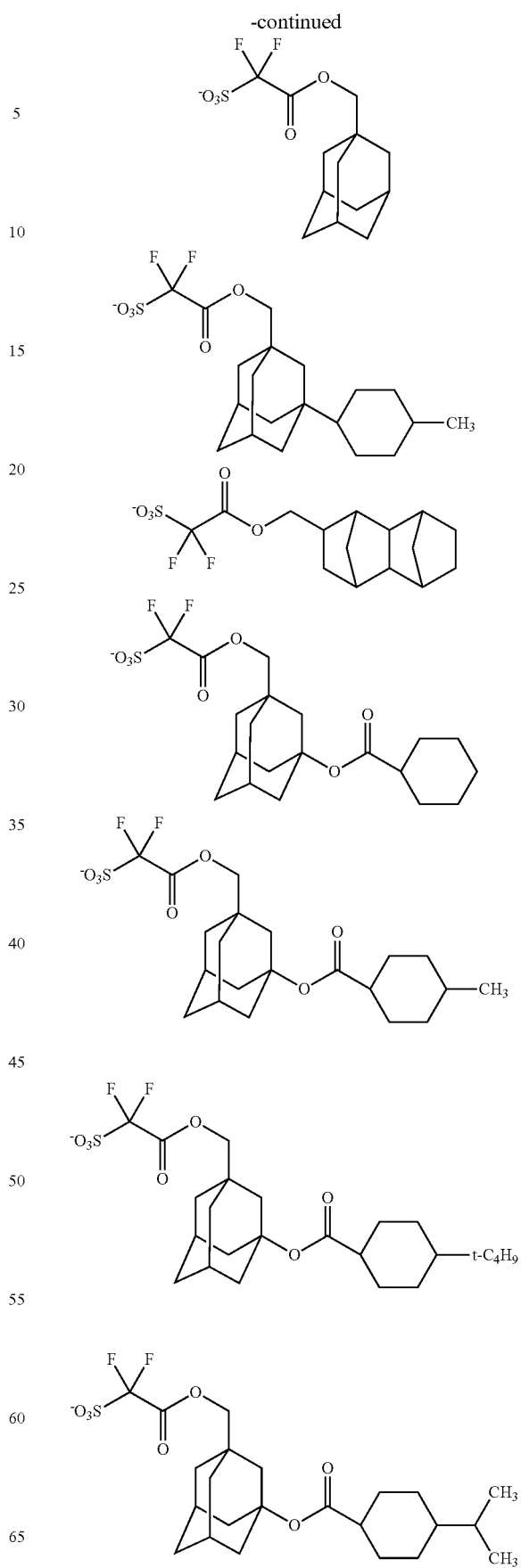

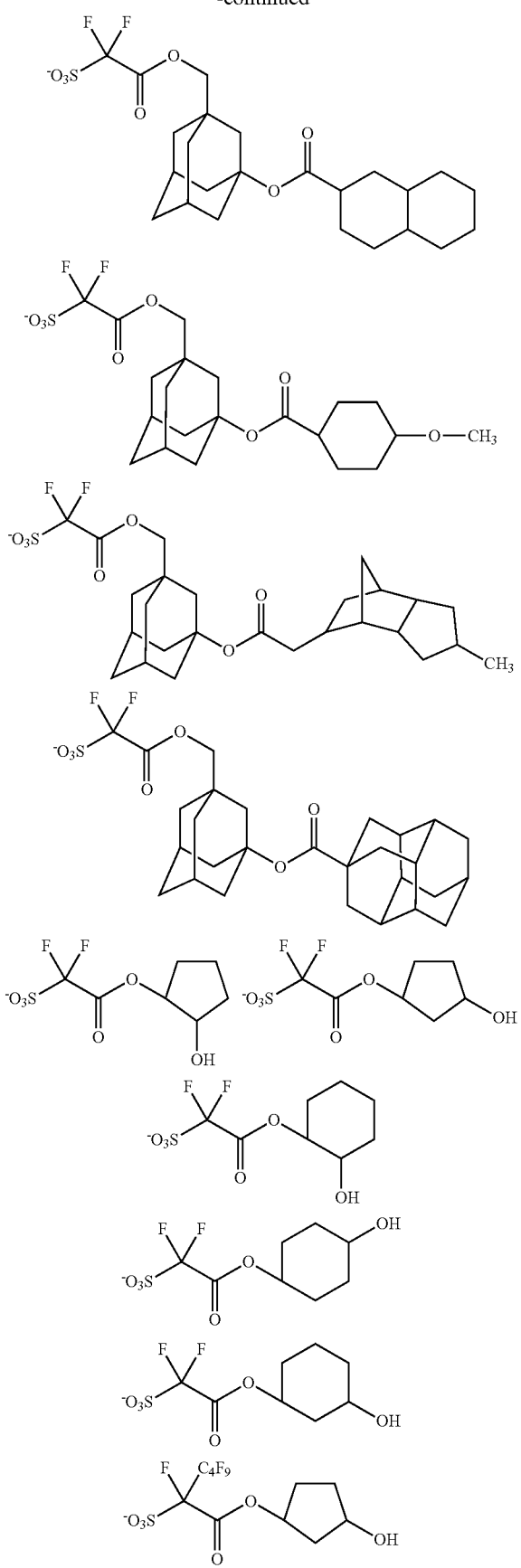
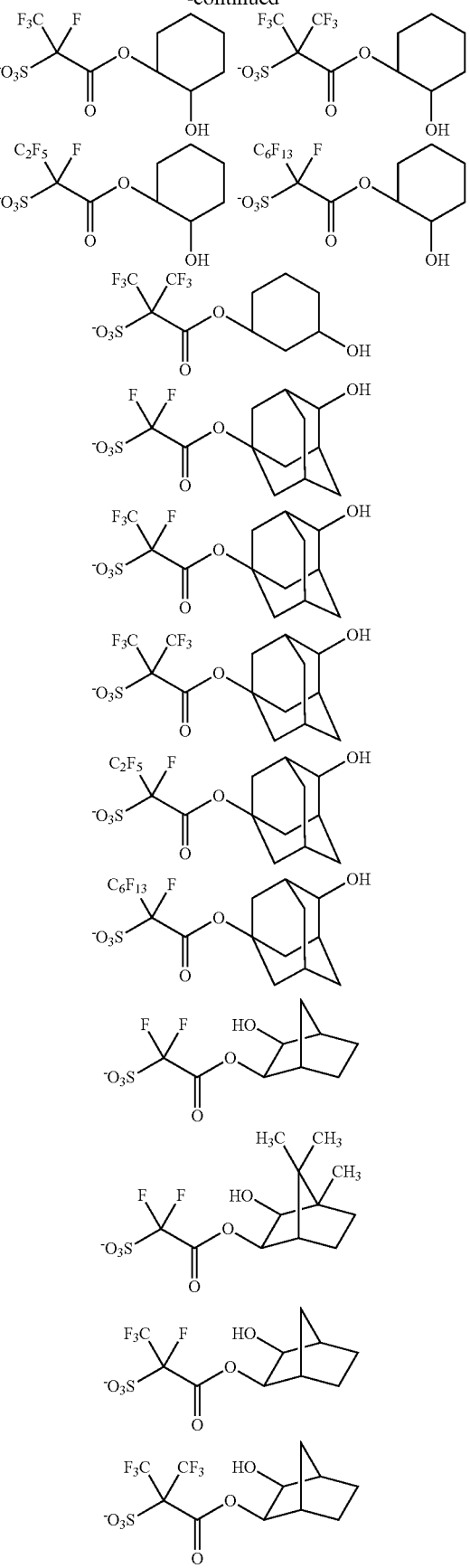

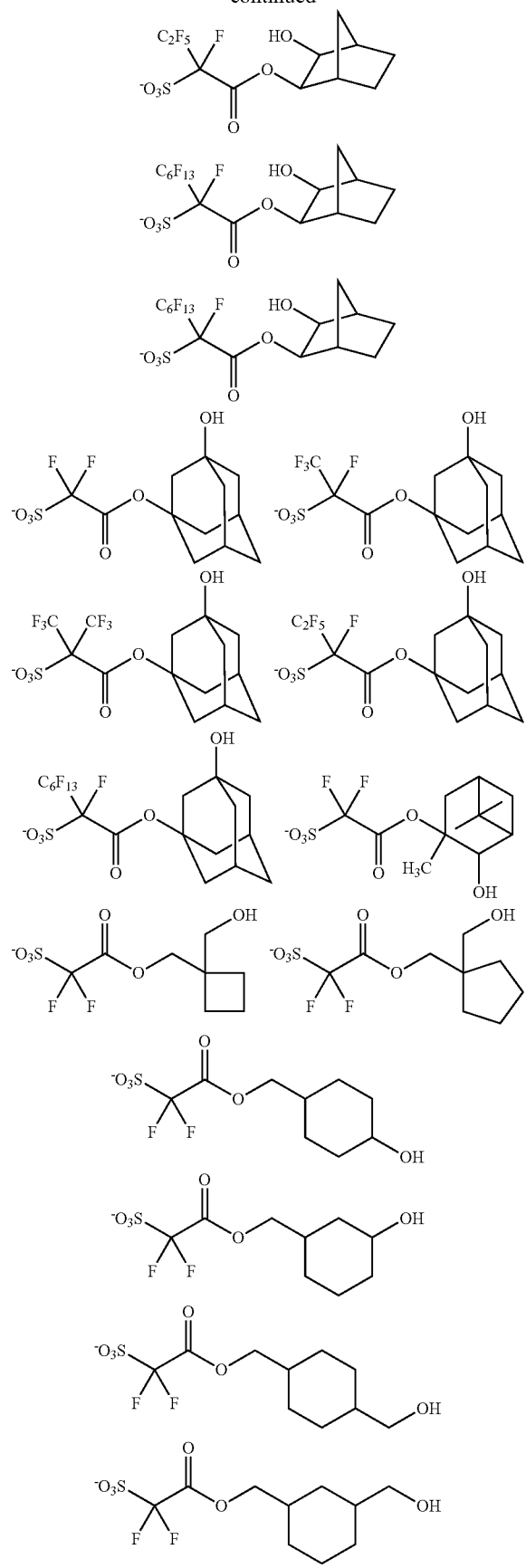
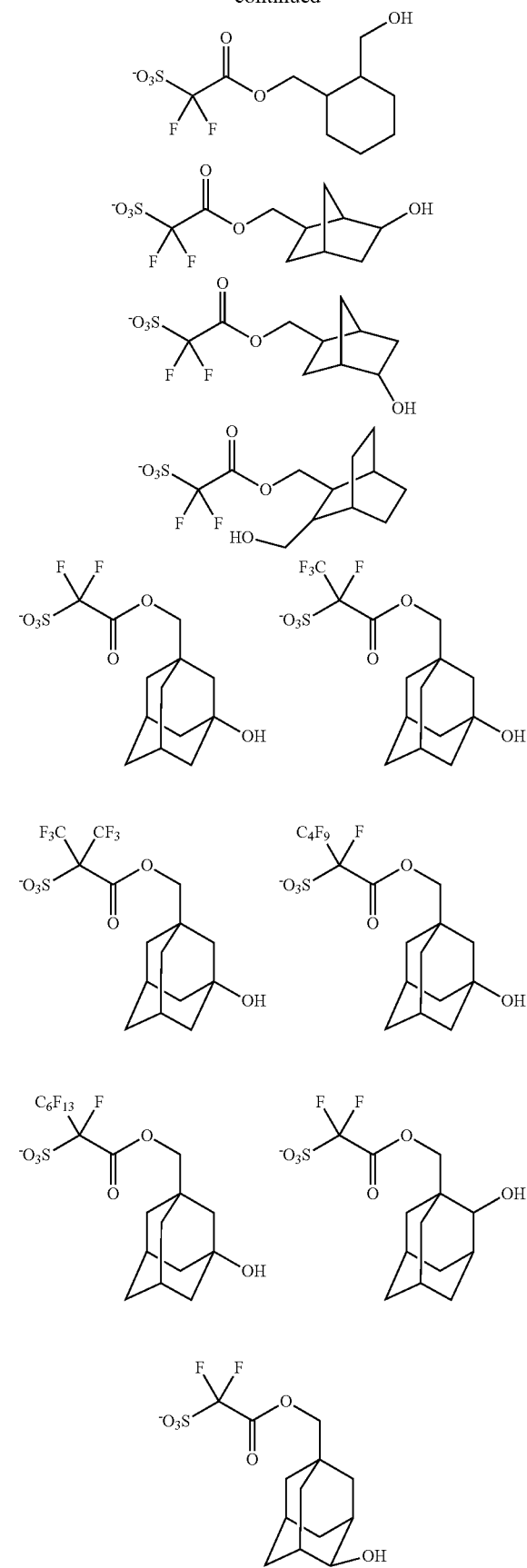

119
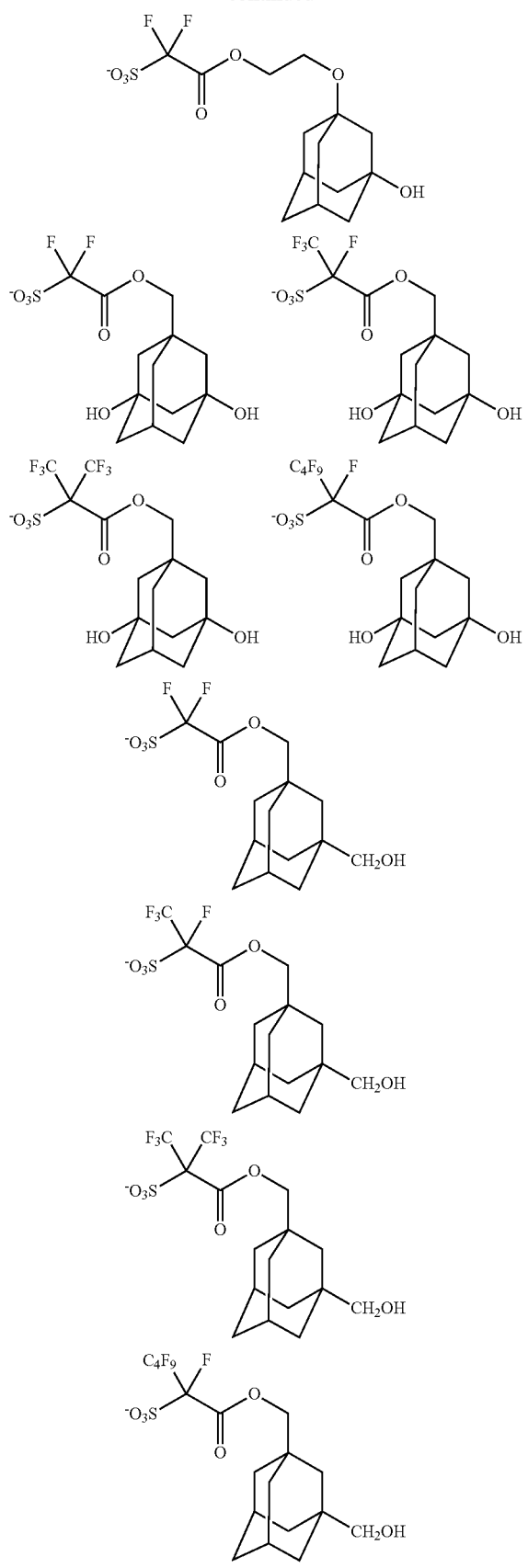
120
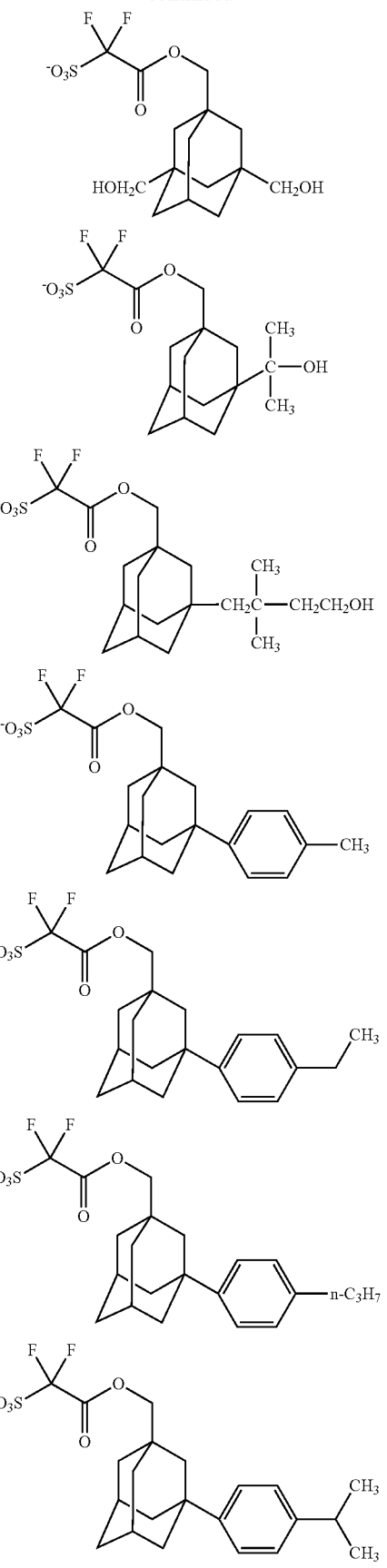

121
-continued
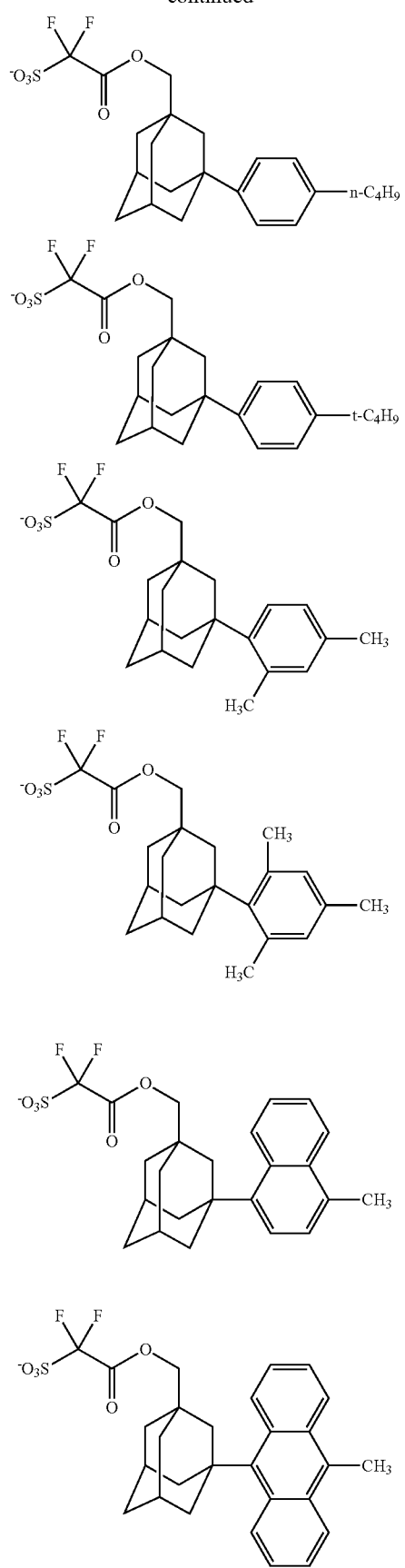
122
-continued
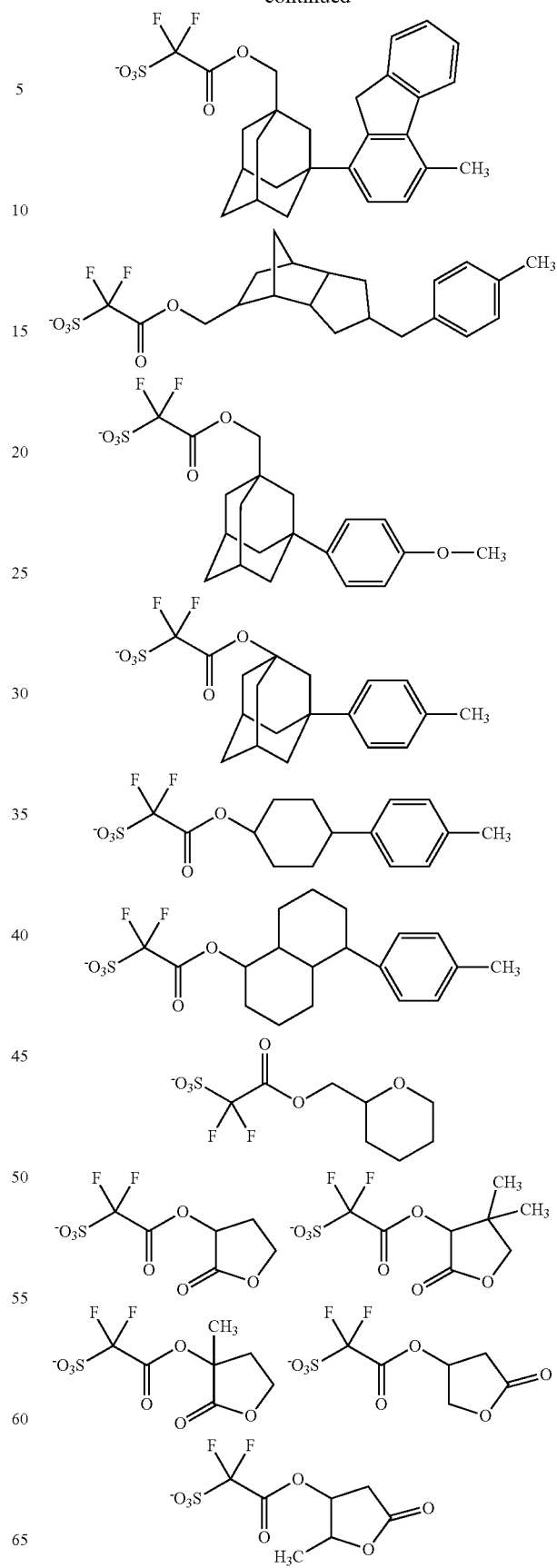

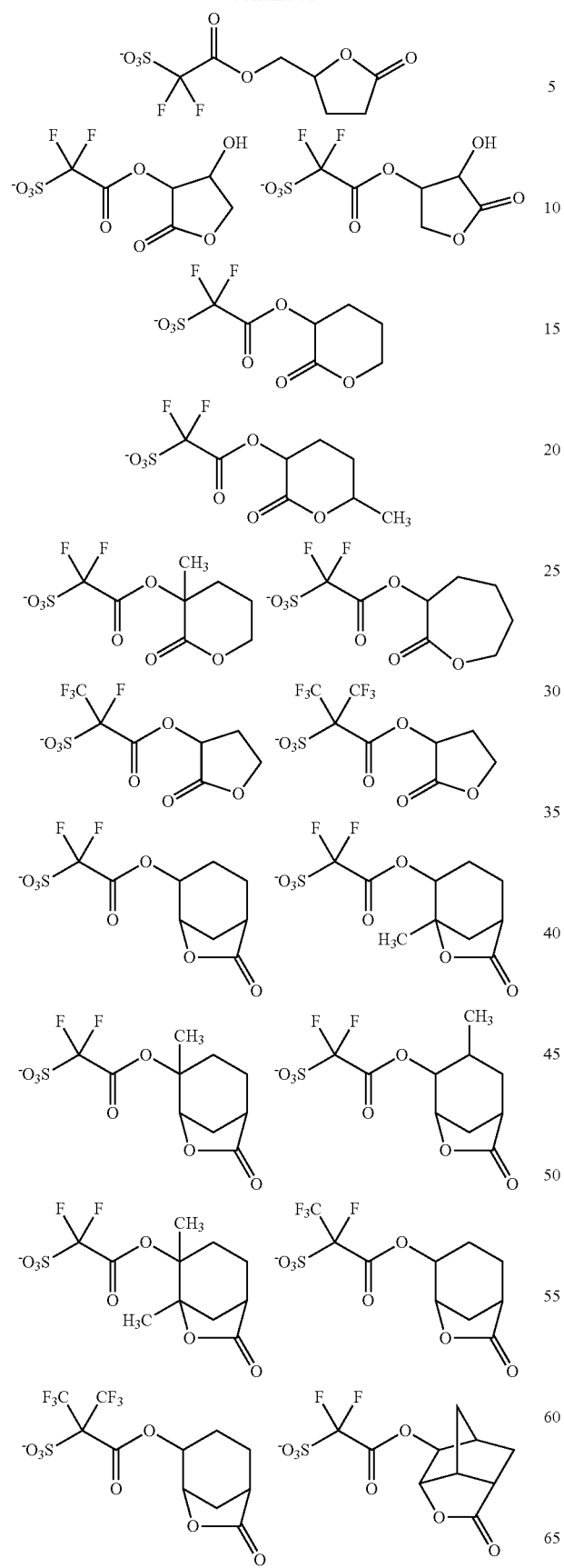
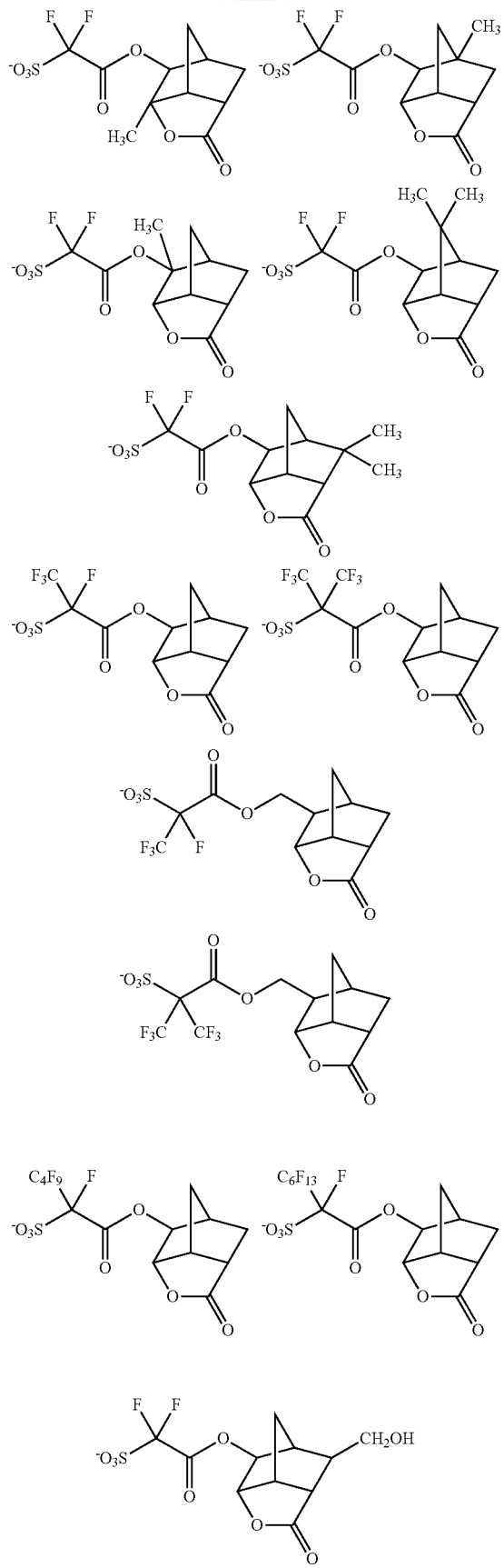

125
-continued
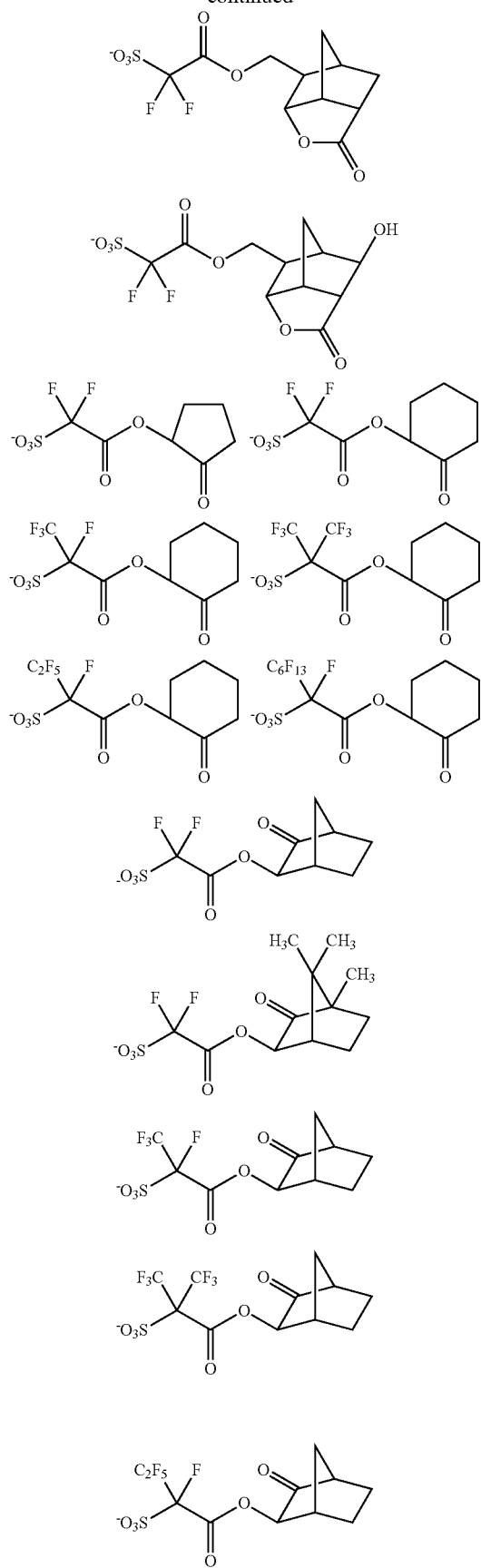
126
-continued
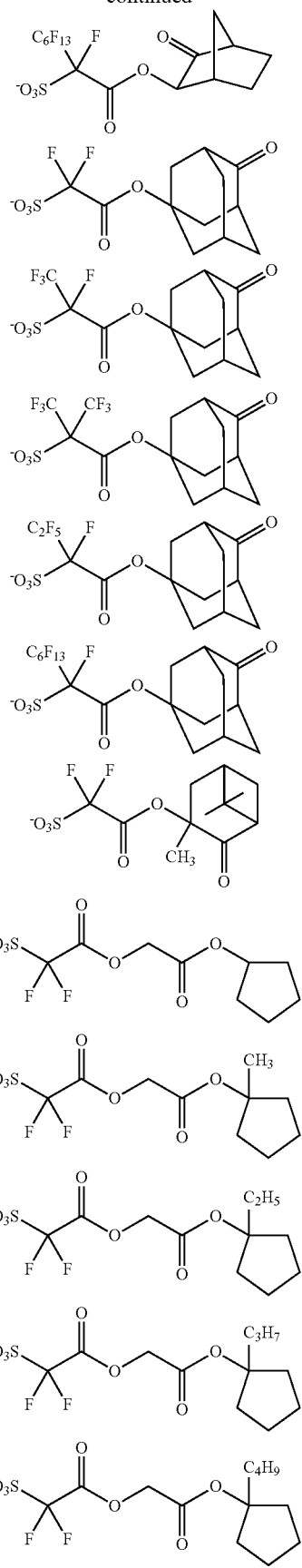

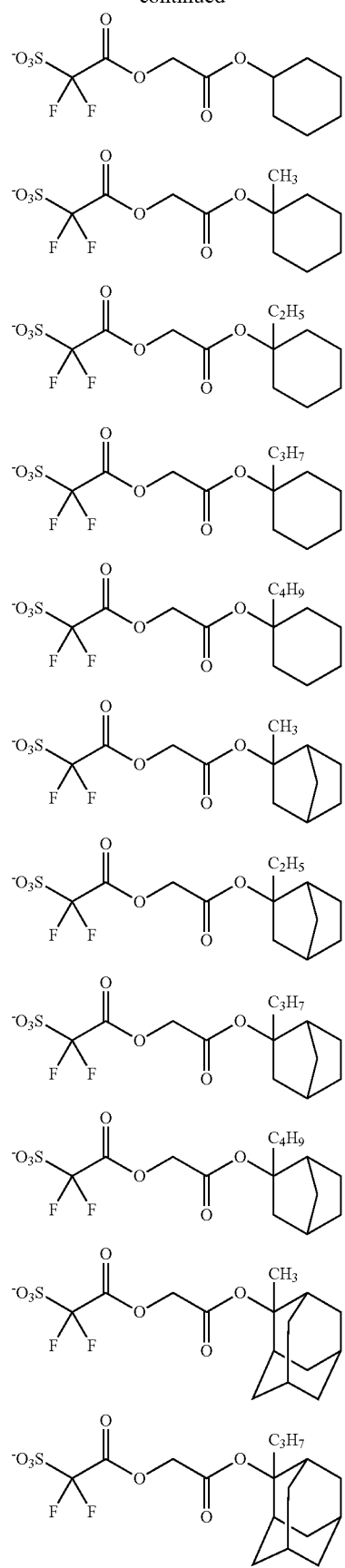
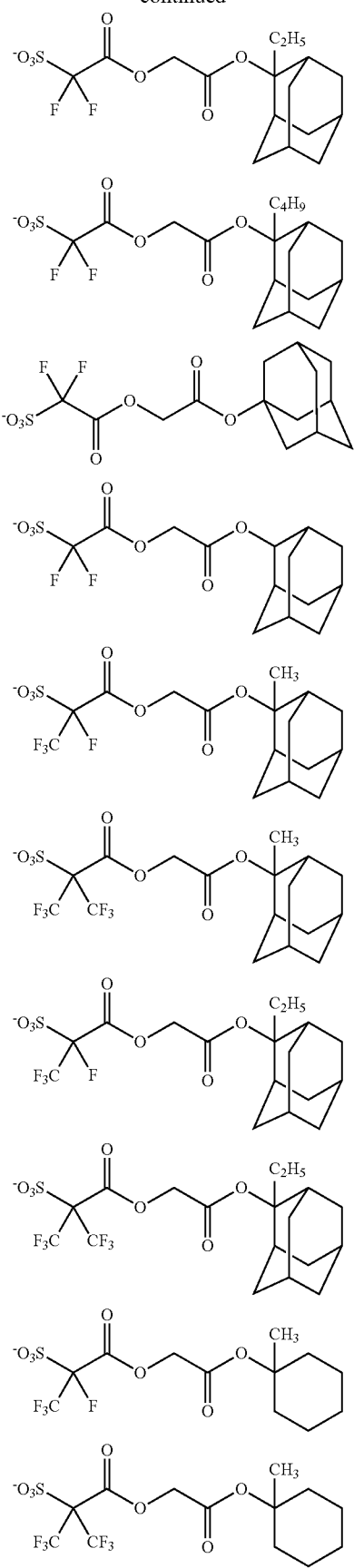

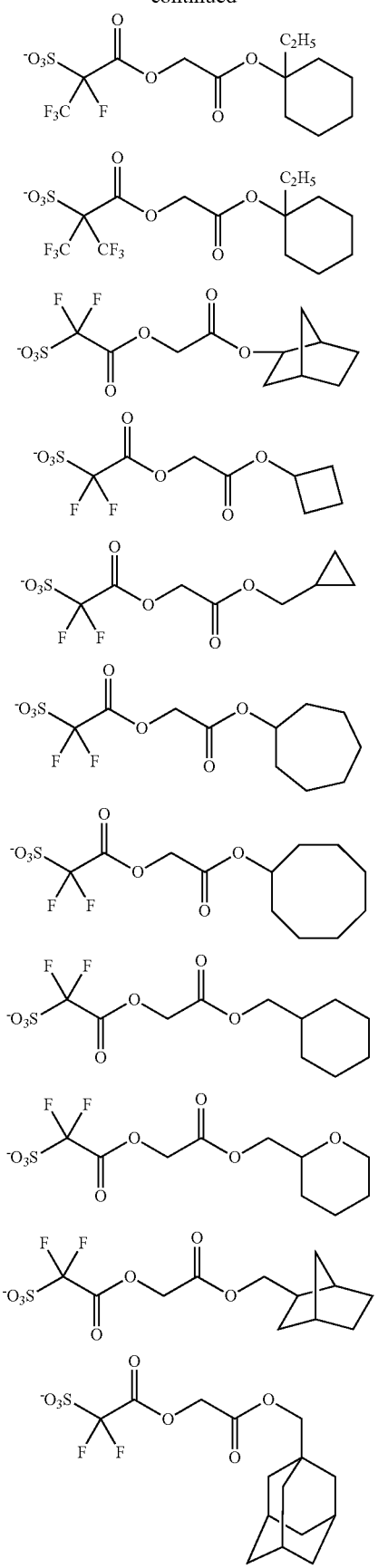
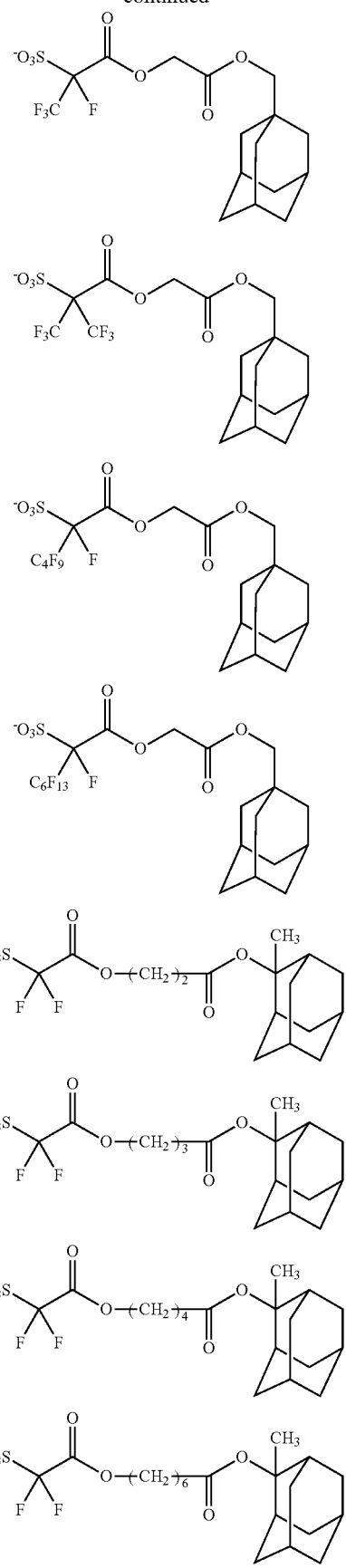

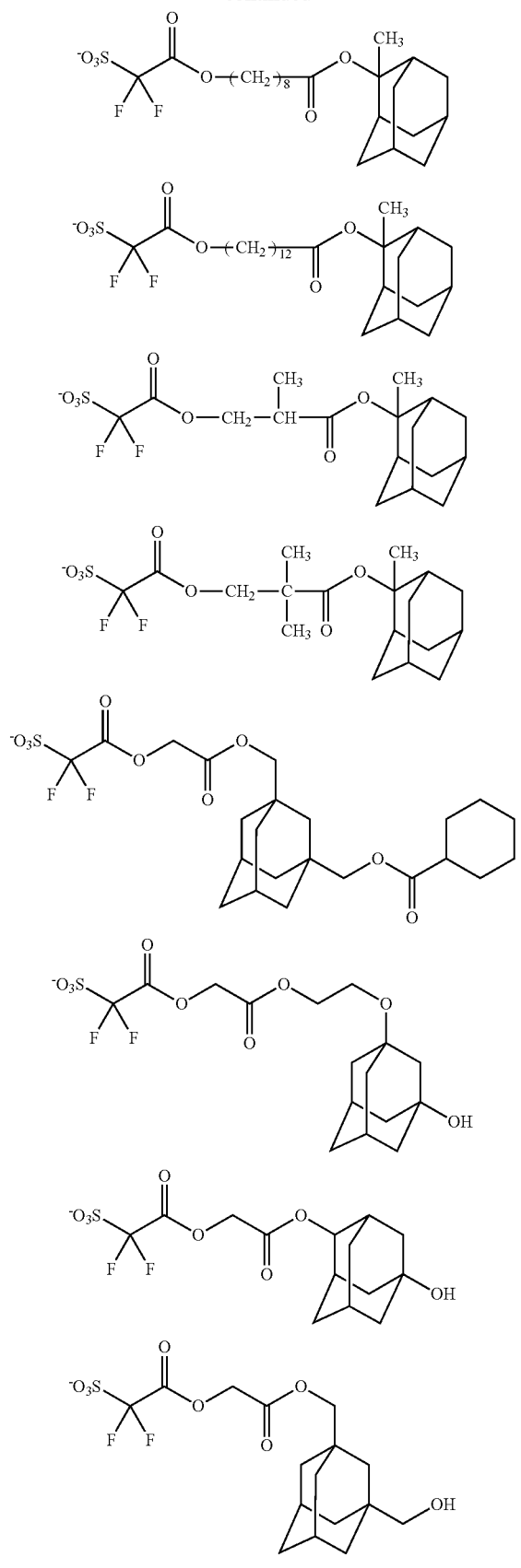
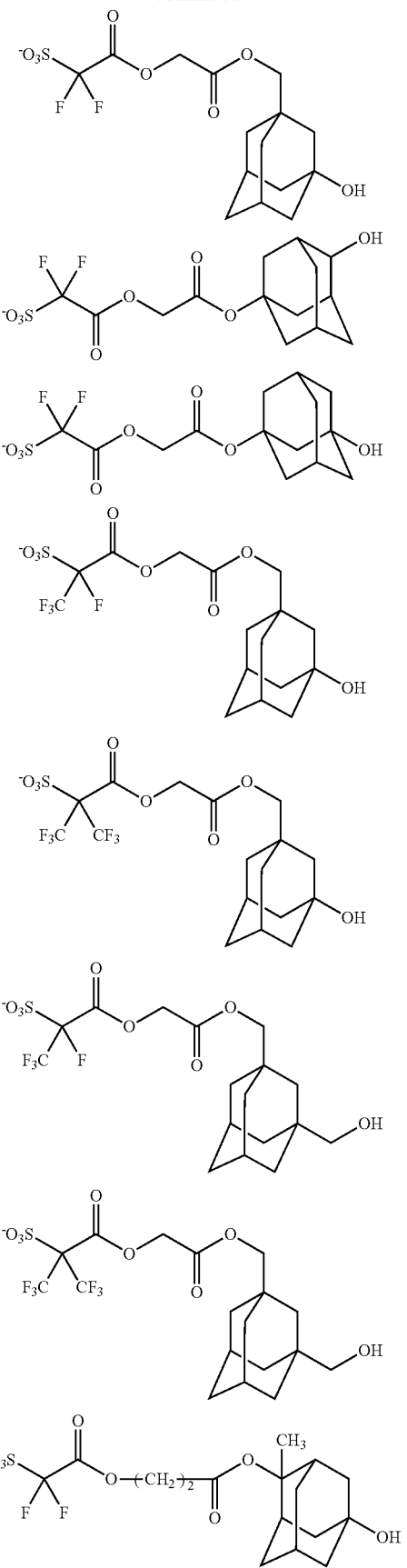

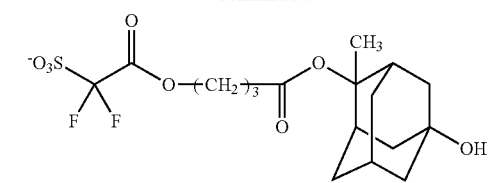
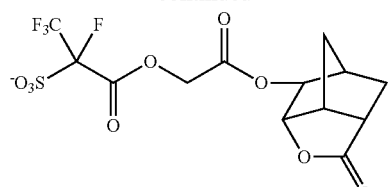
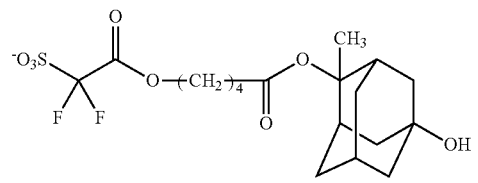
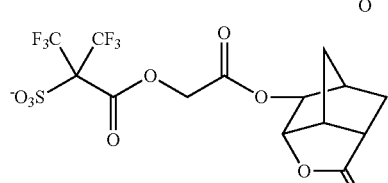
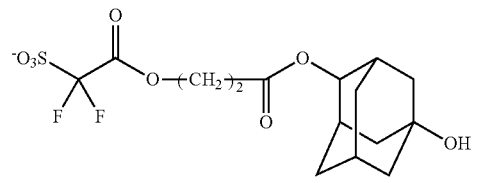
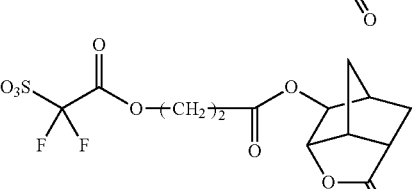
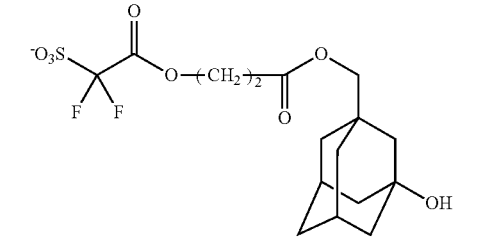
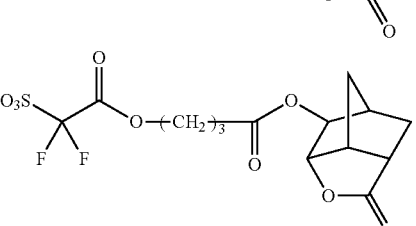
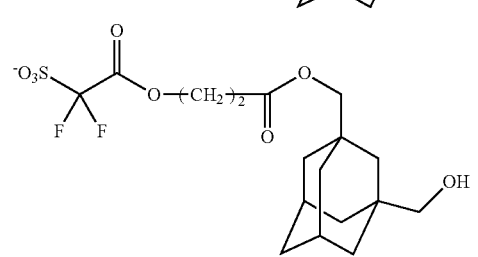
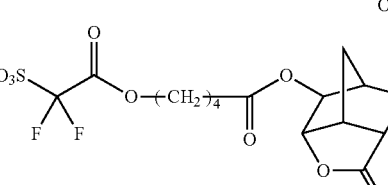
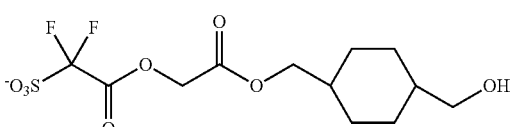
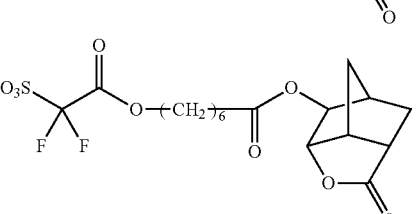
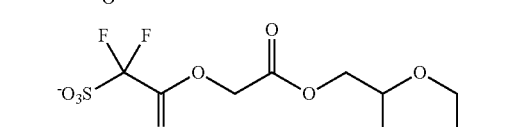
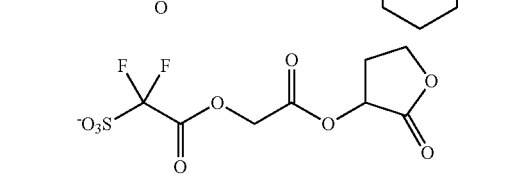
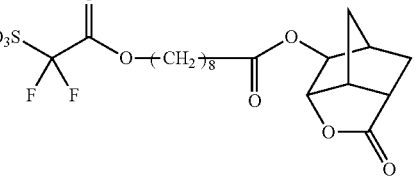
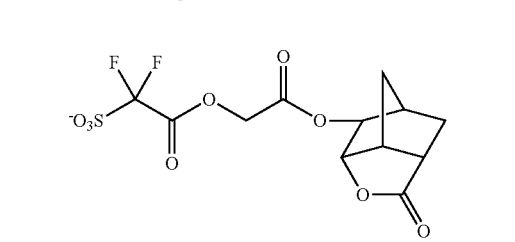
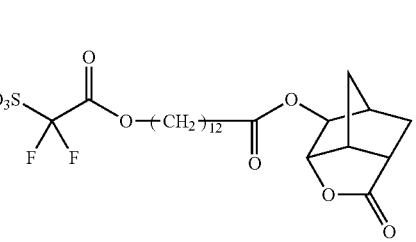

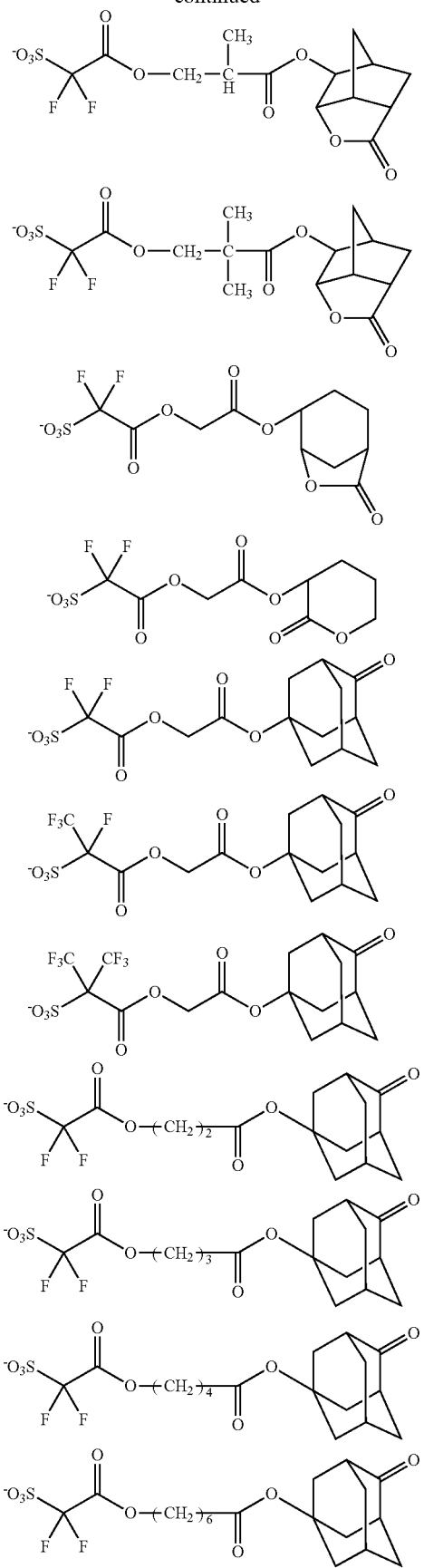
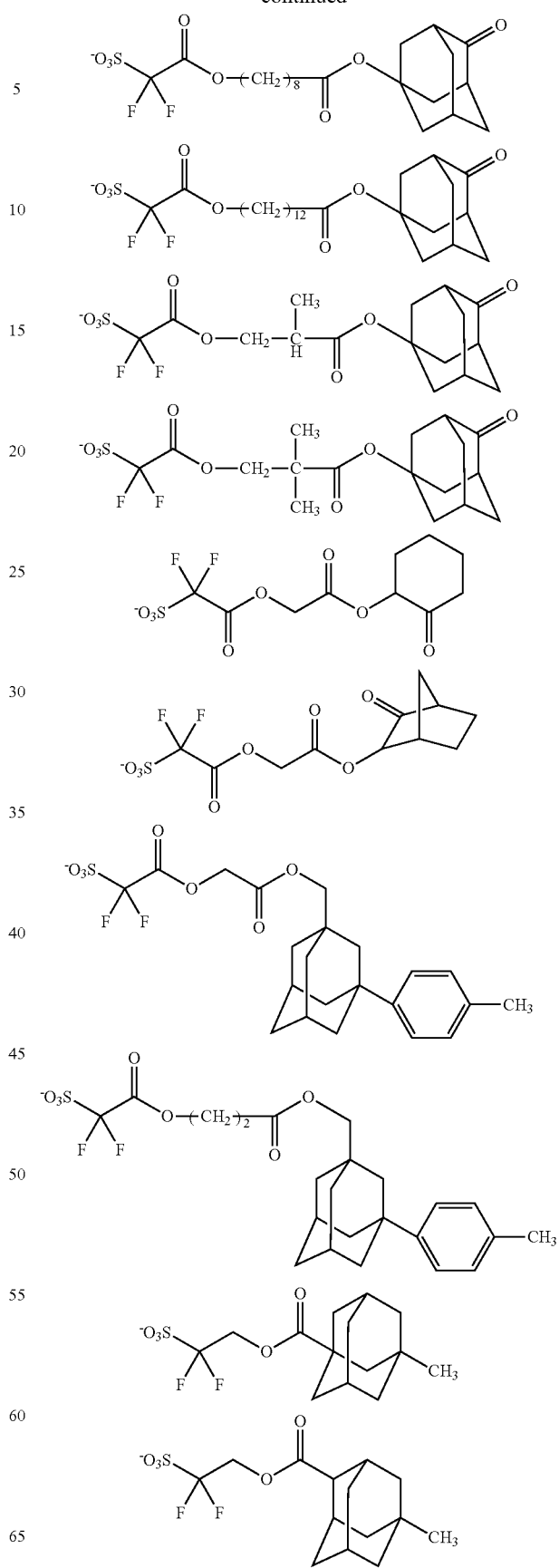

137
-continued
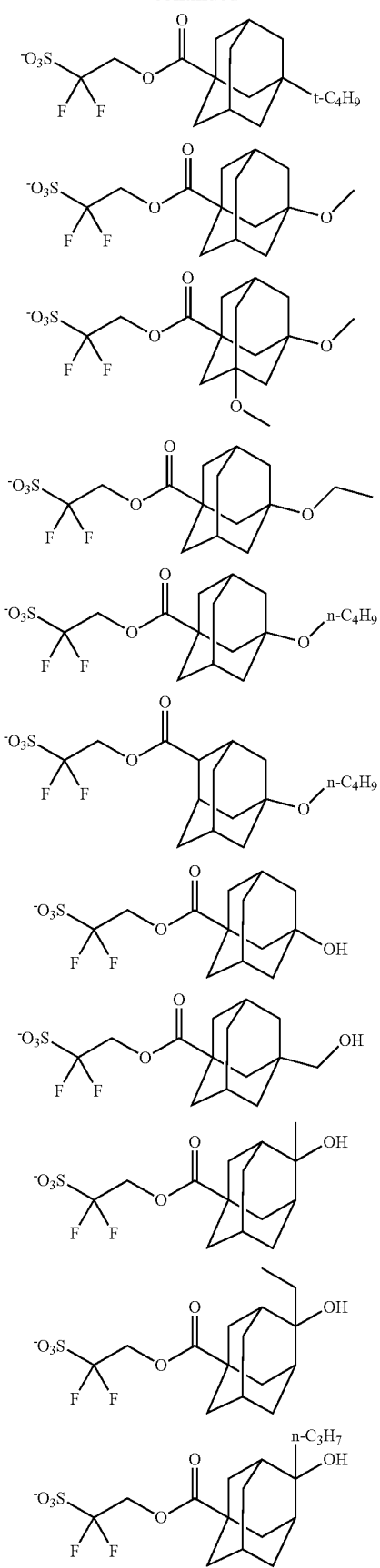
138
-continued
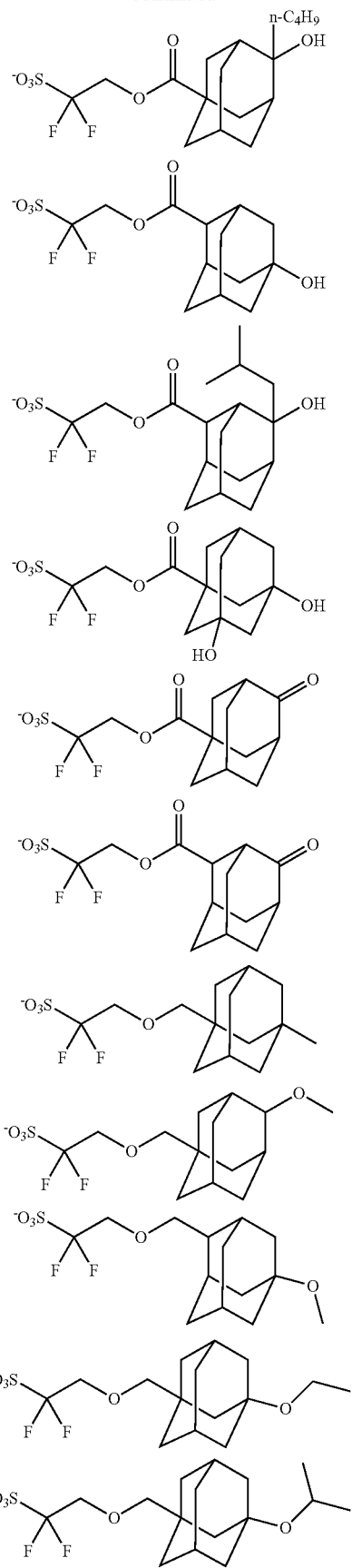

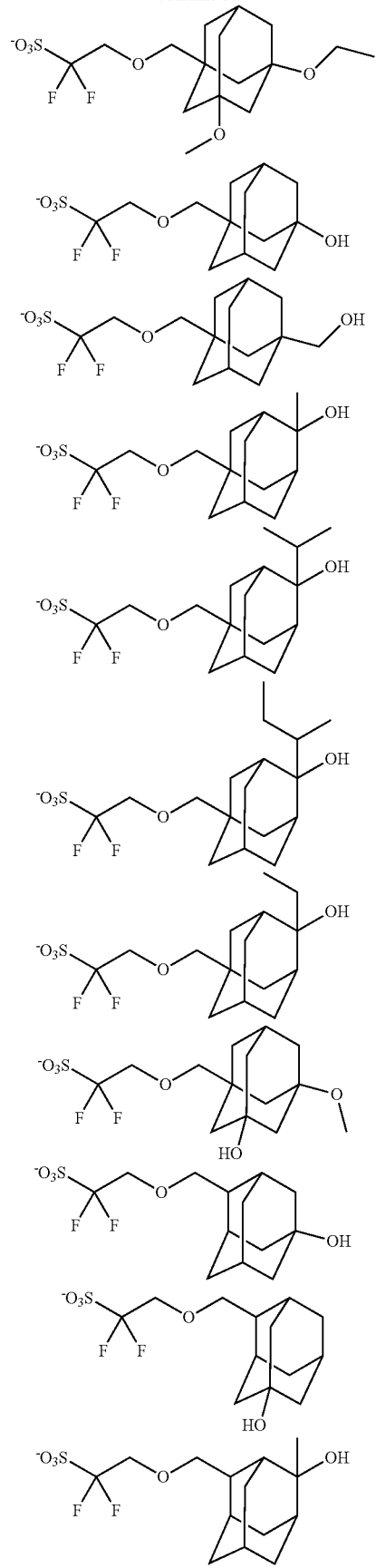
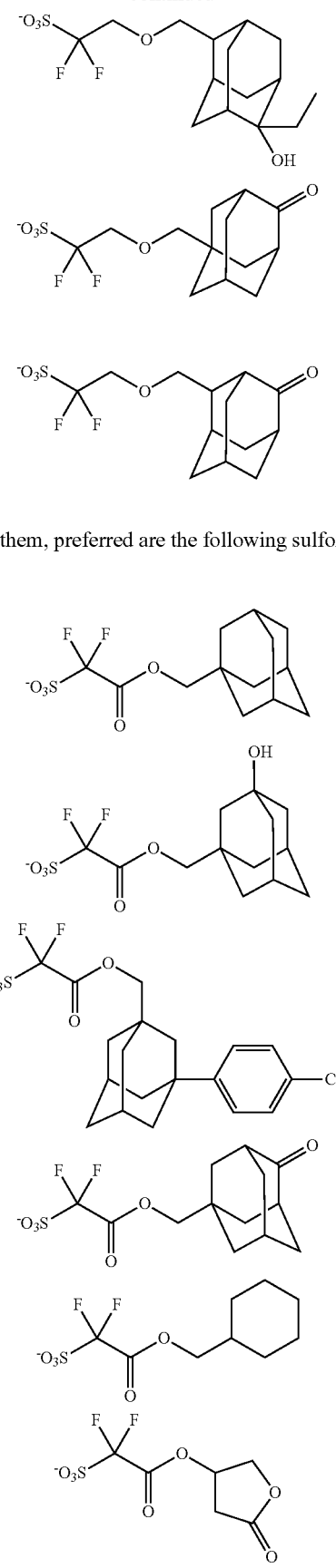
Among them, preferred are the following sulfonic anions.

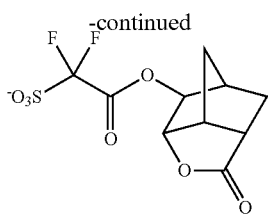

Examples of the cation part represented by $Z^+$ include an onium cation such as a sulfonium cation, an iodonium cation, an ammonium cation, a benzothiazolium cation and a phosphonium cation, and a sulfonium cation and an iodonium cation are preferable, and an arylsulfonium cation is more preferable.

Preferable examples of the cation part represented by $Z^+$ include the cations represented by the formulae (b2-1) to (b2-4):

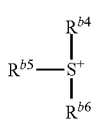 (b2-1)

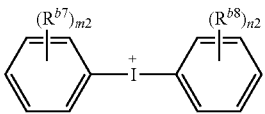 (b2-2)

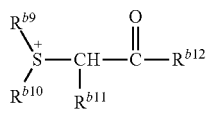 (b2-3)

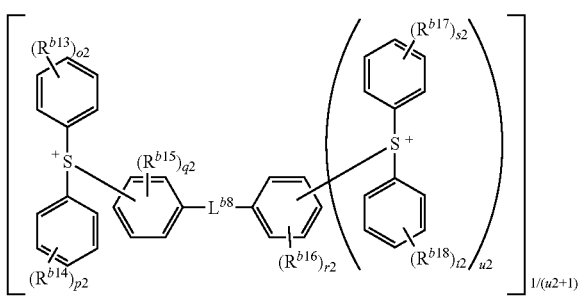 (b2-4)

wherein $R^{b4}$, $R^{b5}$ and $R^{b6}$ each independently represent a C1-C30 aliphatic hydrocarbon group which can have one or more substituents selected from the group consisting of a hydroxyl group, a C1-C12 alkoxy group and a C6-C18 aromatic hydrocarbon group, a C3-C36 saturated cyclic hydrocarbon group which can have one or more substituents selected from the group consisting of a halogen atom, a C2-C4 acyl group and a glycidyloxy group, or a C6-C18 aromatic hydrocarbon group which can have one or more substituents selected from the group consisting of a halogen atom, a hydroxyl group, a C1-C36 aliphatic hydrocarbon group, a C3-C36 saturated cyclic hydrocarbon group or a C1-C12 alkoxy group, $R^{b7}$ and $R^{b8}$ are independently in each occurrence a hydroxyl group, a C1-C12 aliphatic hydrocarbon group or a C1-C12 alkoxy group, m2 and n2 independently represents an integer of 0 to 5, $R^{b9}$ and $R^{b10}$ each independently represent a C1-C36 aliphatic hydrocarbon group or a C3-C36 saturated cyclic hydrocarbon group, or $R^{b9}$ and $R^{b10}$ are bonded to form a C2-C11 divalent acyclic hydrocarbon group which forms a ring together with the adjacent $S^+$, and one or more —CH$_2$— in the divalent acyclic hydrocarbon group may be replaced by —CO—, —O— or —S—, and $R^{b11}$ represents a hydrogen atom, a C1-C36 aliphatic hydrocarbon group, a C3-C36 saturated cyclic hydrocarbon group or a C6-C18 aromatic hydrocarbon group, $R^{b12}$ represents a C1-C12 aliphatic hydrocarbon group, a C3-C18 saturated cyclic hydrocarbon group or a C6-C18 aromatic hydrocarbon group and the aromatic hydrocarbon group can have one or more substituents selected from the group consisting of a C1-C12 aliphatic hydrocarbon group, a C1-C12 alkoxy group, a C3-C18 saturated cyclic hydrocarbon group and an acyloxy group, or $R^{b11}$ and $R^{b12}$ are bonded each other to form a C1-C10 divalent acyclic hydrocarbon group which forms a 2-oxocycloalkyl group together with the adjacent —CHCO—, and one or more —CH$_2$— in the divalent acyclic hydrocarbon group may be replaced by —CO—, —O— or —S—, and $R^{b13}$, $R^{b14}$, $R^{b15}$, $R^{b16}$, $R^{b17}$ and $R^{b18}$ each independently represent a hydroxyl group, a C1-C12 aliphatic hydrocarbon group or a C1-C12 alkoxy group, $L^{b11}$ represents —S— or —O— and o2, p2, s2 and t2 each independently represents an integer of 0 to 5, q2 and r2 each independently represents an integer of 0 to 4, and u2 represents 0 or 1.

The aliphatic hydrocarbon group represented by $R^{b9}$ to $R^{b11}$ has preferably 1 to 12 carbon atoms. The saturated cyclic hydrocarbon group represented by $R^{b9}$ to $R^{b11}$ has preferably 3 to 36 carbon atoms and more preferably 4 to 12 carbon atoms.

Examples of the aliphatic hydrocarbon group and the aromatic hydrocarbon group include the same as described above. Preferable examples of the aliphatic hydrocarbon group include a methyl group, an ethyl group, a propyl group, an isopropyl group, a butyl group, a sec-butyl group, a tert-butyl group, a pentyl group, a hexyl group, an octyl group and a 2-ethylhexyl group. A C4-C12 cyclic aliphatic hydrocarbon group is preferable. Preferable examples of the cyclic aliphatic hydrocarbon group include a cyclopropyl group, a cyclobutyl group, a cyclopentyl group, a cyclohexyl group, a cycloheptyl group, a cyclodecyl group, a 2-alkyl-a-adamantyl group, a 1-(1-adamantyl)-1-alkyl group and an isobornyl group. Preferable examples of the aromatic group include a phenyl group, a 4-methylphenyl group, a 4-ethylphenyl group, a 4-tert-butylphenyl group, a 4-cyclohexylphenyl group, a 4-methoxyphenyl group, a biphenyl group and a naphthyl group. Examples of the aliphatic hydrocarbon group having an aromatic hydrocarbon group include a benzyl group. Examples of the alkoxy group include a methoxy group, an ethoxy group, a propoxy group, an isopropoxy group, a butoxy group, a sec-butoxy group, a tert-butoxy group, a pentyloxy group, a hexyloxy group, a heptyloxy group, an octyloxy group, a 2-ethylhexyloxy group, a nonyloxy group, a decyloxy group, an undecyloxy group and a dodecyloxy group.

Examples of the C3-C12 divalent acyclic hydrocarbon group formed by bonding $R^{b9}$ and $R^{b10}$ include a trimethylene group, a tetramethylene group and a pentamethylene group. Examples of the ring group formed together with the adjacent $S^+$ and the divalent acyclic hydrocarbon group include a thiolan-1-ium ring (tetrahydrothiphenium ring), a thian-1-ium ring and a 1,4-oxathian-4-ium ring. A C3-C7 divalent a cyclic hydrocarbon group is preferable.

Examples of the C1-C10 divalent acyclic hydrocarbon group formed by bonding $R^{b11}$ and $R^{b12}$ include a methylene group, an ethylene group, a trimethylene group, a tetramethylene group and a pentamethylene group and examples of the ring group include the followings.

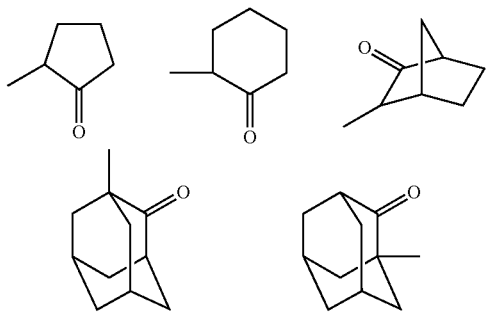

A C1-C5 divalent acyclic hydrocarbon group is preferable.

Among the above-mentioned cations, preferred is the cation represented by the formula (b2-1), and more preferred is the cation represented by the formula (b2-1-1). A triphenylsulfonium cation is especially preferable.

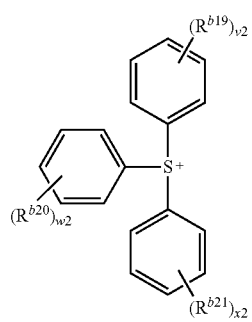

(b2-1-1)

wherein $R^{b19}$, $R^{b20}$ and $R^{b21}$ are independently in each occurrence a halogen atom, a hydroxyl group, a C1-C36 aliphatic hydrocarbon group, a C3-C36 saturated cyclic hydrocarbon group or a C1-C12 alkoxy group, and one or more hydrogen atoms of the aliphatic hydrocarbon group can be replaced by a hydroxyl group, a C1-C12 alkoxy group or a C6-C18 aromatic hydrocarbon group, and one or more hydrogen atoms of the saturated cyclic hydrocarbon group can be replaced by a halogen atom, a glycidyloxy group or a C2-C4 acyl group, and v2, w2 and x2 independently each represent an integer of 0 to 5.

The aliphatic hydrocarbon group has preferably 1 to 12 carbon atoms, and the saturated cyclic hydrocarbon group has preferably 4 to 36 carbon atoms, and v2, w2 and x2 independently each preferably represent 0 or 1.

It is preferred that $R^{b19}$, $R^{b20}$ and $R^{b21}$ are independently in each occurrence a halogen atom, a hydroxyl group, a C1-C12 alkyl group or a C1-C12 alkoxy group and v2, w2 and x2 independently each represent an integer of 0 to 5, and it is more preferred that $R^{b19}$, $R^{b20}$ and $R^{b21}$ are independently in each occurrence a fluorine atom, a hydroxyl group, a C1-C12 alkyl group or a C1-C12 alkoxy group, and v2, w2 and x2 independently each preferably represent 0 or 1.

Examples of the cation represented by the formula (b2-1) include the followings.

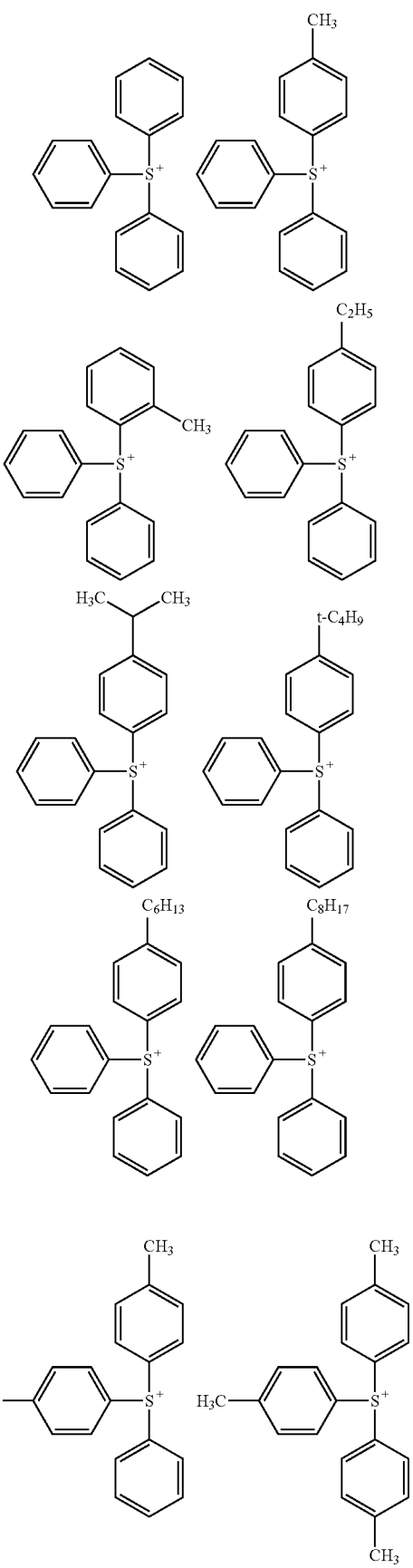

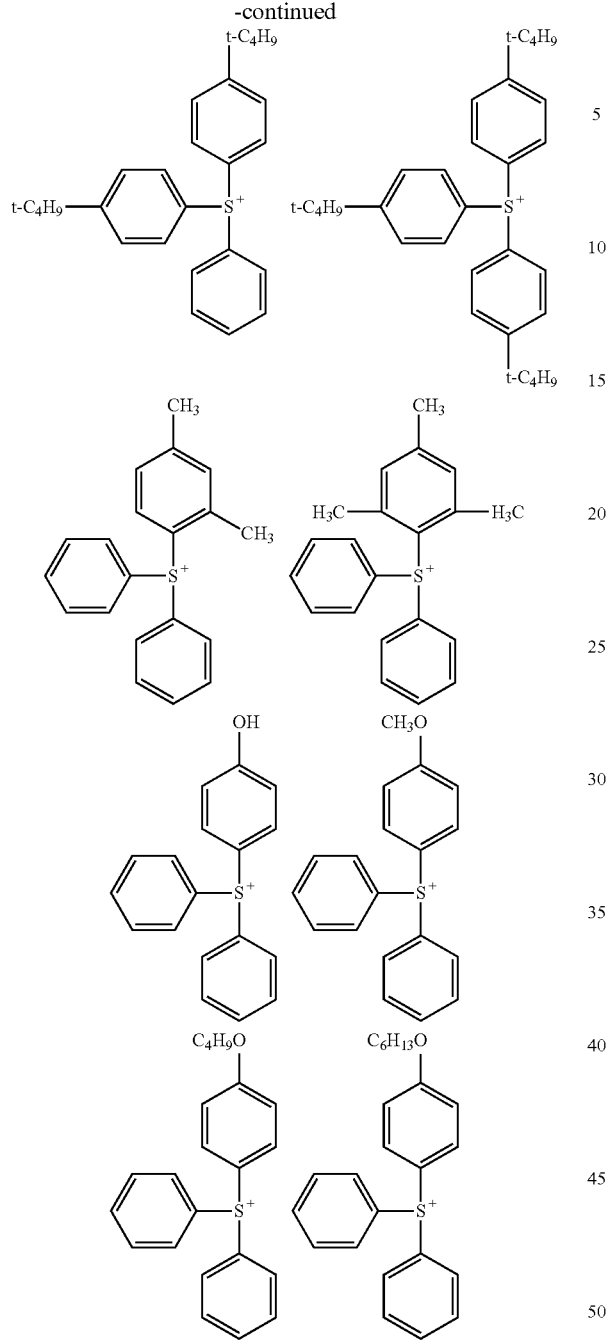
Examples of the cation represented by the formula (b2-2) include the followings.
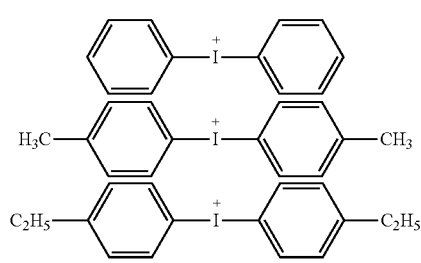
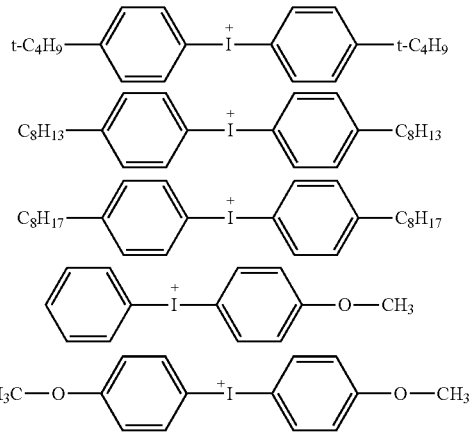
Examples of the cation represented by the formula (b2-3) include the followings.
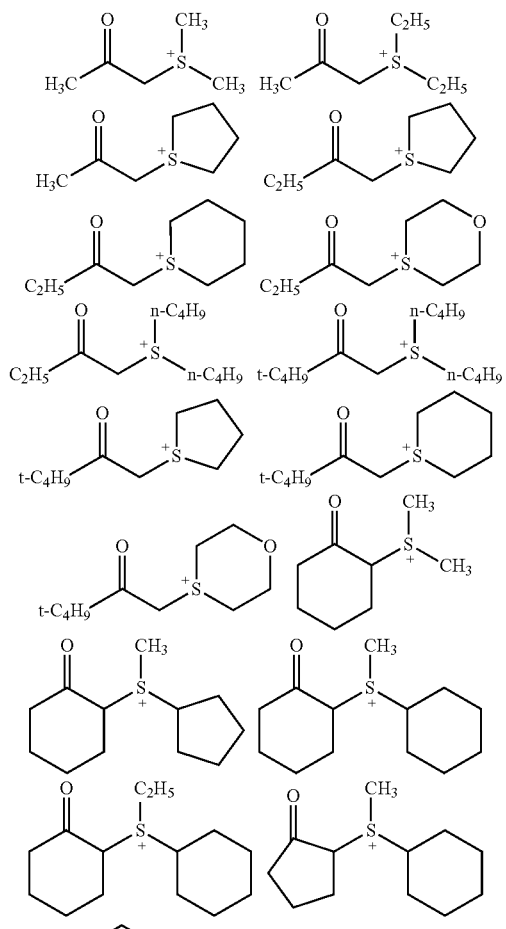
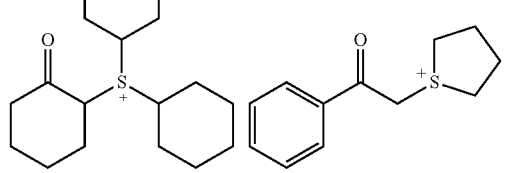

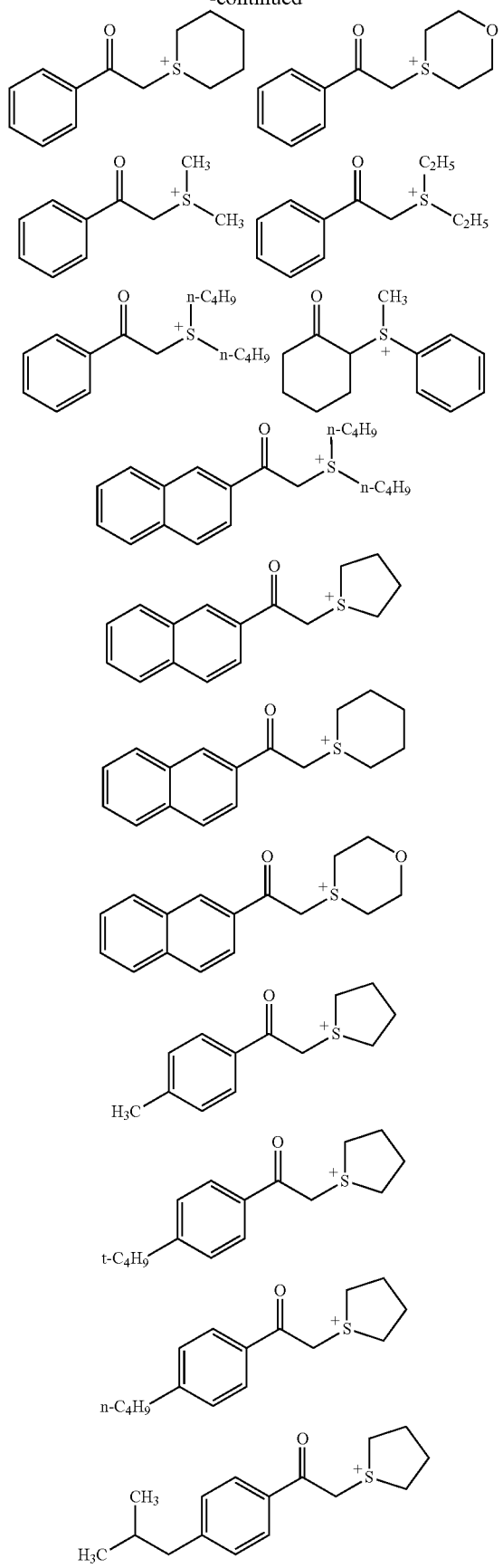
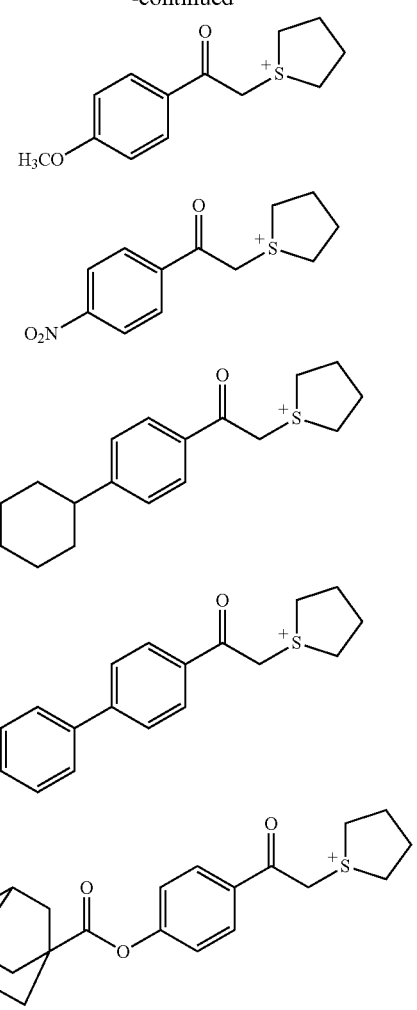
Examples of the cation represented by the formula (b2-4) include the followings.
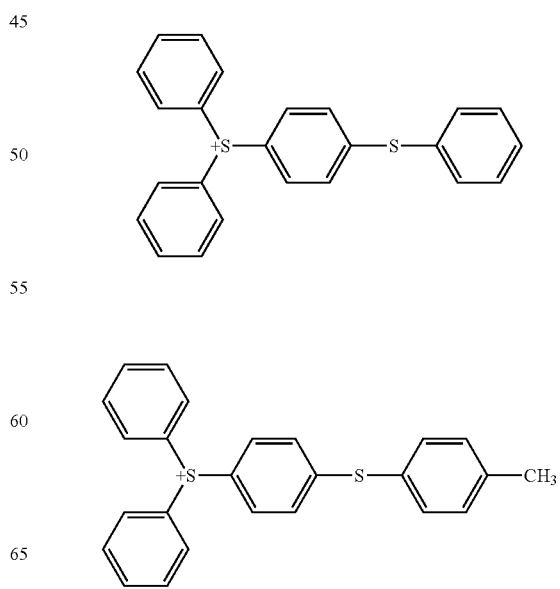

149
-continued
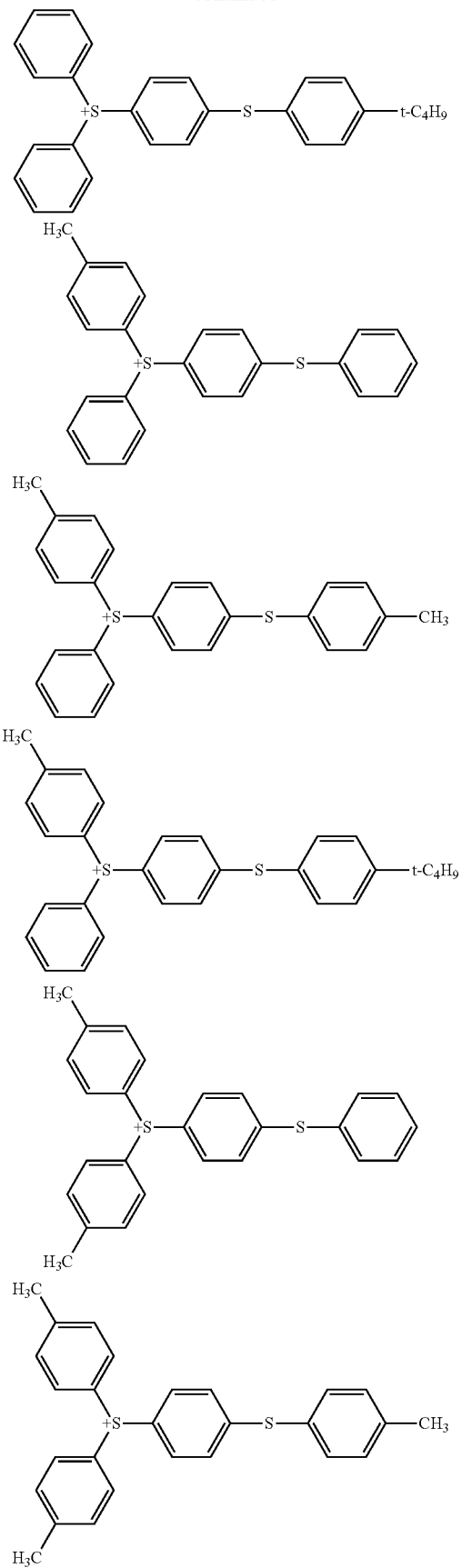
150
-continued
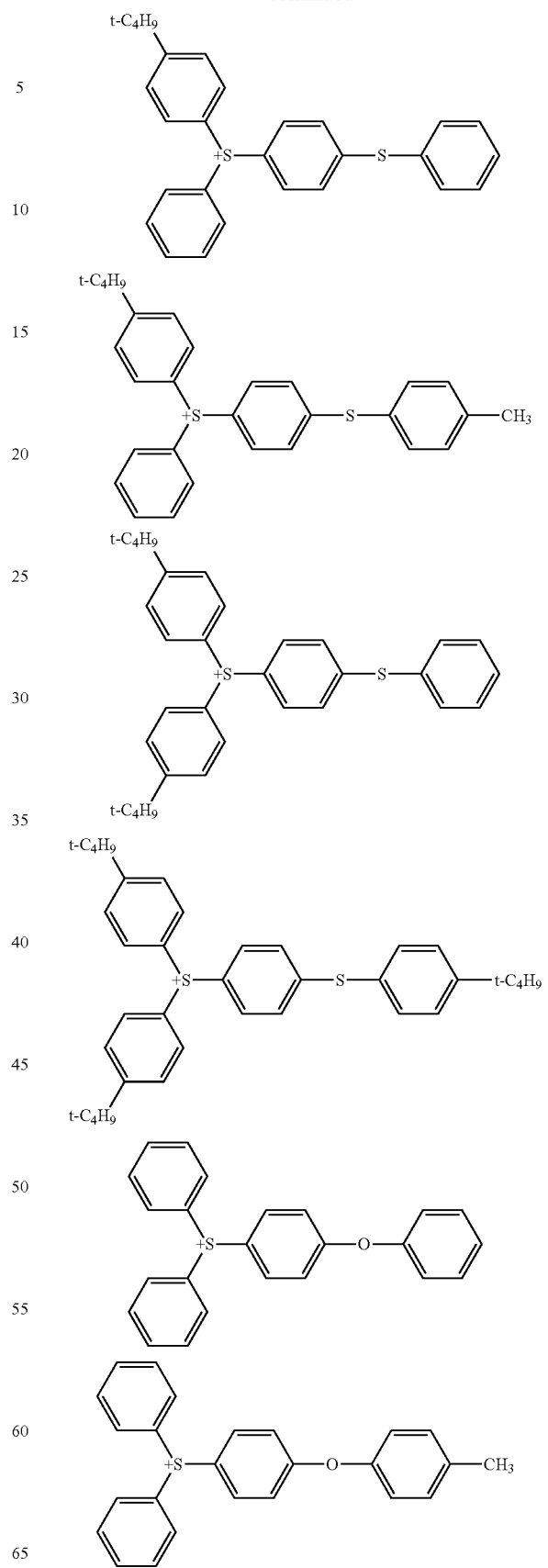

151
-continued
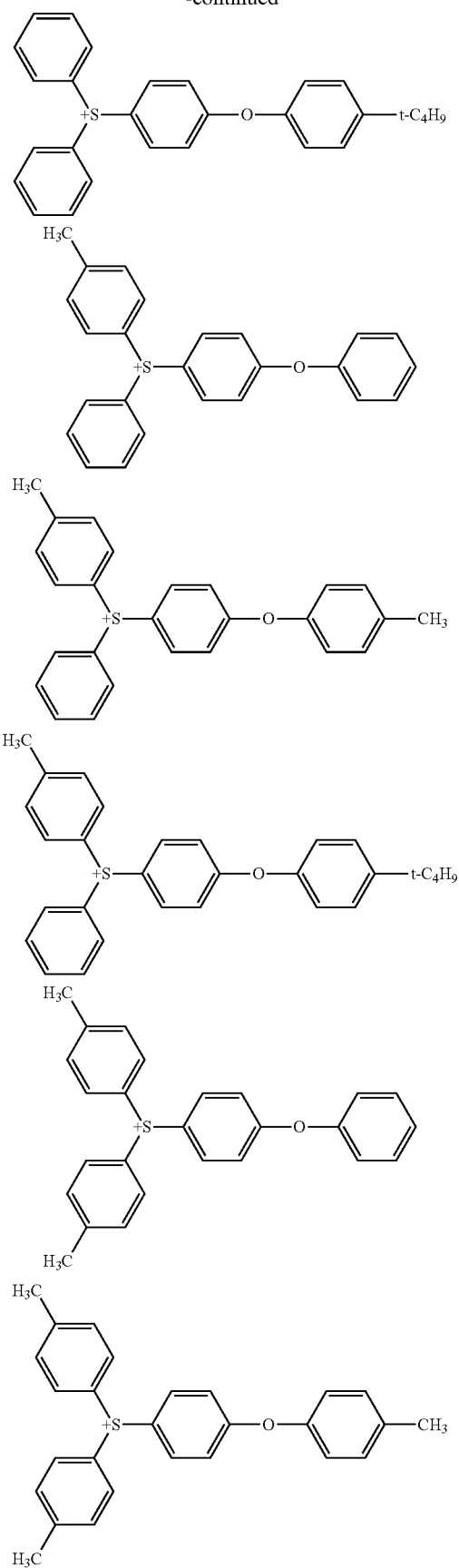
152
-continued
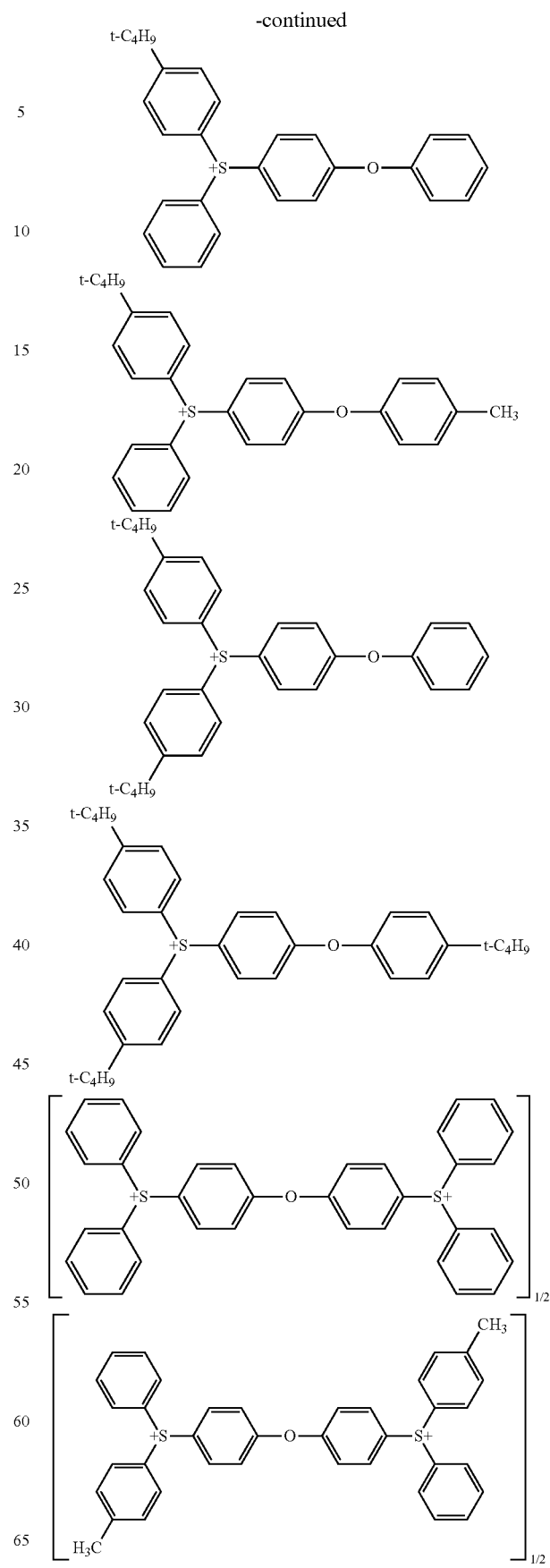

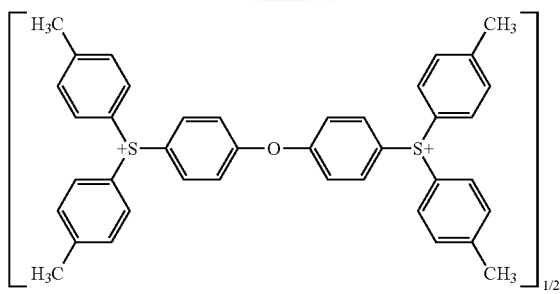
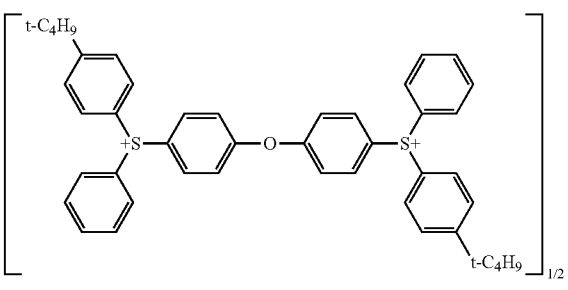
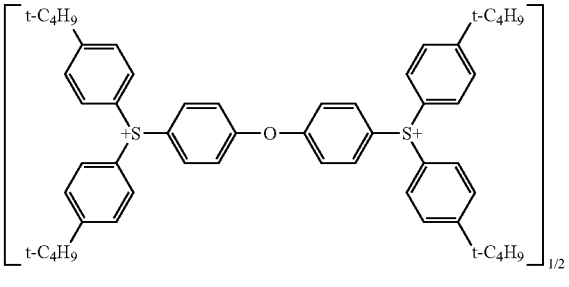
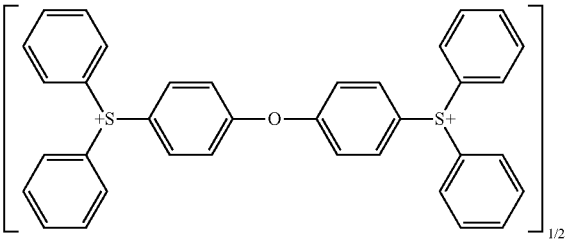
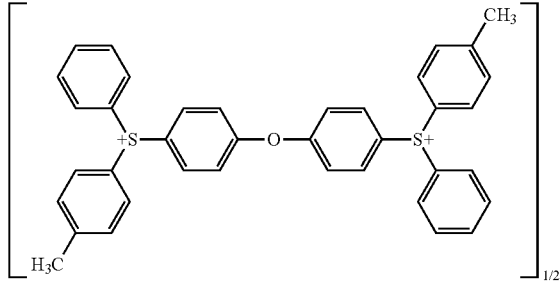
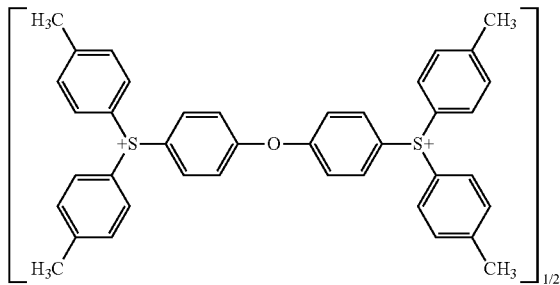
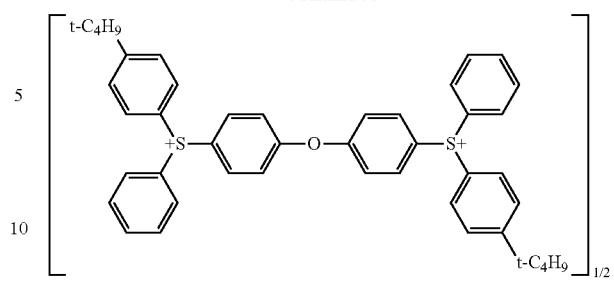
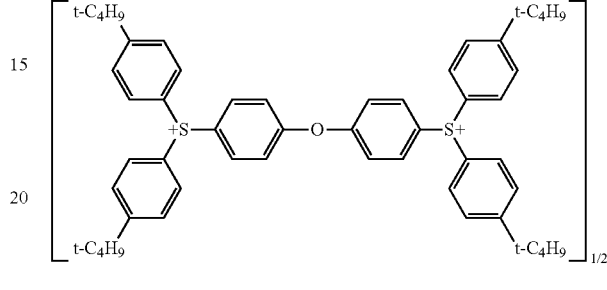

Examples of the salt represented by the formula (B1) include a salt wherein the anion part is any one of the above-mentioned anion part and the cation part is any one of the above-mentioned cation part. Preferable examples of the salt include a combination of any one of anions represented by the formulae (b1-1-1) to (b1-1-9) and the cation represented by the formulae (b2-1-1), and a combination of any one of anions represented by the formulae (b1-1-3) to (b1-1-5) and the cation represented by the formulae (b2-3).

The salt represented by the formulae (B1-1) to (B1-17) are preferable, and the salt represented by the formulae (B1-1), (B1-2), (B1-3), (B1-6), (B1-11), (B1-12), (B1-13) and (B1-14) are more preferable.

(B1-1)
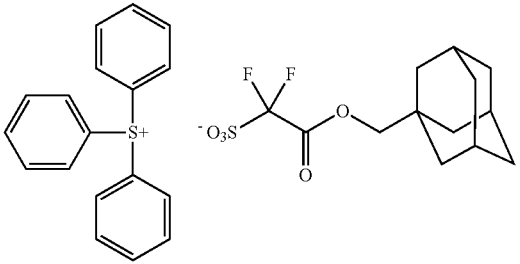

(B1-2)
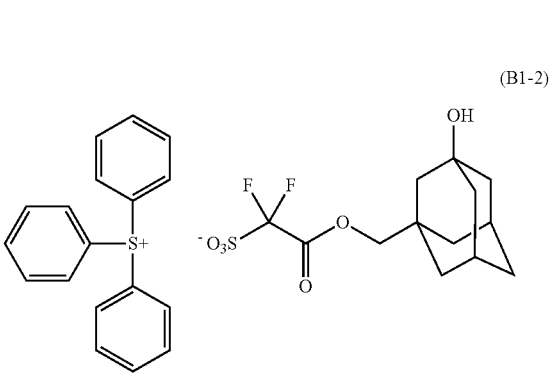

(B1-3)
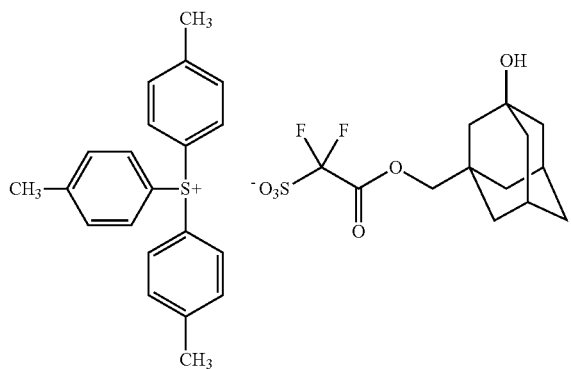
(B1-4)
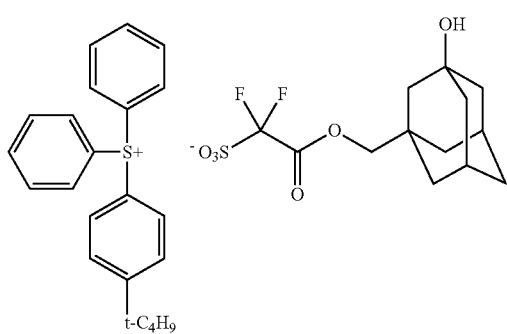
(B1-5)
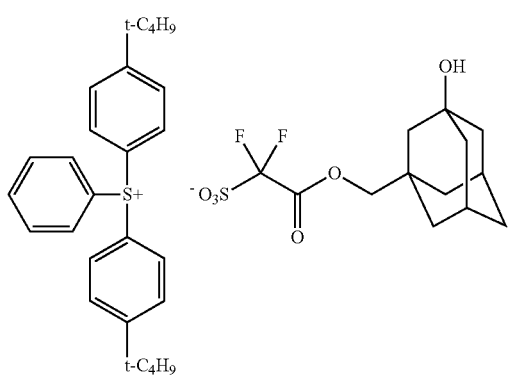
(B1-6)
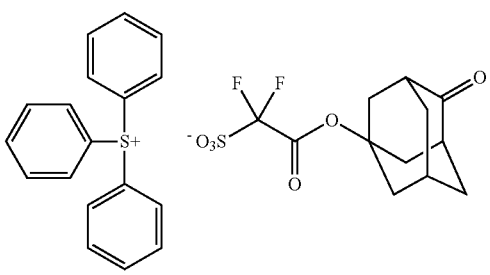
(B1-7)
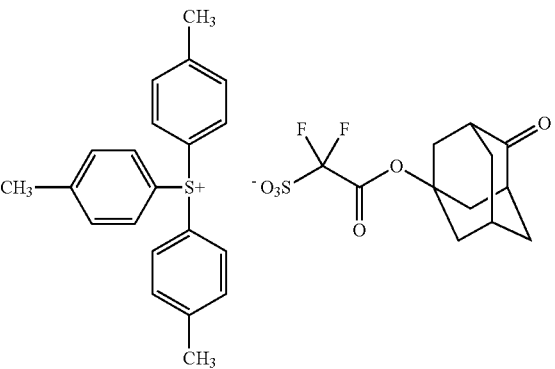
(B1-8)
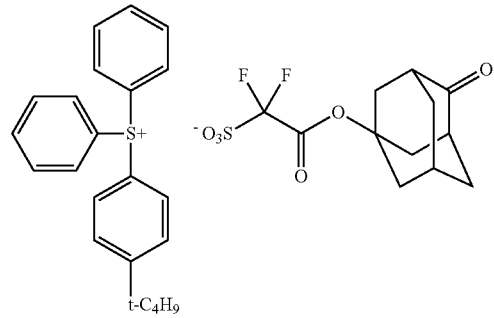
(B1-9)
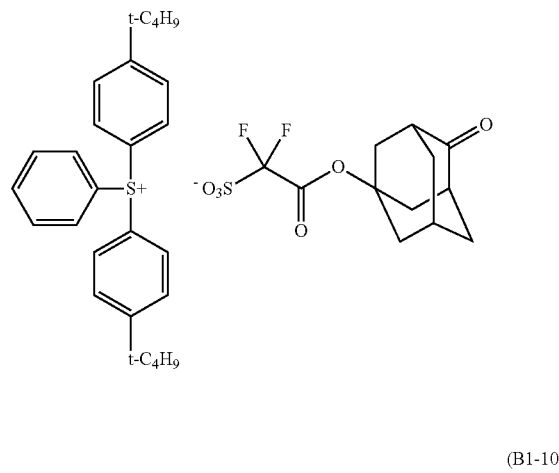
(B1-10)
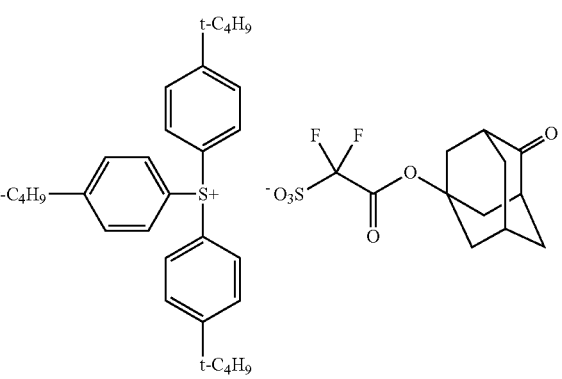

-continued (B1-11)
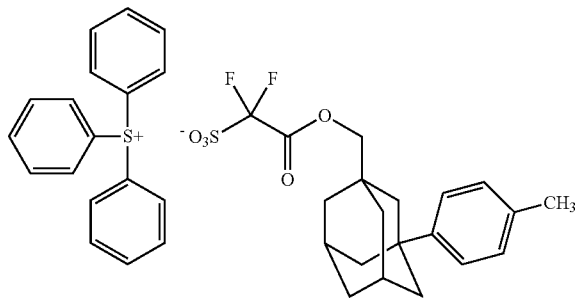

(B1-12)

(B1-13)

(B1-14)

(B1-15)

(B1-16)

-continued (B1-17)
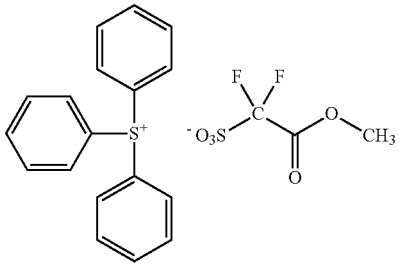

The salt represented by the formula (B1) can be produced, for example, by the method described in JP 2008-209917 A.

Two or more kinds of the acid generator can be used in combination.

The content of the acid generator is usually 1 part by weight or more and preferably 3 parts by weight or more per 100 parts by weight of the resin component, and 30 parts by weight or less and preferably 25 parts by weight or less per 100 parts by weight of the resin component.

The photoresist composition of the present invention can contain one or more basic compounds, and the content of the basic compound is usually 0.01 to 1% by mass based on solid component. It is preferred that the content of the basic compound is smaller than that of the compound (I) in the photoresist composition of the present invention. The basic compound has the property that it can trap an acid, especially an acid generated from the acid generator by applying a radiation.

The basic compound is preferably a basic nitrogen-containing organic compound, and examples thereof include an amine compound such as an aliphatic amine and an aromatic amine and an ammonium salt. Examples of the aliphatic amine include a primary amine, a secondary amine and a tertiary amine. Examples of the aromatic amine include an aromatic amine in which aromatic ring has one or more amino groups such as aniline and a heteroaromatic amine such as pyridine. Preferable examples thereof include an aromatic amine represented by the formula (C2):

(C2)
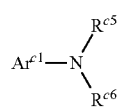

wherein $Ar^{c1}$ represents an aromatic hydrocarbon group, and $R^{c5}$ and $R^{c6}$ each independently represent a hydrogen atom, an aliphatic hydrocarbon group, a saturated cyclic hydrocarbon group or an aromatic hydrocarbon group, and the aliphatic hydrocarbon group, the saturated cyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group.

The aliphatic hydrocarbon group is preferably an alkyl group and the saturated cyclic hydrocarbon group is preferably a cycloalkyl group. The aliphatic hydrocarbon group preferably has 1 to 6 carbon atoms. The saturated cyclic hydrocarbon group preferably has 5 to 10 carbon atoms. The aromatic hydrocarbon group preferably has 6 to 10 carbon atoms.

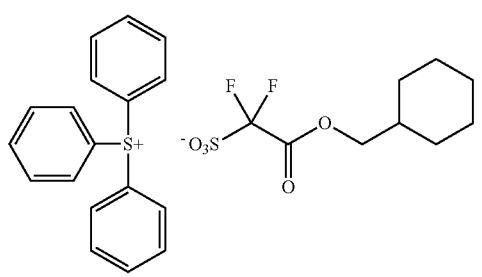
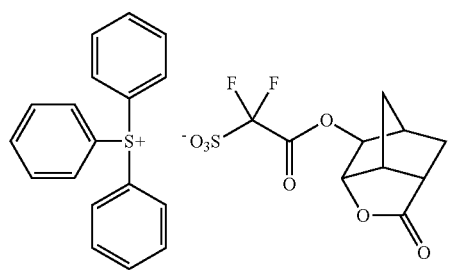
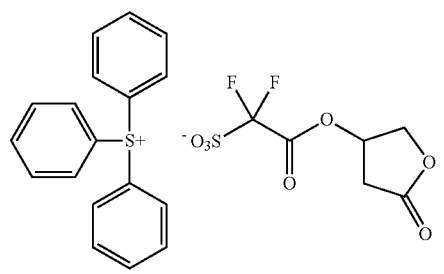
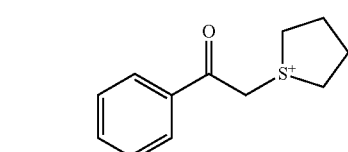
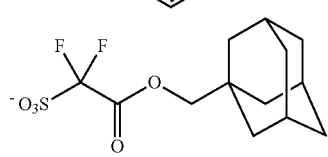

As the aromatic amine represented by the formula (C2), an amine represented by the formula (C2-1):

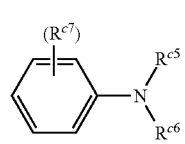

(C2-1)

wherein $R^{c5}$ and $R^{c6}$ are the same as defined above, and $R^{c7}$ is independently in each occurrence an aliphatic hydrocarbon group, an alkoxy group, a saturated cyclic hydrocarbon group or an aromatic hydrocarbon group, and the aliphatic hydrocarbon group, the alkoxy group, the saturated cyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group, and m3 represents an integer of 0 to 3, is preferable. The aliphatic hydrocarbon group is preferably an alkyl group and the saturated cyclic hydrocarbon group is preferably a cycloalkyl group. The aliphatic hydrocarbon group preferably has 1 to 6 carbon atoms. The saturated cyclic hydrocarbon group preferably has 5 to 10 carbon atoms. The aromatic hydrocarbon group preferably has 6 to 10 carbon atoms. The alkoxy group preferably has 1 to 6 carbon atoms.

An ammonium salt represented by the formula (C2-2):

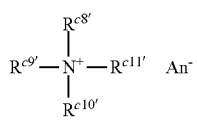

(C2-2)

wherein $R^{c8'}$, $R^{c9'}$, $R^{c10'}$, and $R^{c11'}$ each independently represent an aliphatic hydrocarbon group, a saturated cyclic hydrocarbon group or an aromatic hydrocarbon group, and the aliphatic hydrocarbon group, the saturated cyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group, and $An^-$ represents $OH^-$, is also preferable. The aliphatic hydrocarbon group is preferably an alkyl group and the saturated cyclic hydrocarbon group is preferably a cycloalkyl group. The aliphatic hydrocarbon group preferably has 1 to 8 carbon atoms. The saturated cyclic hydrocarbon group preferably has 5 to 10 carbon atoms. The aromatic hydrocarbon group preferably has 6 to 10 carbon atoms. The alkoxy group preferably has 1 to 6 carbon atoms.

Examples of the aromatic amine represented by the formula (C2) include 1-naphthylamine, 2-naphthylamine, aniline, diisopropylaniline, 2-methylaniline, 3-methylaniline, 4-methylaniline, 4-nitroaniline, N-methylaniline, N,N-dimethylaniline, and diphenylamine, and among them, preferred is diisopropylaniline and more preferred is 2,6-diisopropylaniline. Examples of the ammonium salt represented by the formula (C2-2) include tetramethylammonium hydroxide and tetrabutylammonium hydroxide.

Other examples of the basic compound include amines represented by the formulae (C3) to (C11):

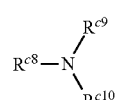

(C3)

(C4)

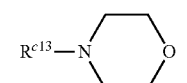

(C5)

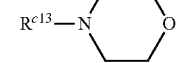

(C6)

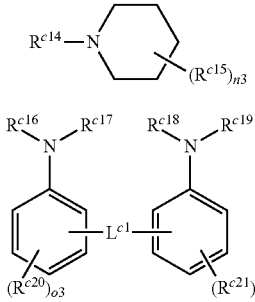

(C7)

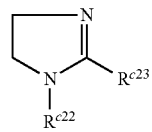

(C8)

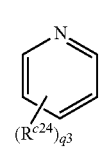

(C9)

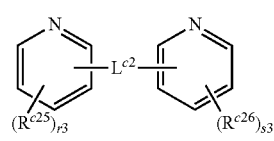

(C10)

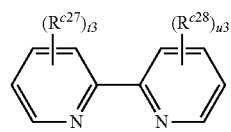

(C11)

wherein $R^{c8}$, $R^{c20}$, $R^{c21}$, and $R^{c23}$ to $R^{c28}$ each independently represent an aliphatic hydrocarbon group, an alkoxy group, a saturated cyclic hydrocarbon group or an aromatic hydrocarbon group, and the aliphatic hydrocarbon group, the alkoxy group, the saturated cyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group, $R^{c9}$, $R^{c10}$, $R^{c11}$ to $R^{c14}$, $R^{c16}$ to $R^{c19}$, and $R^{c22}$ independently represents a hydrogen atom, an aliphatic hydrocarbon group, a saturated cyclic hydrocarbon group or an aromatic hydrocarbon group, and the aliphatic hydrocarbon group, the saturated cyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group, $R^{c15}$ is independently in each occurrence an aliphatic hydrocarbon group, a saturated cyclic hydrocarbon group or an alkanoyl group, $L^{c1}$ and $L^{c2}$ each independently represents a divalent aliphatic hydrocarbon group, —CO—, —C(=NH)—, —C(=NR$^{c3}$)—, —S—, —S—S— or a combination thereof and $R^{c3}$ represents a C1-C4 alkyl group, O3 to u3 each independently represents an integer of 0 to 3 and n3 represents an integer of 0 to 8.

The aliphatic hydrocarbon group has preferably 1 to 6 carbon atoms, and the saturated cyclic hydrocarbon group has preferably 3 to 6 carbon atoms, and the alkanoyl group has preferably 2 to 6 carbon atoms, and the divalent aliphatic hydrocarbon group has preferably 1 to 6 carbon atoms. The divalent aliphatic hydrocarbon group is preferably an alkylene group.

Examples of the amine represented by the formula (C3) include hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethydipentylamine, ethyldihexylamine, ethydiheptylamine, ethyldioctylamine, ethyldinonylamine, ethyldidecylamine, dicyclohexylmethylamine, tris[2-(2-methoxyethoxy)ethyl]amine, triisopropanolamine, ethylenediamine, tetramethylenediamine, hexamethylenediamine, 4,4'-diamino-1,2-diphenylethane, 4,4'-diamino-3,3'-dimethyldiphenylmethane and 4,4'-diamino-3,3'-diethyldiphenylmethane.

Examples of the amine represented by the formula (C4) include piperazine. Examples of the amine represented by the formula (C5) include morpholine. Examples of the amine represented by the formula (C6) include piperidine and hindered amine compounds having a piperidine skeleton as disclosed in JP 11-52575 A. Examples of the amine represented by the formula (07) include 2,2'-methylenebisaniline. Examples of the amine represented by the formula (C8) include imidazole and 4-methylimidazole. Examples of the amine represented by the formula (C9) include pyridine and 4-methylpyridine. Examples of the amine represented by the formula (010) include di-2-pyridyl ketone, 1,2-di(2-pyridyl)ethane, 1,2-di(4-pyridyl)ethane, 1,3-di(4-pyridyl)propane, 1,2-bis(2-pyridyl)ethene, 1,2-bis(4-pyridyl)ethene, 1,2-di(4-pyridyloxy)ethane, 4,4'-dipyridyl sulfide, 4,4'-dipyridyl disulfide, 2,2'-dipyridylamine and 2,2'-dipicolylamine. Examples of the amine represented by the formula (C11) include bipyridine.

The photoresist composition of the present invention usually contains one or more solvents. Examples of the solvent include a glycol ether ester such as ethyl cellosolve acetate, methyl cellosolve acetate and propylene glycol monomethyl ether acetate; a glycol ether such as propylene glycol monomethyl ether; an acyclic ester such as ethyl lactate, butyl acetate, amyl acetate and ethyl pyruvate; a ketone such as acetone, methyl isobutyl ketone, 2-heptanone and cyclohexanone; and a cyclic ester such as γ-butyrolactone.

The amount of the solvent is usually 90% by weight or more, preferably 92% by weight or more preferably 94% by weight or more based on total amount of the photoresist composition of the present invention. The amount of the solvent is usually 99.9% by weight or less based on total amount of the photoresist composition of the present invention. The photoresist composition containing a solvent can be preferably used for producing a thin layer photoresist pattern.

The photoresist composition of the present invention can contain, if necessary, a small amount of various additives such as a sensitizer, a dissolution inhibitor, other polymers, a surfactant, a stabilizer and a dye as long as the effect of the present invention is not prevented.

The photoresist composition of the present invention is useful for a chemically amplified photoresist composition.

A photoresist pattern can be produced by the following steps (1) to (5):

(1) a step of applying the photoresist composition of the present invention on a substrate, (2) a step of forming a photoresist film by conducting drying, (3) a step of exposing the photoresist film to radiation, (4) a step of baking the exposed photoresist film, and (5) a step of developing the baked photoresist film with an alkaline developer, thereby forming a photoresist pattern.

The applying of the photoresist composition on a substrate is usually conducted using a conventional apparatus such as spin coater. The photoresist composition is preferably filtrated with filter having 0.2 μm of a pore size before applying. Examples of the substrate include a silicon wafer or a quartz wafer on which a sensor, a circuit, a transistor or the like is formed.

The formation of the photoresist film is usually conducted using a heating apparatus such as hot plate or a decompressor, and the heating temperature is usually 50 to 200° C., and the operation pressure is usually 1 to $1.0*10^5$ Pa.

The photoresist film obtained is exposed to radiation using an exposure system. The exposure is usually conducted through a mask having a pattern corresponding to the desired photoresist pattern. Examples of the exposure source include a light source radiating laser light in a UV-region such as a KrF excimer laser (wavelength: 248 nm), an ArF excimer laser (wavelength: 193 nm) and a $F_2$ laser (wavelength: 157 nm), and a light source radiating harmonic laser light in a far UV region or a vacuum UV region by wavelength conversion of laser light from a solid laser light source (such as YAG or semiconductor laser). Other examples of the exposure source include EUV (extreme ultraviolet) and EB (electron beam).

The temperature of baking of the exposed photoresist film is usually 50 to 200° C., and preferably 70 to 150° C.

The development of the baked photoresist film is usually carried out using a development apparatus. The alkaline developer used may be any one of various alkaline aqueous solution used in the art. Generally, an aqueous solution of tetramethylammonium hydroxide or (2-hydroxyethyl)trimethylammoniumhydroxide (commonly known as "choline") is often used. After development, the photoresist pattern formed is preferably washed with ultrapure water, and the remained water on the photoresist pattern and the substrate is preferably removed.

The photoresist composition of the present invention provides a photoresist pattern in a good focus margin, and therefore, the photoresist composition of the present invention is suitable for ArF excimer laser lithography, KrF excimer laser lithography, EUV (extreme ultraviolet) lithography, EUV immersion lithography and EB (electron beam) lithography, and the photoresist composition of the present invention is especially suitable for EUV (extreme ultraviolet) lithography and EB (electron beam) lithography.

EXAMPLES

The present invention will be described more specifically by Examples, which are not construed to limit the scope of the present invention.

The "%" and "part(s)" used to represent the content of any component and the amount of any material used in the following examples and comparative examples are on a weight basis unless otherwise specifically noted. The weight-average molecular weight of any material used in the following examples is a value found by gel permeation chromatography [Column (Three Columns with guard column): TSKgel Multipore HXL-M, manufactured by TOSOH CORPORATION, Solvent: Tetrahydrofuran, Flow rate: 1.0 mL/min., Detector: RI detector, Column temperature: 40° C., Injection volume: 100 μL] using standard polystyrene, manufactured by TOSOH CORPORATION, as a standard reference material. The content ratio of the structural unit derived from each monomer in the resin was calculated based on the amount of the unreacted monomers in the reaction mixture, which was measured by liquid chromatography analysis.

Synthesis Example 1

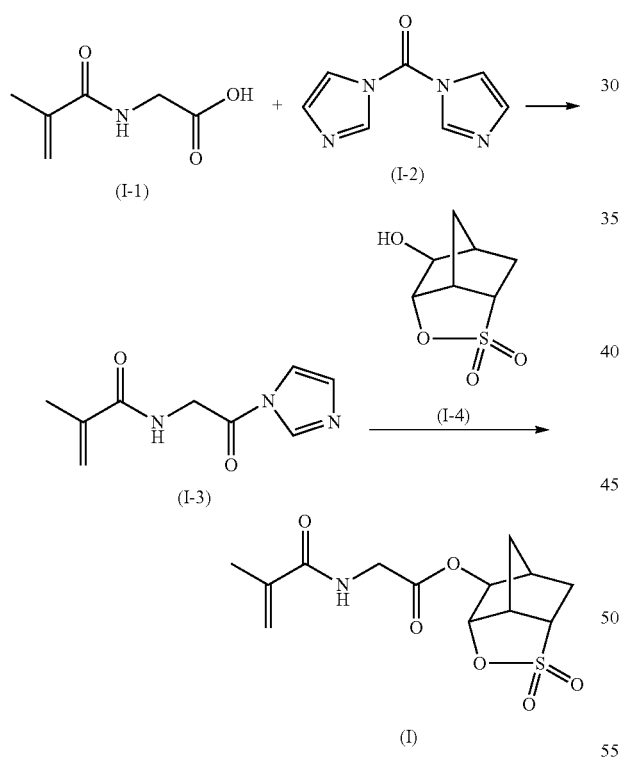

To a reactor, 33.25 parts of a compound represented by the formula (I-1), 23.93 parts of dicyclohexylcarbodiimide and 40.00 parts of dichloromethane were added to prepare a mixture. The mixture was cooled to about 0° C., and then, 18.83 parts of a compound represented by the formula (I-2) was added thereto. The resultant mixture was stirred at about 0° C. for 1 hour. The mixture was heated up to 23° C. and then, further stirred at 23° C. for 30 minutes. The obtained mixture was filtrated to remove insoluble matter. The filtrate obtained was concentrated to obtain 44.19 parts of a compound represented by the formula (I-3).

To a reactor, 19.33 parts of the compound represented by the formula (I-3), 19.02 parts of a compound represented by the formula (I-4) and 200 parts of acetonitrile were added to prepare a mixture. The mixture was stirred at 50° C. for 3 hours. The mixture obtained was concentrated. To the residue obtained, 300 parts of chloroform and 150 parts of ion-exchanged water were added. The resultant mixture was stirred and separated to an organic layer and an aqueous layer. The organic layer was washed with 150 parts of ion-exchanged water and concentrated. The residue was purified with column chromatography (silica gel 60-200 mesh available from Merck KGaA, Developing solvent:ethyl acetate) to obtain 14.58 parts of a monomer represented by the formula (I). This is called as Monomer (I).

MS: 315.1 (molecular ion peak)

In Resin Synthesis Examples, monomers represented by the formulae (A) to (J) were used. The monomer represented by the formula (A) is called as Monomer (A). The monomer represented by the formula (B) is called as Monomer (B). The monomer represented by the formula (C) is called as Monomer (C). The monomer represented by the formula (D) is called as Monomer (D). The monomer represented by the formula (E) is called as Monomer (E). The monomer represented by the formula (F) is called as Monomer (F). The monomer represented by the formula (G) is called as Monomer (G). The monomer represented by the formula (H) is called as Monomer (H). The monomer represented by the formula (J) is called as Monomer (J).

(A)

(B)

(C)

(D) 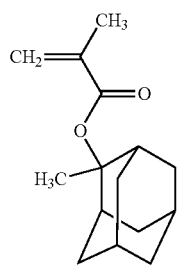

(E) 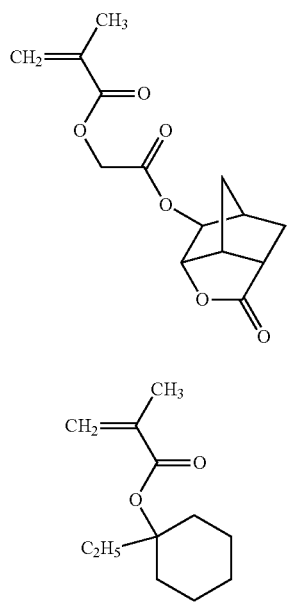

(F)

(G) 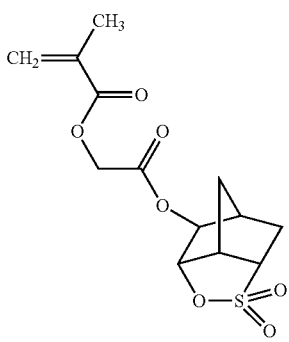

(H) 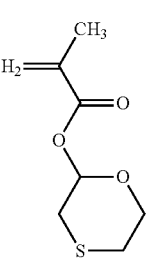

(J) 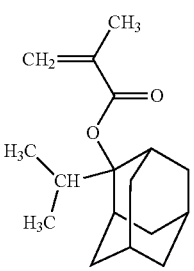

(I) 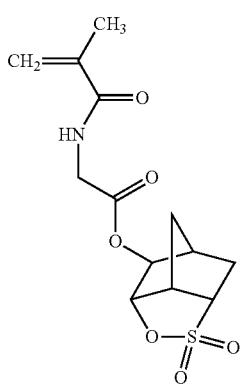

Resin Synthesis Example 1

Monomer (A), Monomer (D), Monomer (B) and Monomer (C) were mixed at a molar ratio of 13:25:23:39 (Monomer (A):Monomer (D):Monomer (B):Monomer (C)), and 1,4-dioxane in 1.5 times mass based on the total amount of all monomers was added thereto. To the resultant mixture, azobisisobutyronitrile as an initiator in a ratio of 0.80 mol % based on all monomer molar amount, and azobis(2,4-dimethylvaleronitrile) as an initiator in a ratio of 2.40 mol % based on all monomer molar amount were added. The obtained mixture was heated at 69° C. for about 5 hours. Then, the reaction mixture obtained was poured into a large amount of methanol to cause precipitation. The precipitate was isolated by filtration and dissolved in 1,4-dioxane. The resultant solution was poured into a large amount of methanol to cause precipitation, and this operation was repeated for purification. As a result, a resin having a weight-average molecular weight of about $1.9 \times 10^4$ was obtained in a yield of 72%. This is called as Resin A1. Resin A1 had the structural units derived from Monomer (A), Monomer (D), Monomer (B) and Monomer (C).

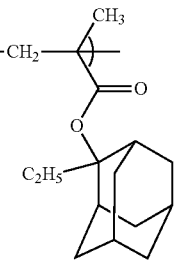 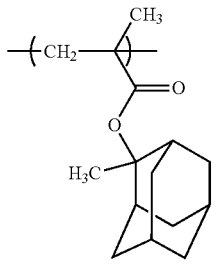

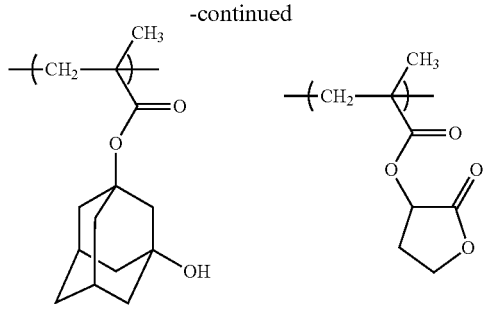

Resin Synthesis Example 2

Monomer (A), Monomer (B) and Monomer (C) were mixed at a molar ratio of 50:25:25 (Monomer (A):Monomer (B):Monomer (C)), and 1,4-dioxane in 1.5 times mass based on the total amount of all monomers was added thereto. To the resultant mixture, azobisisobutyronitrile as an initiator in a ratio of 1 mol % based on all monomer molar amount, and azobis(2,4-dimethylvaleronitrile) as an initiator in a ratio of 3 mol % based on all monomer molar amount were added. The obtained mixture was heated at 80° C. for about 8 hours. Then, the reaction mixture obtained was poured into a large amount of a mixture of methanol and water (methanol/water=4/1 (mass ratio)) to cause precipitation. The precipitate was isolated by filtration and dissolved in 1,4-dioxane. The resultant solution was poured into a large amount of a mixture of methanol and water (methanol/water=4/1 (mass ratio)) to cause precipitation, and this operation was repeated twice for purification. As a result, a resin having a weight-average molecular weight of about $9.2 \times 10^3$ was obtained in a yield of 60%. This is called as Resin A2. Resin A2 had the structural units derived from Monomer (A), Monomer (B) and Monomer (C).

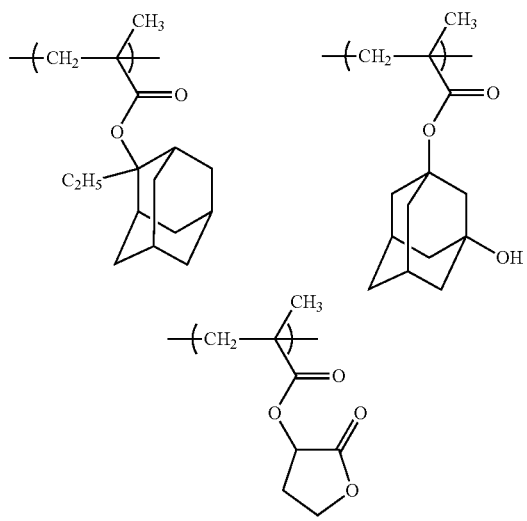

Resin Synthesis Example 3

Monomer (A), Monomer (F), Monomer (B), Monomer (C) and Monomer (E) were mixed at a molar ratio of 32:7:8:43:10 (Monomer (A):Monomer (F):Monomer (B):Monomer (C):Monomer (E)), and 1,4-dioxane in 1.5 times mass based on the total amount of all monomers was added thereto. To the resultant mixture, azobisisobutyronitrile as an initiator in a ratio of 1 mol % based on all monomer molar amount, and azobis(2,4-dimethylvaleronitrile) as an initiator in a ratio of 3 mol % based on all monomer molar amount were added. The obtained mixture was heated at 73° C. for about 5 hours. Then, the reaction mixture obtained was poured into a large amount of methanol to cause precipitation. The precipitate was isolated by filtration and dissolved in 1,4-dioxane. The resultant solution was poured into a large amount of methanol to cause precipitation, and this operation was repeated for purification. As a result, a resin having a weight-average molecular weight of about $8.9 \times 10^3$ was obtained in a yield of 78%. This is called as Resin A3. Resin A3 had the structural units derived from Monomer (A), Monomer (F), Monomer (B), Monomer (C) and Monomer (E).

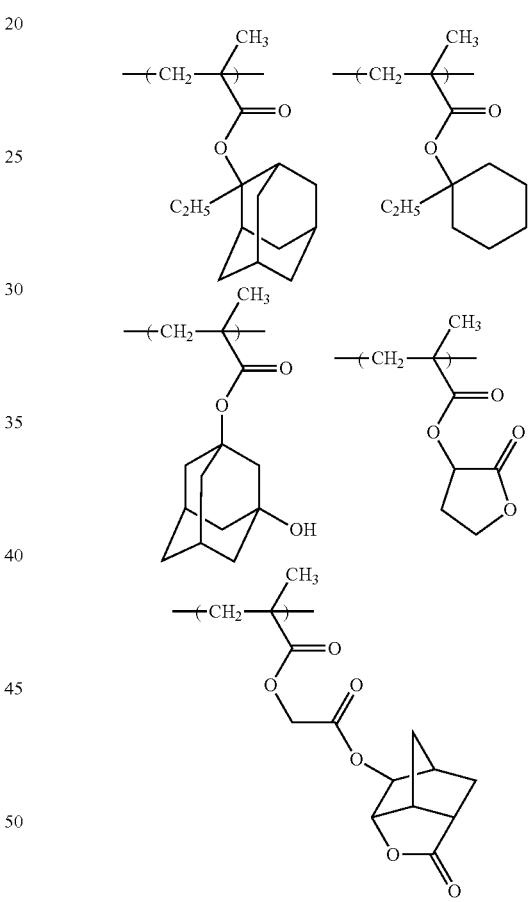

Resin Synthesis Example 4

Monomer (A), Monomer (F), Monomer (B), Monomer (C) and Monomer (G) were mixed at a molar ratio of 32:7:8:43:10 (Monomer (A):Monomer (F):Monomer (B):Monomer (C):Monomer (G)), and 1,4-dioxane in 1.5 times mass based on the total amount of all monomers was added thereto. To the resultant mixture, azobisisobutyronitrile as an initiator in a ratio of 1 mol % based on all monomer molar amount, and azobis(2,4-dimethylvaleronitrile) as an initiator in a ratio of 3 mol % based on all monomer molar amount were added. The obtained mixture was heated at 70° C. for about 5 hours.

Then, the reaction mixture obtained was poured into a large amount of methanol to cause precipitation. The precipitate was isolated by filtration and dissolved in 1,4-dioxane. The resultant solution was poured into a large amount of methanol to cause precipitation, and this operation was repeated for purification. As a result, a resin having a weight-average molecular weight of about 9.0×10³ was obtained in a yield of 80%. This is called as Resin A4. Resin A4 had the structural units derived from Monomer (A), Monomer (F), Monomer (B), Monomer (C) and Monomer (G).

76%. This is called as Resin A5. Resin A5 had the structural units derived from Monomer (A), Monomer (H), Monomer (B), Monomer (C) and Monomer (G).

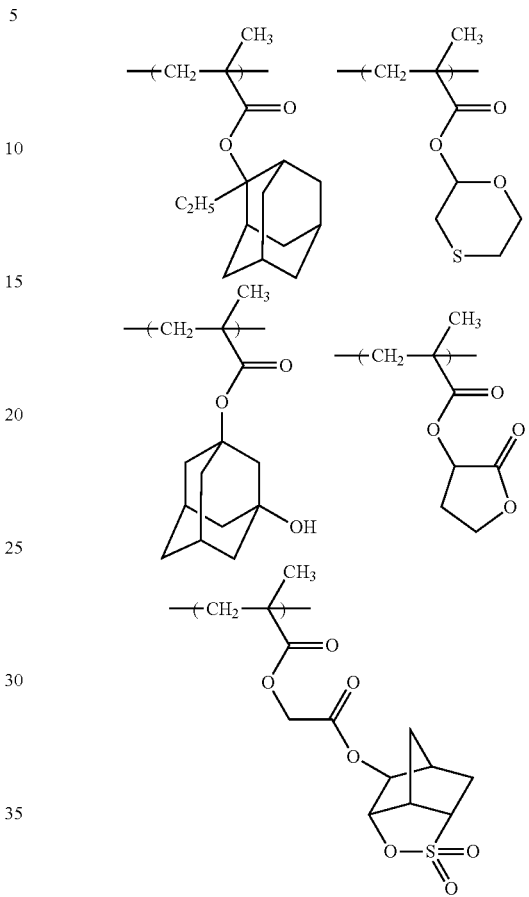

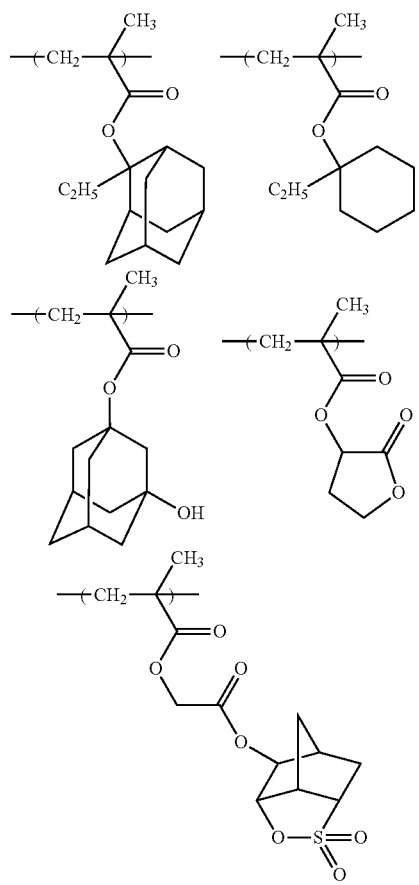

Resin Synthesis Example 5

Monomer (A) Monomer (H) Monomer (B) Monomer (C) and Monomer (G) were mixed at a molar ratio of 32:7:8:43:10 (Monomer (A):Monomer (H):Monomer (B):Monomer (C): Monomer (G)), and 1,4-dioxane in 1.5 times mass based on the total amount of all monomers was added thereto. To the resultant mixture, azobisisobutyronitrile as an initiator in a ratio of 1 mol % based on all monomer molar amount, and azobis(2,4-dimethylvaleronitrile) as an initiator in a ratio of 3 mol % based on all monomer molar amount were added. The obtained mixture was heated at 70° C. for about 5 hours. Then, the reaction mixture obtained was poured into a large amount of methanol to cause precipitation. The precipitate was isolated by filtration and dissolved in 1,4-dioxane. The resultant solution was poured into a large amount of methanol to cause precipitation, and this operation was repeated for purification. As a result, a resin having a weight-average molecular weight of about 8.7×10³ was obtained in a yield of Resin Synthesis Example 6

Monomer (J) Monomer (F) Monomer (B) Monomer (C) and Monomer (I) were mixed at a molar ratio of 35:10:6:37: 12 (Monomer (J):Monomer (F):Monomer (B):Monomer (C): Monomer (I)), and 1,4-dioxane in 1.5 times mass based on the total amount of all monomers was added thereto. To the resultant mixture, azobisisobutyronitrile as an initiator in a ratio of 1 mol % based on all monomer molar amount, and azobis(2,4-dimethylvaleronitrile) as an initiator in a ratio of 3 mol % based on all monomer molar amount were added. The obtained mixture was heated at 75° C. for about 5 hours. Then, the reaction mixture obtained was poured into a large amount of a mixture of methanol and water to cause precipitation. The precipitate was isolated by filtration and dissolved in 1,4-dioxane. The resultant solution was poured into a large amount of a mixture of methanol and water to cause precipitation, and this operation was repeated for purification. As a result, a resin having a weight-average molecular weight of about 7.2×10³ was obtained in a yield of 65%. This is called as Resin A6. Resin A6 had the structural units derived from Monomer (J), Monomer (F), Monomer (B), Monomer (C) and Monomer (I).

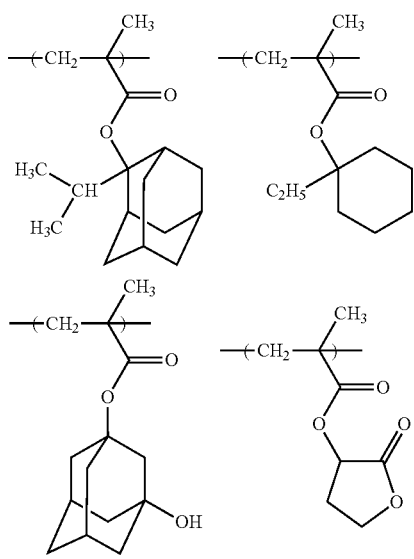
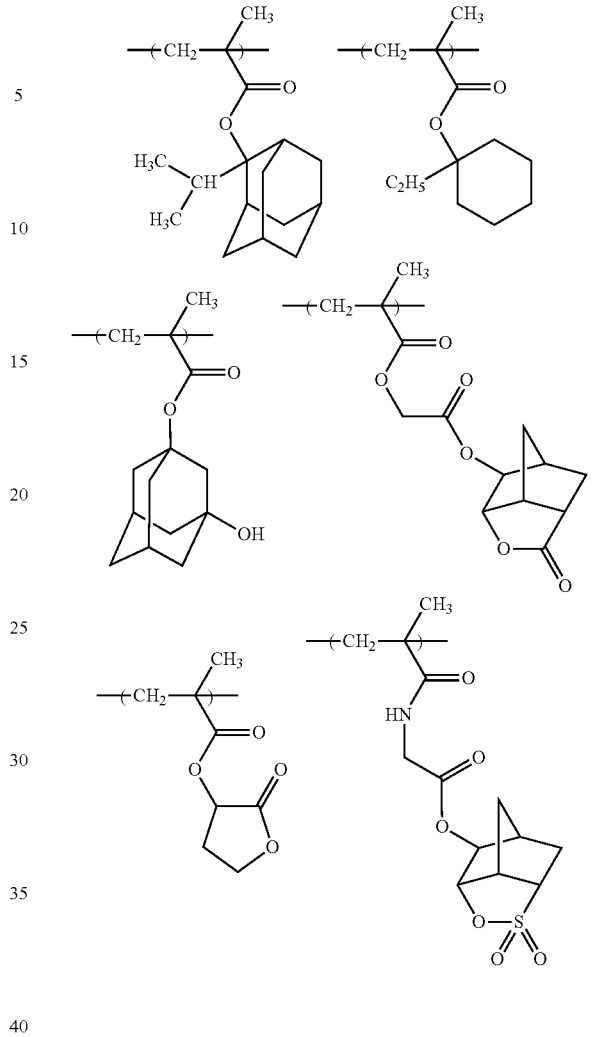

Resin Synthesis Example 7

Monomer (J), Monomer (F), Monomer (B), Monomer (E), Monomer (C) and Monomer (I) were mixed at a molar ratio of 35:10:8:12:23:12 (Monomer (J):Monomer (F):Monomer (B):Monomer (E):Monomer (C):Monomer (I)), and 1,4-dioxane in 1.5 times mass based on the total amount of all monomers was added thereto. To the resultant mixture, azobisisobutyronitrile as an initiator in a ratio of 1 mol % based on all monomer molar amount, and azobis(2,4-dimethylvaleronitrile) as an initiator in a ratio of 3 mol % based on all monomer molar amount were added. The obtained mixture was heated at 75° C. for about 5 hours. Then, the reaction mixture obtained was poured into a large amount of a mixture of methanol and water to cause precipitation. The precipitate was isolated by filtration and dissolved in 1,4-dioxane. The resultant solution was poured into a large amount of a mixture of methanol and water to cause precipitation, and this operation was repeated for purification. As a result, a resin having a weight-average molecular weight of about $7.4 \times 10^3$ was obtained in a yield of 66%. This is called as Resin A7. Resin A7 had the structural units derived from Monomer (J), Monomer (F), Monomer (B), Monomer (E), Monomer (C) and Monomer (I).

Resin Synthesis Example 8

Monomer (A) Monomer (F) Monomer (B) Monomer (C) and Monomer (I) were mixed at a molar ratio of 32:7:8:43:10 (Monomer (A):Monomer (F):Monomer (B):Monomer (C):Monomer (I)), and 1,4-dioxane in 1.5 times mass based on the total amount of all monomers was added thereto. To the resultant mixture, azobisisobutyronitrile as an initiator in a ratio of 1 mold based on all monomer molar amount, and azobis(2,4-dimethylvaleronitrile) as an initiator in a ratio of 3 mol % based on all monomer molar amount were added. The obtained mixture was heated at 75° C. for about 5 hours. Then, the reaction mixture obtained was poured into a large amount of a mixture of methanol and water to cause precipitation. The precipitate was isolated by filtration and dissolved in 1,4-dioxane. The resultant solution was poured into a large amount of a mixture of methanol and water to cause precipitation, and this operation was repeated for purification. As a result, a resin having a weight-average molecular weight of about $7.5 \times 10^3$ was obtained in a yield of 78%. This is called as Resin A8. Resin A8 had the structural units derived from Monomer (A), Monomer (F), Monomer (B), Monomer (C) and Monomer (I).

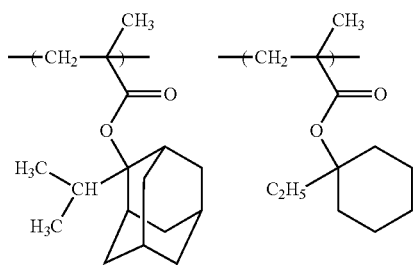

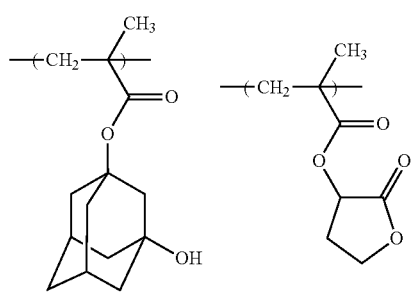

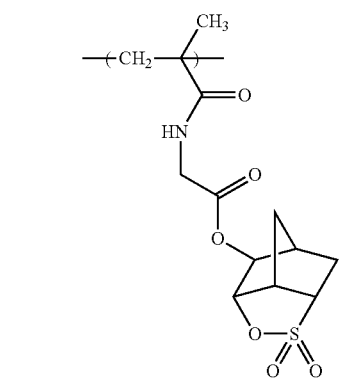

Resin Synthesis Example 9

Monomer (J), Monomer (B), Monomer (C) and Monomer (G) were mixed at a molar ratio of 51.7:7.8:23.3:17.2 (Monomer (J):Monomer (B):Monomer (C):Monomer (G)), and 1,4-dioxane in 1.5 times mass based on the total amount of all monomers was added thereto. To the resultant mixture, azobisisobutyronitrile as an initiator in a ratio of 1 mol % based on all monomer molar amount, and azobis(2,4-dimethylvaleronitrile) as an initiator in a ratio of 3 mol % based on all monomer molar amount were added. The obtained mixture was heated at 75° C. for about 5 hours. Then, the reaction mixture obtained was poured into a large amount of a mixture of methanol and water to cause precipitation. The precipitate was isolated by filtration and dissolved in 1,4-dioxane. The resultant solution was poured into a large amount of a mixture of methanol and water to cause precipitation, and this operation was repeated for purification. As a result, a resin having a weight-average molecular weight of about $7.7 \times 10^3$ was obtained in a yield of 64%. This is called as Resin A9. Resin A9 had the structural units derived from Monomer (J), Monomer (B), Monomer (C) and Monomer (G).

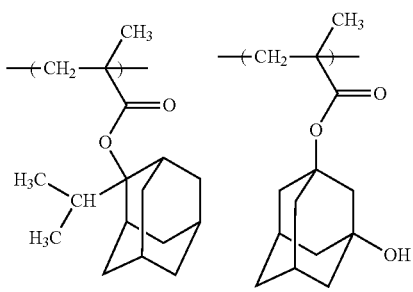

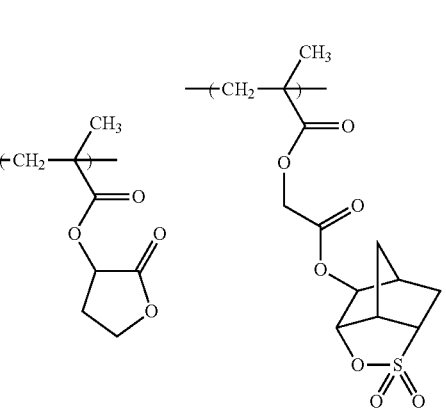

Resin Synthesis Example 10

Monomer (A), Monomer (H), Monomer (B), Monomer (C) and Monomer (E) were mixed at a molar ratio of 32:7:8:43:10 (Monomer (A):Monomer (H):Monomer (B):Monomer (C):Monomer (E)), and 1,4-dioxane in 1.5 times mass based on the total amount of all monomers was added thereto. To the resultant mixture, azobisisobutyronitrile as an initiator in a ratio of 1 mol % based on all monomer molar amount, and azobis(2,4-dimethylvaleronitrile) as an initiator in a ratio of 3 mol % based on all monomer molar amount were added. The obtained mixture was heated at 73° C. for about 5 hours. Then, the reaction mixture obtained was poured into a large amount of methanol to cause precipitation. The precipitate was isolated by filtration and dissolved in 1,4-dioxane. The resultant solution was poured into a large amount of methanol to cause precipitation, and this operation was repeated for purification. As a result, a resin having a weight-average molecular weight of about $7.9 \times 10^3$ was obtained in a yield of 76%. This is called as Resin A10. Resin A10 had the structural units derived from Monomer (A), Monomer (H), Monomer (B), Monomer (C) and Monomer (E).

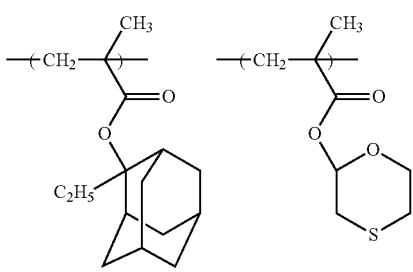

-continued

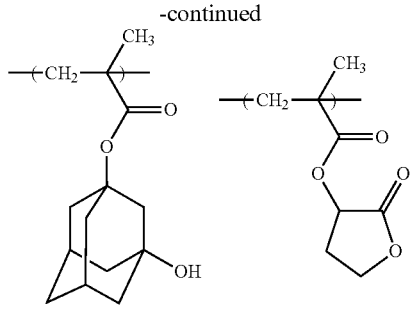

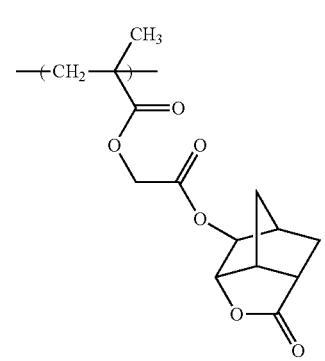

Resin Synthesis Example 11

Monomer (J) Monomer (H) Monomer (B) Monomer (C) and Monomer (E) were mixed at a molar ratio of 35:7:8:40:10 (Monomer (J):Monomer (H):Monomer (B):Monomer (C):Monomer (E)), and 1,4-dioxane in 1.5 times mass based on the total amount of all monomers was added thereto. To the resultant mixture, azobisisobutyronitrile as an initiator in a ratio of 1 mol % based on all monomer molar amount, and azobis(2,4-dimethylvaleronitrile) as an initiator in a ratio of 3 mol % based on all monomer molar amount were added. The obtained mixture was heated at 73° C. for about 5 hours. Then, the reaction mixture obtained was poured into a large amount of methanol to cause precipitation. The precipitate was isolated by filtration and dissolved in 1,4-dioxane. The resultant solution was poured into a large amount of methanol to cause precipitation, and this operation was repeated for purification. As a result, a resin having a weight-average molecular weight of about $7.5 \times 10^3$ was obtained in a yield of 66%. This is called as Resin All. Resin All had the structural units derived from Monomer (J), Monomer (H), Monomer (B), Monomer (C) and Monomer (E).

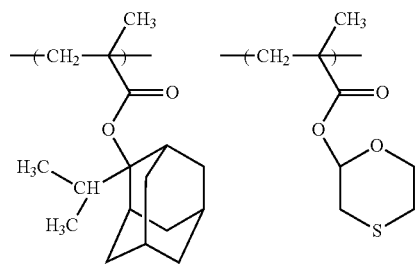

-continued

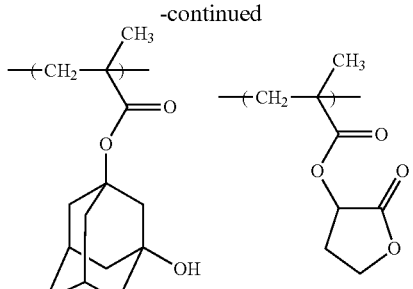

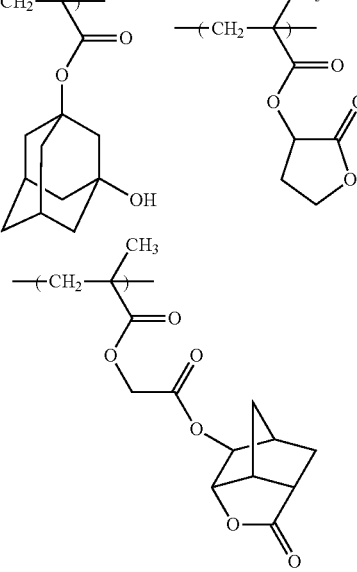

Examples 1 to 21 and Comparative Examples 1 and 2

<Resin>
Resin A1, A2, A3, A4, A5, A6, A7, A8, A9, A10, A11
<Acid Genertor>
B1: Salt represented by the formula (B-1)

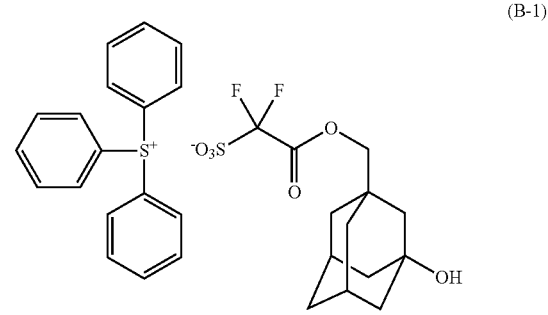

(B-1)

B2: Salt represented by the following formula

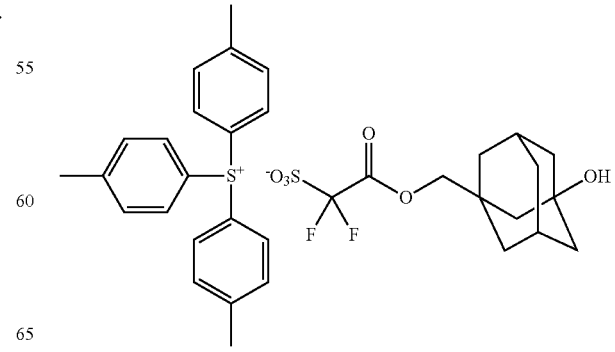

B3: Salt represented by the following formula

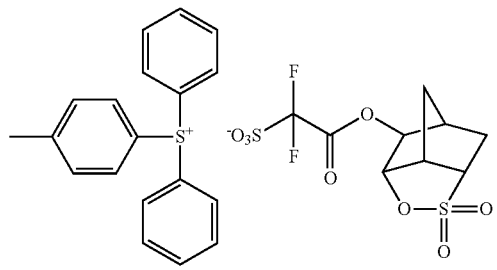

<Basic Compound>
C1: 2,6-diisopropylaniline
C2: tris[2-2(methoxyethoxy)ethyl]amine
<Compound (I)>
I1: Compound represented by the formula (I-1)

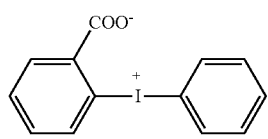
(I-1)

I2: Compound represented by the formula (I-2)

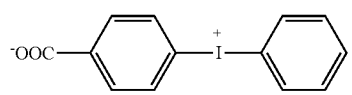
(I-2)

<Solvent>

| E1: | propylene glycol monomethyl ether acetate | 265.0 parts |
|---|---|---|
|  | propylene glycol monomethyl ether | 20.0 parts |
|  | γ-butyrolactone | 3.5 parts |
|  | 2-heptanone | 20.0 parts |
| E2: | propylene glycol monomethyl ether acetate | 240.0 parts |
|  | propylene glycol monomethyl ether | 20.0 parts |
|  | γ-butyrolactone | 3.5 parts |
|  | 2-heptanone | 20.0 parts |

The following components were mixed and dissolved, further, filtrated through a fluorine resin filter having pore diameter of 0.2 μm, to prepare photoresist compositions.
Resin (kind and amount are described in Table 1)
Acid generator (kind and amount are described in Table 1)
Compound (I) (kind and amount are described in Table 1)
Basic compound (kind and amount are described in Table 1)
Solvent (kind and amount are described in Table 1)

TABLE 1

|  | Resin (kind/ amount (part)) | Acid Generator (kind/ amount (part)) | Compound (I) (kind/ amount (part)) | Basic Compound (kind/ amount (part)) | Solvent |
|---|---|---|---|---|---|
| Ex. 1 | A1/10 | B1/0.85 | I1/0.10 | — | E1 |
| Ex. 2 | A1/10 | B1/0.85 | I1/0.10 | C1/0.12 | E1 |
| Ex. 3 | A1/10 | B1/0.85 | I1/0.10 | C2/0.12 | E1 |
| Ex. 4 | A1/10 | B1/0.85 | I2/0.10 | — | E1 |
| Ex. 5 | A1/10 | B1/0.85 | I2/0.10 | C1/0.12 | E1 |
| Ex. 6 | A1/10 | B1/0.85 | I2/0.10 | C2/0.12 | E1 |
| Ex. 7 | A2/10 | B1/0.85 | I1/0.10 | — | E1 |
| Ex. 8 | A2/10 | B1/0.85 | I1/0.10 | C1/0.12 | E1 |
| Ex. 9 | A2/10 | B1/0.85 | I1/0.10 | C2/0.12 | E1 |
| Ex. 10 | A3/10 | B1/0.85 | I1/0.10 | — | E1 |
| Ex. 11 | A4/10 | B1/0.85 | I1/0.10 | — | E1 |
| Ex. 12 | A5/10 | B1/0.85 | I1/0.10 | — | E1 |
| Ex. 13 | A4/10 | B1/0.85 | I1/0.10 | C1/0.12 | E1 |
| Ex. 14 | A4/10 | B1/0.85 | I1/0.10 | C2/0.12 | E1 |
| Ex. 15 | A6/10 | B2/1.10 | I1/0.10 | — | E2 |
| Ex. 16 | A7/10 | B2/1.10 | I1/0.10 | — | E2 |
| Ex. 17 | A8/10 | B2/1.10 | I1/0.10 | — | E2 |
| Ex. 18 | A6/10 | B3/1.10 | I1/0.10 | — | E2 |
| Ex. 19 | A10/10 | B1/0.85 | I1/0.10 | — | E1 |
| Ex. 20 | A10/10 | B2/1.10 | I1/0.10 | — | E1 |
| Ex. 21 | A11/10 | B2/1.10 | I1/0.10 | — | E2 |
| Comp. Ex. 1 | A2/10 | B1/0.85 | — | C1/0.12 | E1 |
| Comp. Ex. 2 | A9/10 | B3/1.10 | — | C1/0.1 | E2 |

TABLE 2

|  | PB (° C.) | PB (° C.) |
|---|---|---|
| Ex. 1 | 125 | 125 |
| Ex. 2 | 125 | 125 |
| Ex. 3 | 125 | 125 |
| Ex. 4 | 125 | 125 |
| Ex. 5 | 125 | 125 |
| Ex. 6 | 125 | 125 |
| Ex. 7 | 125 | 125 |
| Ex. 8 | 125 | 125 |
| Ex. 9 | 125 | 125 |
| Ex. 10 | 125 | 125 |
| Ex. 11 | 125 | 125 |
| Ex. 12 | 125 | 125 |
| Ex. 13 | 125 | 125 |
| Ex. 14 | 125 | 125 |
| Ex. 15 | 95 | 85 |
| Ex. 16 | 95 | 85 |
| Ex. 17 | 110 | 105 |
| Ex. 18 | 95 | 85 |
| Ex. 19 | 125 | 125 |
| Ex. 20 | 125 | 125 |
| Ex. 21 | 95 | 85 |
| Comp. Ex. 1 | 125 | 125 |
| Comp. Ex. 2 | 95 | 85 |

Silicon wafers (12 inchs) were each coated with "ARC-29", which is an organic anti-reflective coating composition available from Nissan Chemical Industries, Ltd., and then baked under the conditions: 205° C., 60 seconds, to form a 78 nm-thick organic anti-reflective coating. Each of the photoresist compositions prepared in Examples 1 to 14, 19 and 20 and Comparative Example 1 was spin-coated over the anti-reflective coating so that the thickness of the resulting film became 110 nm after drying. The silicon wafers thus coated with the respective photoresist compositions were each prebaked on a direct hotplate at a temperature shown in column of "PB" of Table 2 for 60 seconds. Using an ArF excimer laser stepper for immersion exposure ("XT:1900Gi" manufactured by ASML, NA=1.35, HTM P90L45 DipoleX35, Y polarization, s=0.985/0.875), each wafer thus formed with the respective photoresist film was subjected to exposure using photomasks having a line and space pattern, with the exposure quantity being varied stepwise. As the immersion medium, ultrapure water was used.

After the exposure, each wafer was subjected to post-exposure baking on a hotplate at a temperature shown in column of "PEB" of Table 2 for 60 seconds and then to paddle development for 60 seconds with an aqueous solution of 2.38 wt % tetramethylammonium hydroxide.

Each of line and space patterns developed on the organic anti-reflective coating substrate after the development was observed with a scanning electron microscope, the results of which are shown in Table 3.

Effective Sensitivity (ES): It was expressed as the amount of exposure that the line and space pattern of 45 nm became 1:1 after exposure through line and space pattern mask and development.

Line Edge Roughness (LER): The photoresist pattern at ES was observed with a scanning electron microscope. The difference between the height of the highest point and height of the lowest point of the scabrous wall surface of the photoresist pattern was measured. When the difference is 2.5 nm or less, LER is very good and its evaluation is marked by "⊚", when the difference is more than 2.5 nm and 3.0 nm or less, LER is good and its evaluation is marked by "○", and when the difference is more than 3.0 nm, LER is bad and its evaluation is marked by "X". Further, each of the differences is also shown in parentheses in a column of "LER". The smaller the difference is, the better the pattern is. The difference was shown in parentheses in Table 3.

Focus margin (DOF): The photoresist patterns were obtained using a 45 nm line and space pattern photomask at the exposure amount of ES, with the focal point distance being varied stepwise. Each of patterns developed on the organic anti-reflective coating substrate after the development were observed and the focal point distances when the patterns of which line width was within 45 nm±5% (about 42.75 to 47.25 nm) were measured and the difference between the max value of the focal point distance and the minimum value of the focal point distance was calculated. When the difference is 0.15 μm or more, DOF is good and its evaluation is marked by "○", and when the difference is less than 0.15 μm, DOF is bad and its evaluation is marked by "X". Further, each of the differences is also shown in parentheses in a column of "DOF". The difference is bigger, the better focus margin the photoresist composition has.

TABLE 3

| | LER | DOF |
|---|---|---|
| Ex. 1 | ⊚ (2.22) | ○ (0.15) |
| Ex. 2 | ○ (2.52) | ○ (0.15) |
| Ex. 3 | ⊚ (2.14) | ○ (0.15) |
| Ex. 4 | ⊚ (2.48) | ○ (0.15) |
| Ex. 5 | ○ (2.68) | ○ (0.15) |
| Ex. 6 | ⊚ (2.44) | ○ (0.15) |
| Ex. 7 | ○ (2.78) | ○ (0.15) |
| Ex. 8 | ○ (2.74) | ○ (0.15) |
| Ex. 9 | ○ (2.91) | ○ (0.15) |
| Ex. 10 | ⊚ (2.20) | ○ (0.18) |
| Ex. 11 | ⊚ (2.23) | ○ (0.18) |
| Ex. 12 | ⊚ (2.28) | ○ (0.18) |
| Ex. 13 | ⊚ (2.18) | ○ (0.18) |
| Ex. 14 | ⊚ (2.16) | ○ (0.18) |
| Ex. 19 | ⊚ (2.14) | ○ (0.18) |
| Ex. 20 | ⊚ (2.06) | ○ (0.21) |
| Comp. Ex. 1 | X (3.28) | X (0.12) |

Silicon wafers (12 inchs) were each coated with "ARC-29", which is an organic anti-reflective coating composition available from Nissan Chemical Industries, Ltd., and then baked under the conditions: 205° C., 60 seconds, to form a 78 nm-thick organic anti-reflective coating. Each of the photoresist compositions prepared in Examples 15 to 18 and 21 and Comparative Example 2 was spin-coated over the anti-reflective coating so that the thickness of the resulting film became 85 nm after drying. The silicon wafers thus coated with the respective photoresist compositions were each prebaked on a direct hotplate at a temperature shown in column of "PB" of Table 2 for 60 seconds. Using an ArF excimer laser stepper for immersion exposure ("XT:1900Gi" manufactured by ASML, NA=1.35, ¾ Annular, X-Y polarization), each wafer thus formed with the respective photoresist film was subjected to exposure using photomasks having a contact hole pattern, with the exposure quantity being varied stepwise. As the immersion medium, ultrapure water was used.

After the exposure, each wafer was subjected to post-exposure baking on a hotplate at a temperature shown in column of "PEB" of Table 2 for 60 seconds and then to paddle development for 60 seconds with an aqueous solution of 2.38 wt % tetramethylammonium hydroxide.

Each of contact hole patterns developed on the organic anti-reflective coating substrate after the development was observed with a scanning electron microscope, the results of which are shown in Table 4.

Effective Sensitivity (ES): It was expressed as the amount of exposure that the hole diameter of the contact hole pattern became 55 nm after exposure through the contact hole pattern photomask having a diameter of 70 nm and development.

Focus margin (DOF): The photoresist patterns were obtained using a contact hole pattern photomask having a diameter of 70 nm at the exposure amount of ES, with the focal point distance being varied stepwise. Each of patterns developed on the organic anti-reflective coating substrate after the development were observed and the focal point distances when the patterns of which hole diameter was between 52.2 nm or more and 57.7 nm were measured and the difference between the max value of the focal point distance and the minimum value of the focal point distance was calculated. When the difference is 0.18 μm or more, DOF is good and its evaluation is marked by "○", and when the difference is less than 0.18 μm, DOF is bad and its evaluation is marked by "X". Further, each of the differences is also shown in parentheses in a column of "DOF". The difference is bigger, the better focus margin the photoresist composition has.

TABLE 4

| | DOF |
|---|---|
| Ex. 15 | ○ (0.24) |
| Ex. 16 | ○ (0.24) |
| Ex. 17 | ○ (0.21) |
| Ex. 18 | ○ (0.21) |
| Ex. 21 | ○ (0.24) |
| Comp. Ex. 2 | X (0.17) |

The photoresist composition of the present invention provides a good resist pattern having good focus margin, and is especially suitable for ArF excimer laser lithography, EUV lithography and EB lithography.

What is claimed is:

1. A photoresist composition comprising
a resin which comprises a structural unit derived from monomers represented by the formulae (a1-1) and (a1-2):

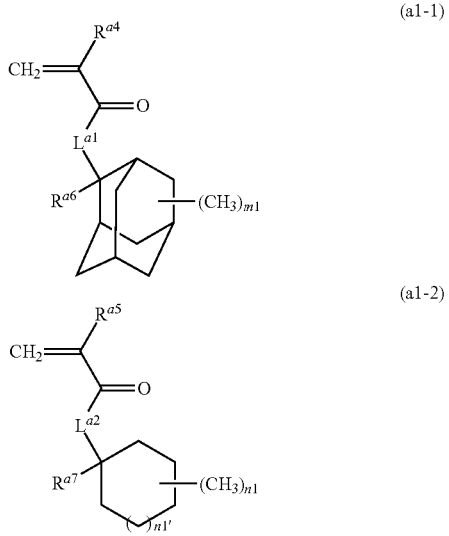

(a1-1)

(a1-2)

wherein $R^{a4}$ and $R^{a5}$ each independently represents a hydrogen atom or a methyl group, $R^{a6}$ and $R^{a7}$ each independently represents a C1-C8 aliphatic hydrocarbon group or a C3-C10 alicyclic hydrocarbon group, $L^{a1}$ and $L^{a2}$ each independently represents *—O— or *—O—(CH$_2$)$_{k1}$—CO—O— in which * represents a binding position to —CO—, and k1 represents an integer of 1 to 7, and m1 represents an integer of 0 to 14, n1 represents an integer of 0 to 10, and n1' represents an integer of 0 to 3, and which resin is insoluble or poorly soluble in an alkali aqueous solution but becomes soluble in an alkali aqueous solution by the action of an acid, an acid generator and
a compound represented by the formula (I):

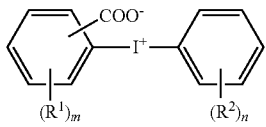

(I)

wherein $R^1$ and $R^2$ are independently in each occurrence a C1-C12 hydrocarbon group, a C1-C6 alkoxy group, a C2-C7 acyl group, a C2-C7 acyloxy group, a C2-C7 alkoxycarbonyl group, a nitro group or a halogen atom, and m and n independently each represent an integer of 0 to 4.

2. A process for producing a photoresist pattern comprising the following steps (1) to (5):

(1) a step of applying the photoresist composition according to claim 1 on a substrate, (2) a step of forming a photoresist film by conducting drying, (3) a step of exposing the photoresist film to radiation, (4) a step of baking the exposed photoresist film, and (5) a step of developing the baked photoresist film with an alkaline developer, thereby forming a photoresist pattern.

3. The photoresist composition according to claim 1, wherein the acid generator is a salt represented by the formula (B1):

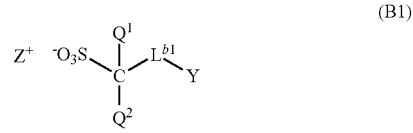

(B1)

wherein $Q^1$ and $Q^2$ each independently represent a fluorine atom or a C1-C6 perfluoroalkyl group, $L^{b1}$ represents a single bond or a C1-C17 saturated divalent hydrocarbon group which can have one or more substituents, and one or more —CH$_2$— in the saturated divalent hydrocarbon group can be replaced by —O— or —CO—, Y represents a C1-C18 aliphatic hydrocarbon group or a C3-C18 saturated cyclic hydrocarbon group, and the aliphatic hydrocarbon group and the saturated cyclic hydrocarbon group can have one or more substituents, and one or more —CH$_2$— in the aliphatic hydrocarbon group and the saturated cyclic hydrocarbon group can be replaced by —O—, —CO— or —SO$_2$, —, and $Z^+$ represents an organic cation.

* * * * *